(12) United States Patent
Ooishi et al.

(10) Patent No.: US 6,337,832 B1
(45) Date of Patent: *Jan. 8, 2002

(54) OPERABLE SYNCHRONOUS SEMICONDUCTOR MEMORY DEVICE SWITCHING BETWEEN SINGLE DATA RATE MODE AND DOUBLE DATA RATE MODE

(75) Inventors: Tsukasa Ooishi; Masatoshi Ishikawa, both of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/272,194

(22) Filed: Mar. 18, 1999

(30) Foreign Application Priority Data

Jun. 10, 1998 (JP) ............................................ 10-162477
Oct. 14, 1998 (JP) ............................................ 10-292561

(51) Int. Cl.[7] ................................................ G11C 8/00
(52) U.S. Cl. .................................. 365/233; 365/230.01
(58) Field of Search ........................... 365/233, 230.01, 365/230.03, 230.06

(56) References Cited

U.S. PATENT DOCUMENTS

| | | | |
|---|---|---|---|
| 5,703,829 A | 12/1997 | Suzuki et al. ................ 365/233 |
| 5,831,924 A | * 11/1998 | Nitta et al. ............. 365/230.03 |
| 5,876,446 A | 2/1999 | Konishi et al. .............. 365/233 |
| 5,886,946 A | 3/1999 | Ooishi ......................... 365/233 |
| 5,910,927 A | * 6/1999 | Hamamoto et al. ..... 365/230.03 |
| 5,946,266 A | 8/1999 | Iwamoto et al. ............ 365/233 |
| 5,963,467 A | * 10/1999 | Miyatake et al. ........... 365/149 |
| 5,995,441 A | 11/1999 | Kato et al. ................... 365/233 |
| 6,011,735 A | 1/2000 | Ooishi et al. ................ 365/200 |

OTHER PUBLICATIONS

"A 2.5–ns Clock Access, 250–MHz, 256–Mb SDRAM with Synchronous Mirror Delay", T. Saeki et al., IEEE Journal of Solid–State Circuits, vol. 31, No. 11, Nov. 1996, pp. 1656–1665.

* cited by examiner

*Primary Examiner*—David Nelms
*Assistant Examiner*—Anh Phung
(74) *Attorney, Agent, or Firm*—McDermott, Will & Emery

(57) ABSTRACT

A synchronous semiconductor memory device operates an input/output buffer circuit in synchronization with an external clock signal in a single data rate SDRAM operation mode. In a double data rate SDRAM operation mode, an internal clock signal of a frequency two times that of the external clock signal is generated. The input/output buffer circuit is operated in synchronization with the internal clock signal.

24 Claims, 68 Drawing Sheets

FIG. 24

556.2 i=0-7(BANK)
j=LEFT, RIGHT (INSIDE CHIP)
k=EVEN/ODD (INSIDE BANK)

OPERABLE SYNCHRONOUS SEMICONDUCTOR MEMORY DEVICE SWITCHING BETWEEN SINGLE DATA RATE MODE AND DOUBLE DATA RATE MODE

BACKGROUND OF THE INVENTION

1. Field of the Invention

The present invention relates to semiconductor integrated circuit devices, and particularly to a semiconductor integrated circuit device that operates in synchronization with an external clock signal. More particularly, the present invention relates to, for example, a synchronous semiconductor memory device that operates in synchronization with an external clock signal.

2. Description of the Background Art

In accordance with increase in the operating speed of recent microprocessors (referred to as MPU hereinafter), a synchronous DRAM that operates in synchronization with a clock signal and the like (synchronous DRAM: referred to as SDRAM hereinafter) are used to realize high speed access of dynamic random access memories (referred to as DRAM hereinafter) employed as the main storage device.

The internal operation of such SDRAMs is divided into the row related operation and column related operation for control.

To allow further increase in the operation speed in a SDRAM, a bank structure is employed where memory cell arrays are divided into a plurality of banks that are operable independently. In other words, the operation of each bank is under independent control for a row related operation and a column related operation.

However, further increase in the high speed operation is required for a semiconductor memory device depending upon the applied system.

In contrast, some systems do not require such a high speed operation. When a SDRAM designed to correspond to a system that requires maximum speed is used in a system that allows a lower operating frequency, it is not desirable from the standpoint of power consumption to operate the SDRAM according to the specification of the highest speed.

Also, the manner of synchronous operation for the entire system differs. There are systems having a reference clock signal for synchronous operation output from only the controller end, and systems in which a synchronizing clock signal is output equally to each control device and semiconductor memory device forming the system.

It may be necessary to modify the operation mode of the SDRAM itself in the above two cases to operate faster taking account of the effect of skew of a clock signal.

If a different design is to be provided according to each particular application, the cost required for designing and fabrication will increase.

In accordance with increase in the speed of the throughput of the DRAM becoming a critical issue in the system performance, a SDRAM that inputs/outputs data in synchronization with an externally applied clock is now popular instead of the DRAM of the EDO method.

The SDRAM method has the data, address, and various commands input into the chip in synchronization with the rising edge of an externally applied clock with the internal process of the memory chip partially carried out in synchronization with the clock, and has the output also provided in synchronization with the edge of the external clock.

In system applications where a great amount of data is to be processed at high speed such as image data, a further higher throughput is required.

To this end, a double data rate synchronous DRAM (referred to as DDR-SDRAM hereinafter) has been proposed as a new input/output method of a DRAM. An external strobe clock for data is applied, and data is input in synchronization with both the rising and falling edges. An internal strobe clock in synchronization with the data output is provided.

FIG. 77 shows a block diagram of an example of this DDR-SDRAM. Only the data input/output through one data input/output terminal is depicted in the drawing.

In a data writing operation, the data input in synchronization with a strobe clock from a pad 9000 passes through the input buffer to be held in an input register. Here, the data input at the rise of a clock and the data input at the fall of the clock are held in separate input registers 9002 and 9003.

The input control circuit switches a connection switch 9004 for the data bus and the register according to whether the address is even or odd.

Following the latency of the data strobe clock, the data is provided to the internal data bus in synchronization with the clock. In general, two clocks are set as the latency of the data strobe. The memory array is divided depending whether the address is even or odd. Data is received from respective corresponding data buses to be stored into a corresponding memory cell. When data is written continuously, address counters 9006 and 9007 generate the required addresses, which are sent to the memory array.

Here, address counters 9006 and 9007 generate different patterns depending upon whether the corresponding memory array is at an even address or an odd address.

In a data reading operation, data is read out from a corresponding memory cell according to the address sent to the memory array from address counters 9006 and 9007 to be output to the data bus.

Output control circuit 9008 alters the connection between the data bus and the output register depending upon whether the address is an uneven number or an odd number. The data is temporarily stored in the register. Output control circuit 9008 switches switch 1012 in accordance with the set latency to output data alternately that are latched in output registers 9009 and 9010 in synchronization with the rising and falling edges of the clock.

In the above-described system, it was necessary to produce different chips depending upon whether the SDRAM takes the single data rate system (referred to as SDR-DRAM hereinafter) or the double data rate system despite similarity in the chip internal operation.

SUMMARY OF THE INVENTION

In view of the foregoing, an object of the present invention is to provide a synchronous semiconductor memory device that can adjust the margin of chip operation flexibly with respect to an external clock signal according to the system requirement.

Another object of the present invention is to provide a synchronous semiconductor memory device that allows implementation of a single data rate SDRAM and a double data SDRAM with the same chip.

A further object of the present invention is to provide a synchronous semiconductor memory device that can ensure an operation margin sufficient for an external clock signal according to the system.

According to an aspect of the present invention, a synchronous semiconductor memory device receiving an address signal and a control signal in synchronization with an external clock signal includes a memory cell array, a control circuit, a first internal synchronizing signal generation circuit, a second internal synchronizing signal generation circuit, an address signal input circuit, a control signal input circuit, a memory cell select circuit, a plurality of data input/output nodes, and an interface circuit.

The memory cell array includes a plurality of memory cells arranged in a matrix. The control circuit controls the operation of the synchronous semiconductor memory device. The first internal synchronizing signal generation circuit outputs a first internal clock signal synchronized with the external clock signal and having a frequency higher than that of the external clock signal. The second internal synchronizing signal generation circuit outputs a second internal clock signal synchronized with the external clock signal.

The address signal input circuit inputs an address signal in synchronization with the second internal clock signal. The control signal input circuit inputs a control signal in synchronization with the second internal clock signal. The memory cell select circuit selects a memory cell according to the address signal.

The plurality of data input/output nodes receive write data to a memory cell or read out data from a memory cell. The interface circuit is provided between a memory cell selected by the select circuit and a data input/output node to transfer write data.

The interface circuit effects input of write data from each of a plurality of data input/output nodes in synchronization with the second internal clock signal in a first operation mode, and effects input of write data from each of the plurality of data input/output nodes in synchronization with the first internal clock signal in a second operation mode.

Preferably, the memory cell array is a bank divided into a plurality of memory cell blocks, allowing a read operation and a write operation independently. The synchronous semiconductor memory device further includes an address bus, a command data bus, a first variable vernier circuit, and a second variable vernier circuit.

The address bus is provided in common to the plurality of memory cell blocks to transmit an address signal from the address signal input circuit. The command data bus is provided in common to the plurality of memory cell blocks to transmit the internal control signal output from the control circuit. The first variable vernier circuit adjusts the delay amount of the signal transmitted through the address bus under control of the control circuit. The second variable vernier circuit adjusts the delay amount of the signal transmitted through the command data bus under control of the control circuit.

The memory cell select circuit includes a plurality of local select circuits provided corresponding to the memory cell blocks to select a memory cell according to the address signal from the address bus. Each local select circuit is rendered active in response to selection of a corresponding memory cell block according to an internal control signal and an address signal.

According to still another aspect of the present invention, a synchronous semiconductor memory device that inputs a row address signal and a column address signal in synchronization with an external clock signal includes a memory cell array, an internal synchronizing signal generation circuit, an address signal input circuit, a row select circuit, and a column select circuit.

The memory cell array includes a plurality of memory cells arranged in a matrix. The memory cell array includes a plurality of memory cell blocks.

The internal synchronizing signal generation circuit provides an internal clock signal in synchronization with the external clock signal. The address signal input circuit inputs row and column address signals in synchronization with the internal clock signal.

The row select circuit is provided corresponding to a memory cell block to select a memory cell row according to a row address signal. The row select circuit includes a first retain circuit for retaining a row address signal from the address signal input circuit.

The column select circuit is provided corresponding to a memory cell block to select a memory cell column according to a column address signal. The column select circuit includes a second retain circuit for retaining a column address signal that is supplied in a time-divisional manner with respect to the row address signal, and a path select circuit for initiating a select operation of a memory cell column for data output prior to the end of a row select operation of the row select circuit according to the column address signal in the second retain circuit.

The main advantage of the present invention is that the margin of the chip operation can be adjusted flexibly with respect to an external clock signal according to the system requirement since the distribution of an internal clock signal can be modified according to external designing.

Another advantage of the present invention is that the operating margin can be improved allowing each bank to be operated with difference in phase. Therefore, an array structure optimum with respect to system change that improves the freedom of degree in array division in a multidivided array in addition to a high speed read out operation can be implemented.

Still another advantage of the present invention is that the read out operation can be carried out at high speed since the select operation of a memory cell column for data output is initiated prior to the end of a row select operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 23 and 24 are schematic block diagrams showing a structure of a row predecoder 36 and a column predecoder 34, respectively.

DESCRIPTION OF THE PREFERRED EMBODIMENTS

First Embodiment

Figure 1:
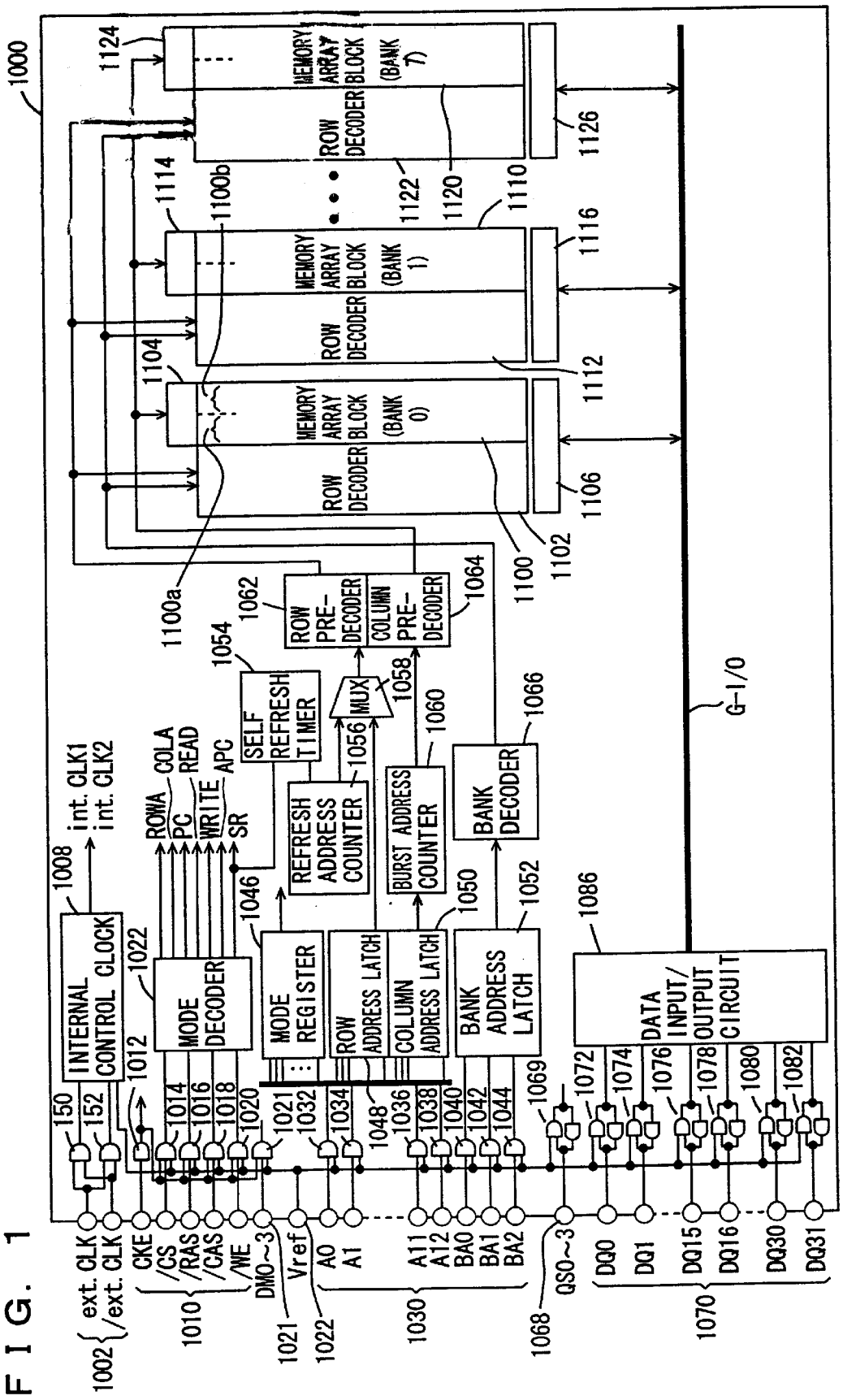
FIG. 1 is a schematic block diagram showing a structure of a synchronous semiconductor memory device 1000 according to a first embodiment of the present invention.

FIG. 1 is a schematic block diagram showing a structure of a synchronous semiconductor memory device 1000 according to a first embodiment of the present invention.

SDRAM 1000 includes an external clock signal input terminal 1002 receiving externally applied complementary clock signals ext.CLK and ext./CLK, clock input buffers 150 and 152 applying a buffer process on a clock signal applied to external clock terminal 1002, an internal control clock signal generation circuit 1008 receiving the outputs of clock buffers 150 and 152 to generate a first internal clock signal int.CLK1 and a second internal clock signal int.CLK2, and a mode decoder 1002 receiving via input buffers 1012–1020 that operate according to second internal signal int.CLK2 an external control signal provided via an external control signal input terminal 1010.

A signal CKE, a chip select signal /CS, a row address strobe signal /RAS, a column address strobe signal /CAS, a write control signal /WE, and data mask signals DM0–DM3 are applied to internal control signal input terminal 1010.

Signal CKE serves to designate that input of a control signal to the chip is allowed. Input of a control signal is not permitted so that the chip cannot operate unless this signal is rendered active.

Signal /CS serves to identify whether a command signal is input or not. When this signal is active (L level), identification of a command is made according to the level combination of other control signals at the rising edge of a clock signal.

Signal /RAS serves to designate an operation of row related circuitry. Signal /CAS serves to designate activation of the operation of column related circuitry. Signal /WE serves to identify a write operation or a read operation.

Signals DM0–DM3 serve to designate a mask operation of data transfer for respective data input/output terminals DQ0–DQ7, DQ8–DQ15, DQ16–DQ23, and DQ24–DQ31.

Mode decoder 1022 provides an internal control signal to control the operation of the internal circuitry of SDRAM 1000 according to these external control signals. Mode decoder 1022 outputs, for example, signals ROWA, COLA, ACD, PC, READ, WRITE, APC and SR as internal control signals. Signal ROWA serves to indicate that row related access is to be carried out. Signal COLA serves to indicate that column related access is to be carried out. Signal ACT designates activation of a word line.

Signal PC designates a precharge operation, and the end of a row related circuit operation. Signal READ designates a readout operation with respect to column related circuitry. Signal WRITE designates a write operation with respect to column related circuitry.

Signal APC designates an automatic precharge operation. Upon specification of an automatic precharge operation, a precharge operation is automatically initiated at the end of the burst cycle. Signal SR designates a self refresh operation. Upon the start of a self refresh operation, a self refresh timer operates. At the elapse of a predetermined time, a word line is rendered active to initiate a refresh operation.

SDRAM 1000 further includes a self refresh timer 1054 starting a count operation when a self refresh mode is specified by signal SR to designate activation of a word line, i.e., initiation of a refresh operation, at the elapse of a predetermined time, and a refresh counter 1056 for generating an address to carry out a refresh operation according to designation from self refresh timer 1054.

SDRAM 1000 further includes a reference potential input terminal 1022 for receiving a signal VREF to which the determination of an H level (logical high) or an L level (logical low) of an input signal will be referenced, a mode register 1046 retaining information for a predetermined operation mode, for example, burst length data and information associated with which of the single data operation or double data operation is specified, according to the combination of an address signal applied via address signal input terminal 1030 and the aforementioned external control signals, a row address latch 1048 receiving an address signal via address signal input buffers 1032–1038 that operate according to a second internal clock signal int.CLK2 to retain an input row address, when applied, a column address latch 1050 receiving address signals A0–A12 to retain a column address at the input timing thereof, a multiplexer 1058 receiving the outputs from refresh address counter 1056 and row address latch 1048 to selectively provide the output from row address latch 1048 when in a normal operation, and the output from refresh address counter 1056 when in a self refresh operation, a row predecoder 1062 receiving an output from multiplexer 1058 to predecode a row address, a burst address counter 1060 for generating an internal column address according to the burst length data from mode register 1046 with the column address retained in column address latch 1050 as a reference, a column predecoder 1064 receiving the output from burst address counter 1060 to predecode a corresponding column address, a bank address latch 1052 receiving bank addresses BA0–BA2 applied to the address input terminal through input buffers 1040–1044 that operate according to internal clock signal int.CLK2 to retain a specified bank address value, and a bank decoder 1066 receiving the output of bank address latch 1052 to decode a bank address.

The address signal applied to address signal input terminal 1030 is used to write data into the mode register according to a combination of several bits thereof in writing operation mode information into the mode register. For example, the setting of the values of burst length BL and CAS latency CL are specified by a combination of a predetermined number of bits of the address signal.

Bank address signals BA0–BA2 designate the bank to be accessed in respective row related access operation and column related access operation. More specifically, in each of the row related and column related access, bank address signals BLA0–BLA2 applied to address signal input terminal 1030 is input to bank address latch 1052, and then decoded by bank decoder 1066 to be transmitted to each memory array block (bank).

SDRAM 1000 further includes memory array blocks 1100, 1110 and 1120 operating as banks 0–7 that is the unit allowing independent operation of read out and writing, row decoders 1102, 1112 and 1122 for selecting a row (word line) in a corresponding bank according to the outputs from bank decoder 1066 and row predecoder 1062, column decoders 1104, 1114 and 1124 for selecting a column (bit line pair) in a corresponding bank according to the output from column predecoder 1064, I/O ports 1106, 1116 and 1126 for applying data read out from a selected memory cell in a selected bank to a global I/O bus G-I/O in a readout operation and for applying write data transmitted through bus G-I/O to a corresponding bank in a write operating, a data input/output circuit 1086 for retaining and applying to bus G-I/O externally applied write data in a write operation, and for retaining readout data transmitted through bus G-I/O in a readout operation, and bidirectional input/output buffers 1072–1082 to transfer input/output data DQ0–DQ31 between data input/output circuit 1086 and data input/output terminal 1070.

Bidirectional input/output buffers 1072–1082 operates in synchronization with a first internal clock signal int.CLK1 in a double data rate SDRAM (referred to as DDR-SDRAM hereinafter) operation mode, and in synchronization with a second internal clock signal int.CLK2 in a single data rate SDRAM (referred to as SDR-SDRAM hereinafter) operation mode, according to the operation mode data retained in mode register 1046, as will be described afterwards.

Signals QS0–QS3 to or from input/output terminal 1068 via bidirectional input/output buffer 1069 indicate the data transfer timing for corresponding data input/output terminals DQ0–DQ7, DQ8–DQ15, DQ16–DQ23, and DQ24–DQ31.

In the following, signals QS0–QS3 are generically referred to as a signal QS in an SDR-SDRAM operation mode, and a signal DQS in a DDR-SDRAM operation mode.

Figure 2:
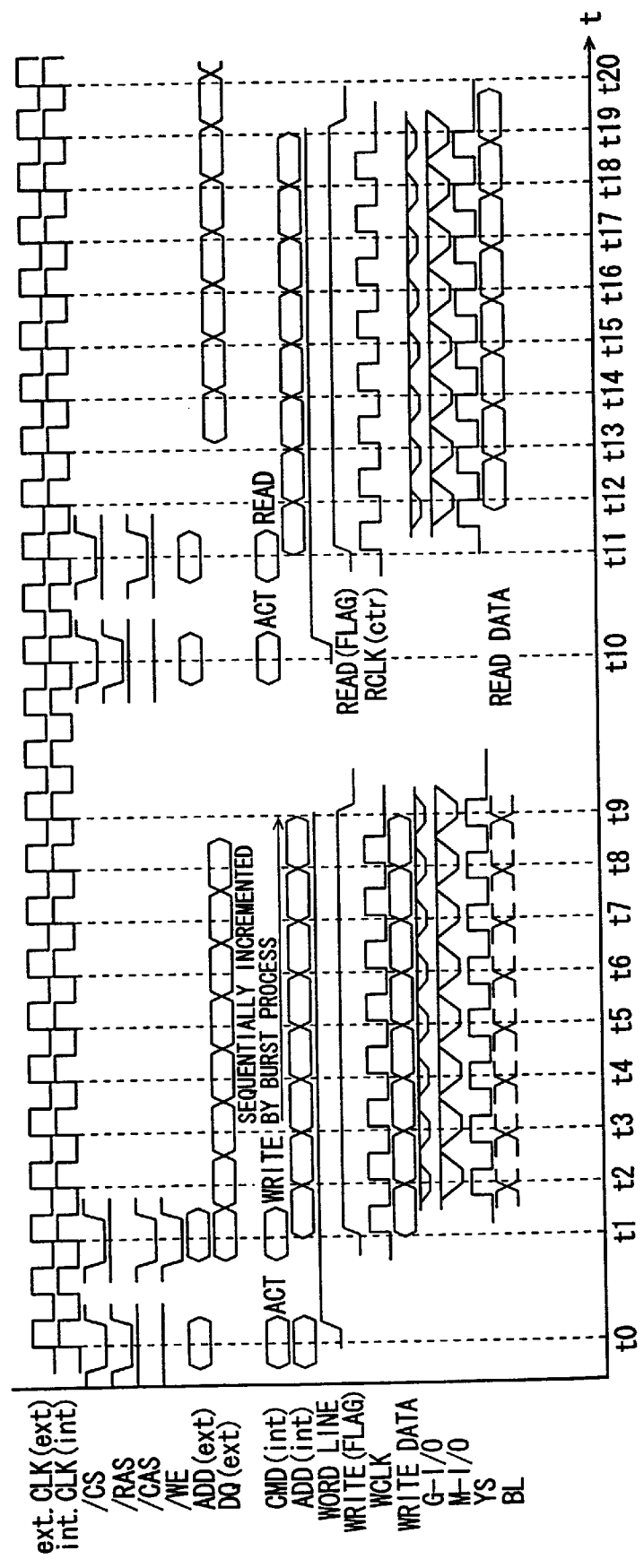
FIGS. 2. and 3 are timing charts for describing a single data rate operation and a double data rate operation of SDRAM 1000, respectively.

FIG. 2 is a timing chart for describing a single data rate operation of SDRAM 1000 of FIG. 1.

In FIG. 2, an operation will be described where the burst length is 8 and the CAS latency of the read operation is 3.
[Write operation in SDR-SDRAM mode]

At the rise of external clock signal ext.CLK at time t0, signals /CS and /RAS are at an active state (L level). The operation of a corresponding bank is rendered active in response to specification of an activated bank address.

A select operation of a corresponding row is performed according to the address signal applied at time t0.

At the rise of external clock signal ext.CLK at time t1, a write operation is specified according to the active state (L level) of signals /CS, /CAS and /WE. A continuous data write operation (burst write operation) is performed according to the address signal applied at time t1. More specifically, signal WRITE designating a write operation in SDRAM 1000 attains an active state (H level), and an internal address int.ADD corresponding to the burst length specified from burst address counter 1060 is output.

In response, the write data applied to data input/output terminal DQ (an arbitrary one of data input/output terminal 1070 is called data input/output terminal DQ hereinafter) at time t1 is latched in data input/output circuit 1086 in SDRAM 1000, and then transmitted to a selected memory array block via global I/O bus D/I/O.

The write data transmitted via I/O line pair M-I/O in the memory array block is transmitted onto bit line pair BL at time t2 in response to activation of a column select signal YS corresponding to a memory cell column selected by internal address signal int.ADD according to write clock signal WCLK generated in SDRAM 1000.

As a result, data is written into a selected memory cell.

In a similar manner, the data applied to data input/output terminal DQ at time t3-time tq is sequentially written into sequentially selected memory cells.
[Readout operation in SDR-SDRAM operation mode]

In a readout operation, a bank selected by a bank address signal is activated in response to activation of signals /CS and /RAS at the rise of external clock signal ext.CLK at time t10.

Also, a select operation of a corresponding row is performed according to the address signal applied at time t10.

At the rise of external clock signal ext.CLK at time t11, a readout operation is specified in response to the active state (L level) of signals /CS and /CAS. A corresponding column is selected according to the address signal applied at time t11. Burst address counter 1060 sequentially outputs a burst address corresponding to the specified burst length of 8 according to the address signal applied at time t11.

In response to read out clock signal RCLK generated in SDRAM 1000, a corresponding memory cell is selected. The readout data is transmitted to and retained in data input/output circuit 1086 via I/O line pair M-I/O and global I/O bus G-I/O. The readout data corresponding to the column address applied at time t11 is output to data input/output terminal DQ at time t14 which is three clocks later.

In a similar manner, data read out from the burst address specified by burst address counter 1060 is sequentially applied to data input/output terminal DQ at sequential time t15 to time t21 (not shown).

Figure 3:
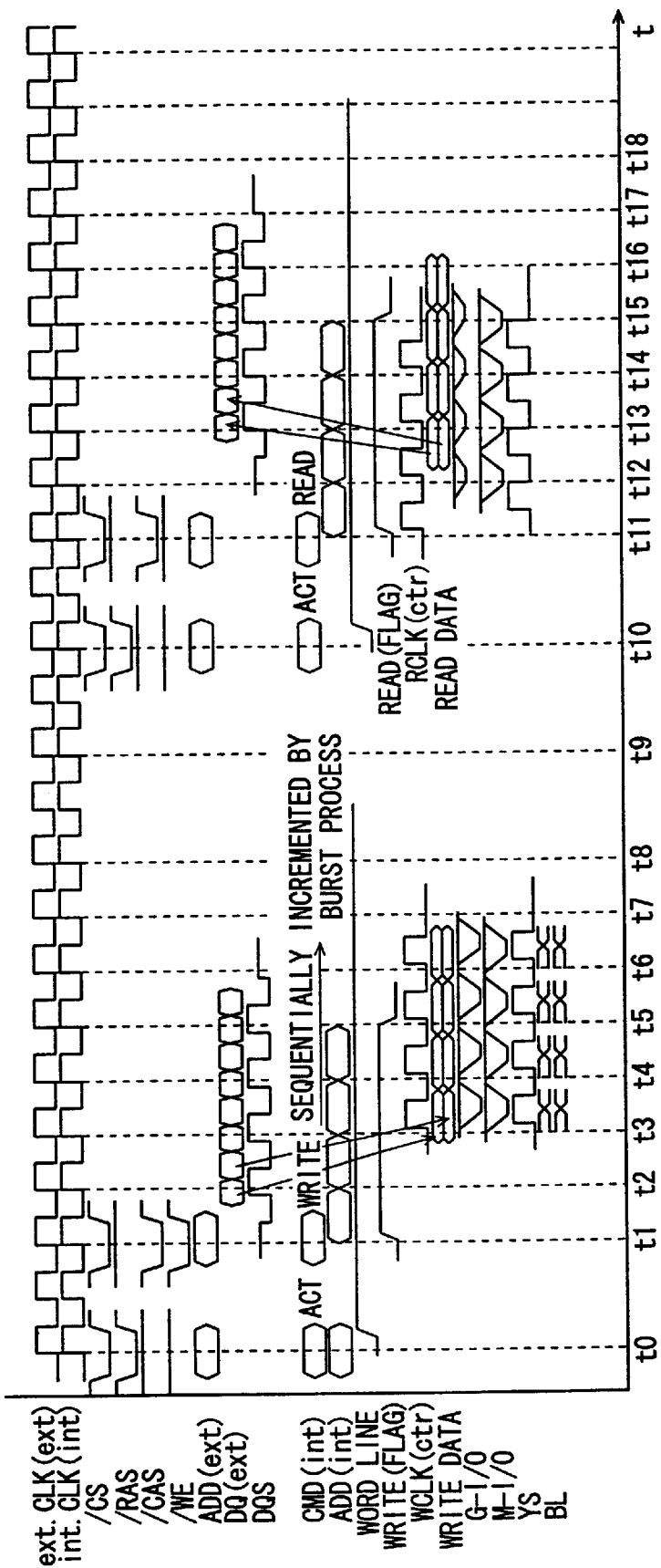

FIG. 3 is a timing chart for describing a double data rate operation of SDRAM 1000 of FIG. 1.

In FIG. 3, an operation where the burst length is 8 and the CAS latency of the read operation is 2 will be described. The CAS latency of 2 implies that data output is initiated at the second clock from the command input.
[Write operation in DDR-SDRAM mode]

Referring to FIG. 3, at the rising edge of external clock signal ext.CLK at time t0, activation of the SDRAM is designated in response to the active state of signals /CS and /RAS.

At time t0, a row address and a bank address are input to be retained in row address latch 1048 and bank address latch 1052, respectively.

At the edge of activation of internal clock signal int.CLK at time t1, a write operation is specified in response to the active state of signals /CS, /CAS and /WE. Here, a column address is also input and retained in column address latch 1050. By setting a burst write operation mode at the current stage, the column address will be automatically incremented in SDRAM 1000 by burst test counter 1060 in the write operation of the following cycles.

In response to specification of a write operation, the flag signal WRITE to designate a write operation internally exhibits a transition to an active state.

Then, by altering the externally applied write data in synchronization with signal DQS applied to SDRAM 1000, write data is input.

The data written serially is converted into parallel data for every two bits at data input/output circuit 1086. The converted data is written into a selected memory cell at time t4–t6 subsequent to time t3.
[Readout operation in DDR-SDRAM mode]

At the rising edge of external clock signal ext.CLK at time t10, an ACT command to render a word line active is input in response to the active state of signals /CS and /RAS. At this time point, an address specifying a word line is also input.

At time t11, a readout operation is specified according to the active state of signals /CS and /CAS. Here, a column address is specified and retained in column address latch 1050. Burst address counter 1060 generates an internal address according to the column address stored in column address latch 1050. A word line is activated, and data is read out in two parallel bits from a selected memory cell. The data is amplified by a sense amplifier to be read out in synchronization with a readout clock RCLK generated in SDRAM 1000.

The data that are read out two bits in parallel are maintained in data input/output circuit 1086 and converted into serial data. The data is output sequentially to data input/output data 1070 from time t13.

Upon specification of a burst read operation mode, the readout operation from time t14 is carried out as set forth in the following. The column address is automatically incremented internally while the parallel readout of two bits and conversion into serial data are sequentially carried out to be provided to the data input/output terminal.

Here, in synchronization with the data output, signal DQS is output from SDRAM 1000 to provide the data output timing from SDRAM 1000.

As described above, the address signal is input to column address latch 1050 in column related access. The manner of change of the column address at the burst mode is classified into two types, i.e., the interleave system and the sequential system. Which of these two types to be selected is stored as operation information in mode register 1046 as a combination of the address signals. The manner of alteration of burst address counter 1060 differs under control of mode register 1046.

In the DDR-SDRAM operation mode, data must be output two times in one cycle of an external clock signal. As the operation of the internal circuit in the DDR-SDRAM operation mode, two data must be read out from the selected memory array block in one clock cycle. This means that two addresses must be generated at one time in order to read out the two data regarding the address signal output from burst address counter 1060.

There is a problem that the burst address cannot be generated by simply incrementing the input address sequentially since the burst address at the initial state, i.e., the externally applied column address signal, may be either an even numbered or odd numbered address.

For example, when 1 is input as an external column address signal, the pair of internal column address signals to be generated is (1, 2) for a sequential mode and (1, 0) for an interleave mode.

Therefore, the place where column selection is carried out for an even numbered address and the place of column selection (column of activated column select signal) of an odd numbered address will differ.

Thus, SDRAM 1000 has a structure in which the memory cell array blocks are divided into the region corresponding to an even numbered address and a region corresponding to an odd numbered address to separate the decoder of the column select signal corresponding to an even numbered address from the column select signal corresponding to an odd numbered address.

For example, in memory cell array bank 0, the memory array block is divided into a region 1100a corresponding to an even numbered address and a region 1100b corresponding to an odd numbered address.

In view of the foregoing, the write operation and read operation in a DDR-SDRAM operation mode are as set forth in the following.

The address signal of the first column access cycle has its value directly transmitted to column predecoder 1064.

In the next burst cycle, the process corresponding to the address counter for an even numbered address and the process corresponding to the address counter of an odd numbered address are performed. Then, the processed address signal is transmitted to column related predecoder 1064.

In the operation for a DDR-SDRAM, the data input operation is carried out in synchronization with an externally applied DQS clock for the bidirectional synchronization (referred to as "bidirectional mode" hereinafter).

The data output operation is carried out in synchronization with a synchronizing clock generated at internal control clock generation circuit 1008 in SDRAM 1000.

In a write operation, the command and the burst address are input. The data is input slightly behind the input command and burst address at a frequency two times that of the external clock. This delay with respect to the external clock is of no problem if carried out at the timing of the externally applied DQS clock.

Upon recognition of a write command input, mode decoder 1022 renders write flag WRITE active, whereby a write clock signal WCLK is generated from internal control clock generation circuit 1008 corresponding to internal clock signal int.CLK1. The write clock signal must be delayed corresponding to the slight delay of data input.

In FIG. 3, the write clock signal is rendered active at a phase two clock signals behind the external clock signal accommodating a slight margin. The write data input to data input/output circuit 1086 in synchronization with internal clock signal int.CLK1 of a frequency two times the external clock signal through data input/output terminal 1070 is transmitted two bits at the same time (an even numbered address and an odd numbered address) to global I/O bus G-I/O and arrayed main I/O line pair M-I/O in synchronization with write clock signal WCLK. In response to activation of a column select signal for a predetermined column in a selected memory array block, data is written into a memory cell via a selected bit line pair. At the second access et seq. in the burst cycle, an internal column address that is altered according to the burst system is output from burst address counter 1060, whereby write data is written sequentially for every two bits according to write clock signal WCLK.

When a command and the burst address are input in a read operation and mode decoder 1022 recognizes a read command input, mode decoder 1022 renders read flag READ active. Accordingly, a read clock signal RCLK is generated in response to an internal clock signal int.CLK2 from internal control clock generation circuit 1008 having a frequency identical to that of the external clock signal. Column select signal YS is rendered active according to this read clock signal RCLK. Data of two bits (even numbered address group and odd numbered address group) are read out simultaneously from the sense amplifier.

The data of 2 bits read out are latched in data input/output circuit 1086 as read data via main I/O line pair M-I/O and global I/O bus G-I/O. The data of 2 bits input in parallel to data input/output circuit 1086 are converted serially. The converted data is output from internal control circuit generation circuit 1008 at a clock timing slightly earlier than the CAS latency timing, in synchronization with internal clock signal int.CLK1 altered at a frequency two times that of the external clock signal.

At the second access and et seq. of the burst cycle, an internal column address signal that is altered corresponding to the burst address system is output from burst address counter 1060, whereby data is sequentially read out according to read clock signal RCLK from the selected memory cell block (bank).

[Comparison between DDR-SDRAM and SDR-SDRAM]

The following Table 1 shows the difference in the operation specification of a single data rate SDRAM and a DDR-SIDRAM.

TABLE 1

| | DDR-SDRAM | SDR-SDRAM |
|---|---|---|
| Data input control | ① For bidirectional synchronization<br>• In synchronization with DQS(IN) signal<br>• Predetermined latency for external clock signal<br>② For uni-directional synchronization<br>• In synchronization with rising and falling edge of external clock<br>• Predetermined latency for external clock signal | ① In synchronization with external clock signal CLK<br>② In synchronization with rising edge of signal CLK |
| Data output control | ① Generate synchronizing clock of frequency two times external clock, output data in synchronization<br>② Output signal DQS | ③ In synchronization with external clock signal CLK<br>④ In synchronization with rising edge of signal CLK |
| External clock signal | • Complementary clock signal | • Single phase clock signal |
| Data mask | ① Write operation only<br>② Predetermined latency for external clock | • Both write and read operations |
| Burst length | • 2/4/8<br>(Internal operation: 1/2/4) | •1/2/4/8 |
| CAS latency | • 1.5/2/2.5 | • 2/3 |
| Control by CKE signal | • Power down | • Internal clock suspend<br>• Power down |
| Mode register | ① Burst length BL<br>② CAS latency CL<br>③ Burst type BT<br>④ DLL/PLL control | ① Burst length BL<br>② CAS latency CL<br>③ Burst type BT |
| Read termination | Read/BurstStop/Precharge | Read/Write/Term./Precharge |
| Write termination | Write/Read/Precharge | Read/Write/Term./Precharge |

As to data input, the SDR-SDRAM has both the input and output operations carried out in response to the rising edge of an external clock. The data output operation of the SDR-SDRAM is cariied out in synchronization with the rising edge of an external clock signal after the CAS latency.

As to data input in a DDR-SDRAM, data is input in synchronization with an externally applied DQS clock when in a bidirectional mode.

In a unidirectional mode, data is input at the rising and falling edges of external clock signal ext.CLK, or in synchronization with internal clock signal int.CLK1 having a frequency two times that of external clock signal ext.CLK that is generated according to complementary external clock signals ext.CLK and /ext.CLK. In DDR-SDRAM, data is output in synchronization with internal clock signal int.CLK1 that is in synchronism with external clock signal ext.CLK and that has a frequency two times that of external clock signal ext.CLK. At the same time, a QS clock is output from SDRAM 1000 as a signal indicating the data output timing.

When the operation mode is to be altered from the DDR-SDRAM to the SDR-SDRAM, changes are made as to the data input clock switching, data output clock switching, cessation of synchronizing clock generation, switching of the input timing of a latch in data input and the internal transmission timing, and the input timing of the latch to data output and transmission to an output buffer.

Figure 4A:
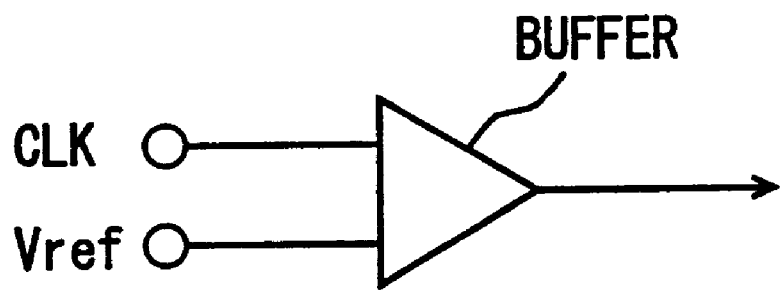
FIGS. 4A and 4B show the structure of a clock input buffer of a SDR-SDRAM and a DDR-SDRAM, respectively.
Figure 4B:
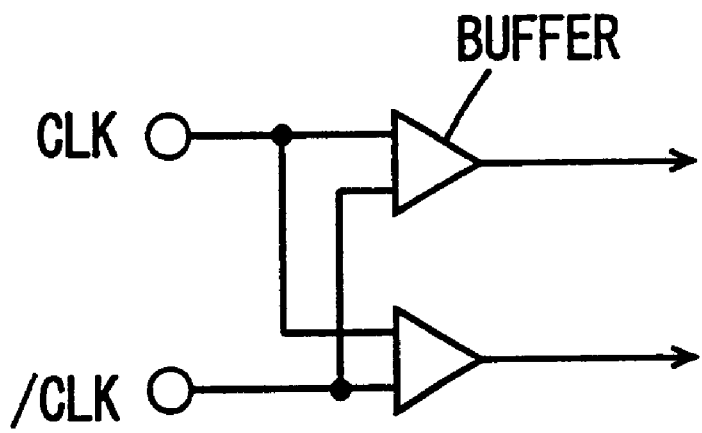

FIGS. 4A and 4B show the structure of a clock input buffer for a SDR-DRAM and a DDR-SDRAM, respectively.

The DDR-SDRAM uses an internal clock signal that is generated according to externally applied complementary clock signals ext.CLK and /ext.CLK, and that has a frequency two times that of the external clock signal. Alternatively, an internal clock signal generated as a two-phase clock can be used at the time point of each of the complementary external clock signals crossing the level of reference potential Vref. In this case, the internal circuit will operate in synchronization with only the rising edge of the internal clock signal.

In a SDR-SDRAM, an externally applied single phase external clock signal ext.CLK is used.

The operation mode can be modified from the DDR-SDRAM mode to the SDR-SDRAM mode by switching the structure to use the externally applied clock signal as complementary clock signals ext.CLK and /ext.CLK or as a single phase clock signal ext.CLK.

Figure 5:
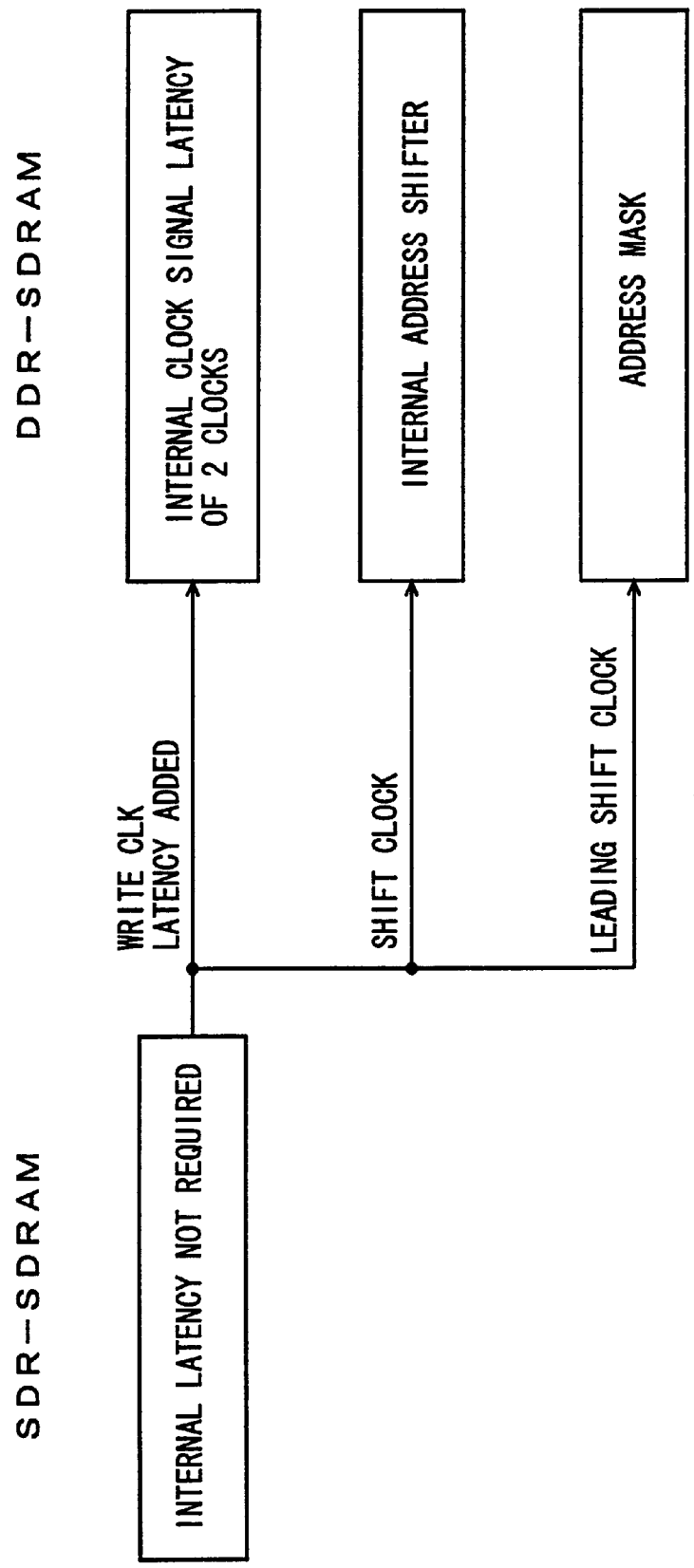
FIG. 5 represents the concept of switching the control of the data mask operation between a SDR-SDRAM and a DDR-SDRAM.

FIG. 5 represents the concept of switching the control of the data mask operation for a SDR-SDRAM and a DDR-SDRAM.

In a DDR-SDRAM operation mode, the data mask mode is used only for a writing operation. Therefore, data is input at the timing of an externally applied QS clock as for normal data in a writing operation.

In a SDR-SDRAM, write data is input at the rising edge of an external clock as for a normal data in a write operation. In a read operation, data is output at the rising edge of an external clock as for normal data.

When the operation mode is to be modified from a DDR-SDRAM to a SDR-SDRAM mode, the clock for an input operation must be switched in a write operation. A circuit structure that can correspond to a data mask operation only for the SDR-SDRAM mode is required in the read operation.

In the burst length control, the smallest unit of the burst length is 2 since data of 2 bits are controlled simultaneously per one data input/output terminal in the DDR-SDRAM operation mode. Therefore, the burst lengths of 2, 4 and 8 correspond to the burst lengths of 1, 2 and 4 for an internal clock signal in the operation of the internal circuit.

In contrast, the burst lengths are 1, 2, 4 and 8 in a SDR-SDRAM operation mode.

Therefore, burst address counter 60 is only required to operate corresponding to the maximum burst length of 8 when changing from a DDR-SDRAM operation mode to a SDR-SDRAM operation mode.

Figure 6:
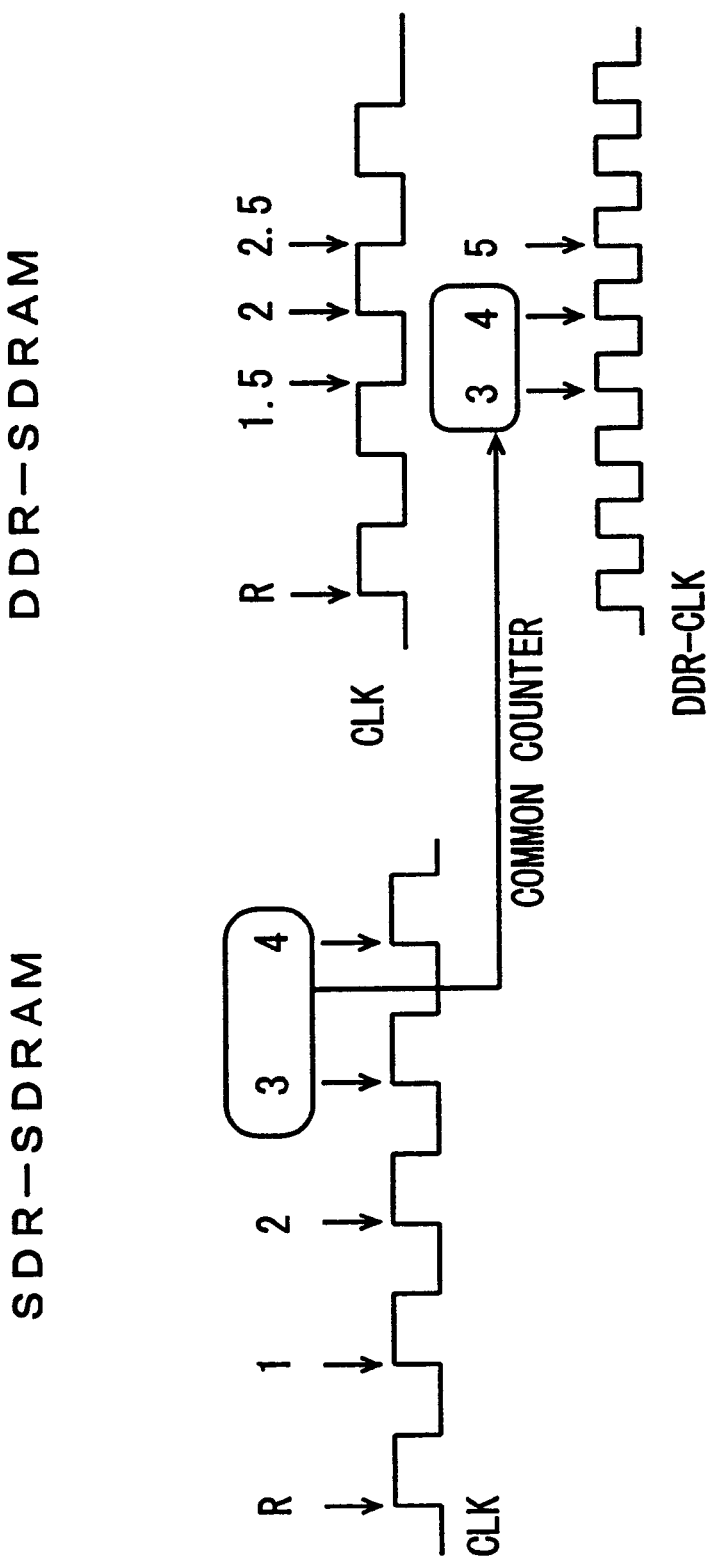
FIG. 6 shows the timing of CAS latency of a SDR-SDRAM and a DDR-SDRAM.

FIG. 6 shows the CAS latency timing of a SDR-SDRAM and a DDR-SDRAM.

In a DDR-SDRAM mode, the CAS latency takes any of the values of 1.5/2/2.5. A structure that allows respective detection of the points at the clock cycles of 3-4-5 for internal clock signal int.CLK1 of a frequency two times that external clock signal ext.CLK is required. This means that the respective 1.5/2/2.5 cycle points are to be determined after internal clock signal int.CLK1 of a frequency two times that external clock signal ext.CLK is converted into a 2-phase clock.

In a SDR-SDRAM operation mode, the CAS latency is either 2 or 3. In this case, a circuit structure that can detect the clock cycle point of ½ for an external clock signal is required since the triggering point of initiating data output corresponds to the time point when the CAS latency is at the ½ clock cycle.

Therefore, when the operation mode is to be modified from the DDR-SDRAM mode to the SDR-SDRAM mode, a structure is required that can detect the 1.5 cycle time point of the reference clock signal in respective operation modes using a latency shift register, and that can switch the reference clock signal.

As to signal CKE, the only difference is that there is no clock suspend mode in the DDR-SDRAM operation mode. The remaining elements are similar to those for the SDR-SDRAM operation mode. Therefore, a circuit structure that allows addition of the clock suspend feature is merely required when the operation mode is altered from the DDR-SDRAM mode to the SDR-SDRAM mode.

As to the setting of the mode register, the burst length BL, the CAS latency CL, and the burst type BT (data specifying either the interleave system or the sequential system) set in the mode register is required in a SDR-SDRAM operation mode. In a DDR-SDRAM operation mode, a structure that can have data indicating a DLL operation mode or a PLL operation mode set is required as the synchronizing operation mode in generating internal clock signal int.CLK2, in addition to the above-described setting.

As to the read termination and write termination, a structure that allows the addition of only the control portion differing therebetween is required.

Another difference between a DDR-SDRAM operation mode and a SDR-SDRAM operation mode is that a synchronizing clock generation circuit (clock recovery circuit) is required. Also, serial-parallel conversion and parallel-serial conversion must be carried out in data input/output circuit 86 for a DDR-SDRAM operation mode. In addition, the bus width of the global data bus G-I/O to transfer data to and from a memory array block must be doubled since data is read out and written 2 bits in parallel.

Therefore, a data bus two times the data bus width required in a DDR-SDRAM operation mode is to be provided for the bus width of global I/O data bus G-I/O in order to allow both the DDR-SDRAM operation mode and the SDR-SDRAM operation mode.

The following Table 2 is provided to describe in further detail the improved modified portions of the DDR-SDRAM operation mode and the SDR-SDRAM operation mode described with reference to FIG. 1.

TABLE 2

|  | SDR-SDRAM | DDR-SDRAM |
|---|---|---|
| ① Clock input | • Single phase clock signal (FIG. 4A) | • Complementary clock signals (FIG. 4B) |
| ② Control by signal CKE | • Power down<br>• Clock suspend | • Allowed by common circuit<br>• Process suppressed |
| ③ Burst length | • 1/2/4/8 (full page) | • 2/4/8 (Internal operation 1/2/4)<br>• BL = 1 corresponds to suspend<br>• Full page operation suspended |
| ④ Address control | • Random access<br>• 3 bits/full bit burst counter<br>• Sequential/interleave mode | • Pair bit random access<br>• Two of 2-bit burst counter (for even numbered address and odd numbered address)<br>• Add address transition circuit for sequential mode |
| ⑤ CAS latency (FIG. 6) | | |
| ⑤ Input/output timing of DQ terminal | • External clock signal | • DQ clock signal |
| ⑥ Data mask control (FIG. 5) | • Read and write operation<br>• Write latency = 0 | • Write operation only |
| ⑦ Mode register | BL, CL, BT | BL, CL, BT, DLL control, test mode |
| ⑧ Burst interruption | • Interruption of read operation by write operation<br>DQS mask used<br>• Termination, automatic precharge | Burst suppression command & wait for 1 clock<br><br>Common circuit (center circuit portion) |
| ⑨ Write operation | Read/write both initiated at same cycle | Internal operation having latency of 2 clocks when writing |

In a SDR-SDRAM operation mode, the address control corresponding to a complete random access requires a full bit burst counter of 3 bits in accordance with the maximum burst length of 8. Also, the sequential and interleave modes are required for the burst operation mode.

In contrast, in a DDR-SDRAM operation mode, random access for every pair of 2 bits is carried out. Therefore, two 2-bit burst counters are required corresponding to the even numbered address and the odd numbered address. Furthermore, an address transition circuit must be added for the sequential mode.

As to write control in a DDR-SDRAM operation mode, waiting is conducted for the timing to initiate an internal operation with the data latched since the serial data is input slightly behind the external clock for a writing operation. If the write operation can be initiated at a clock that is shifted by 2 clocks with respect to an external clock, the 2-serial input bits can be written in parallel into a selected memory cell. A similar process is carried out for an input data mask.

Therefore, the serial-parallel conversion of input data and the parallel-serial conversion portion of the output data are not required in transition modifying from a DDR-SDRAM operation mode to a SDR-SDRAM operation mode.

The following Table 3 shows the change of the internal column address output from burst address counter 60 for the sequential mode and the interleave mode according to the values of the start address (A2, A1, A0) in respective burst length.

TABLE 3

| Burst Length | Start Address (A2, A1, A0) | Sequential Mode | Interleave Mode |
|---|---|---|---|
| 2 | xx0 | 0,1 | 0,1 |
|  | xx1 | 1,0 | 1,0 |
| 4 | x00 | 0,1,2,3 | 0,1,2,3 |
|  | x01 | 1,2,3,0 | 1,0,3,2 |
|  | x10 | 2,3,0,1 | 2,3,0,1 |
|  | x11 | 3,0,1,2 | 3,2,1,0 |
| 8 | 000 | 0,1,2,3,4,5,6,7 | 0,1,2,3,4,5,6,7 |
|  | 001 | 1,2,3,4,5,6,7,0 | 1,0,3,2,5,4,7,6 |
|  | 010 | 2,3,4,5,6,7,0,1 | 2,3,0,1,6,7,4,5 |
|  | 011 | 3,4,5,6,7,0,1,2 | 3,2,1,0,7,6,5,4 |
|  | 100 | 4,5,6,7,0,1,2,3 | 4,5,6,7,0,1,2,3 |
|  | 101 | 5,6,7,0,1,2,3,4 | 5,4,7,6,1,0,3,2 |
|  | 110 | 6,7,0,1,2,3,4,5 | 6,7,4,5,2,3,0,1 |
|  | 111 | 7,0,1,2,3,4,5,6 | 7,6,5,4,3,2,1,0 |

In the sequential mode, an internal column address sequentially incremented by 1 from the applied start address of (A2, A1, A0) is output from burst address counter 1060. In the interleave mode, an internal column address having just one bit differing from the previous output internal column address with respect to start address (A2, A1, A0) is output from burst address counter1060.

Therefore, the interleave mode operation is suitable for a higher speed operation since the sequentially changing address signal differs only by one bit data from the immediately preceding value.

[Unidirectional mode and bidirectional mode]

Figure 7:
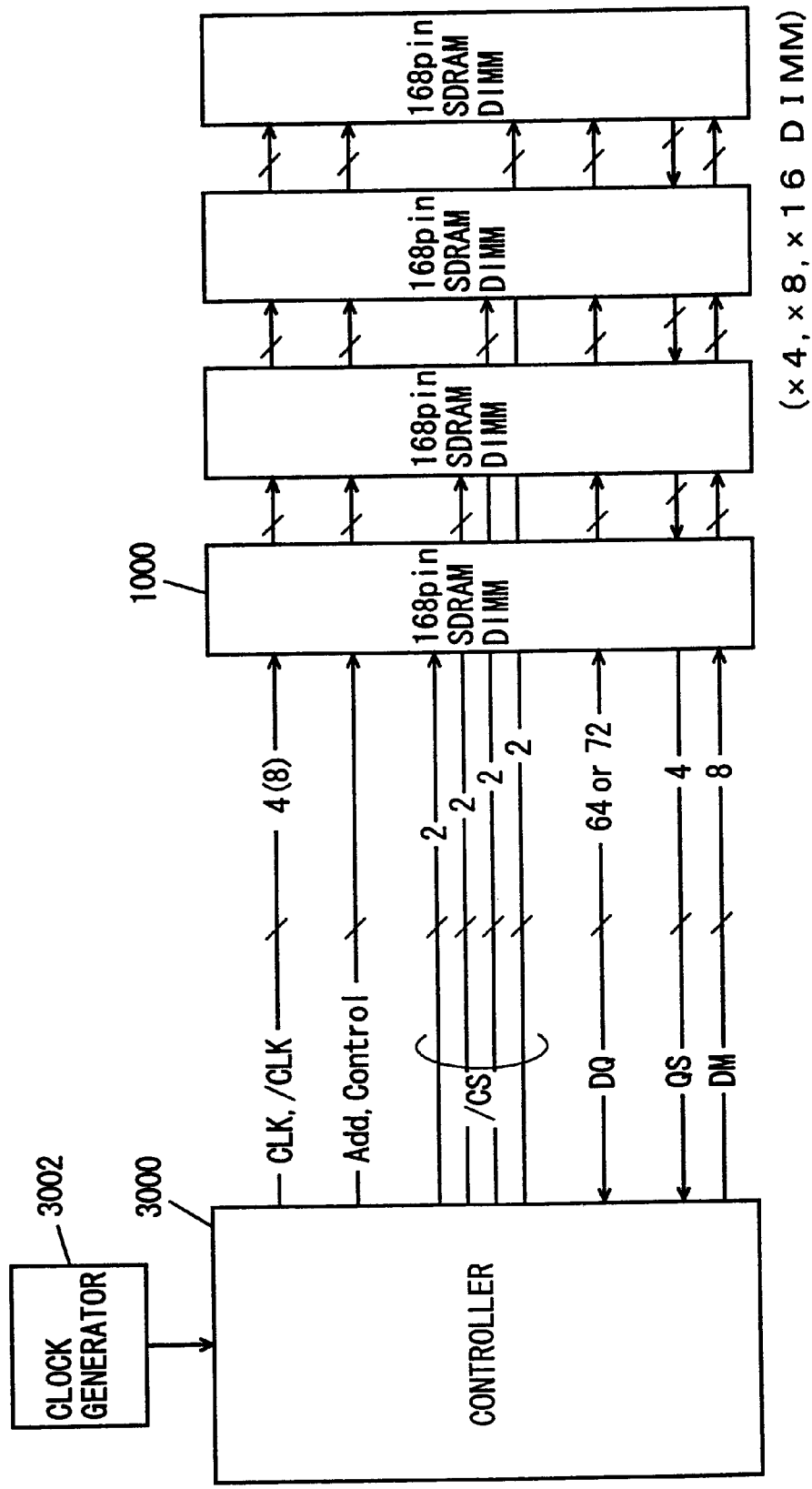
FIGS. 7 and 8 are schematic block diagrams showing a structure of a system in a unidirectional mode and a bidirectional mode, respectively.

FIG. 7 is a schematic block diagram showing a structure of the system in a unidirectional mode.

In a unidirectional mode, a clock signal from clock signal generation circuit 3002 is applied to a controller 3000, whereby clock signals ext.CLK and /ext.CLK are applied to SDRAM 1000.

Also, an address signal, a control signal, a chip select signal /CS, data mask signal DM and the like are applied from controller 3000 to SDRAM 1000.

It is to be noted that data writing is carried out in synchronization with external clock signal ext.CLK according to the present structure in which clock signals ext.CLK and /ext.CLK are applied to SDRAM 1000 from controller 3000. In contrast, data is read out from SDRAM 1000 in synchronization with signal QS. More specifically, signal QS indicating the data output timing from SDRAM 1000 is output in synchronization with output data DQ. Controller 3000 receives read out data DQ in synchronization with signal QS.

Figure 8:
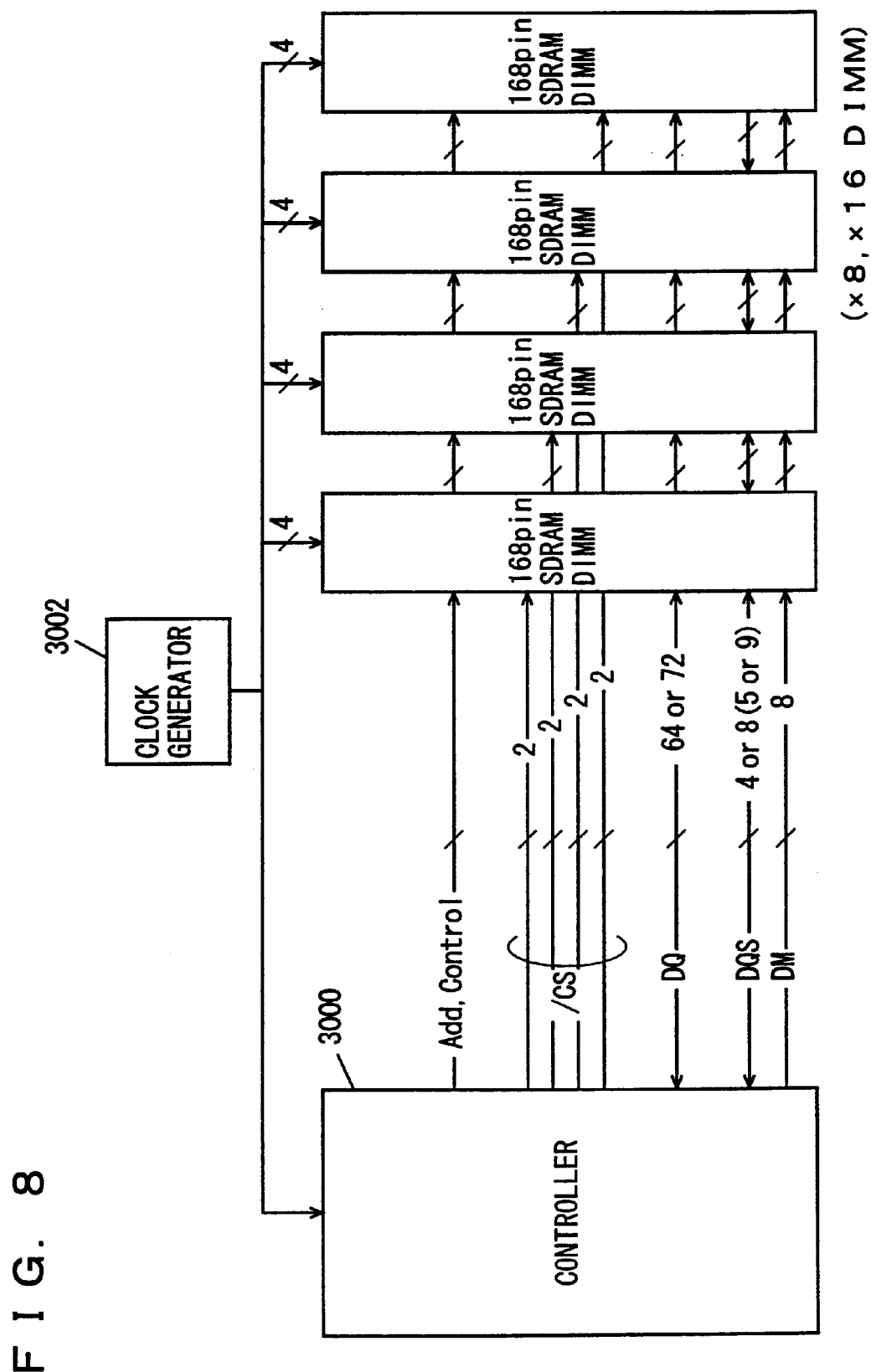

FIG. 8 is a schematic block diagram showing the structure of a system in a bidirectional mode.

The bidirectional system of FIG. 8 differs from the unidirectional mode system of FIG. 7 in that external clock signals ext.CLK and /ext.CLK that become the reference of a synchronizing operation are applied from a clock generation circuit 3002 to controller 3000 and SDRAM 1000.

In this case, a bidirectional timing signal DQS is applied in synchronization with write data DQ to SDRAM 1000 when writing data from controller 3000 to SDRAM 1000.

In reading out data from SDRAM 1000, signal DQS indicating the data output timing is applied from SDRAM 1000 to controller 3000 in synchronization with readout data DQ.

By the above-described structure, the data input operation can be controlled by signal DQS in synchronization with the input/output data at both the controller 3000 and SDRAM 1000 sides even when there is difference in phase between external clock signal ext.CLK applied to controller 3000 and external clock signal ext.CLK applied to SDRAM 1000.

[Switching structure of internal clock signal between DDR-SDRAM operation mode and SDR-SDRAM operation mode]

Figure 9:
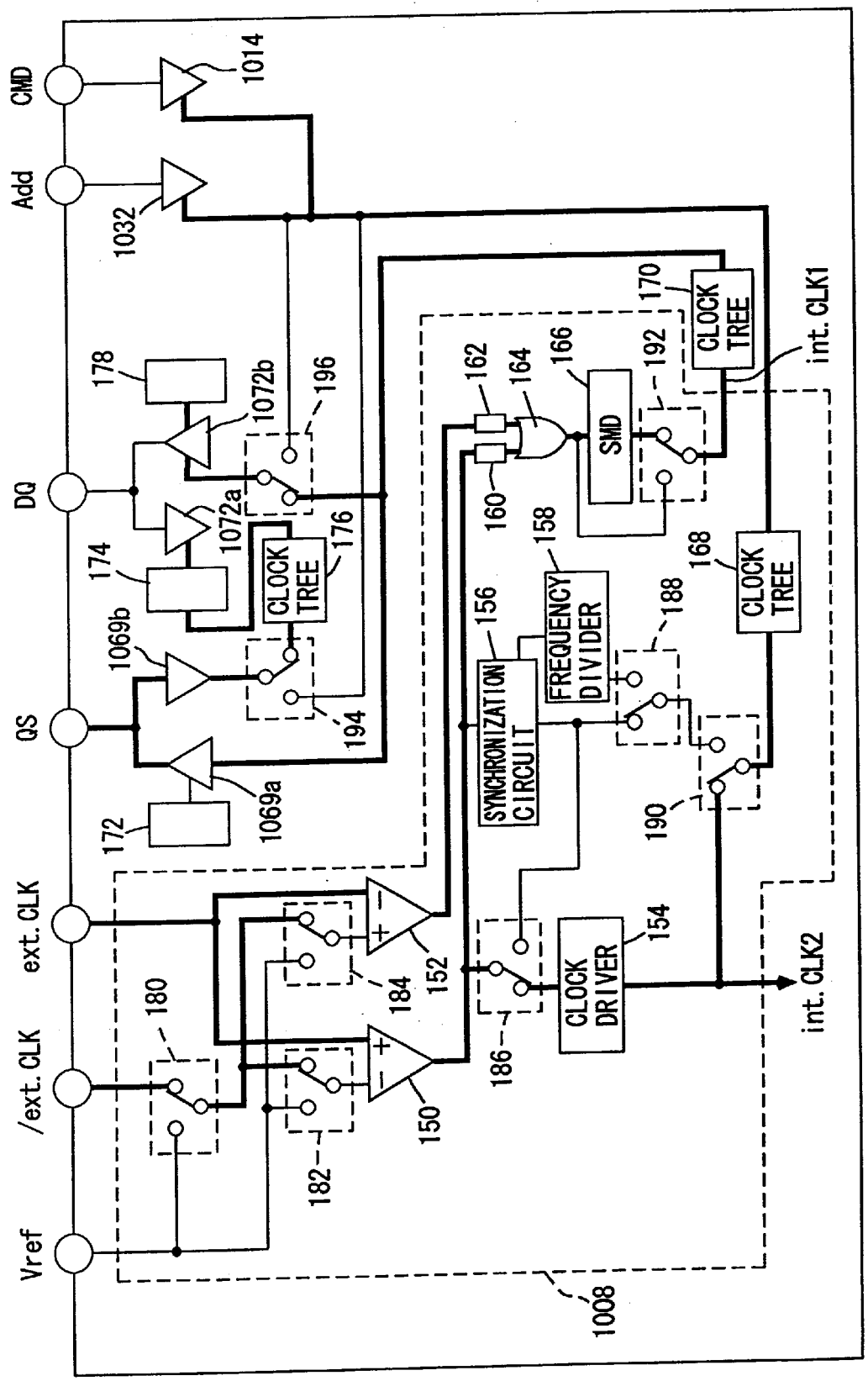
FIG. 9 is a block diagram for describing in further detail the structure of an input clock generation circuit 1008.

FIG. 9 is a schematic block diagram to describe in further detail the structure of internal clock generation circuit 1008 of FIG. 1.

Internal clock generation circuit 1008 switches the frequency of internal clock signals int.CLK1 and int.CLK2 and the synchronizing operation with respect to external clock signal ext.CLK between a DDR-SDRAM operation mode and a SDR-SDRAM operation mode depending upon the operation mode data applied to mode register 1046.

The structure and operation of internal clock generation circuit 1008 will be described here.

Internal control clock generation circuit 1008 includes a switching circuit 180 receiving a reference potential Vref and an inverted external clock signal /ext.CLK and controlled by the operation mode data, a switching circuit 182 receiving reference potential Vref and the output of switching circuit 180 under control of the operation mode data, a switching circuit 184 receiving reference potential Vref and the output of switching circuit 180 under control of the operation mode data, a differential amplifier 150 receiving external clock signal ext.CLK at the + input node and the output of switching circuit 182 at the − input node, a differential amplifier 152 receiving the output from switching circuit 184 at the + input node and external clock signal ext.CLK at the − input node, a synchronization circuit 156 receiving an output of differential amplifier 150 to switch between the DLL operation mode or PLL operation mode and generate a synchronizing signal according to the data retained in mode register 1046, a switching circuit 186 receiving the outputs of differential amplifier circuit 150 and synchronization circuit 156 under control by the operation mode data, and a clock driver 154 receiving and buffering the output of switching circuit 186 to output an internal clock signal int.CLK2.

Internal clock signal int.CLk2 output from clock driver 154 is an internal clock signal that controls the internal circuit of SDRAM 1000, for example, the row/column select operation for a memory array block (bank), and the data readout operation of I/O ports 1106–1126 from a memory array block (bank).

Internal control clock generation circuit 1008 further includes a frequency divider circuit 158 receiving the output from synchronization circuit 156 to frequency-divide the signal by a factor of n, a switching circuit 188 receiving the outputs of synchronization circuit 156 and frequency divider circuit 158 under control of the operation mode data, and a switching circuit 190 receiving the outputs of switching circuit 188 and clock driver circuit 154 under control of the operation mode data.

Internal control clock generation circuit 1008 further includes a one shot pulse generation circuit 160 receiving the output of differential amplifier 150 to output a one shot pulse in response to the activation edge of the received output, a one shot pulse generation circuit 162 generating a one shot pulse in response to the activation edge of the output of differential amplifier 152, an OR circuit 164 receiving the outputs of one shot pulse generation circuits 160 and 162, a synchronous mirror delay circuit 166 receiving the output of OR circuit 164 to generate a signal in synchronization thereof, and a switching circuit 192 receiving the outputs of synchronous mirror delay circuit 166 and OR gate 164 under control of the operation mode data.

In FIG. 9, an address signal input terminal receiving address signal A0, an external control signal input terminal receiving chip select signal /CS, and a data input/output terminal receiving data DQ0 are representative of address signal input terminal 1030, control signal input terminal 1010, and data input/output terminal 1070, respectively.

The output from switching circuit 190 is applied to address input buffer 32 and external control signal buffer 14 via a clock tree 168 to arrange the phase of the clock signal and supply the signal to the address signal input terminal group and the external control signal input terminal group.

The output of switching circuit 192 is applied to switching circuits 194 and 196 via a clock tree 170 that arranges the phase of the internal clock signal to supply the signal to respective data input/output terminals in the data input/output terminal group.

The output from clock tree 170 is applied to an output buffer 1069*a* under control of output control circuit 172 to output clock signal QS to the signal QS input/output terminal. The signal from the clock signal QS input terminal is applied to switching circuit 194 via input buffer 1069*b*.

The output of switching circuit 194 is applied to a data input control circuit 174 via a clock tree 176 that arranges the phase of the clock signal output from switching circuit 194 to supply the signal to respective data input/output terminals in data input/output terminal group 1070. Under control of data input circuit 174, the write data applied to data input/output terminal 1070 is received by input buffer 1072a.

Data output buffer 1072b receiving the outputs of clock trees 170 and 168 and responsive to the output from switching circuit 196 that is controlled by the operation mode data provides the readout data to the data input/output terminal. The operation of output buffer 1072b is controlled by data output control circuit 178.

The operation of switching circuits 180–196 in the DDR-SDRAM operation mode will be described in further detail with reference to FIG. 9.

In FIG. 9, a synchronous delay circuit (SMD circuit) is used in the DDR-SDRAM operation mode. Synchronization circuit 156 is not used. Complementary clock signals are used for the input clock signal. In the data input/output operation mode, the transmission path of an active signal and an inactive signal is represented by a bold line and a thin line, respectively, when the bidirectional mode is set in the data input/output operation.

More specifically, switching circuit 180 is set to the side of receiving and providing to switching circuits 182 and 184 an inverted clock signal /ext.CLK. Switching circuit 182 is set to the side of receiving and supplying to the − input node of differential amplifier 150 the output of switching circuit 180. Switching circuit 184 is set to the side of receiving and providing to the + input node of differential amplifier 152 the output of switching circuit 180.

Switching circuit 186 is set to the side of receiving and supplying to clock driver 154 the output of differential amplifier 150.

Switching circuit 188 is set to the side of receiving and supplying to switching circuit 190 the output of synchronization circuit 156. Switching circuit 190 is set to the side of receiving and supplying to clock tree 168 the output of clock driver 154. Switching circuit 192 is set to the side of receiving and supplying to clock tree 170 the output of synchronous mirror delay circuit 166.

Switching circuit 194 is set to the side of receiving and supplying to clock tree 176 the output of QS signal input buffer 1069b. Switching circuit 196 is set to the side of receiving and supplying to data output buffer 74 the output of clock tree 170.

By the above-described setting of switching circuits 182–196, the following DDR-SDRAM operation mode is set.

The synchronizing clock signal for data output corresponds to the signal generated by synchronous mirror delay circuit 166. The usage of this clock signal from synchronous mirror delay circuit 166 allows an appropriate data input/output operation when SDRAM 1000 operates at a high frequency and the clocked skew becomes a problem with the output control on data input/output terminal 1070 from the clock input buffer, or when data is to be input to the controller side at a timing identical to that of the external clock.

However, the output signal from synchronization circuit 156 that operates as a DLL circuit is not used for input data control.

In this case, the input external clock signal is complementary signals ext.CLK and /ext.CLK.

Furthermore, the structure corresponds to a bidirectional mode in which signal QS is output from the QS signal output terminal at the time of data output and in which data is input according to signal QS provided from the controller side at the time of data reading.

Internal clock signal int.CLK2 controlling the operation of the internal circuit is generated by clock driver 154 according to the output from differential amplifier 150. Internal clock signal int.CLK2 output from clock driver 154 is transmitted to address signal input terminal group 1030 and external control signal input terminal group 1010 via clock tree 168 to be used for the control of the input timing of these signals.

One shot pulse generation circuits 160 and 162 generate a one shot pulse corresponding to the activation edge of the output signals from differential amplifiers 150 and 152. A signal of a frequency two times that external clock signal ext.CLK is output from OR circuit 164. In response to the output signal from OR circuit 164, synchronous mirror delay circuit 166 generates an internal clock signal int.CLK1 having a frequency two times that of external clock signal ext.CLK.

Internal clock signal int.CLK1 is applied to data output buffer 1072b and QS signal output buffer 1069a via clock tree 170.

The present invention is not limited to the above-description in which first internal clock signal int.CLK1 has a frequency two times that of external clock signal ext.CLK. First internal clock signal int.CLK1 may have a frequency N times that of external clock signal ext.CLK.

Figure 10:
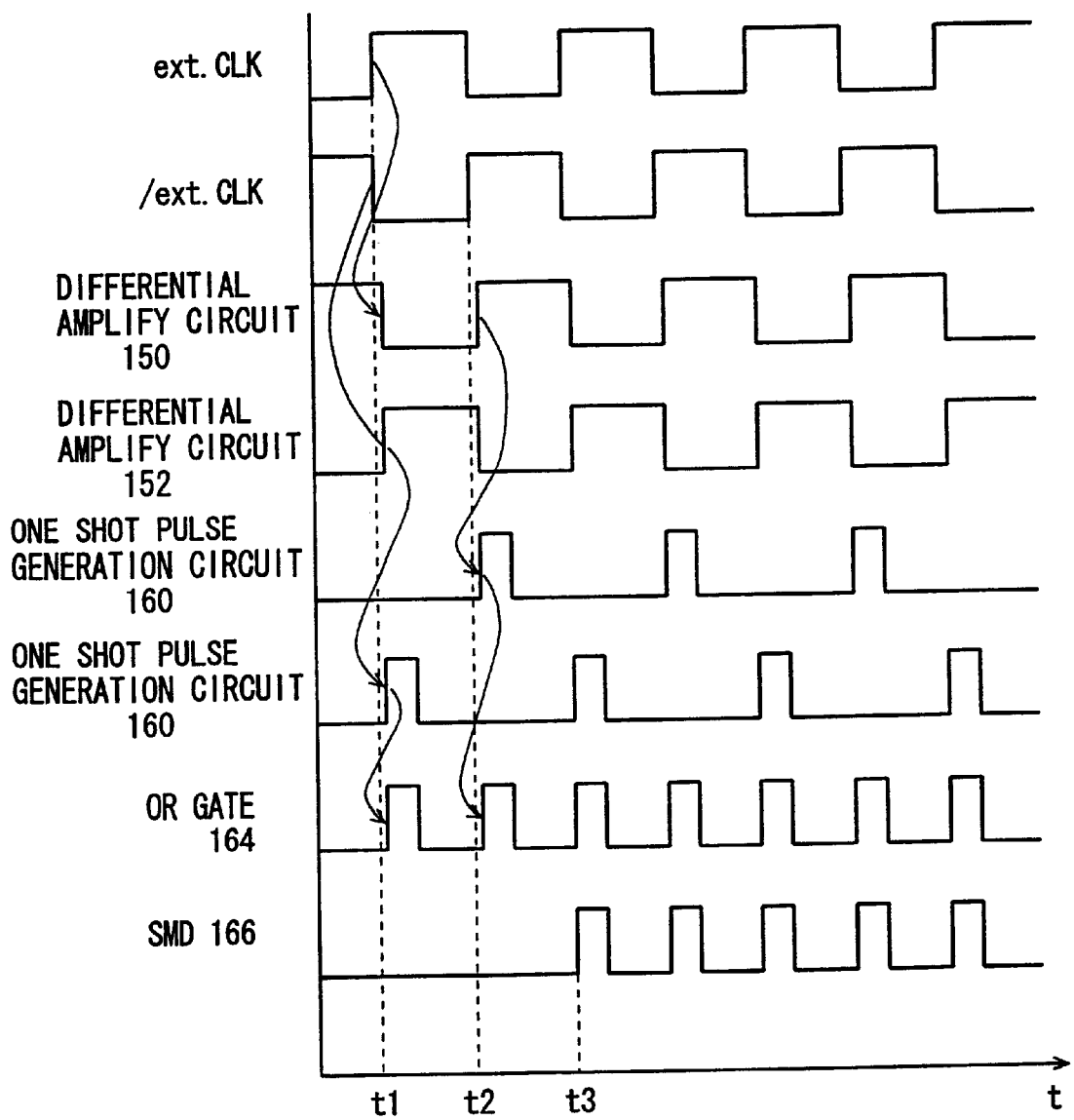
FIG. 10 is a timing chart for describing the operation of a synchronous mirror delay circuit 166.

FIG. 10 is a timing chart for describing the operations of differential amplifiers 150 and 152, one shot pulse generation circuits 160 and 162, OR gate 164, and synchronous mirror delay circuit 166.

At time t1, external clock signal ext.CLK is pulled up to an active state (H level), and signal /ext.CLK is pulled down to an inactive level (L level). In response, the output of differential amplifier 152 is driven to an H level and the output of differential amplifier 150 is driven to an L level. In response to the output of differential amplifier 152 pulled up to an H level, a one shot pulse is output from one shot pulse generation circuit 162. OR gate 164 receiving this one shot pulse provides a corresponding one shot pulse signal.

At time t2, signal ext.CLK is pulled down to an L level and signal /ext.CLK is pulled up to an H level. In response, the output of differential amplifier 150 is driven to an H level. Accordingly, a one shot pulse is output from one shot pulse generation circuit 160, and a corresponding one shot pulse signal is output from OR gate 164.

In a similar manner, a one shot pulse signal is output from OR gate 164 in response to the respective rising edges of external clock signal ext.CLK and inverted external clock signal /ext.CLK.

Synchronous mirror delay circuit 166 receiving the output from OR gate 164 begins to output an internal clock signal int.CLK in synchronization with external clock signal ext.CLK and having a frequency two times that of external clock signal ext.CLK at the second cycle from the output of the first one shot pulse from OR gate 164, i.e., at time t3.

Figure 11:
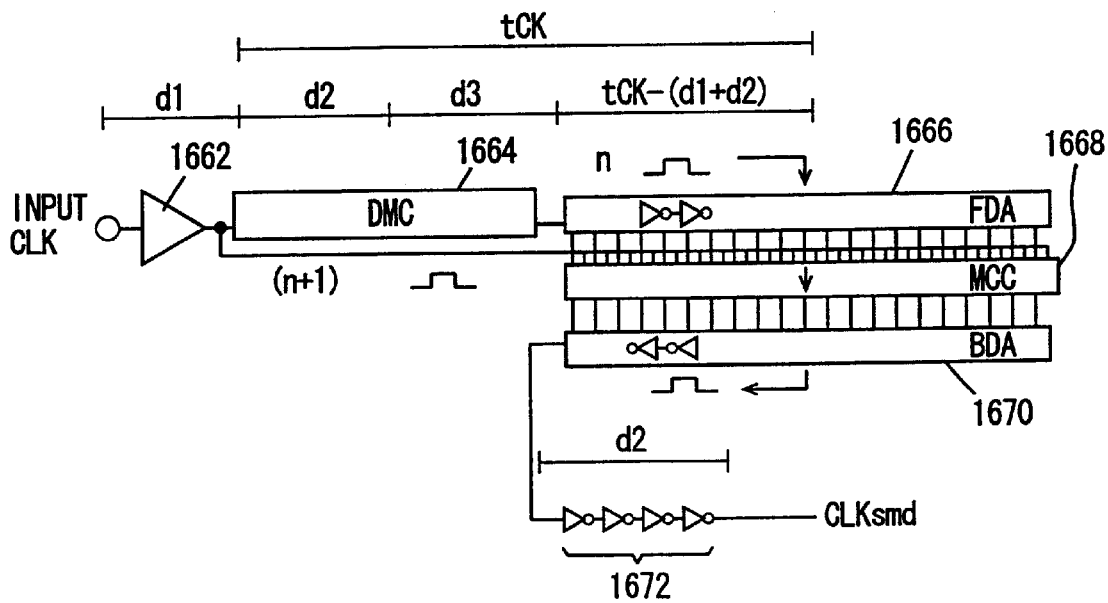
FIG. 11 is a schematic block diagram showing a structure of synchronous mirror delay circuit 166.
Figure 12:
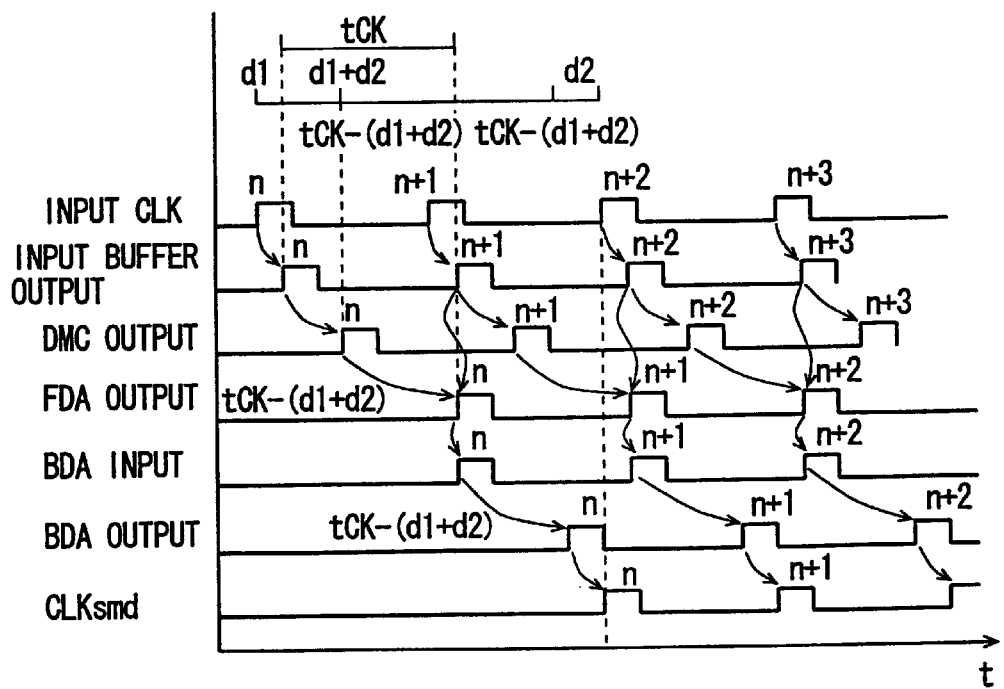
FIG. 12 is a timing chart for describing an operation of synchronous mirror delay circuit 166.

FIG. 11 is a schematic block diagram showing a structure of synchronous mirror delay circuit 166, and FIG. 12 is a timing chart for describing the operation of synchronous mirror delay circuit 166.

The details of a synchronous mirror delay circuit 166 is described in IEEE Journal of Solid-State Circuits, Vol. 31, No. 11, November 1996, pp. 1656–1665 (T. Saeki, et. al.). Therefore, only the structure and operation of synchronous mirror delay circuit 166 will be described briefly hereinafter.

Referring to FIG. 11, synchronous mirror delay circuit 166 includes an input buffer 1662 receiving an input signal, a delay monitor circuit 1664 receiving the output of input buffer 1662, a forward direction delay array 1666 receiving the output of delay monitor circuit 1664, a mirror control circuit 1668 receiving the output of a selected delay circuit from the delay circuit array in forward direction delay array 1666 to transmit the received output to a reverse direction delay circuit array 1670, and a delay buffer 1672.

Referring to FIG. 12, the nth clock signal applied to input buffer 1662 is output to forward direction delay circuit array 1666 via delay monitor circuit 1664. The (n+1)th clock signal is output from input buffer 1662 during the period when the n-th clock signal is transmitted to forward direction delay array 1666.

In response, mirror control circuit 1668 transmits the delay circuit in forward direction delay array 1666 to which the n-th clock signal has arrived to the corresponding delay circuit in reverse direction delay circuit array 1670. More specifically, the n-th clock signal is reflected at a selected position in forward direction delay array 1666 to be transmitted to reverse direction delay circuit array 1670.

The signal output from delay circuit 1672 is adjusted so as to be in synchronization with the (n+2)th input clock signal.

In other words, synchronous mirror delay circuit 166 can begin to output internal clock signal int.CLK1 in synchronization with the input clock signal from the second clock from the first input of a clock signal.

Thus, synchronous mirror delay circuit 166 is suitable for control of the data input/output circuits since the time from the initiation of a synchronous operation up to the time when a synchronizing signal is generated is short.

Figure 13:
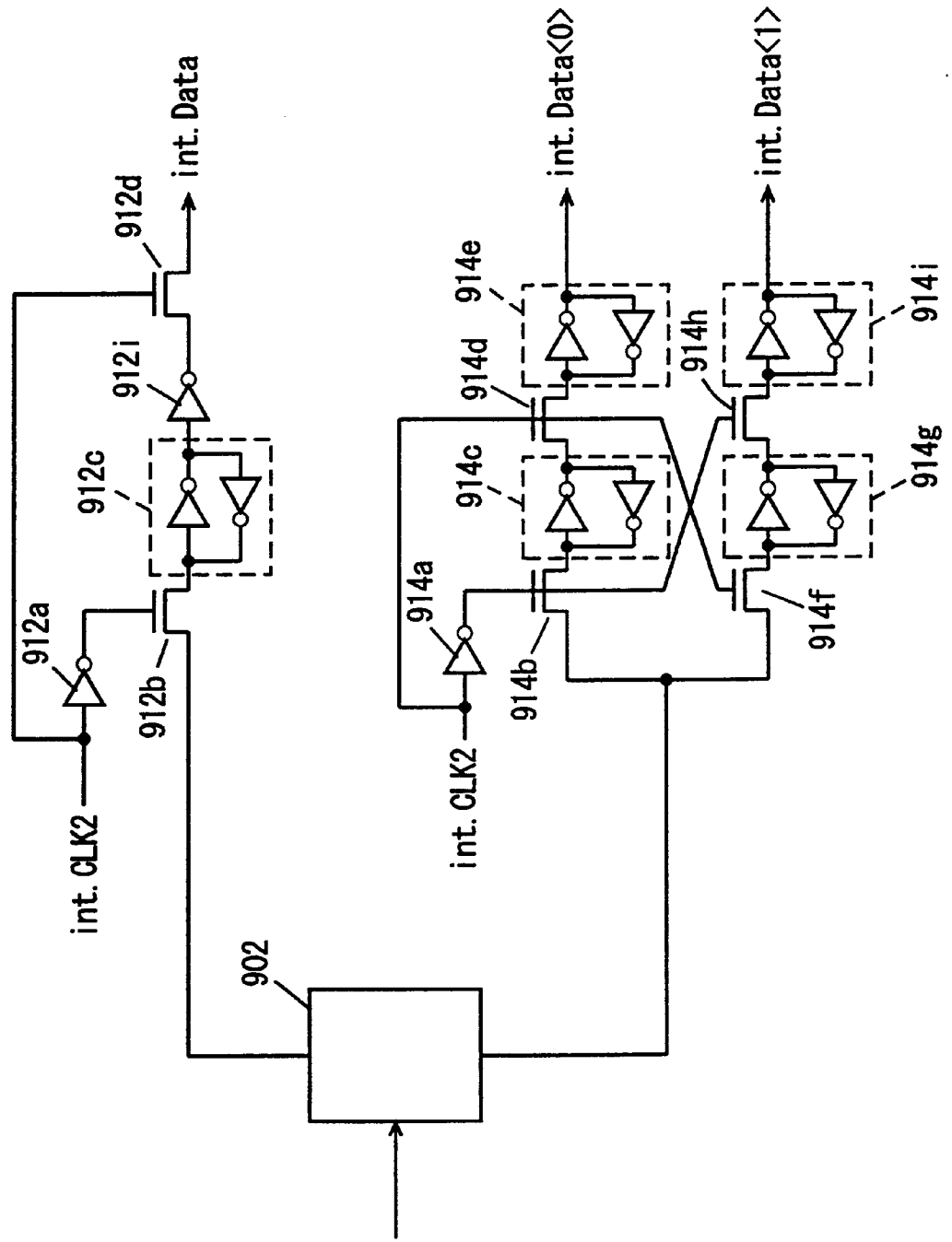
FIGS. 13 and 14 are schematic block diagrams showing a structure of a serial parallel converter 900 and a parallel serial converter 950, respectively, in a data input/output circuit 1086.

FIG. 13 is a schematic block diagram showing the structure of the serial-parallel converter in data input/output circuit 1086 of FIG. 1.

Serial-parallel converter 900 includes a switch circuit 902 to switch the output node to provide the input data to either the first output node or the second output node depending upon the operation mode data (data indicating whether to operate as a DDR-SDRAM or a SDR-SDRAM) retained in mode register 46, an n channel MOS transistor 912*b* receiving the output from switching circuit 902 at its source and having its gate potential controlled by the output of inverter 912*a* receiving second internal clock signal int.CLK2 in the SDR-SDRAM operation mode, a latch circuit 912*c* receiving the signal from the drain of n channel MOS transistor 912*b* at its input, an inverter 912*i* receiving the output of latch circuit 912*c*, and an n channel MOS transistor 912*d* receiving the output of inverter 912*i* at its source, and having a gate potential controlled by second internal clock signal int.CLK2.

Therefore, n channel MOS transistor 912*d* provides a data output 1 clock after the data from switch circuit 902 is latched.

Serial-parallel converter 900 further includes an n channel MOS transistor 914*b* receiving the output from switch circuit 902 at its gate and having a gate potential controlled by the output of inverter 914*a* receiving second internal clock signal int.CLK2 in the DDR-SDRAM operation mode, a latch circuit 914*c* receiving the signal from the drain of n channel MOS transistor 914*b*, an n channel MOS transistor 914*d* receiving the output of latch circuit 914*c* at its source, and having a gate potential controlled by internal clock signal int.CLK2, a latch circuit 914*e* receiving and holding a signal from the drain of n channel MOS transistor 914*d*, an n channel MOS transistor 914*f* receiving the output from switch circuit 902 at its source, and having a gate potential controlled by internal clock signal int.CLK2, a latch circuit 914*g* receiving and maintaining the signal from the drain of n channel MOS transistor 914*f*, an n channel MOS transistor 914*h* receiving the output from latch circuit 914*g* at its source, and having a gate potential controlled by the output of inverter 914*a*, and a latch circuit 914*i* receiving and maintaining the output from the drain of n channel MOS transistor 914*h*.

Therefore, in the DDR-SDRAM operation mode, the data from switch circuit 902 is output as parallel data int.Data (0) and int.Data (1) from latch circuits 914*e* and 914*i*.

Figure 14:
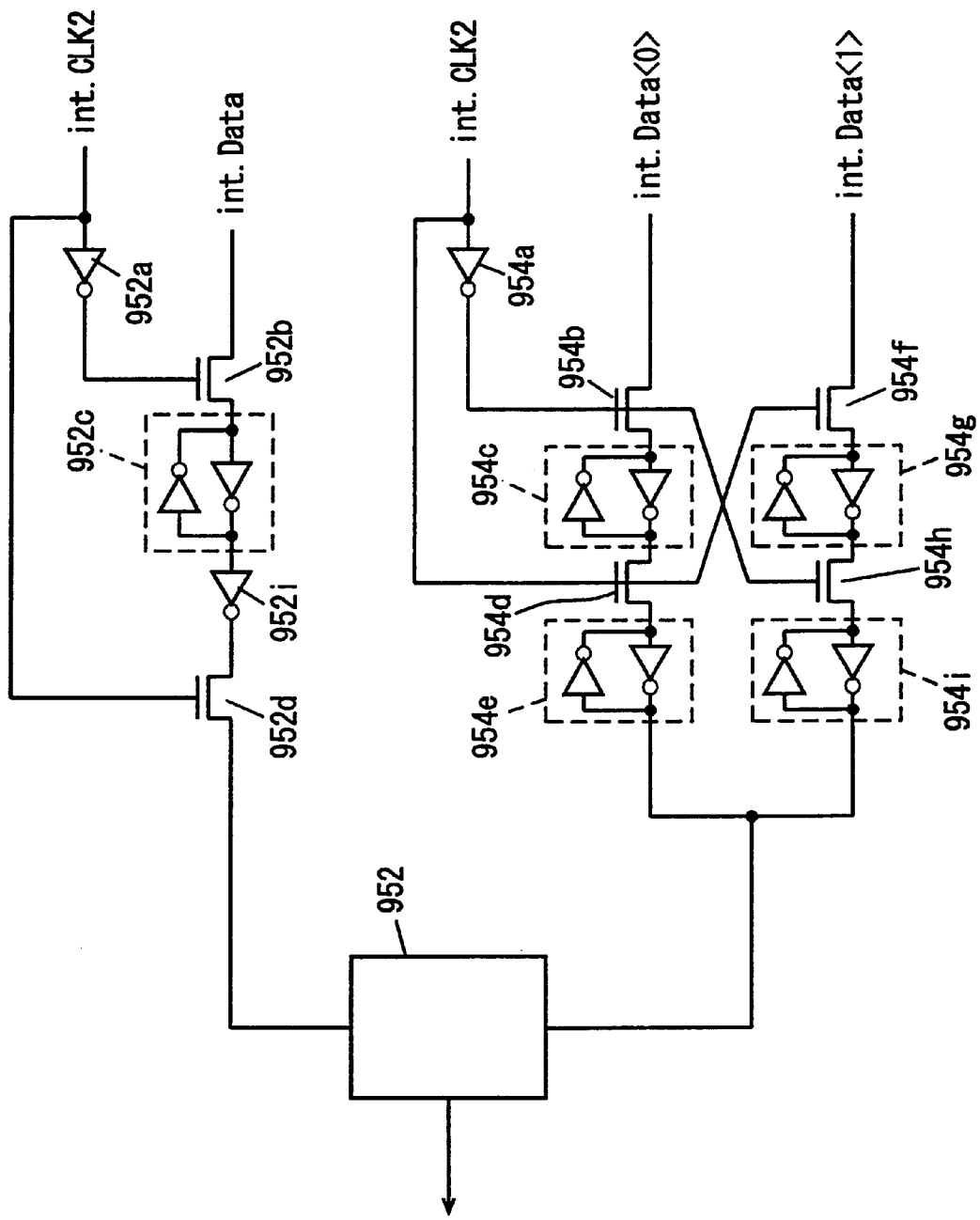

FIG. 14 is a schematic block diagram showing a structure of parallel-serial converter 950 in data input/output circuit 1086.

Parallel-serial converter 950 includes an n channel MOS transistor 952*b* receiving internal data int.Data at its source, and having a gate potential controlled by the output of an inverter 952*a* receiving internal clock signal int.CLK2 in the SDR-SDRAM operation mode, a latch circuit 952*c* receiving the signal from the drain of n channel MOS transistor 915*b*, an inverter 952*i* receiving the output of latch circuit 952*c*, and an n channel MOS transistor 952*d* receiving the output of inverter 952*i* at its source and having a gate potential controlled by internal clock signal int.CLK2.

The data from n channel MOS transistor 952*d* is output 1 clock after the data is applied and latched by switch circuit 952 in the SDR-SDRAM operation mode.

Serial-parallel converter 950 further includes an n channel MOS transistor 954*b* receiving internal data int.Data (0) at its source and having a gate potential controlled by the output of inverter 954*a* receiving internal clock signal int.CLK2 in the DDR-SDRAM operation mode, a latch circuit 954*c* receiving the signal from the drain of n channel MOS transistor 954*b*, an n channel MOS transistor 954*d* receiving the output of latch circuit 954*c* at its source, and having a gate potential controlled by internal clock signal int.CLK2, a latch circuit 954*e* receiving and maintaining the signal from the drain of n channel MOS transistor 954*d*, an n channel MOS transistor 954*f* receiving internal data int.Data (1) at its source, and having a gate potential controlled by internal clock signal int.CLK2, a latch circuit 954*g* receiving and maintaining the signal from the drain of n channel MOS transistor 954*f*, an n channel MOS transistor 954*h* receiving the output of latch circuit 954*g* at its source, and having a gate potential controlled by the output of inverter 954*a*, and a latch circuit 954i receiving and maintaining the output from the drain of n channel MOS transistor 954*h*.

The data from latch circuits 954*e* and 954*i* are applied to switch circuit 952.

Switch circuit 952 selectively outputs the input data according to the operation mode data maintained in mode register 1046.

In a DDR-SDRAM operation mode, parallel data int.Data (0) and int.CLK (1) are output from switch circuit 952 as serial data.

By the above-described structure, the data latching operation or the parallel-serial conversion/serial-parallel conversion operation is carried out in the data input/output operation for the SDR-SDRAM and DDR-SDRAM operation modes.

Figure 15:
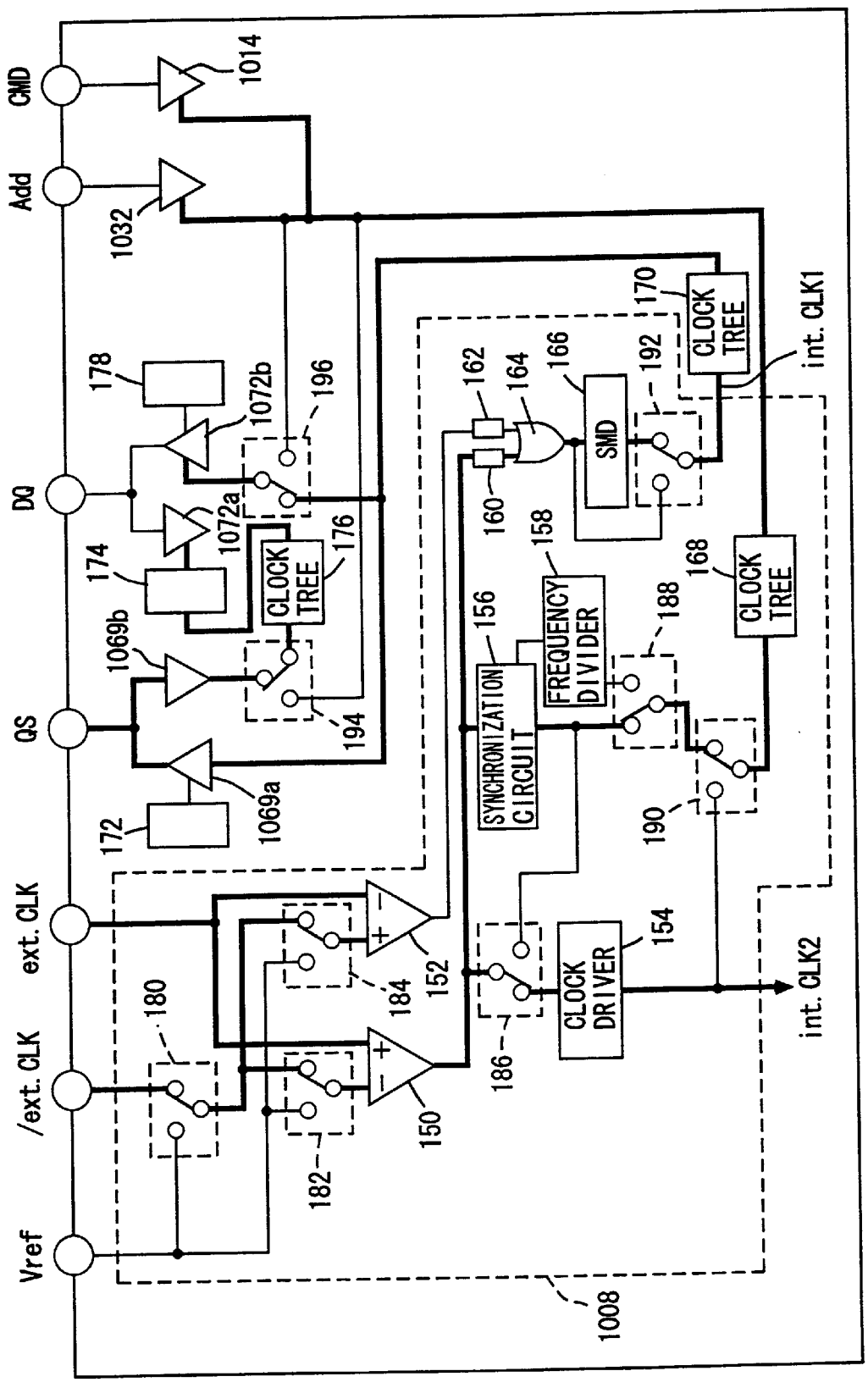
FIGS. 15, 16 and 17 are schematic block diagrams for describing the states of switching circuits 180–196.

FIG. 15 is a schematic block diagram for describing the status of switching circuits 180–196 according to the structure of internal control clock generation circuit 1008 of FIG. 9 when the clock signal output from internal synchronization circuit 156 is used for the address signal input and external control signal input in the DDR-SDRAM operation mode.

In the DDR-SDRAM operation mode, internal clock signal int.CLK1 output from synchronous mirror delay circuit 166 is used for data output. The signal output from synchronization circuit 156 is used for the input of an address signal and an external control signal. The signal output from clock driver 154 is used for the operation of the internal circuit.

Also, the structure is provided so that the output from synchronous mirror delay circuit 166 is also applied to the QS signal input terminal to allow a bidirectional mode operation.

By the above structure, the effect of skew of an external clock signal in the input operation of an address signal and an external control signal can be suppressed at a higher operating frequency in the DDR-SDRAM operation mode.

Figure 16:
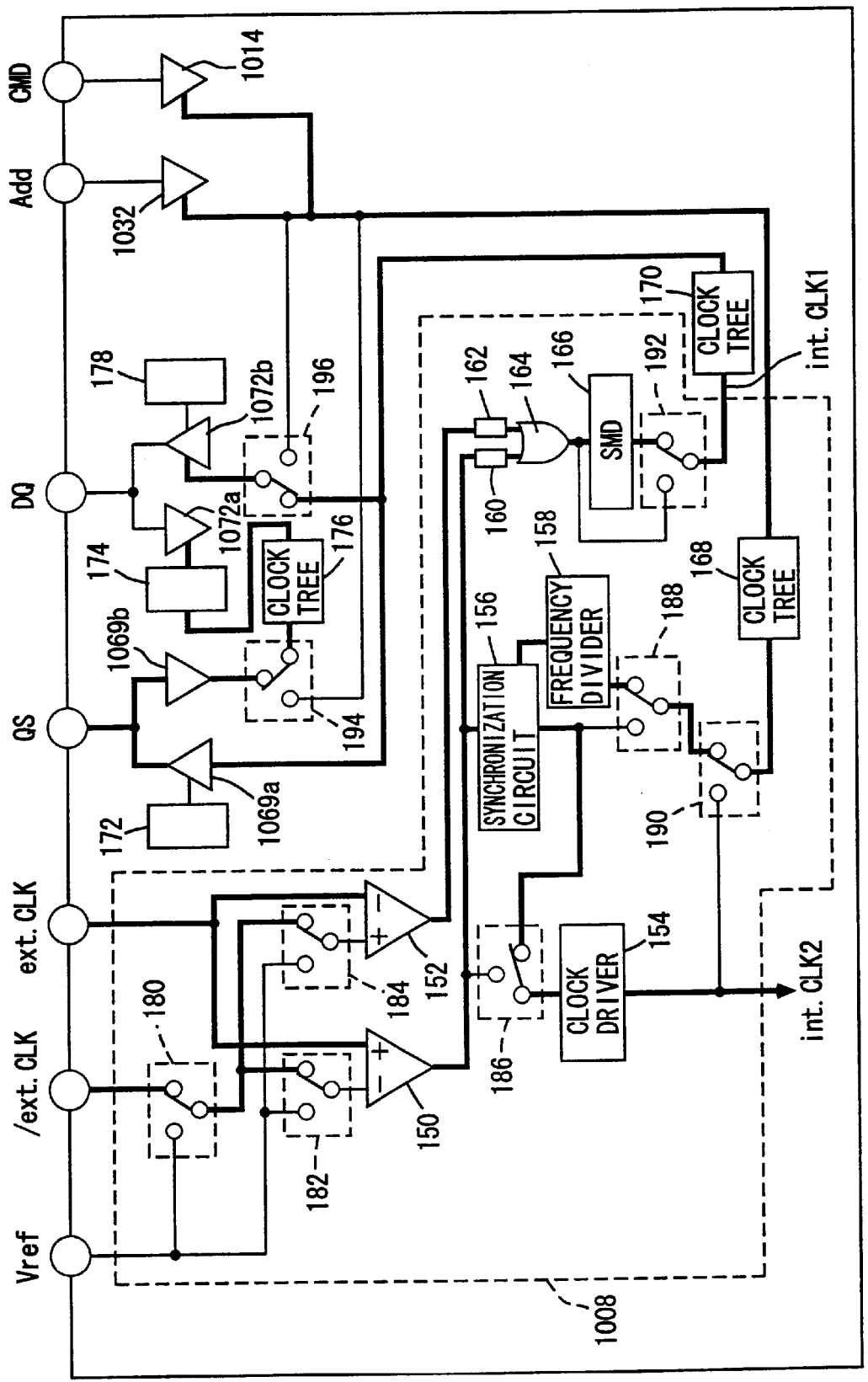

FIG. 16 is a schematic block diagram for describing the operation of switching circuits 180–196 at another operation mode of internal control clock generation circuit 1008.

The structure of FIG. 16 corresponds to an internal high speed operation mode to operate the internal circuit at a frequency N times the external clock frequency to save the time required to control the internal circuit.

More specifically, synchronization circuit 156 of FIG. 16 receives the output from differential amplifier 156 to generate clock signal int.CLK2 having a frequency of N times. This signal is applied to the internal circuit via clock driver 154.

Switching circuit 188 is set to the side of receiving the output from frequency divider circuit 158 that divides the output from synchronization circuit 156 by a factor of N. Switching circuit 190 is set to the side of receiving the output from switching circuit 188.

Therefore, the internal clock signal applied to the address signal input terminal and the external control signal input terminal via clock tree 168 has a frequency identical to that of the external clock signal.

Figure 17:
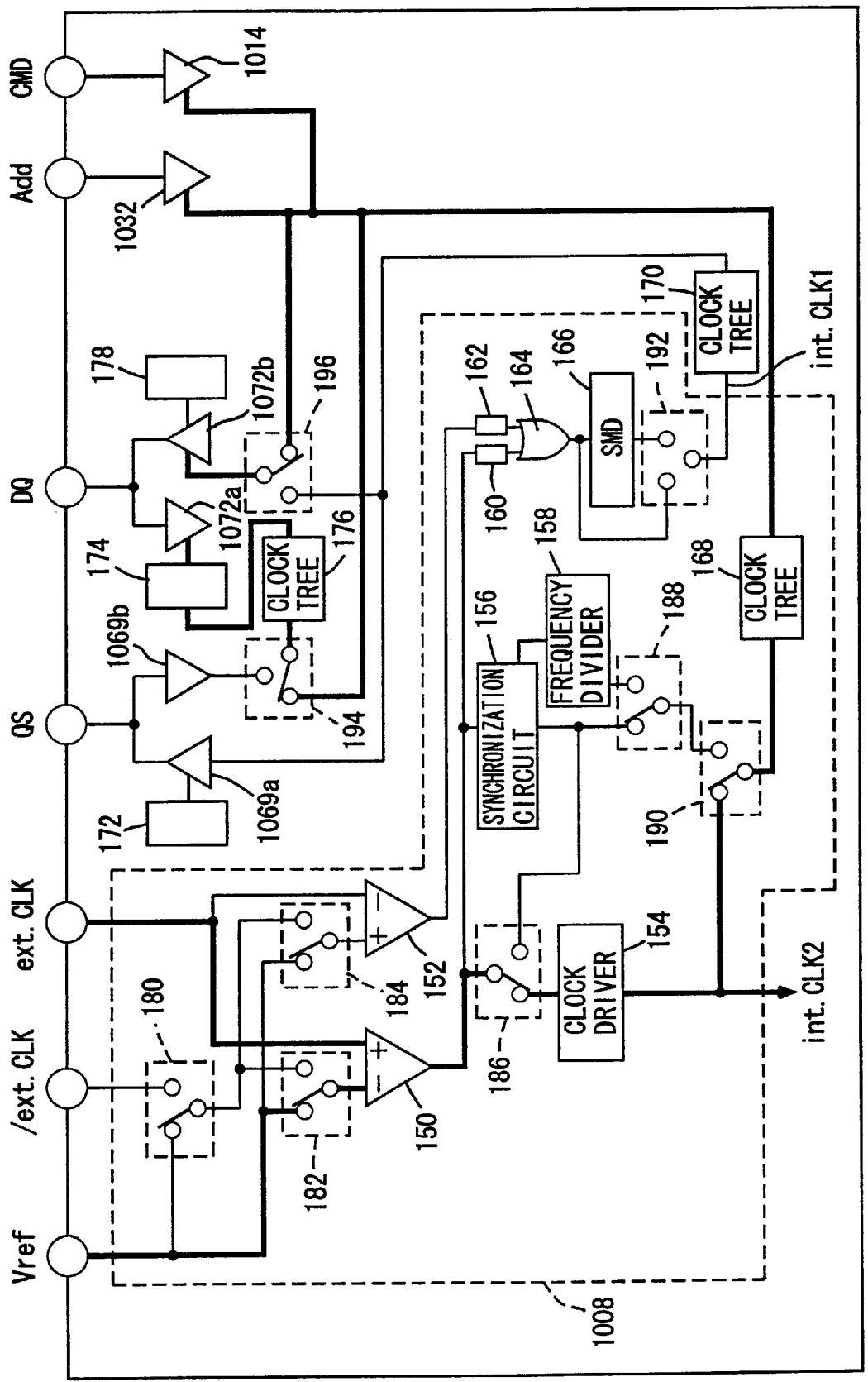

FIG. 17 is a schematic block diagram for describing the status of switching circuits 180–196 of internal control clock generation circuit 1008 when SDRAM 1000 of FIG. 1 operates in the SDR-SDRAM operation mode.

In FIG. 17, the system of transmitting an active signal in the SDR-SDRAM operation mode is indicated by a bold line.

Switching circuits 180, 182 and 184 are set to the side of receiving reference potential Vref. Differential amplifier 150 receives reference potential Vref and external clock signal ext.CLK to output a signal of a frequency identical to that of external clock signal ext.CLK. Since switching circuit 186 is set to the side of receiving the output from differential amplifier 150, clock driver 154 receives the output from differential amplifier 150 to output an internal clock signal int.CLK2 of a frequency identical to that of external clock signal ext.CLK.

Since switching circuit 190 is set to the side of receiving the output of clock driver 154, signal int.CLK2 output from clock driver 154 is applied to the address signal input terminal group and the external control signal input group via clock tree 168.

Switching circuits 194 and 196 are also set to the side of receiving the output from clock tree 168. Therefore, the data input/output operation is controlled by an internal clock signal of a frequency identical to that of external clock signal ext.CLK.

In this case, the structure does not correspond to a bidirectional mode since switching circuit 194 is not set to the side of receiving signal QS.

By switching the operation mode of internal control clock generation circuit 1008 according to the operation mode data held in mode register 1046, an operation mode corresponding to the specification of the system in which SDRAM 1000 is incorporated can be selected.

Second Embodiment

Figure 18:
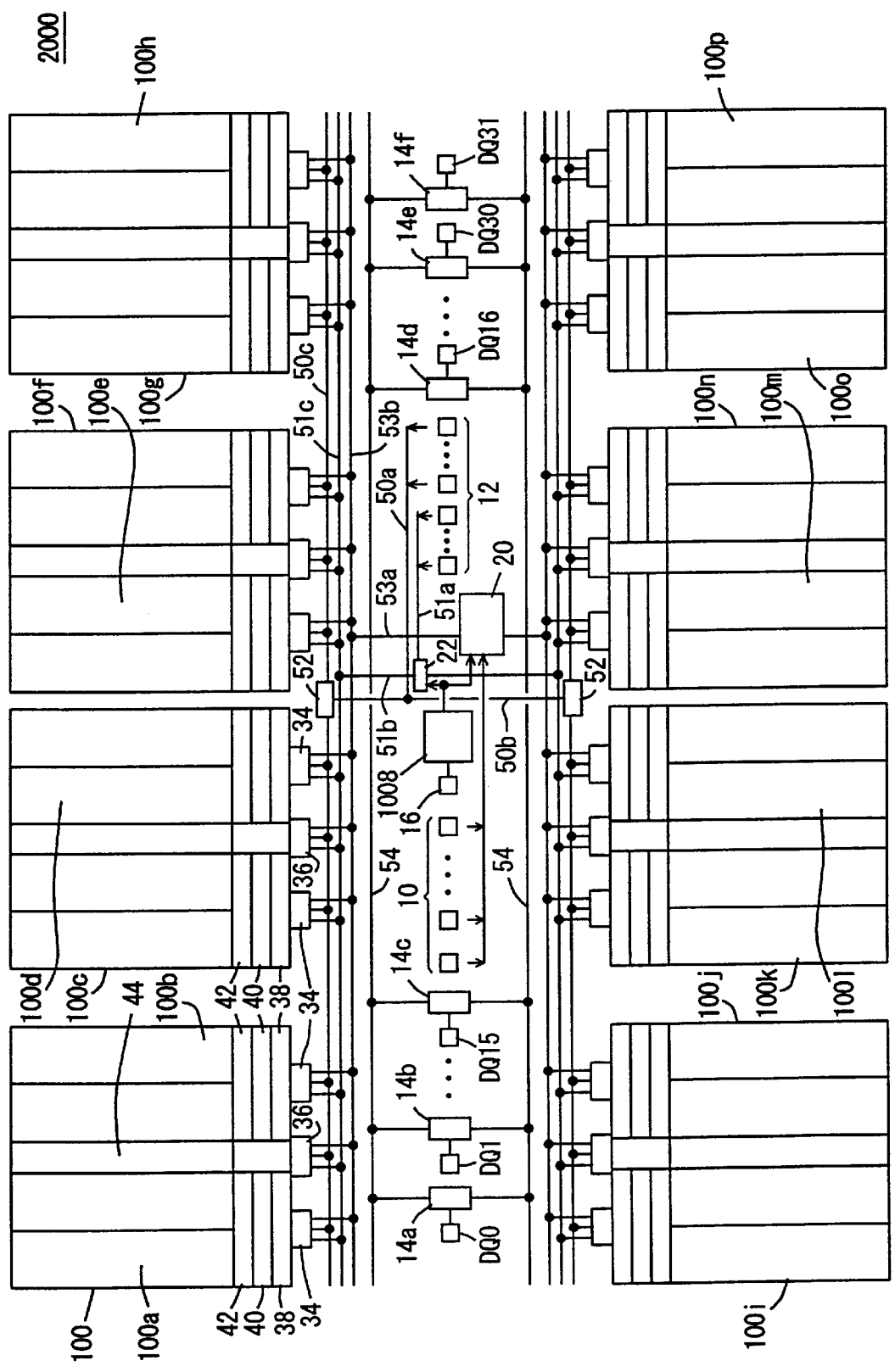
FIG. 18 is a schematic block diagram showing a structure of a synchronous semiconductor memory device 2000 according to a second embodiment of the present invention.

FIG. 18 is a schematic block diagram showing a structure of a synchronous semiconductor memory device 2000 according to a second embodiment of the present invention.

Referring to FIG. 18, synchronous semiconductor memory device 2000 includes a control circuit 20 receiving and decoding external control signals /RAS, /CAS, /W, /CS and the like applied via external control signal input terminal group 10 to generate an internal control signal, command data buses 53a and 53b for transmitting the internal control signal output from control circuit 20, and a memory cell array 1000 in which memory cells are arranged in a matrix.

Memory cell array 100 is divided into a total of 16 memory cell blocks 100a–100p as shown in FIG. 18. When synchronous semiconductor memory device 2000 has a storage capacity of 1 Gbits, for example, each memory cell block has a capacity of 64 Mbits. Each block can operate as an independent bank.

Synchronous semiconductor memory device 2000 further includes an internal control clock generation circuit 1008 receiving complementary external clock signals ext.CLK and /ext.CLK applied to clock signal input terminals 16a and 16b, respectively, to initiate a synchronous operation under control of control circuit 20 to output internal clock signals int.CLK1 and int.CLK2.

Internal control clock generation circuit 1008 has a structure similar to that of internal control clock generation circuit 1008 of the first embodiment.

External address signals A0–Ai (i: natural number) applied via address signal input terminal group 12 are input into synchronous semiconductor memory device 2000 in synchronization with second internal clock signal int.CLK2 under control of control circuit 20.

A predetermined number of bits of data out of external address signals A0–Ai are applied to bank decoder 22 via address bus 51a. Decoded bank addresses B0–B7 are transmitted from bank decoder 22 to each bank via address buses 51b and 51c.

The other external address signals applied to address signal input terminal group 12 are transmitted to address driver 52 via address buses 50a and 50b. The address signal is further transmitted from address driver 52 to each bank (memory cell block) via address bus 50c.

Synchronous semiconductor memory device 2000 further includes a row predecoder 36 provided for every pair of memory cell blocks to latch and predecode the row address transmitted from address bus 50c under control of control circuit 20, a row decoder 44 for selecting a corresponding row (word line) of a memory cell block selected according to the output from row decoder 36, a column predecoder 34 provided for every memory cell block to latch and predecode the column address transmitted through address bus 50c under control of control circuit 20, a column predecoder line 40 for transmitting the output from predecoder 34, and a column decoder 42 for selecting a corresponding column (bit line pair) of a memory cell block selected according to the output from column predecoder line 40.

Synchronous semiconductor memory device 2000 further includes data input terminals DQ0–DQ15 and DQ16–DQ31 arranged in a region along the direction of the longer side at the center of the chip, and outside the region where external column signal input terminal group 10 and address signal input terminal group 12 are provided, input/output buffer circuits 14a–14f provided corresponding to data input/output terminals DQ0–DQ31, respectively, a data bus 54 for transferring data between an input/output buffer and a corresponding memory cell block, and a read/write amplifier 38 provided corresponding to memory cell blocks 100a–100b to transfer data between data bus 54 and a selected memory cell column.

Each of input/output buffer circuits 14a–14f has a structure similar to that of the data input/output buffer of the first embodiment to input/output data to/from memory cell 100 via data input/output circuit 1086 of a structure similar to that of the first embodiment (not shown).

Signal /RAS applied to external control signal input terminal group 10 is a row address strobe signal to initiate the internal operation in synchronous semiconductor memory device 2000 and to determine the activation period of the internal operation. In response to activation of signal /RAS, the circuit related to the operation of selecting a row in memory cell array 100 such as row decoder 44 is rendered active.

Signal /CAS applied to external control signal input terminal group 10 is a column address strobe signal to render the circuit of selecting a column in memory cell array 100 active.

Signal /CH applied to external control signal input terminal group 10 is a chip select signal indicating selection of synchronous semiconductor memory device 2000. Signal /W indicates a write operation of synchronous semiconductor memory device 2000.

The input operation of signals /CS, /RAS, /CAS and /W are carried out in synchronization with internal clock signal int.CLK2.

The input operation of an address signal to address signal input terminal group 12 is carried out in synchronization with second internal clock signal int.CLK.

The data input/output via data input/output terminals DQ0–DQ31 is carried out in synchronization with first internal clock signal int.CLK1 or second internal clock signal int.CLK2 according to whether in the SDR-SDRAM operation mode or the DDR-SDRAM operation mode. Also, data input can be carried out in synchronization with an externally applied signal DQS according to the operation mode as in the first embodiment.

Figure 19:
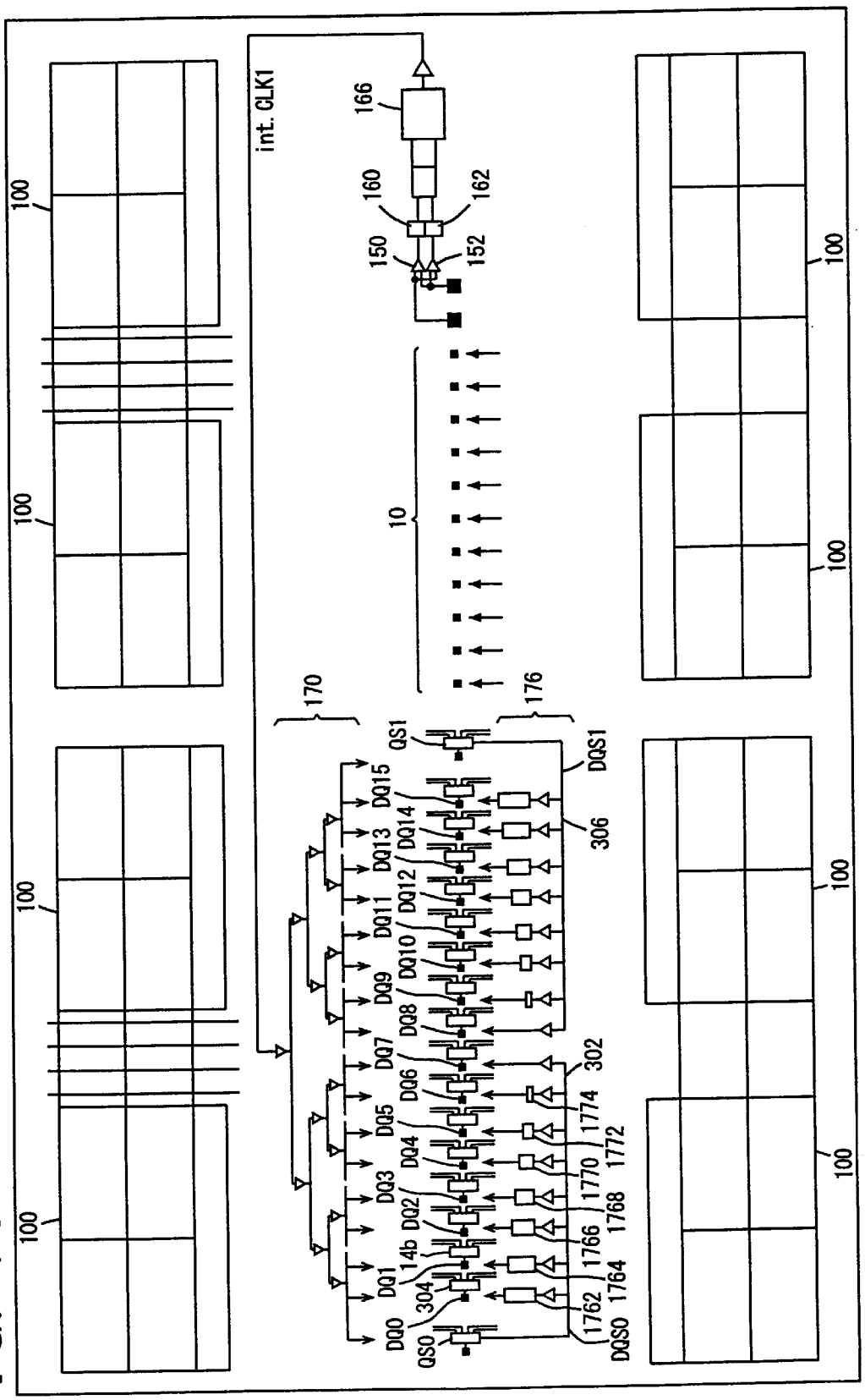
FIG. 19 is a schematic block diagram showing a structure of clock trees 170 and 176.

FIG. 19 is a schematic block diagram showing a structure of clock trees 170 and 176.

Clock tree 170 corresponding to data output receives complementary external clock signals ext.CLK and /ext.CLK. Clock signal int.CLK of a frequency two times that of external clock signal ext.CLK generated from synchronous mirror delay circuit 166 is sequentially divided into two in a tree-like manner in response to the output from synchronous mirror delay circuit 166 to be eventually divided into 16. The divided internal clock signal is applied to a corresponding data input/output terminals DQ0–7 and DQ8–15 via clock tree 168.

Also, the internal clock signal is applied to the data strobe terminal QS via the dummy delay circuit having the same delay time. When data strobe terminal QS is located in the proximity of data input/output terminal DQ0 or DQ15, the phase error between the clock signal applied to the data input/output terminal and the clock signal applied to the DQS signal input terminal can be neglected. Therefore, the structure of such a dummy delay circuit can be omitted. The data output operation can be controlled by internal clock signal int.CLK1 distributed in such a manner.

The structure of clock tree 176 dividing the clock signal when data is input for a bidirectional mode and the like will be described hereinafter.

In clock tree 176 receiving an externally applied signal DQS0, elements are arranged on the divided path starting from an element 1762 of the greatest amount of delay adjustment located closest to DQS signal input terminal QS0 up to elements 1764–1774 of sequentially smaller amount of delay adjustment so that the delay up to each data input/output terminal is equal. Signal DQS0 is applied to a corresponding data input/output terminal via respective delay elements 1762–1774.

According to the structure of FIG. 19, signal DQS0 is transmitted to corresponding data input/output terminals DQ0–DQ7 by bus 302. Signal DQS0 transmitted by bus 302 is applied to a corresponding data input/output terminal DQ0 via buffer circuit 304 and delay element 1762 having the greatest amount of delay.

Signal DQS0 is transmitted to a corresponding one of data input/output terminals DQ1–DQ7 via a delay element of a small amount of delay in the order of data input/output terminal DQ1 to DQ7.

According to a similar structure, externally applied signal DQS1 is provided to data input/output terminals DQ8–DQ15.

Figure 20:
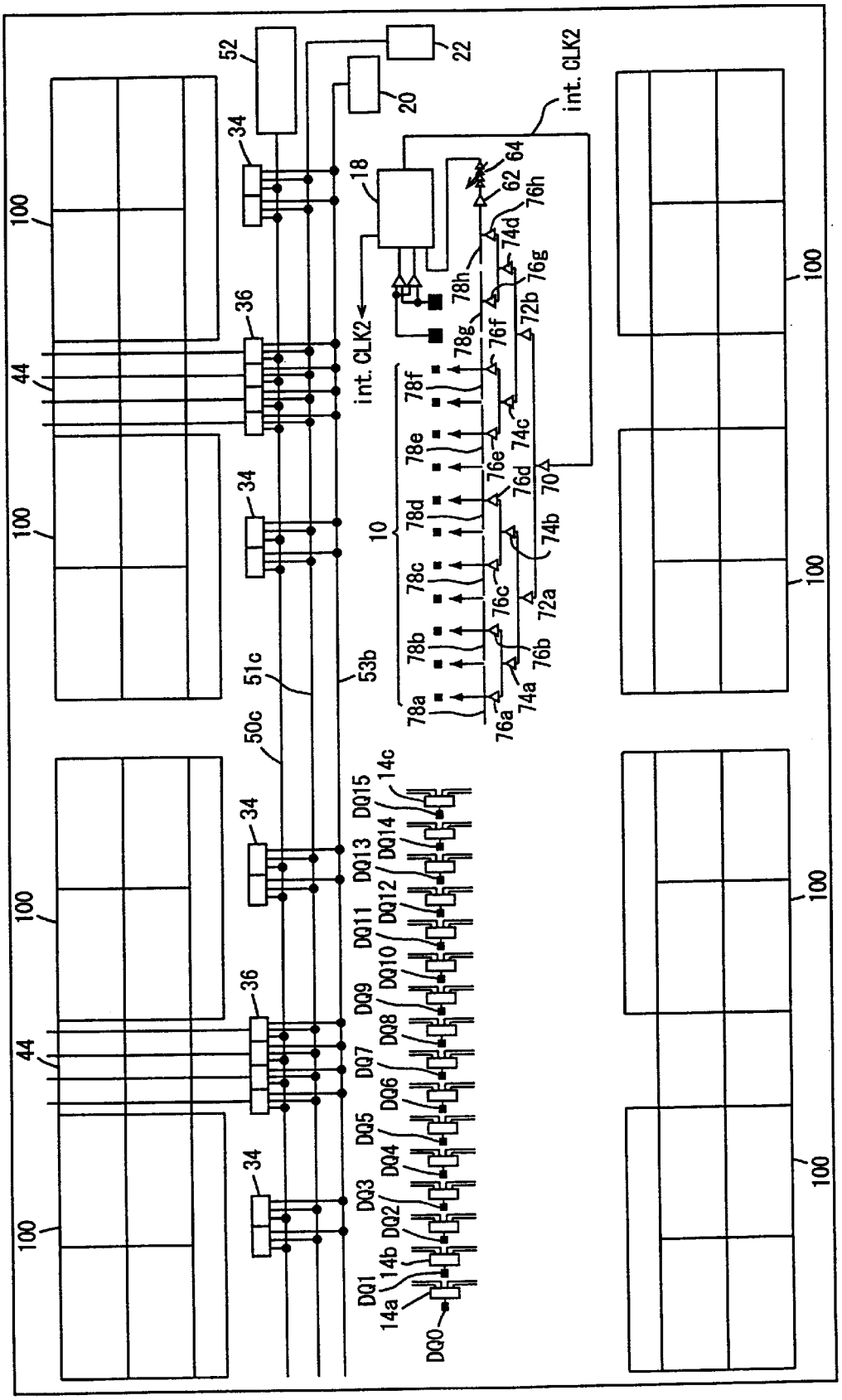
FIG. 20 is a diagram representing the concept of a structure of providing a second internal clock signal int.CLK2 to an input terminal in synchronous semiconductor memory device 2000.

FIG. 20 is a schematic diagram showing a structure of applying second internal clock signal int.CLK2 to respective input terminals of external control signal input terminal group 10 in synchronous semiconductor memory device 2000 of FIG. 18.

Referring to FIG. 20, external clock signals ext.CLK and /ext.CLK applied through the clock signal input terminal are provided to internal control clock generation circuit 1008 via buffer circuits 150 and 152.

Input clock signal int.CLK2 output from internal control clock generation circuit 1008 is first applied to a buffer circuit 70.

The output of buffer circuit 70 is further divided into two to be applied to buffer circuits 72a and 72b.

The output of buffer circuit 72a is further divided into two to be applied to buffer circuits 74a and 74b.

Similarly, the output of buffer circuit 72b is further divided into two to be applied to buffer circuits 74c and 74d.

The outputs from buffer circuits 74a, 74b, 74c and 74d are further divided into two and applied respectively to buffer circuits 76a and 76b, buffer circuits 76c and 76d, buffer circuits 76e and 76f, and buffer circuits 76g and 76h.

The output of buffer circuit 70 is sequentially divided into two to result eventually as 8 clock signals. The eight clock signals are applied to lines 78a–78h. An external control signal is input from external control signal input terminal group 10 in synchronization with the clock signal supplied from respective ends of lines 78a–78h.

The clock signal from the end of line 78h is applied to internal control clock generation circuit 1008 via a replica buffer circuit 62 and a delay adjust circuit 64. Internal control clock generation circuit 1008 sets the output from delay adjust circuit 64 in synchronization with the phase of external clock signal ext.CLK applied from buffer circuit 150 to generate second internal clock signal int.CLK2.

In the case where delay adjust circuit 64 is not provided, adjustment is made so that external clock signal ext.CLK applied to buffer circuit 150 is equal in phase with the clock signal on line 78h applied to replica buffer circuit 62 since buffer circuit 150 and replica buffer circuit 62 have the same structure. Here, the clock signal on line 78h is equal in phase to the other clock signals on lines 78a–78g.

In other words, the input operation of an external control signal is carried out in synchronization with external clock signal ext.CLK.

Here, delay adjust circuit 64 is required to adjust the difference between external clock signal ext.CLK and internal clock signal int.CLK in the amplitude level and the ratio of the activation period of the clock signal corresponding to that frequency.

The structure for dividing internal clock signal int.CLK2 with respect to external control signal input terminal group 10 described with reference to FIG. 2 is also provided corresponding to address signal input terminal group 12. This structure allows an address signal to be input in synchronization with external clock signal ext.CLK.

Figure 21:
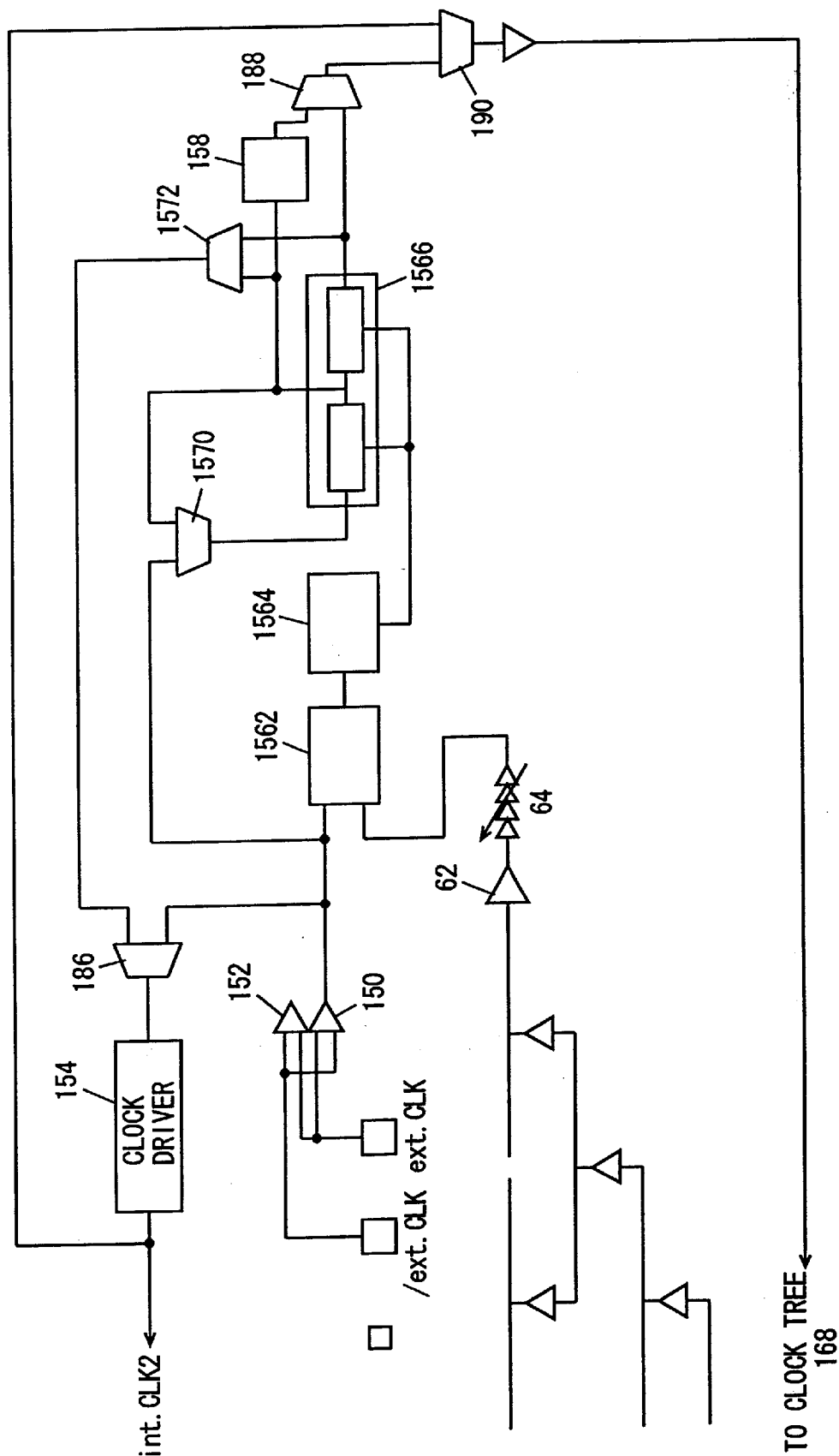
FIG. 21 is a schematic block diagram for describing in further detail the structure of an internal synchronization circuit 156.

FIG. 21 is a schematic block diagram for describing in further detail the structure of internal synchronization circuit 156 of FIG. 20.

Synchronization circuit 156 includes a phase comparator 1562 receiving the outputs from differential amplifier 150 and delay adjust circuit 64 to compare the phase therebetween, and a delay control circuit 1564 for controlling the amount of delay of variable delay circuit 1566 according to the output from phase comparator 1562.

Variable delay circuit 1566 includes a plurality of stages of delay circuits connected in series with each other. Each delay circuit has its delay time controlled by a delay control signal from delay control circuit 1564.

Synchronization circuit 156 further includes a multiplexer 1570 applying the output from differential amplifier 150 to variable delay circuit 1566 when synchronization circuit 156 operates as a DLL circuit and applying the output signal from an intermediate point of the plurality of stages of delay circuits in variable delay circuit 1566 to variable delay circuit 1566 when synchronization circuit 156 operates as a PLL circuit, and a multiplexer 1572 applying the output of variable delay circuit 1566 to switching circuit 186 when synchronization circuit 156 operates as a DLL circuit, and applying the output from the middle delay circuit of the plurality of delay circuits in variable delay circuit 1566 when synchronization circuit 156 operates as a PLL circuit.

Frequency divider circuit 158 of FIG. 9 receives the output from the middle delay circuit out of the plurality of delay circuits in variable delay circuit 1566 to output a signal that is frequency-divided by a predetermined factor.

Switching circuit 188 receives the outputs of frequency divider 158 and variable delay circuit 1566 to selectively output either received signal.

Switching circuit 190 receives the outputs of clock driver 154 and switching circuit 188 to selectively output one of the received signals as internal clock signal int.CLK2.

Switching circuit 186 receives the outputs of differential amplifier 150 and multiplexer 1572 to selectively provide one of the received signals to clock driver 154.

According to the structure of FIG. 21, synchronization circuit 156 has a structure of supplying an external clock signal int.CLK with respect to the input operation of an address signal and an external control signal.

In an internal high speed mode, the internal synchronization circuit attains a PLL operation mode from a DLL operation mode. Therefore, this synchronization circuit will be referred to as a DPLL circuit hereinafter.

It is assumed that the multiplication factor in obtaining an integral multiple of the frequency of the externally applied clock in the internal high speed mode is, although not limited, 4.

It is assumed that the external clock signal is complementary clock signals ext.CLK and /ext.CLK here.

Also, the input operation of an address signal and an external control signal is effected at the rising edge of internal clock signal int.CLK2.

It is to be noted that synchronization circuit 156 may be implemented using the output signal of int.CLK2 for the control of data input/output. Also, the multiplication factor in obtaining an integral multiple of the frequency of the externally applied clock can be 8, 16, or a greater number in the internal high speed mode.

The operation will be described briefly hereinafter.

The output of variable delay circuit 1566 is applied to the internal circuit through clock driver 154. External clock signal ext.CLK passing through the differential amplifier circuit (input buffer) is selected by switching circuit 186 and has the drivability increased by clock driver 154 to be applied to the internal circuitry as the reference signal of a control signal.

The output of differential amplifier 150 is selected by multiplexer 1570 to be input as a trigger signal of variable delay circuit 1566.

In a normal operation, the output of variable delay circuit 1566 is applied to clock tree 168 in priority by switching circuits 188 and 190.

The clock signal increased in drivability by driver circuit 191 via switching circuit 190 is applied to each of input/output terminals DQ0–DQ31 via clock tree 168. Control is provided so that the phase of internal clock signal int.CLK2 divided by clock tree 168 is substantially equal with respect to all the data input/output terminals.

The clock signal passing through clock tree 168 is input to phase comparator 1562 via replica buffer 362 corresponding to the input buffer of the clock signal. Phase comparator 1562 compares the phase of internal clock signal int.CLK2 from this replica buffer with the phase of the external clock signal from differential amplifier 150.

The operation in an internal high speed mode will be described hereinafter.

The output of the delay circuit having an amount of delay half the total amount of delay is selected by multiplexer 1570 to be applied to variable delay circuit 1566 instead of the external clock signal. Therefore, variable delay circuit 1566 forms a closed loop.

Here, multiplexer 1570 includes one stage of an inverter circuit. By this inverter, the number of delay stages in the loop formed of the variable delay circuit and this inverter circuit corresponds to an odd number of stages. Therefore, this loop forms a ring oscillator to initiate free-running oscillation.

The reason why output is provided from the section of half the total amount of delay of variable delay circuit 1566 is to equal the delay of one frequency of the ring oscillator with the delay of the variable delay circuit. The output of the ring oscillator is applied to frequency divider 158 to be frequency-divided by a factor of 4 and then selected by switching circuits 188 and 190. The output is distributed to the address signal input terminal group and the external control signal input terminal group via clock tree 168. The amount of delay of vaniable delay circuit 1566 is controlled by phase comparator 1562 and delay control circuit 1564 so that the frequency phase of internal clock signal int.CLK2 supplied to the address signal input terminal group or external control signal input terminal group matches the frequency phase of the external clock signal.

In the state where the phases match, the output of the ring oscillator has a frequency four times that of external clock signal ext.CLK.

Internal clock signal int.CLK2 of a quadrupled frequency is selected by multiplexer 1572 and switching circuit 186 to have its drivability increased by clock driver 154 and applied to the internal circuitry as a control signal.

By the above-described structure, the internal circuit can automatically implement an operation of 4 bursts even in the read operation during the time of 1 clock of external clock signal ext.CLK.

This means that the internal circuit itself can operate at high speed even when the frequency of external clock signal ext.CLK is not high by such an operation mode.

Figure 22:
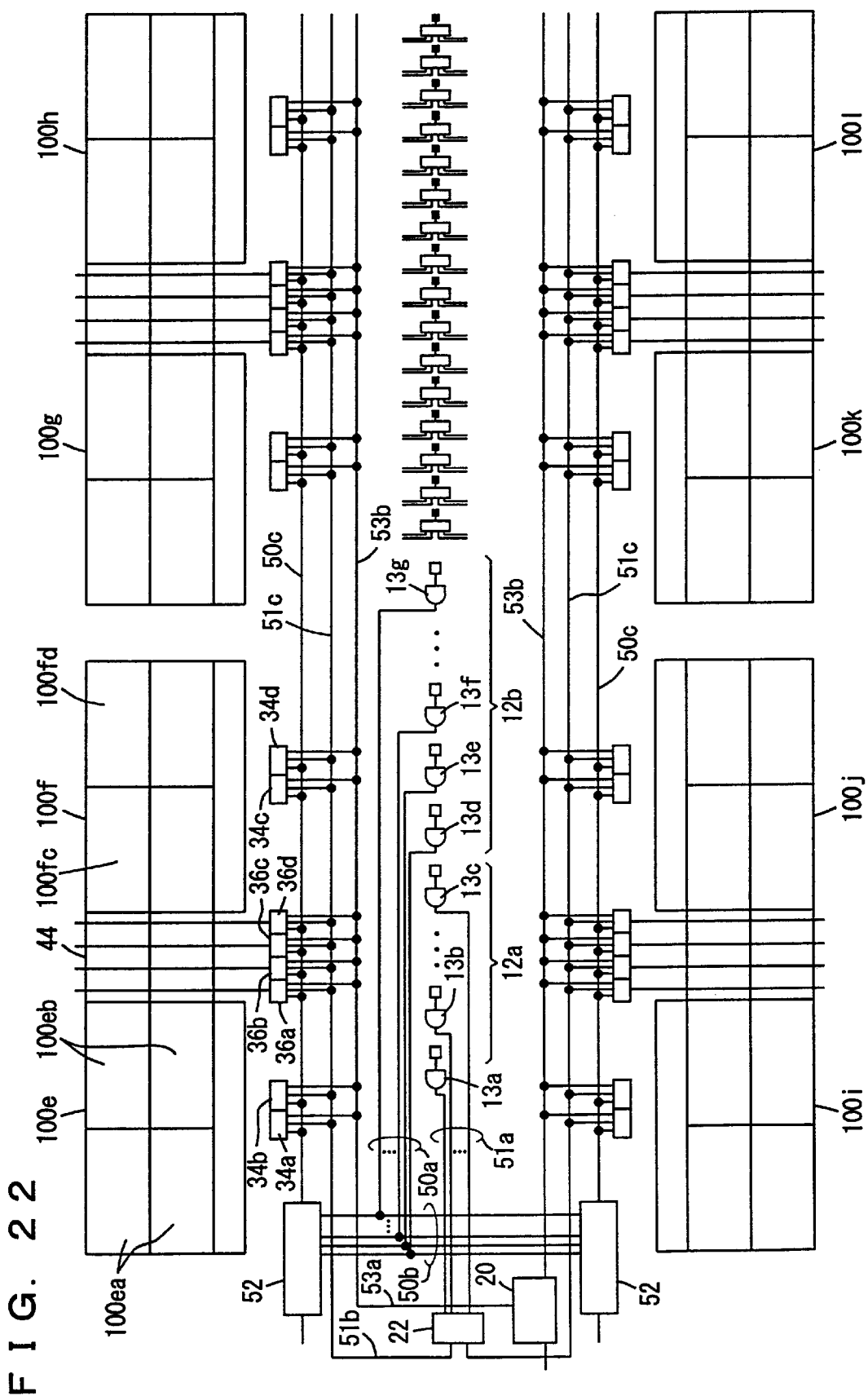
FIG. 22 is a schematic block diagram showing a structure of an address bus and a command data bus.

FIG. 22 schematically shows the structure of address signal input terminal group 12, address buses 50a, 50b, 50c, 51a, 51b, 51c, and command data buses 53a and 53b.

The more significant bits of data of the address signal applied to address signal input terminal group 12a out of address signal input terminal group 12 is provided to bank address bus 5ia by input buffers 13a–13c operating in synchronization with internal clock signal int.CLK. Bank decoder 22 receives and decodes the data from bank address bus 51a to provide the decoded signal to respective memory cell blocks (bank) via bank address buses 51b and 51c.

The less significant bits of data of the address signal applied to address signal input terminal group 12b is applied to address driver 52 via address data buses 50a and 50b by input buffers 13d–13g operating in synchronization with internal clock signal int.CLK. Address driver 52 provides the address signal to each bank (memory cell block) via address data bus 50c.

Control circuit 20 receives and decodes the command data applied to control signal input terminal group 10. The decoded command data is transmitted to each memory cell block (bank) via command data buses 53a and 53b.

Each bank, for example memory cell block 100e, is further divided into memory subblocks 100ea and 100eb.

As to row predecoder 36, a row predecoder 36a corresponds to memory cell subblock 100ea and a row predecoder 36b corresponds to memory cell subblock 100eb. Row predecoder 36a is rendered active upon sensing selection of bank 100e according to the bank address transmitted through bank address bus 51c and sensing designation of a row related operation through command data bus 53b to input the address data through address bus 50c and command data through command data bus 53b. In response, row predecoder 36a provides the predecoded address signal to row decoder 44.

Each of row predecoders 36b–36d operates in a similar manner.

As to column predecoder 34, a column predecoder 34a provided corresponding to memory cell block 100ea inputs corresponding address data from address bus 50c when memory cell block 10e is selected according to the bank address transmitted through bank address bus 51c and upon detection of activation of a column related operation through command data bus 53b.

Column predecoder 34a predecodes the received column address data to output the predecoded column address signal to a corresponding column predecoder line 40.

Figure 23:
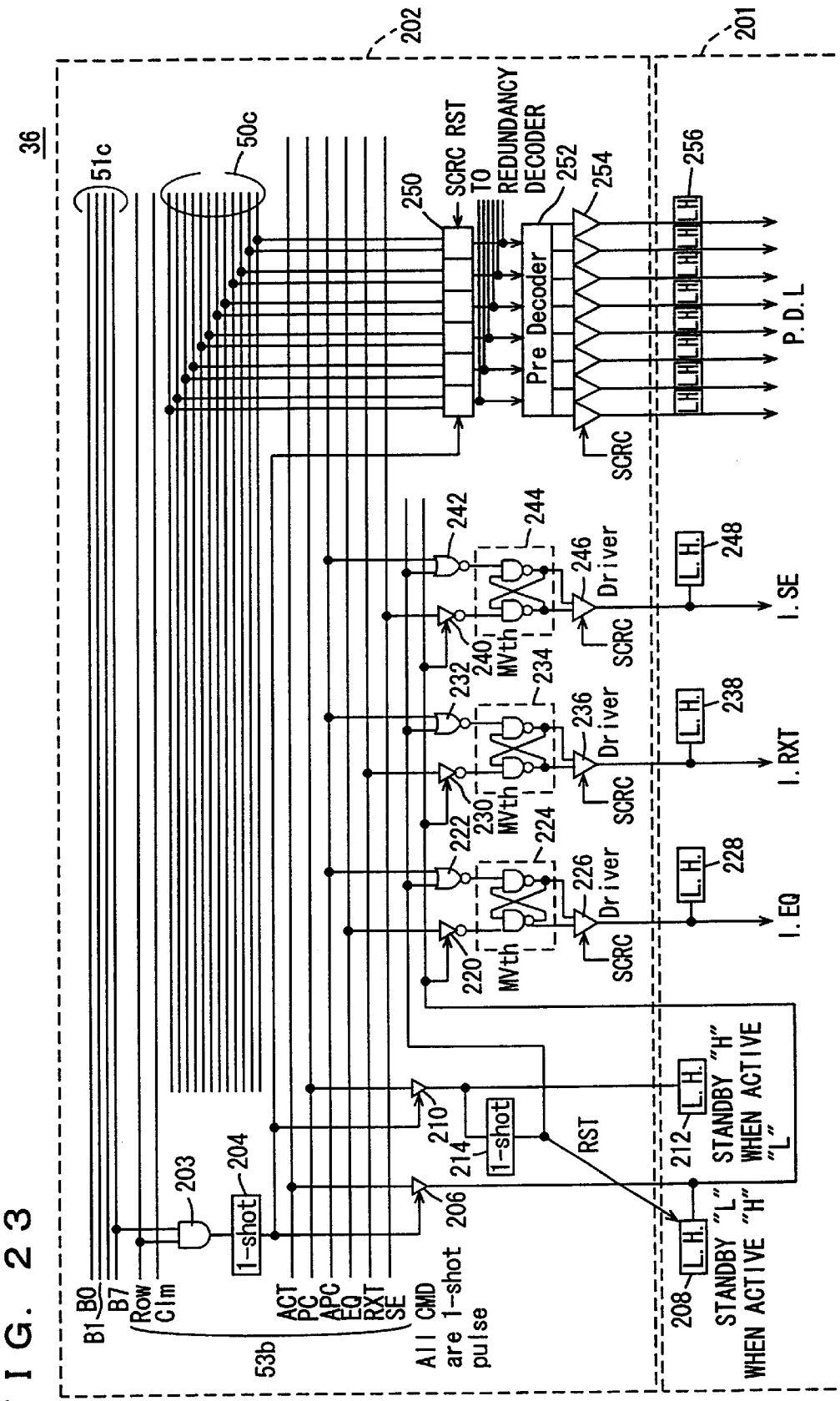

FIG. 23 is a schematic block diagram of a structure of row predecoder 36 of FIG. 22.

Command address bus 53b transmits various signals such as a signal Row designating activation of a row related circuit operation, a signal Clm designating activation of a column related circuit operation, a signal ACT designating activation of the operation of the internal circuits, a signal PC designating bank reset (precharge), a signal APC designating precharging of all banks, a signal EQ designating the cancel of bit line equalization or disconnecting an unused bit line from a sense amplifier, a signal RXT designating activation of a word line, a signal SE designating activation of sense amplifier, and the like.

Bank address bus 51c transmits bank address signals B0–B7 decoded by bank decoder 22. Address bus 50c transmits the address signal from address driver 52.

When bit data B7, for example, of the bank address signal is rendered active and signal Row is rendered active, an active signal is output from AND circuit 203, whereby an active one shot pulse is output from one shot pulse generation circuit 204.

In response, driver circuit 206 is rendered active to input signal ACT. Level retain circuit 208 retains the level of signal ACT.

Similarly, in response to the signal from one shot pulse generation circuit 204, driver circuit 210 is rendered active to receive signal PC. The level of signal PC is retained by level retain circuit 212. In response to the output from driver circuit 210, one shot pulse generation circuit 214 outputs a reset signal to level retain circuit 208. Inverter 220 is rendered active according to the output signal from level retain circuit 208 to receive and output signal EQ. NOR circuit 222 receives signal APC and the signal from one shot pulse generation circuit 214 to output an NOR. Flip-flop circuit 224 is set according to the output of inverter 220 and reset according to the output from NOR circuit 222. Driver circuit 226 that is rendered active by a hierarchical power source control signal SCRC that will be described afterwards receives and outputs the signal from flip-flop circuit 224. The level of the output of driver circuit 226 is retained by level retain circuit 228. The output of level retain circuit 228 is provided as a signal l.EQ to a corresponding memory cell block.

Similarly, flip-flop circuit 234 is rendered active according to a signal from level retain circuit 208 to be set by the output of inverter 230 receiving signal RXT transmitted through command data bus 53b, and reset by the output of NOR circuit 232 receiving signal APC transmitted through one shot pulse generation circuit 214 and command data bus 53b.

Driver circuit 236 receives the output of flip-flop circuit 234 to be rendered active by hierarchical power source control signal SCRC. The output level of driver circuit 236 is retained by level retain circuit 238. The output of level retain circuit 238 is provided to a corresponding memory cell block as a signal l.RXT.

Flip-flop circuit 244 receives signal SE transmitted through command data bus 53b to be set by the output of inverter 240 that is rendered active according to the output level of level retain circuit 208 and to be reset by the output of NOR circuit 242 receiving the output signal of one shot pulse generation circuit 214 and signal APC transmitted through command data bus 53b. Driver circuit 246 receives the output of flip-flop circuit 244 to be rendered active by hierarchical power source control signal SCRC. The output of driver circuit 246 is retained by level retain circuit 244. The output of level retain circuit 244 is provided to a corresponding memory cell block as a signal l.SE.

Latch circuit 250 is reset according to activation of hierarchical power source control signal SCRC and rendered active according to activation of one shot pulse generation circuit 204 to retain the address signal transmitted through address data bus 50c. The output of latch circuit 250 is transmitted to a redundant address decoder (not shown) and also to predecoder 252. The predecoded result is applied to driver circuit 254 that is rendered active according to hierarchical power source control signal SCRC.

The output of driver circuit 254 is retained by level retain circuit 256. Level retain circuit 256 provides the output to a corresponding row predecoder line.

Referring to the structure of row predecoder 36 of FIG. 23, the region 201 including level retain circuits 208, 212, 228, 238, 248 and level retain circuit 256, and a corresponding memory cell block is not controlled by hierarchical power source control signal SCRC. Region 201 always operates with power supply potential Vcc and ground potential Vss as power supply potentials in both an active state and a standby state.

In contrast, the region 202 in row predecoder 36 is controlled by hierarchical power source control signal SCRC to receive power supply potential Vcc and ground potential Vss for operation when signal SCRC is active, and to receive with a potential lower than power supply potential VCC and a potential higher than ground potential Vss as respective power supply potentials when hierarchical power supply potential control signal SCRC is inactive (L level).

Figure 24:
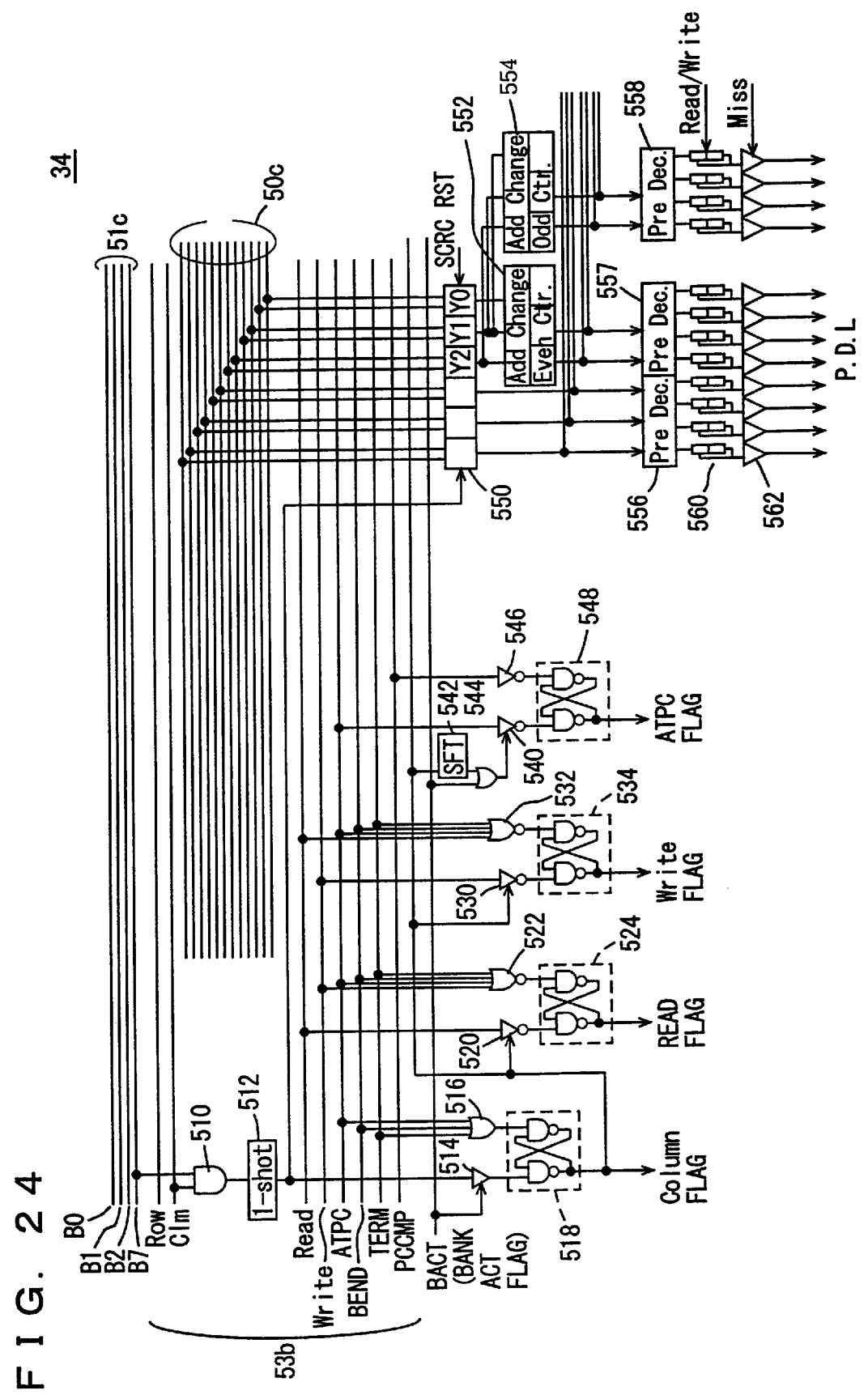

FIG. 24 is a schematic block diagram showing a structure of column predecoder 34.

Referring to FIG. 24, control circuit 20 provides via command data bus 53b a read related access identification signal READ to designate a readout operation, a write related access identification signal WRITE to designate a write operation, an automatic precharge identification signal ATPC to designate an automatic precharge operation, a burst end identification signal BEND to designate the end of a burst operation for each bank, a termination identification signal TERM to designate forced ending of the column select operation when another bank is selected during a column select operation, and a precharge operation identification signal PCCM to designate the end of a precharge operation.

Signal BACT is a flag signal retained in level retain circuit 208 when a bank is selected.

Column predecoder circuit 34 includes an AND circuit 510 receiving signal Clm transmitted through command data bus 53b and a corresponding bank address signal B7, a one shot pulse generation circuit 512 providing a one shot pulse signal according to activation of the output of AND circuit 510, a drive circuit 514 rendered active according to activation of flag signal BACT to drive the output of one shot pulse generation circuit 512, an OR circuit 516 receiving signals ATPC, BEND, and TERM, and a flip-flop circuit 518 set by the output of drive circuit 514 and reset by the output of OR circuit 516 to output a column flag signal Col.FLAG to indicate activation of a column related operation.

Column predecoder circuit 34 further includes an inverter circuit 520 rendered active according to activation of column flag signal Col.FLAG to drive signal READ transmitted through command data bus 53b, an OR circuit 522 receiving signals WRITE, ATPC, BEND, and TERM, and a flip-flop circuit 524 set by the output of inverter circuit 520 and reset by the output of OR circuit 522 to output a read flag signal READ.FLAG indicating activation of a readout operation.

Column predecoder circuit 34 further includes an inverter circuit 530 rendered active according to activation of column flag signal Col.FLAG to drive signal WRITE transmitted through command data bus 53b, an OR circuit 532 receiving signals READ, ATPC, BEND, and TERM, and a flip-flop circuit 524 reset by the output of inverter circuit 530 and reset by the output of OR circuit 532 to output a write flag signal WRITE.FLAG indicating activation of a write operation.

Column predecoder circuit 34 further includes a shift circuit 542 receiving and delaying column flag signal Col.FLAG for a predetermined clock time, an OR circuit 540 receiving flag signal BACT and the output of shift circuit 542, an inverter circuit 544 rendered active according to activation of the output of OR circuit 540 to drive signal ATPC transmitted through command data bus 53b, an inverter circuit 546 receiving signal PCCMP transmitted through command data bus 53b, and a flip-flop circuit 548 set by the output of inverter circuit 544 and reset by the output of inverter circuit 546 to output an automatic precharge flag signal ATPC.FLAG indicating activation of an automatic precharge operation.

Column predecoder circuit 34 further includes a latch circuit 550 rendered active according to the output signal of one shot pulse generation circuit 512 to input the column signal transmitted through address bus 50c. Latch circuit 550 is reset according to activation of signal SCRC.

Column predecoder circuit 34 further includes an even number bit adjust circuit 552 and an odd number bit adjust circuit 554 for adjusting the lower significant bits of the address signal corresponding to the activated column select line (not shown) according to the less significant bits of the column address retained in latch circuit 550, a predecoder 556 predecoding the more significant bit data from latch circuit 550, a predecoder 557 for predecoding the less significant bit data from even number bit adjust circuit 552, a predecoder 558 predecoding the less significant bit data from odd numbered bit adjust circuit 554, a shift circuit 560 rendered active by signal READ or WRITE to delay the predecode signal from predecoder 556, 557 and 558 for a predetermined number of clocks (for example, 2 clocks), and a drive circuit 562 rendered active according to a signal Miss indicating that the address from the redundancy decoder (not shown) does not correspond to the defective address to receive the output from shift circuit 560 and drive the signal on the column predecode line to a level according to the output signal of shift circuit 560.

By the above structure, activation is effected independently for each bank. An advantage similar to that of the first embodiment is provided even when the address bus and the command data bus are provided common to a plurality of banks.

In the first and second embodiments, the modified portion for the circuitry of the DDR-SDRAM and SDR-SDRAM is shown as a common portion. However, the structure of the circuit modified portion of the present invention is not limited to the above two types of chips. For example, the present invention is applicable to the case where the operation of a chip controlling the internal circuitry with an external clock signal and the operation of a chip controlling internal circuitry with a generated internal clock signal can be altered in the same chip. Also, in a chip that includes a particular test mode, the operation of the chip is under control of an internal clock that is generated on the basis of an external clock. The present invention is applicable to the case of switching the clock signal in such a chip since the internal circuitry operates at a frequency higher than that of the external clock.

Third Embodiment

Figure 25:
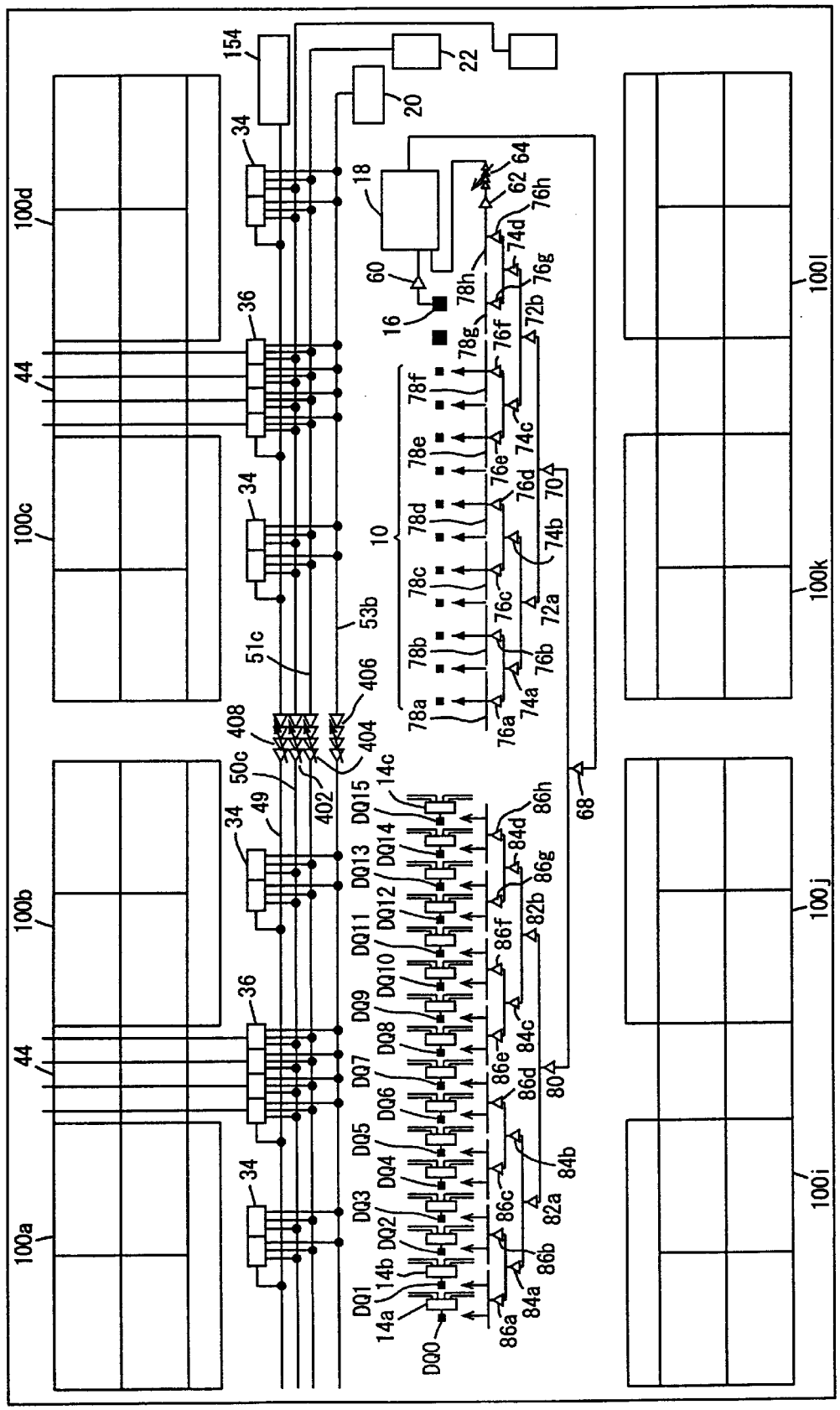
FIG. 25 is a schematic block diagram showing a portion of the structure of a SDRAM according to a third embodiment of the present invention.

FIG. 25 is a block diagram showing a portion of a SDRAM according to a third embodiment of the present invention.

The SDRAM of the third embodiment differs in structure from SDRAM 1000 of FIG. 18 in that variable verniers 402, 404, 406 and 408 are provided between banks 100b and 100c, for example, in bank address bus 50c, address bus 51c, command bus 53b, and bus 49 transmitting a clock signal to each bank.

A variable vernier 408 is provided between banks 100b and 100c in clock bus 49 transmitting internal clock signal int.CLK2 from clock driver 154 to each bank.

Furthermore, a variable vernier (not shown) is provided between banks 100b and 100c in data bus 54 transmitting data between each bank and an input/output buffer.

The remaining elements are similar basically to those of SDRAM 1000 in a unidirectional mode. The same or corresponding components have the same reference characters allotted, and description thereof will not be repeated.

It is assumed that the SDRAM is in a unidirectional mode, and that the input operation of an external control signal and an address signal is effected in synchronization with internal clock signal int.CLK from synchronization circuit 156 that operates as a DLL circuit.

Data input is also carried out in synchronization with internal clock signal int.CLK2 since the mode is the unidirectional mode.

In response to internal clock signal int.CLK2 that has its phase aligned with that of the external clock signal by synchronization circuit 156, the signal output from clock driver 154 is sent to each bank. Control of the operation is provided at the bank side.

Here, the output of synchronization circuit 156 is used for the operation in the chip as well as for data input/output and input of an address signal and an external control signal.

When the output of synchronization circuit 156 is used for data input/output and the input of an address signal and a control signal, the transmission path of internal clock signal int.CLK2 is set so that the phase difference between each pad becomes smaller.

However, it is not particularly necessary to align the phase difference up to each bank in the case of an internal operation of the chip. Operation can be carried out at a different phase for each bank.

Accordingly, an address and command can be distributed together with the clock flow. Signal transmission will be effected with matching phases of the clock signal, address signal, and external control signal in all the banks. Therefore, an operation margin is obtained in the internal circuit.

In the example of FIG. 25, phase control is effected with verniers 402–408 arranged between the bank close to the center and the bank remote from the center. The clock signal, address signal, and control signal will be slightly out of phase during its transmission to respective banks even though the phase is identical out the outset since the circuit complexity corresponding to each line differs. Verniers 402-408 serve to adjust the difference in phase between the signals.

Furthermore, temporary congregation of the operating current can be prevented by shifting the phase for a predetermined delay time for the operation of each bank. The peak value of the operating current in the SDRAM can be reduced.

Reduction in the peak current implies reduction of noise emission during the chip operation. Thus, a stable system operation can be provided.

Figure 26:
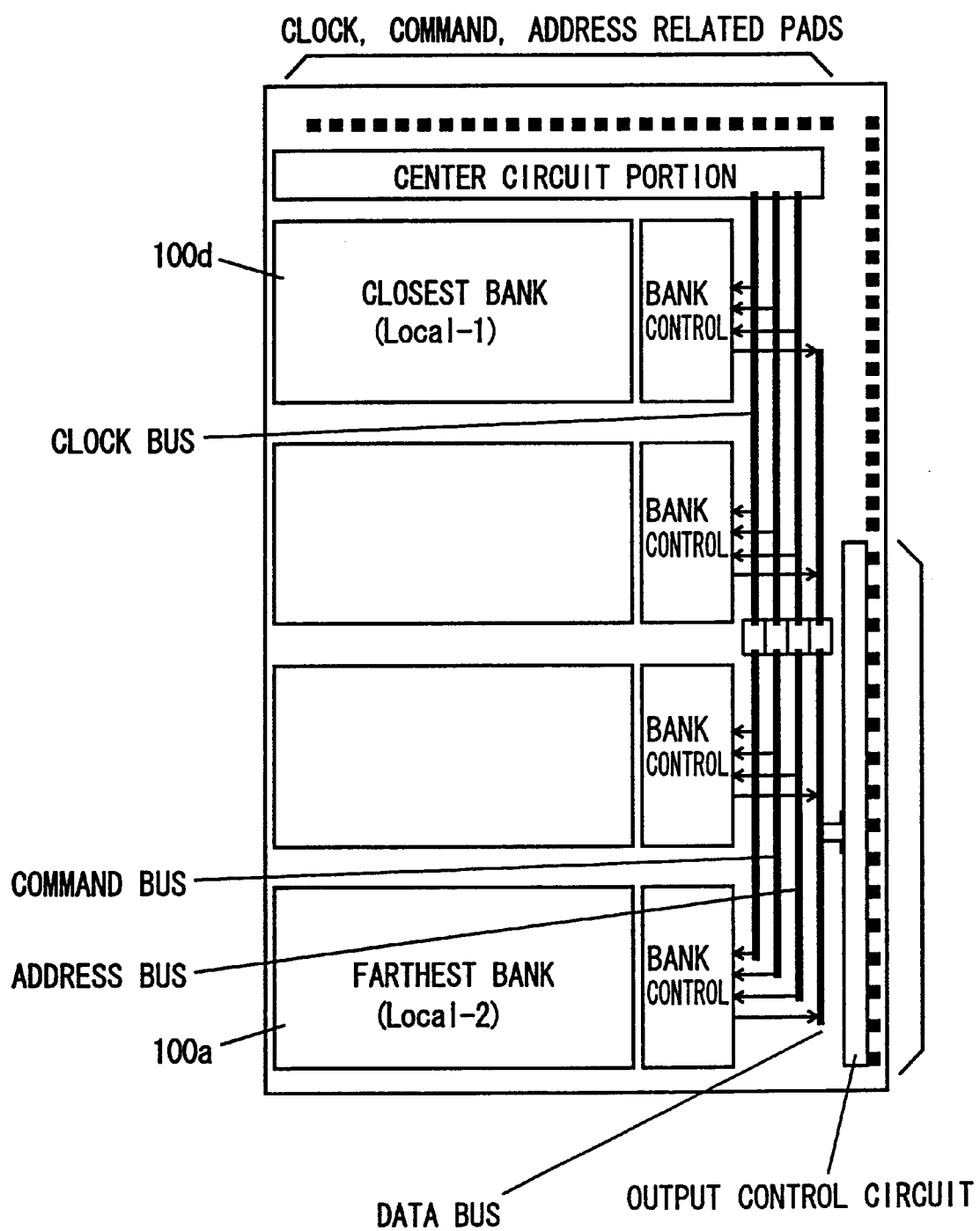
FIG. 26 shows an extraction of banks 100a, 100b, 100c and 100d.

FIG. 26 shows the extraction of banks 100a, 100b, 100c, and 100d from FIG. 25.

Data is transmitted from the circuit portion at the center of the SDRAM to each bank via the clock bus, the command bus, the address bus, and the data bus.

The address signal and the command signal are transmitted most earliest at bank 100d which is located closest to the center circuit area. Therefore, when bank 100d initiates its operation to output data, for example, in a readout operation, the readout data from bank 100d will be output towards the data input/output terminal at an early time point.

In contrast, the address signal and the command signal will be transmitted most latest at bank 100a that is located most remote from the center circuit portion. However, although the readout data is output later than the output from bank 100d, it is to be noted that bank 100a is located closer to the data input/output terminal than bank 100d. Therefore, the time from the output of an address signal and a command signal from the center circuit portion up to the time when the readout data from bank 100a arrives at the data input/output terminal group is substantially equal to the time when the readout data from bank 100d arrives at the data input/output terminal.

Figure 27:
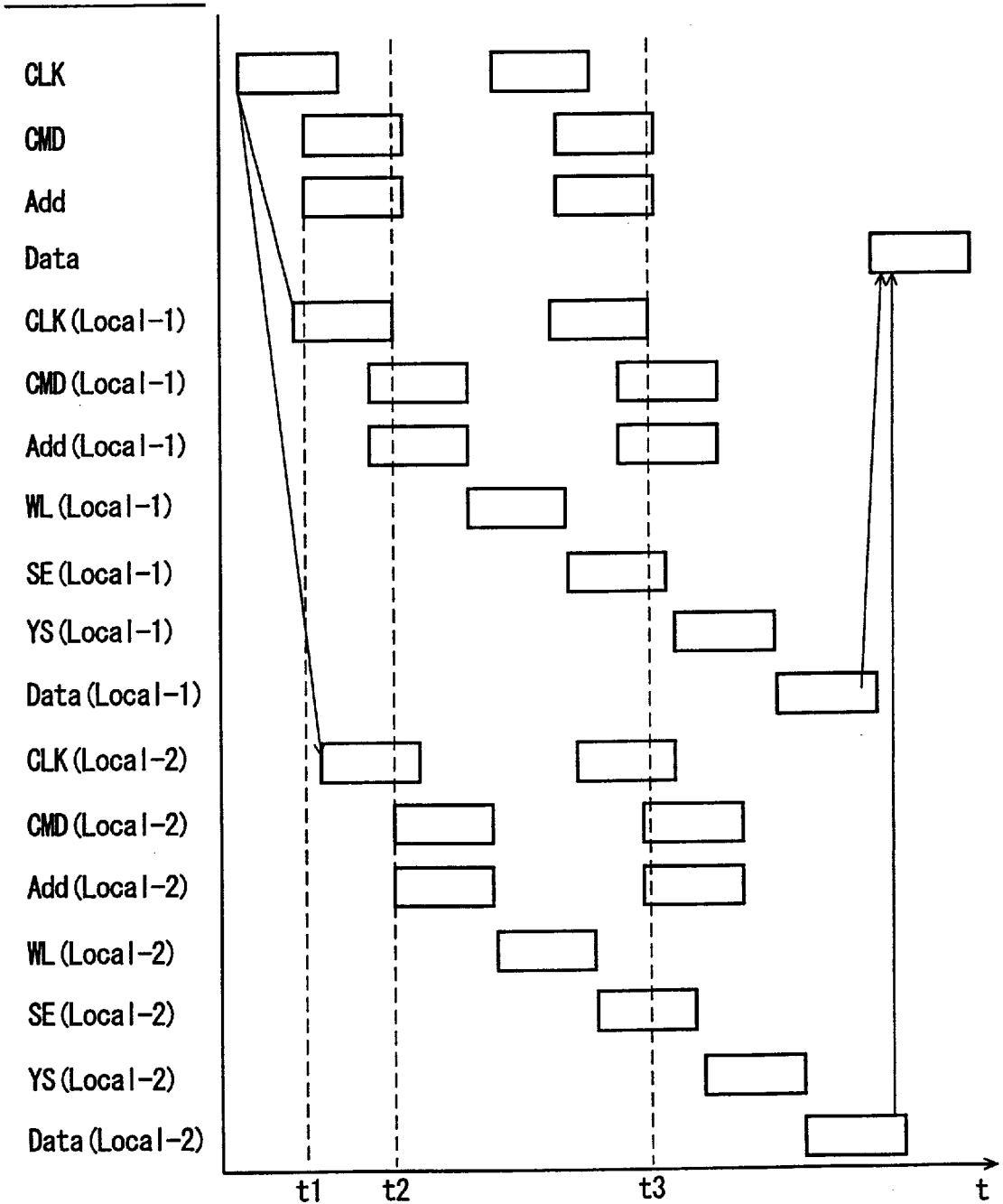
FIGS. 27 and 28 are diagrams for describing a readout operation timing and a write operation timing, respectively.

FIG. 27 is a timing chart for describing this readout operation. In FIG. 27, the period of time where each signal is active is indicated by a rectangle.

In FIG. 27, bank 100d of FIG. 26 is labeled "Local-1" whereas bank 100a is labeled "Local-2".

At time t1, an external control signal and an address signal are input at the center circuit portion.

The time of transmission of the clock signal, control signal, and address signal is later for bank Local-2 than for bank Local-1.

Therefore, the activation time of the word line rendered active according to a command signal and an address signal, the activation time of the sense amplifier, the activation time of a column select signal, and the time when data is read out are all later for bank Local-2 than for bank Local-1.

However, the data delay time to data input/output terminal DQ is smaller for bank Local-2 than bank Local-1. Therefore, the data output arrives at the data input/output terminal at substantially the same time for both banks of Local-1 and Local-2.

Figure 28:
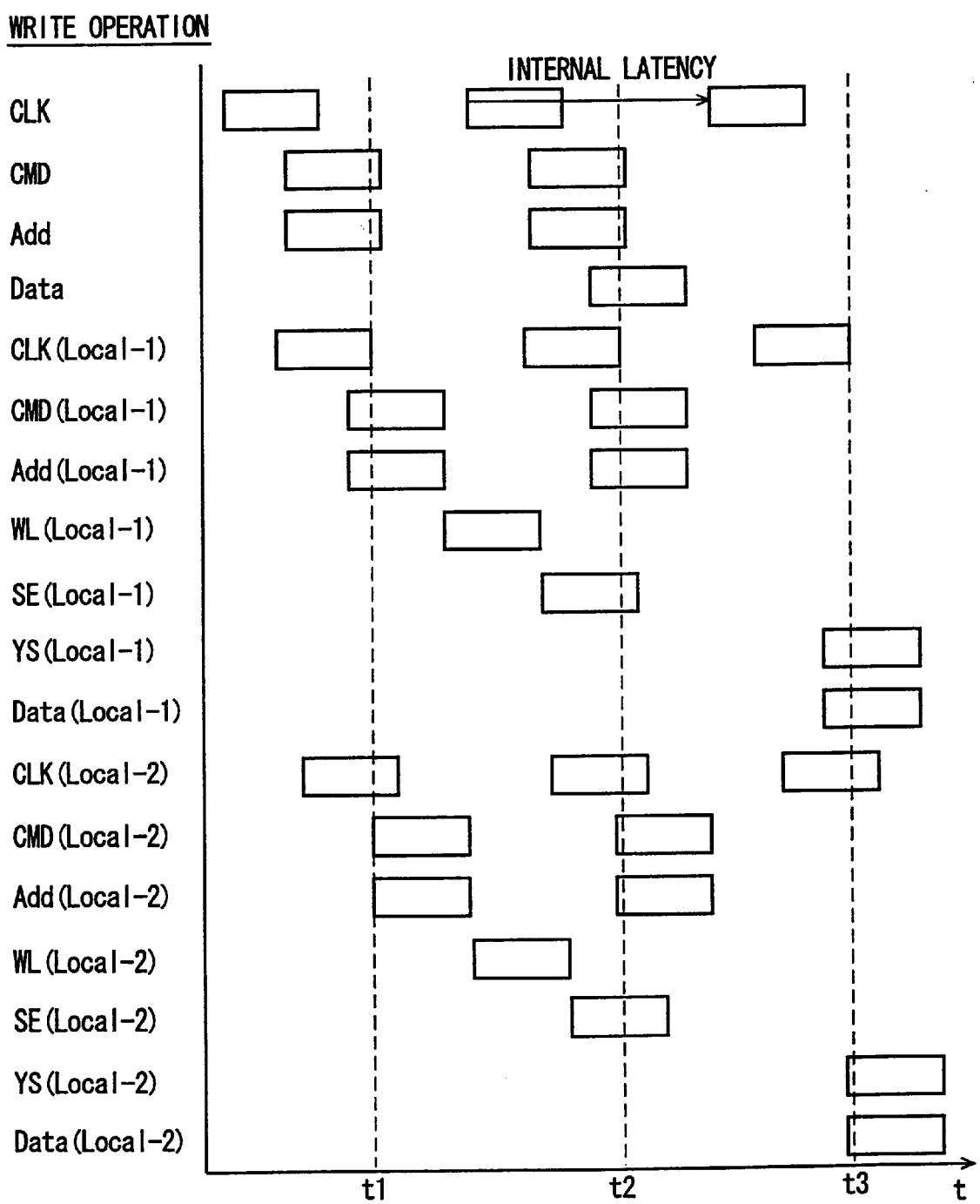

FIG. 28 is a diagram for describing the write operation timing. As described before, the write operation includes an internal latency. Therefore, operation can be effected corresponding to the delay of the clock regardless of whether the bank is located close or remote from the center circuit portion by just transferring the data to the proximity of the array to be written in. Also the coherency of the phase of the timing of activation of a column select signal and data writing can be maintained by effecting the operation of the column select signal corresponding to the internal latency.

Figure 29:
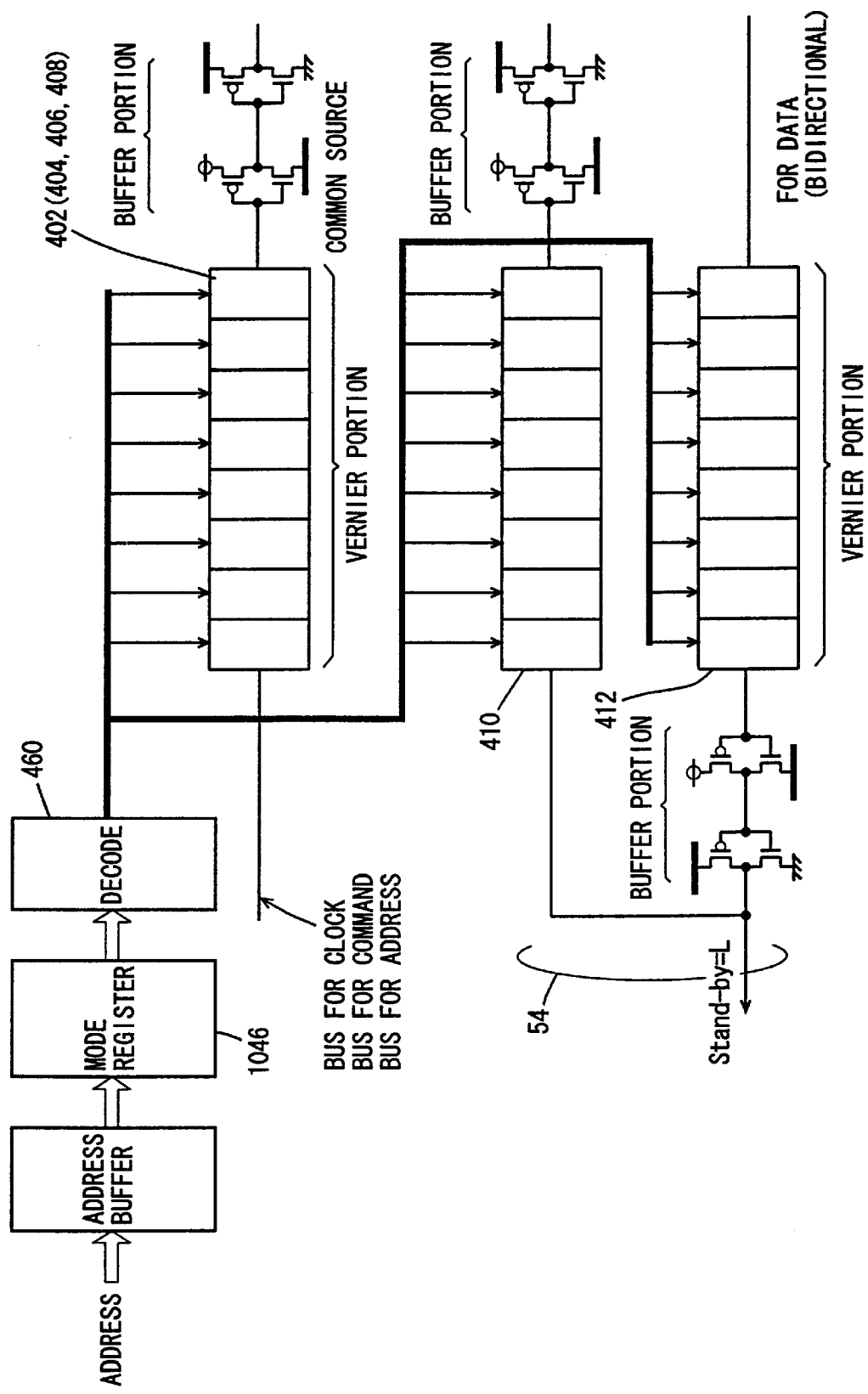
FIG. 29 is a schematic block diagram showing a structure of variable verniers 402–412.

FIG. 29 is a schematic block diagram showing the structure of variable verniers 402–412 provided corresponding to clock data bus 49, bank address bus 50c, address bus 51c, command data bus 53b and data bus 54.

The amount of delay of each of variable verniers 402–412 is controlled independently according to the decoded data from decoder 406 upon receiving the data from mode register 1046.

Figure 30:
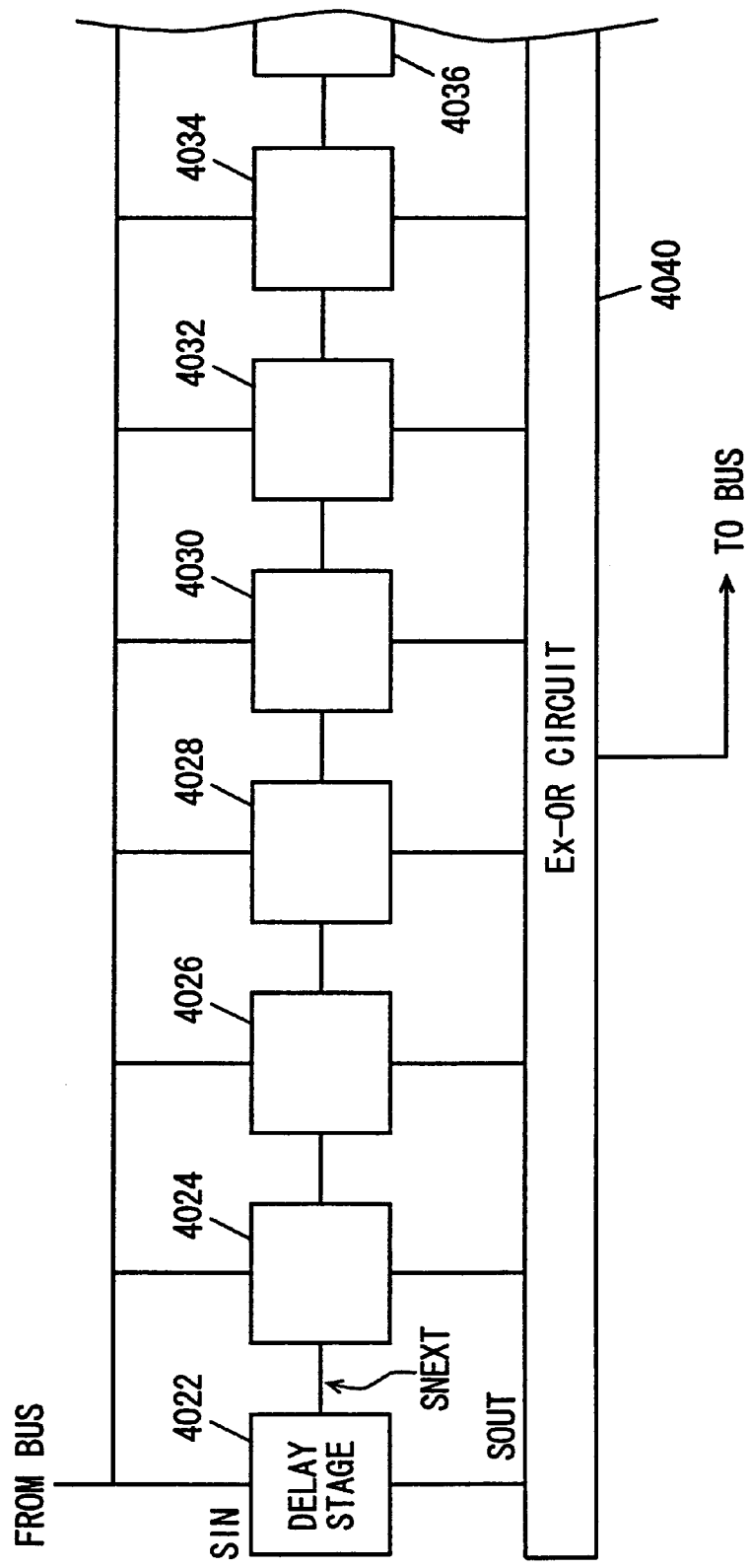
FIG. 30 is a schematic block diagram showing in further detail the structure of variable vernier 402.

FIG. 30 is a schematic block diagram showing a structure of variable vernier 402 in further detail.

Each of the other variable verniers 404–412 has a similar structure.

Variable vernier 402 includes a plurality of delay circuits 4022–4036. Each of delay circuits 4022–4036 has its delay time controlled by control signals VP and VN from decoder 460. Control is provided to send the input signal SIN to the next stage or to an NOR circuit 4040 according to control signal SD from decoder 460.

The output of NOR circuit 4040 is provided to the bus.

Figure 31:
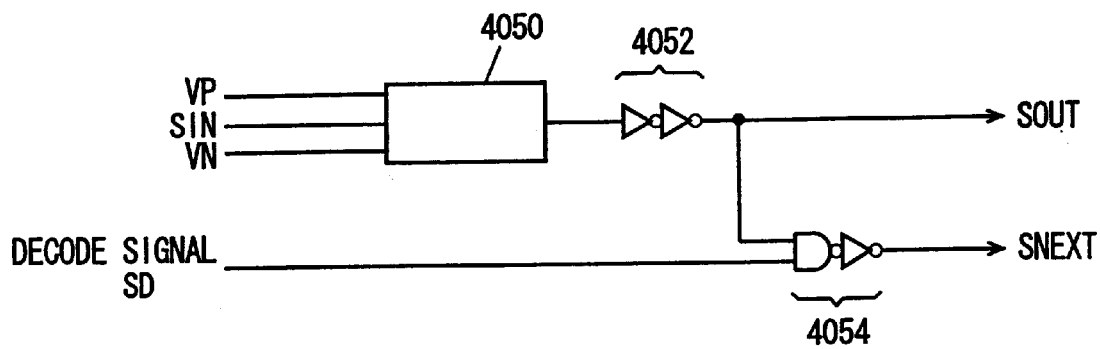
FIG. 31 is a schematic block diagram showing a structure of a delay circuit 4022.

FIG. 31 is a schematic block diagram showing a structure of delay circuit 4022.

Each of the other delay circuits 4024–4036 has a similar structure.

Delay circuit 4022 includes a variable delay circuit 4050 delaying signal SIN for a delay time under control of control signals VP and VN, a buffer 4052 receiving the output of variable delay circuit 4050 to output a signal Sout, and an AND circuit 4054 receiving the output of buffer 4052 and control signal SD to output a signal SNEXT that becomes the input signal SIN of the next stage of the delay circuit.

Figure 32:
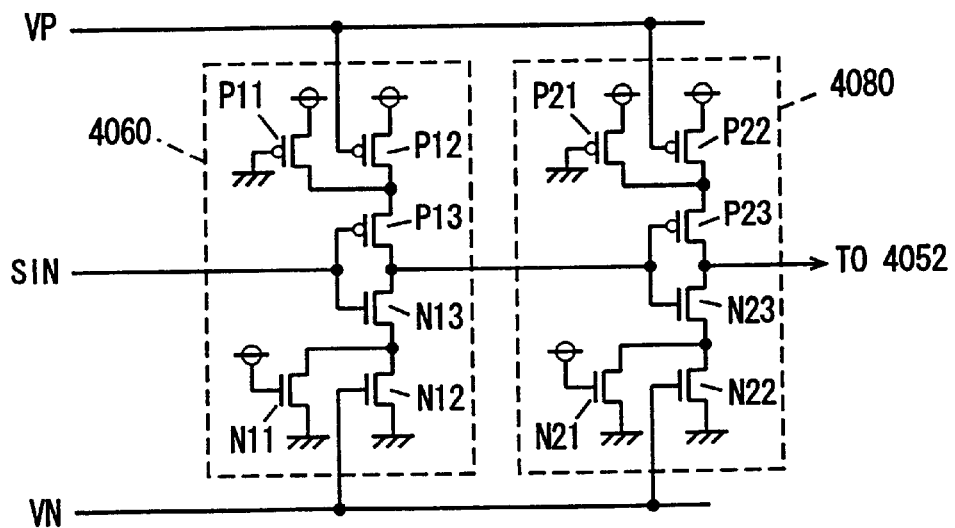
FIG. 32 is a circuit diagram showing a structure of a variable delay circuit 4050.

FIG. 32 is a circuit diagram showing a structure of variable delay circuit 4050.

Inverter 4080 receives the output of inverter 4060 to which signal SIN is input. Inverter 4080 provides the signal to buffer circuit 4052.

The delay time of variable delay circuit 4050 is varied according to the operating currents of inverters 4060 and 4080 being controlled by control signals VP and VN.

[Modification of Third Embodiment]

Figure 33:
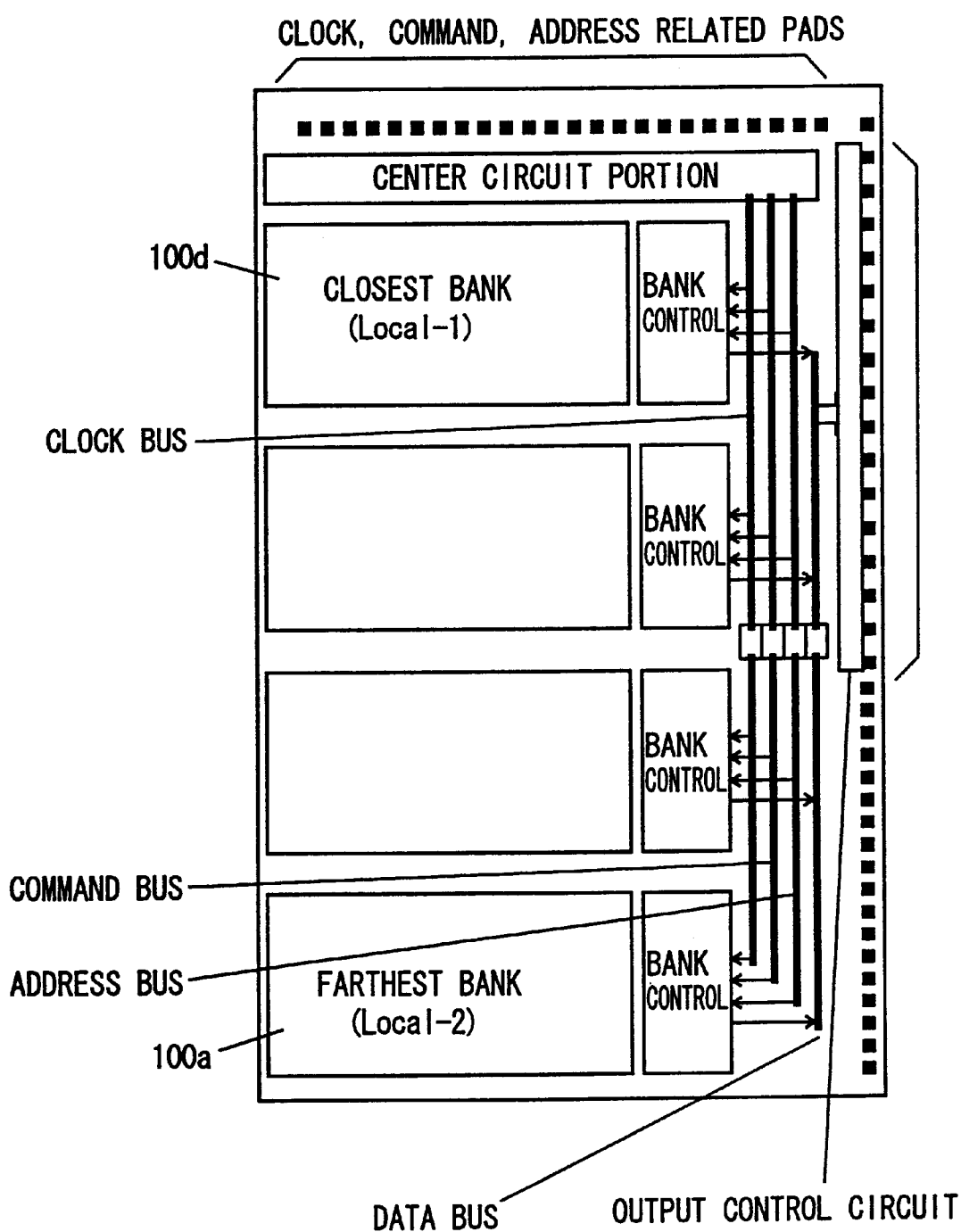
FIG. 33 shows an extraction of the structure of a SDRAM.

FIG. 33 shows a structure of a SDRAM in the case where the data input/output terminal group and the output control circuit are arranged in the proximity of bank 100d, i.e., near the center of the chip.

Data is transmitted from the center circuit portion of the SDRAM to respective banks through the clock bus, command bus, address bus, and data bus.

The address data and command data are transmitted most earliest at bank 100d that is located closest to the center circuit portion. Therefore, when bank 100d initiates its operation to output data, for example, in a readout operation, the data readout from bank 100d will be output towards the data input/output terminal at an early time point.

In contrast, the transmission of an address signal and a command signal is latest for bank 100a that is located most remote from the center circuit portion. The readout data is output later than the output from bank 100d. Bank 100a is located further away with respect to the data input/output terminal than bank 100d. Therefore, the time from the output of an address signal and a command data from the center circuit portion up to the time when the readout data from bank 100a arrives at the data input/output terminal group is later than the time when the readout data from bank 100d arrives at the data input/output terminal. However, the access time to bank 100d is reduced.

Figure 34:
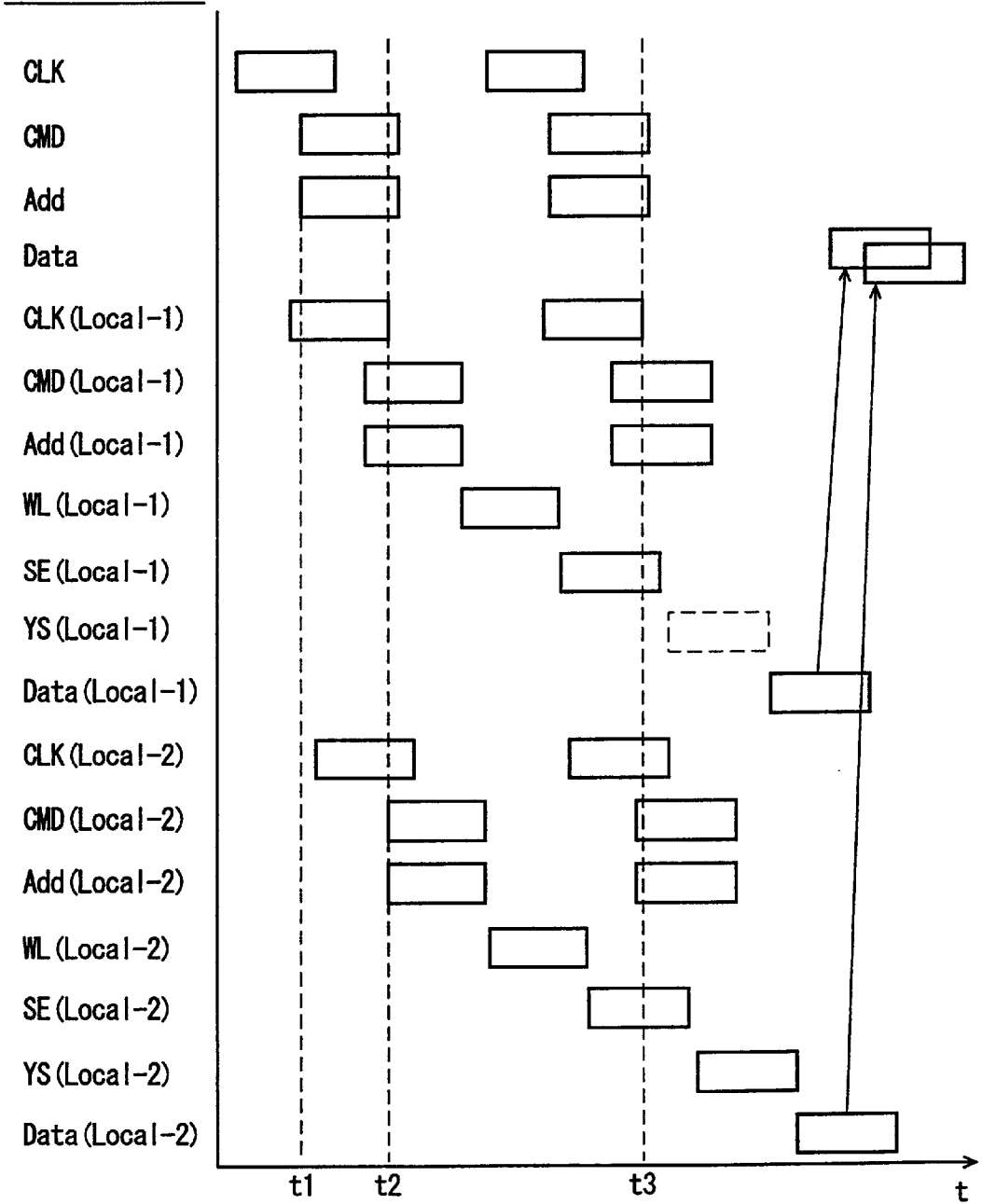
FIGS. 34 and 35 are diagrams for describing a readout operation timing and a write operation timing, respectively.

FIG. 34 is a diagram for describing the readout operation timing. The active period for respective signals is indicated by a rectangle.

In FIG. 34, bank 100d of FIG. 33 is labeled "Local-1" and bank 100a is labeled "Local-2".

At time t1, an external control signal and an address signal are input at the center circuit portion. The time when a clock signal, a control signal, and an address signal is transmitted is later for bank Local-2 than for bank Local-1.

Therefore, the activation time of a word line that is rendered active according to the command signal and the address signal, the activation time of sense amplifier, the activation time of a column select signal, and the time when data is read out are all later for bank Local-2 than for bank Local-1.

Therefore, the readout data from bank Local-1 is output earlier than the readout data from bank Local-2.

Figure 35:
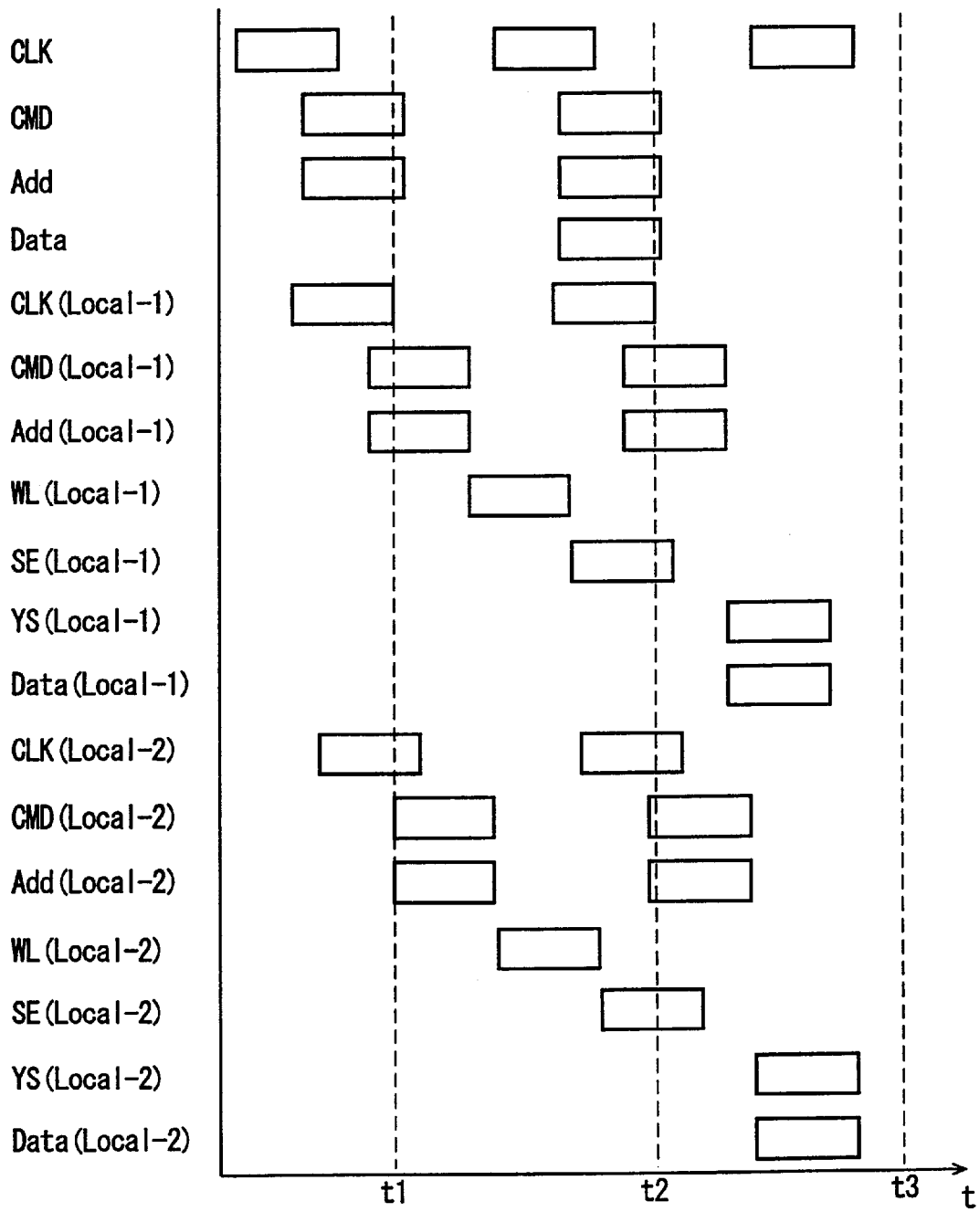

FIG. 35 is a diagram for describing the write operation timing.

Similar to the case of FIG. 28, a write operation has an internal latency. Therefore, operation can be effected corresponding to the delay of the clock regardless of whether the bank is located close or remote from the center circuit area by just transferring the data close to the array to be written in. Also, the phase coherency of the timing of activation of a column select signal and data writing can be maintained by effecting the operation of column select signal corresponding to the internal latency.

Although the present embodiment was described for a phase difference operation according to a delay element provided in the chip, the delay element is not limited to an inverter used therein. For example, a delay element including a resistor component and a capacitor component, or a circuit that detects the charging/discharging time of a capacitor to delay a signal may be employed.

Also, a delay circuit that counts the cycles of a clock can be employed. In this case, a structure that provides control of the delay on the basis of a ½ clock is applied. Furthermore, a structure for delay can be employed that shifts the phase of the clock generated by a clock generation circuit such as a PLL circuit can be employed.

Fourth Embodiment

A structure of a synchronous semiconductor memory device that can operate switching between a SDR-SDRAM operation mode and a DDR-SDRAM operation mode will be described in the fourth embodiment.

Figure 36:
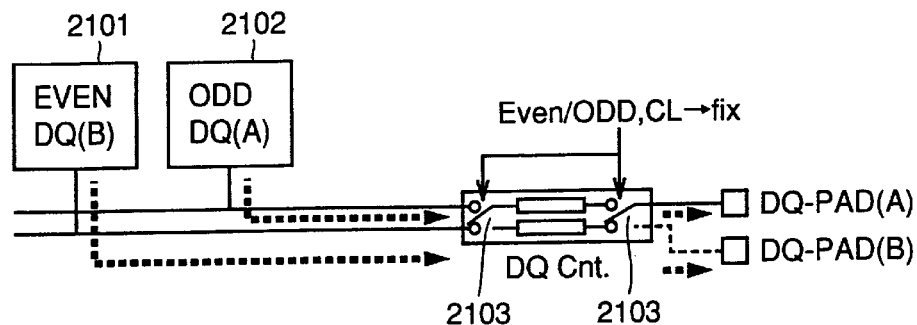
FIGS. 36, 37 and 38 represent the concept of the examples of a first structure, a second structure, and a third structure, respectively, of a synchronous semiconductor memory device that can operate switching between a single data rate and a double data rate.

FIG. 36 represents the concept of a first example of a data output unit of a synchronous semiconductor memory device that is operable switching between a SDR-SDRAM operation mode and a DDR-SDRAM operation mode.

When operating as a DDR-SDRAM, memory array 2101 has data of an even numbered address stored. When operating as a SDR-SDRAM, data is input/output according to a certain data pin DQ (A).

Memory array 2102 has data of an odd numbered address stored when operating as a DDR-SDRAM, and has a data pin DQ (B) assigned differing from data pin DQ (A) corresponding to memory array 101.

Switch circuit 2103 selectively switches the connection between memory arrays 101 and 102 and data input/output pins DQ (A) and DQ (B) under control of the output control circuit when in a DDR-SDRAM operation mode. When in a SDR-SDRAM operation mode, switch circuit 103 has the connection between a data input/output pin and a memory array fixed at a predetermined relationship.

Memory arrays 2101 and 2102 are both accessed by one access, whereby the read out data is held in an output resistor via a data bus. Although the output register is selected so as to output to one external pad by the select circuit when in the DDR-SDRAM operation mode, the output register is fixed to the state to output to respective independent data input/output pads DQ (A) and DQ (B) when in a SDR-SDRAM operation mode.

The above description corresponds to the data output. The same applies for the input unit in which the connection of the DQ pad and the input register with respect to a memory array is switched by a switch circuit in a similar manner.

According to the above-described structure, a synchronous semiconductor memory device that is operable in a DDR-SDRAM operation mode and a SDR-SDRAM operation mode on the same chip with a common structure in the array, data bus, and the input/output unit can be realized.

Figure 37:
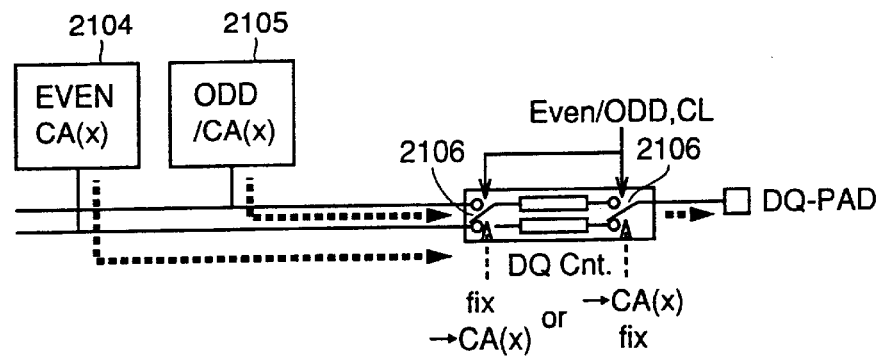

FIG. 37 represents the concept of an other embodiment of the data output unit.

Referring to FIG. 37, memory array 2104 is assigned an uneven numbered address when in a DDR-SDRAM operation mode, and is assigned a certain column address CA (X) in a SDR-SDRAM operation mode.

Memory array 2105 is assigned an odd numbered address in a DDR-SDRAM operation mode, and is assigned a column address /CA (X) in a SDR-SDRAM operation mode. Either memory array 2104 or 2105 is accessed by one read out operation. The read out data is held in the output register via the data bus. Select switch 2106 selects the transmission path depending upon whether the address is an even number or an odd number when in the DDR-SDRAM operation mode. In the SDR-SDRAM operation mode, the path is selected according to column address CA (X).

The above description corresponds to the structure of the data output unit. The same applies for the data input unit provided that the relationship of the memory array with respect to the DQ pad and the input register has an opposite data flow.

According to the above structure, a synchronous semiconductor memory device operable switching between a DDR-SDRAM operation mode and a SDR-SDRAM operation mode on the same chip with a common structure in the array, data bus, and data input/output unit can be implemented.

Figure 38:
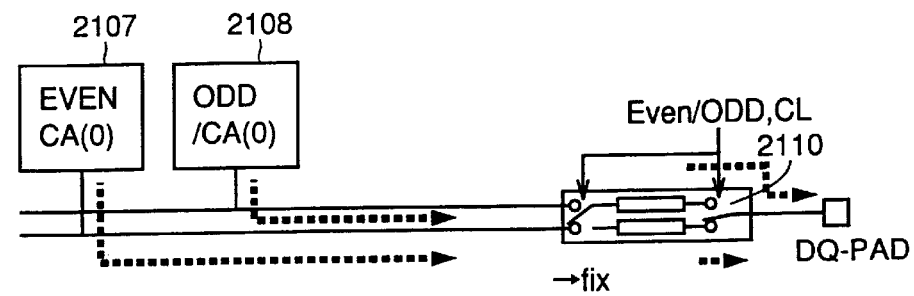

FIG. 38 represents the concept of another structure of the data output unit.

Referring to FIG. 38, memory array 2107 is assigned an even numbered address for both the DDR-SDRAM and SDR-SDRAM operation modes. Memory array 2108 is assigned an odd numbered address for both the DDR-SDRAM and SDR-SDRAM operation modes.

A selector 2110 of the output unit is switched according to the rise and fall of an external clock when in a DDR-SDRAM operation mode, and is switched only at the rise of the external clock when in a SDR-SDRAM operation mode.

By one access operation, both memory arrays 2107 and 2108 are accessed, whereby the data is held in the output register via the data bus.

When in a SDR-SDRAM operation mode, the access to the memory cell is effected once for every two clocks.

The above description corresponds to a structure of the data output unit. The relationship of the memory array with respect to the DQ pad and the input register is analogous to a data input unit, provided that the data flow is opposite.

According to the above structure, a synchronous semiconductor memory device operable switching between a DDR-SDRAM operation mode and a SDR-SDRAM operation mode with a common structure in the array, data bus, and data input/output unit can be implemented on the same chip.

Figure 39:
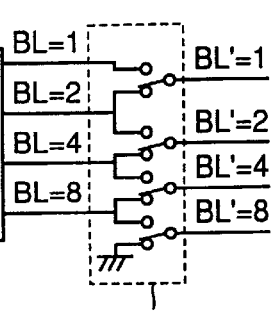
FIG. 39 represents the concept of the structure of switching a mode register signal to set the burst length.

FIG. 39 is a diagram representing the concept of switching the mode register signal to set the burst length.

In a DDR-SDRAM operation mode, input/output of 2 data are carried out at one clock according to the double data rate. Therefore, the internal process of the synchronous semiconductor memory device corresponds to half the burst rate of the DDR-SDRAM operation mode for the burst length of the SDR-SDRAM operation mode.

Therefore, a structure is provided to switch the internal signal indicating the burst length and the decode signal of mode register 2150 by a selector group 2160 shown in FIG. 39 in order to switch between a SDR-SDRAM operation mode and a DDR-SDRAM operation mode with the same chip. In FIG. 39, signal BL is a decode signal of more register 2150 that is directly transmitted to the internal circuit of the synchronous semiconductor memory device in the DDR-SDRAM operation mode.

Signal BL indicates an internal signal in a SDR-SDRAM operation mode.

By the above structure, the difference in the internal signal indicating the burst length between a DDR-SDRAM operation mode and a SDR-SDRAM operation mode can be switched on the same chip with a simple structure.

Figure 40:
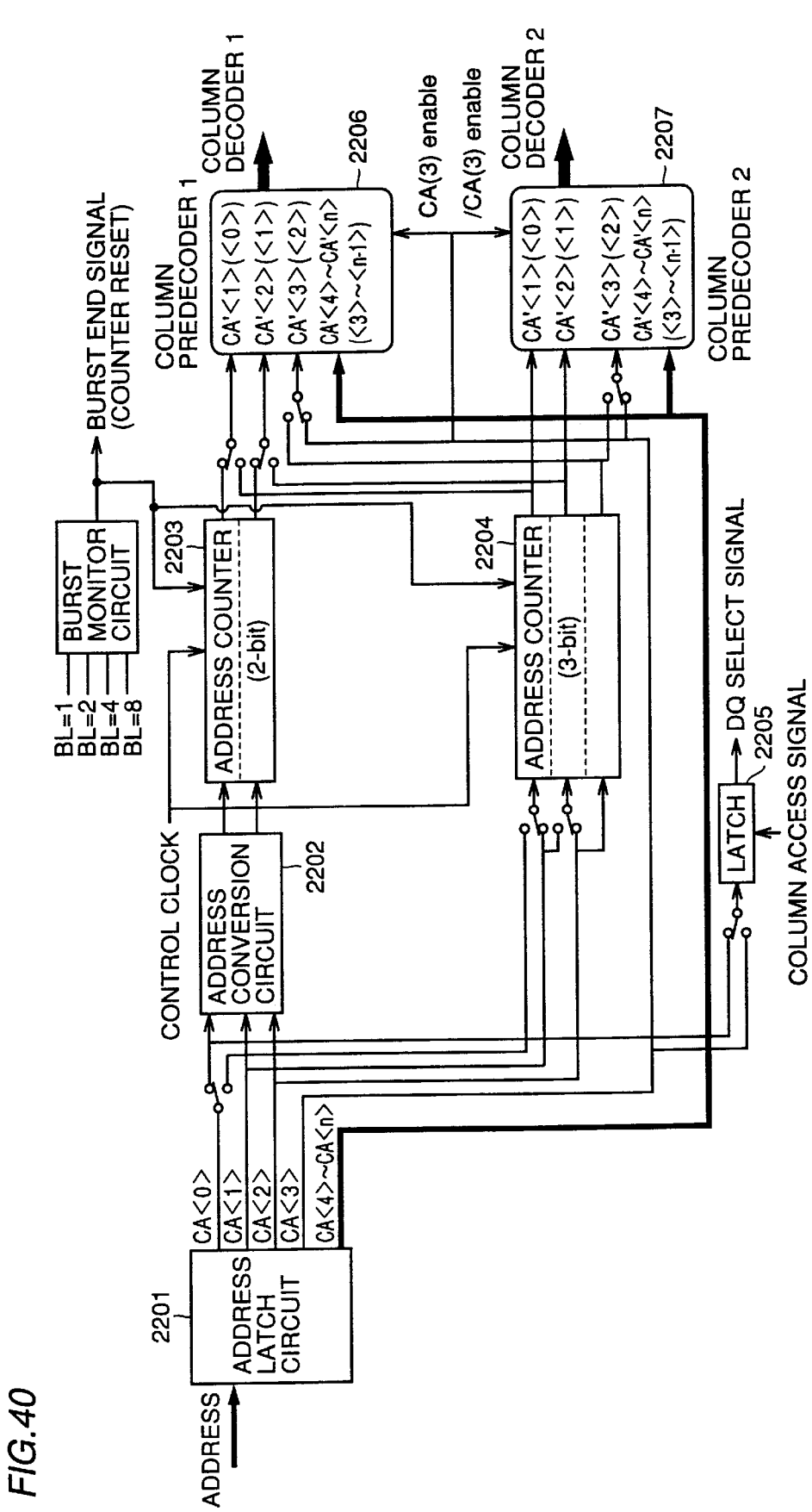
FIG. 40 is a schematic block diagram showing a structure of a column address counter in the synchronous semiconductor memory device based on the concept represented in FIG. 37.

FIG. 40 is a schematic block diagram showing a structure of a column address counter in a synchronous semiconductor memory device based on the concept represented in FIG. 37.

Each switch shown in FIG. 40 implies a selected state in a DDR-SDRAM operation mode.

Referring to FIG. 40, the externally applied address signal held in address latch circuit 2201 is sent except for the least significant one bit to address counter 2203 for the memory array corresponding to an even numbered address and to address counter 2204 for the memory array corresponding to an odd numbered address when in the DDR-SDRAM operation mode.

The address sent to address counter 2203 passes through address conversion circuit 2201 to be subjected to a conversion process according to whether the start address is an even number or an odd number.

The address counter counts the address of two bits according to respective sequential and interleave modes.

The counted address is sent to the predecoder of each memory array. Here, the least significant bit of the column address is retained in latch circuit 2205 to be used in switching the data input/output unit.

When in the SDR-SDRAM operation mode, the latched address are all sent to address counter 2204. Address counter 2204 counts the address. The generated address signal is sent to column predecoders 2206 and 2207. Here, switching between memory arrays 2104 and 2105 shown in FIG. 37 is implemented according to CA (3). Therefore, signal CA (3) serves to control the output to each memory array of the predecode signal.

More specifically, when signal CA (3) is at an H level, the signal is applied to a first column decoder 2206. When signal CA (3) is at an L level, the signal is sent to a second column decoder 2207.

The operation of the memory array is carried out according to the predecode signal. The corresponding memory array will not operate unless the predecode signal is output. Signal CA (3) is held in latch circuit 2205 to be also used for the control of input/output.

Since address counter 2204 is used for both the operation modes of SDR-SDRAM and DDR-SDRAM, a counter corresponding to the number of bits with respect to the specification of the SDR-SDRAM is required.

Here, a 3-bit counter is depicted with the maximum burst length of 8. When the full page mode that accesses all the addresses is to be employed, a counter of a number of bits that can count all the address is required.

In contrast, address counter 2205 is formed of only a 2-bit counter that alters the addresses of the second and third bits since it is used only in the DDR-SDRAM operation mode.

According to the above structure, data is read out from both sides of the memory array corresponding to column decoders 2206 and 2007 when in the double data rate mode.

For example, data is read out from both ends of the array according to an even numbered address and an odd numbered address. When in a DDR-SDRAM operation mode, signal CA (0) is latched as a signal for DQ-selection of the data from the even numbered array and the odd numbered array.

When in a SDR-SDRAM operation mode, signal CA (0) is used as the smallest bit of the burst address. Operation is effected without discrimination between the column decoder corresponding to an even numbered array and the column decoder corresponding to an odd numbered array. Here, a structure is implemented in which only either column decoder operates taking advantage of signal CA3 to select the array since two times the required data will be output in the SDR-SDRAM operation mode.

Signal BL indicating the burst length is applied to the burst monitor circuit. At the end of the cycle corresponding to the burst length, a burst end signal is output, and the address counter reset.

In the DDR-SDRAM operation mode, a burst of 2 bits is effected at the general one clock cycle. Therefore, a signal is issued that is burst at ½ the number of cycles with respect to the SDR mode.

According to the above structure, a synchronous semiconductor memory device including a counting method differing in the row address in the DDR-SDRAM operation mode and the SDR-SDRAM operation mode can be switched on the same chip.

[Detailed Structure of Synchronous Semiconductor Memory Device]

The above description was provided corresponding to the concept represented in FIG. 37. For the sake of further simplification, a structure of a synchronous semiconductor device based on the diagram of FIG. 38 representing a particular concept with respect to FIG. 37 will be described hereinafter.

In other words, description is provided with counter 2204 of FIG. 40 as a 2-bit counter. Although a 3-bit counter is shown in FIG. 40 since the structure corresponds to the usage of a column address CA (3), only a 2-bit counter is required according to the structure of FIG. 38.

More specifically, a structure corresponding to address latch circuit 2001, address conversion circuit 2002, address counters 2203, and 2204, and column predecoders 2206 and 2207 shown in FIG. 40 will be described in further detail.

Figure 41:
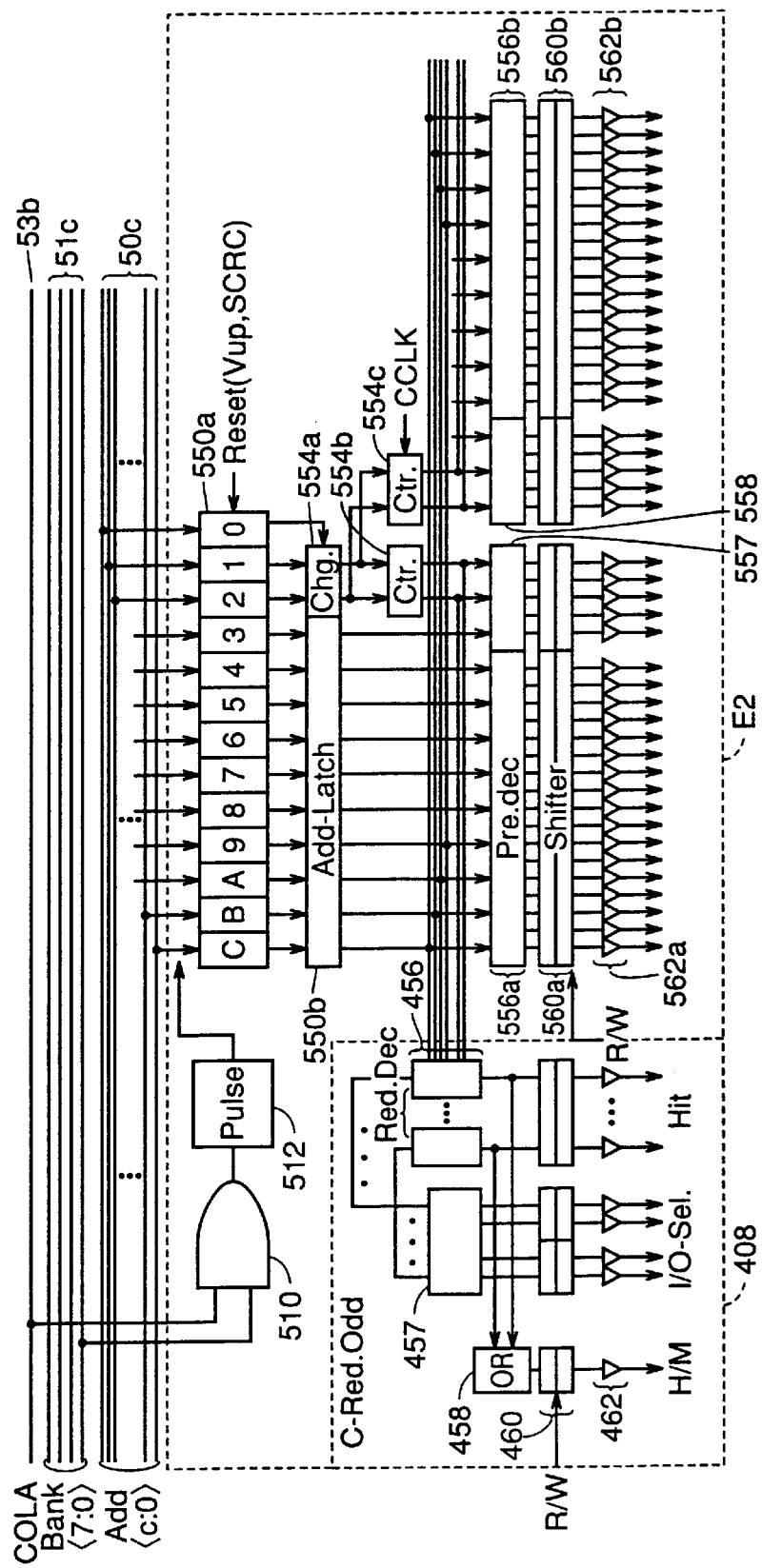
FIG. 41 is a schematic block diagram showing a structure of a column related local control circuit including the control system of the redundancy circuitry.

FIG. 41 is a schematic block diagram showing the structure of the column related local control circuit including the control system of the redundancy circuitry in synchronous semiconductor memory device 2000 of the second embodiment shown in FIG. 18.

Referring to FIG. 41, an address processor E2 is a circuit to control the column select operation for a region 100*a*1 corresponding to an even numbered address and a region 100*a*2 corresponding to an odd numbered address. A redundancy determination unit 408 is a circuit to control the column determination operation with respect to a redundant region SR1.

Redundant region SR1 allows redundancy replacement for both regions 100*a*0 and 100*a*1 corresponding to an even numbered address.

Address processor E2 includes an AND circuit 510 receiving an access signal COLA of a column and a bank address signal, a pulse generation circuit 512 receiving the output of AND circuit 510 to generate a one shot pulse, a first order latch circuit 550*a* receiving the 13-bit address Add (C:0) transmitted from the center through address bus 50*c* according to the output of pulse generation circuit 512, a latch circuit 550*a* for latching a column address output from first order latch circuit 550*a*, an address conversion circuit 554*a* converting the less significant 3 bits of first order latch circuit 550*a* according to the operation condition, counters 554*b* and 554*c* (corresponding to burst address counter 1060) receiving the output of address conversion circuit 554*a* to count for a burst operation in synchronization with a clock signal CCLK, predecoders 556*a*, 556*b*, 557 and 558 receiving the outputs of latch circuit 550*b* and counters 554*b* and 554*c*, shifters 560*a* and 560*b* for delaying the outputs of predecoders 556*a*, 556*b*, 557 and 558, drivers 562*a* and 562*b* for providing the outputs of shifters 560*a* and 560*b* into a memory array, and a redundancy determination unit 408 receiving the address signal latched in latch circuit 550*b* to carry out redundancy determination.

Signal CCLK is an inverted version of internal clock signal int.CLK. Counters 554*b* and 554*c* carry out a count-up operation during the inactivation period of internal clock signal int.CLK.

The structure of predecoders 556*a* and 556*b*, shifters 560*a* and 560*b*, and drivers 562*a* and 562*b* in FIG. 41 correspond to the output of a column select signal corresponding to odd numbered address region 100*a*2 to a predecode line.

Although only redundancy determination unit 408 corresponding to an even numbered address region is depicted in FIG. 41, a structure similar to redundancy determination unit 408 is provided for odd numbered address region 100*a*2.

Redundancy determination unit 408 includes a redundancy determination circuit 456, an input/output select circuit 457 and an OR circuit 458 receiving the output of redundancy determination circuit 456, a shifter 460 delaying the outputs of redundancy determination circuit 456, input/output select circuit 457 and OR circuit 458, and a driver 462 for providing the output of shifter 460 into a memory array.

The operation will be briefly described here.

An address signal sent from the center portion of SDRAM 1010 is input as a column address to first order latch circuit 550*a* according to the output of pulse generation circuit 512 on the basis of access signal COLA and the bank address.

First order latch circuit 550*a* is reset by a signal SCRC after a column address is sent to latch circuit 550*b* and address conversion circuit 554*a*. First order latch circuit 550*a* is reset by a signal Vup that is generated only at the time of power on.

The less significant three bits of the column address relate to the process for a burst operation, and are input to the counter subsequent to an address conversion process.

In practice, the least significant address is common since the even numbered address and the odd numbered address are processed at the same time. The two bits in the less significant three bits are subjected to a counter process.

This result is transmitted to each predecoder in the odd numbered and even numbered address regions of the bank in the memory array. When the column address is applied to the redundancy determination circuit for replacement with a redundant memory column, the signal output from OR circuit 458 attains an active state. In response, the output from driver circuit 462 that is delayed for a predetermined time is recognized as a hit signal Hit that designates replacement of a redundant memory column. Replacement with a redundant memory column is not effected when signal Hit is inactive. In this case, conversion to a redundant column is referred to as a "miss". Therefore, the signal output from driver circuit 462 is generically referred to as a hit/miss signal (referred to as "H/M signal" hereinafter).

The determination result of the plurality of redundancy determination circuits provided corresponding to even numbered address unit 408 is subjected to an OR process by OR circuit 458 to be recognized as a determination result of whether any redundancy replacement is effected or not.

An input/output select signal I/O-Sel. that is output from input/output select circuit 457 via the shifter and the driver indicates to which global I/bus G-I/O the data read out by main I/O line pair RM-I/O belonging to redundant region SR1 is to be output.

Figure 42:
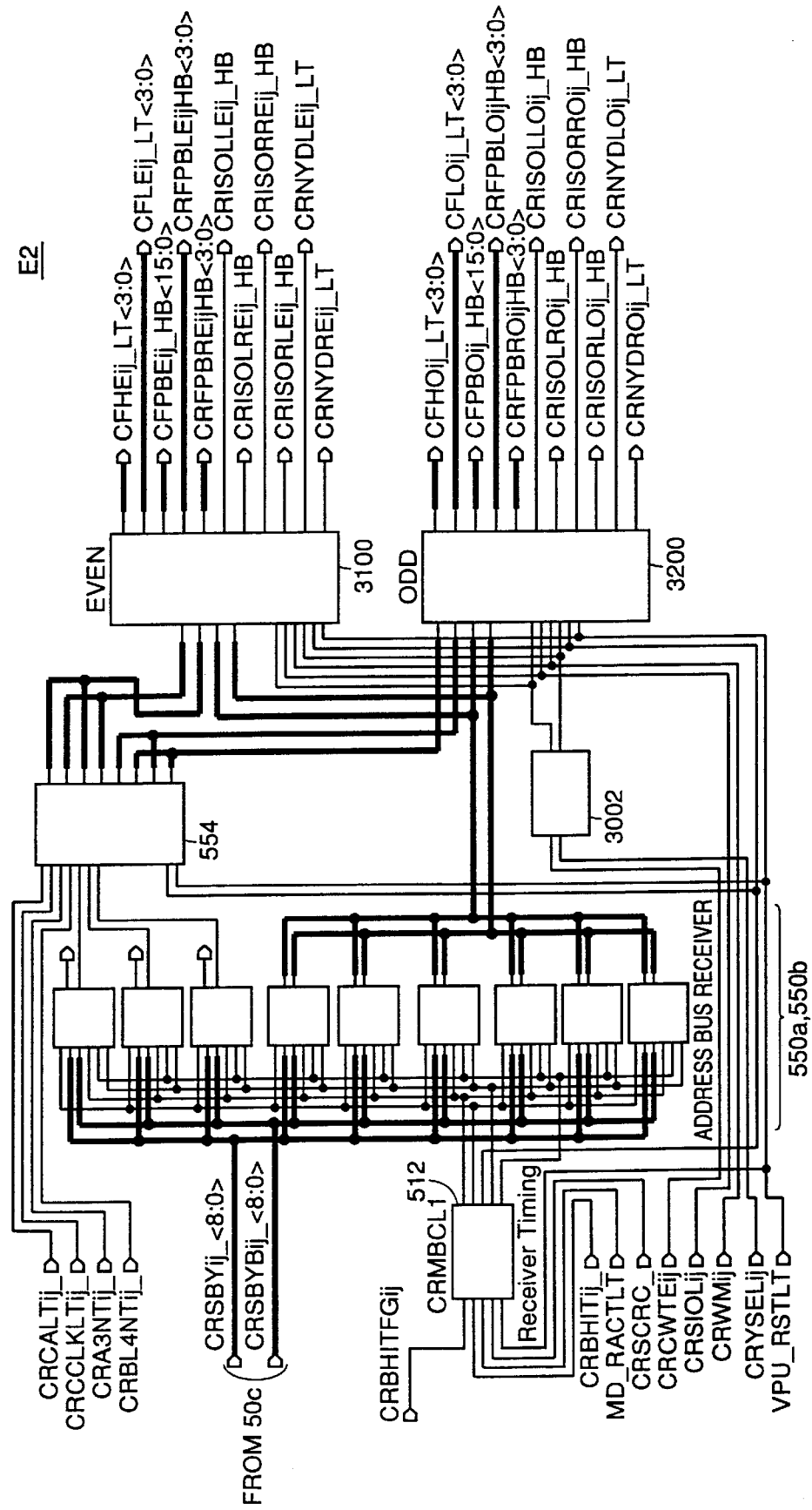
FIG. 42 is a schematic block diagram showing a structure of an address processor E2.

FIG. 42 is a block diagram showing a structure of address processor E2. Various signals in FIG. 42 are set forth in the following.

Signal CRCALTij is the first pulse signal generated when a bank is rendered active.

Signal CRCCLKLTij is a burst and pulse signal indicating the end of a burst operation. Signal CRA3NTij indicates whether the operation mode is a sequential mode or an interleave mode. The sequential mode and the interleave mode are specified by an L level and an H level, respectively.

Signal CRBL4NTij specifies the burst length. A burst length of 4 and 8 is specified at the L level and an H level, respectively.

Signal CRSBYij (8:0) is an address signal transmitted through a signal bus. Signal CRSBYBij (8:0) is a complementary signal of the address signal transmitted through the address bus.

Signal CRBHITFGij is a bank select flag that is rendered active during activation of the bank. Signal CRBHITij is a bank hit signal indicating that the bank is selected.

Signal MD-RACTLT renders the address receiver inactive during the activation period of row address strobe signal RAS. Signal CRSCRC renders the operation mode of the hierarchical power supply active. Signal CRCWTEij designates the write operation. Signal CRSIOLij is a clock signal to control the shift operation of shift register 560a in a write operation.

Signal CRWMij designates a write mask operation. Signal CRYSELij designates the timing of column select signal Ysel. signal VPU-RSTLT is a power up reset signal. Signal CFHkij is a high order address signal subsequent to predecoding. Signal CFLkij is a middle order address signal subsequent to predecoding. Signal CFPPBkij is a lower order address signal subjected to predecoding controlled by the column select timing. Signal CRFPBLkij is a redundancy decode signal for the left memory cell block. Signal CRFPBRkij is a redundancy decode signal for the right memory cell block. The redundancy decode signal is generically referred to as signal CRFPB hereinafter.

Signal CRISOLLkij is a select signal to connect the left redundancy decoder and the global I/O line pair of the left block. Signal CRISOLRkij is a select signal to connect the left redundancy decoder and the global I/O line pair G-I/O of the right block. Signal CRISORLkij is a select signal to connect the right redundancy decoder and the global I/O line pair G-I/O of the left block. Signal CRISORRkij is the select signal to connect the right redundancy decoder and the global I/O line pair G-I/O of the right block.

Signal CRNYDLkij renders the left block inactive when the redundant column is selected. Signal CRNYDLkij renders the right block inactive when the redundant column is selected.

Referring to FIG. 42, address receiver and latch circuits 550a and 550b receive the signal from address bus 50c to carry out an input operation of an address signal according to the signal from a receiver timing control circuit 512. Receiver operation timing control circuit 512 provides control of the operation of the address receiver according to signal CRBHITFGij, i.e. bank select flag, signal CRBHITij, i.e., bank hit signal, signal MD-RACTLT and CRSCRC-HT, and signal VPU-RSTLT.

Address conversion and burst address counter circuit 554 receives the lower order address bits of CRSBYij (0)–(2) out of the column address signal to carry out address conversion and generation of a burst address according to the sequential or interleave operation mode specified by signal CRA3NTij.

Command buffer 3002 receives signal CRCWTEij to designate a write operation and signal CRWMij to designate a write mask operation to control the operation of a corresponding predecoder.

Predecode signal generation circuit 3200 provided corresponding to an even numbered region includes predecoders 556a and 557, shifter 560a driver circuit 562a and redundancy determination unit 408.

Predecode signal generation circuit 3100 generates signals CFHEij, CFLEij and CFPBEij at a predetermined timing according to whether in a write operation or a read operation. When the redundant column is selected, signals CRFPBLEij and CRFPBREij are output to render the corresponding redundant column active.

Predecode signal generation circuit 3100 provides signal CRISOLLEij and the like according to the location of the memory cell column to be replaced with the selected redundant column. When a redundant column is selected, signal CRNYDLEij or CRNYDREij is rendered active to drive active the main amplifier at the end of the replaced memory block.

Predecode signal generation circuit 3200 corresponding to the odd numbered address region has a similar structure.

Figure 43:
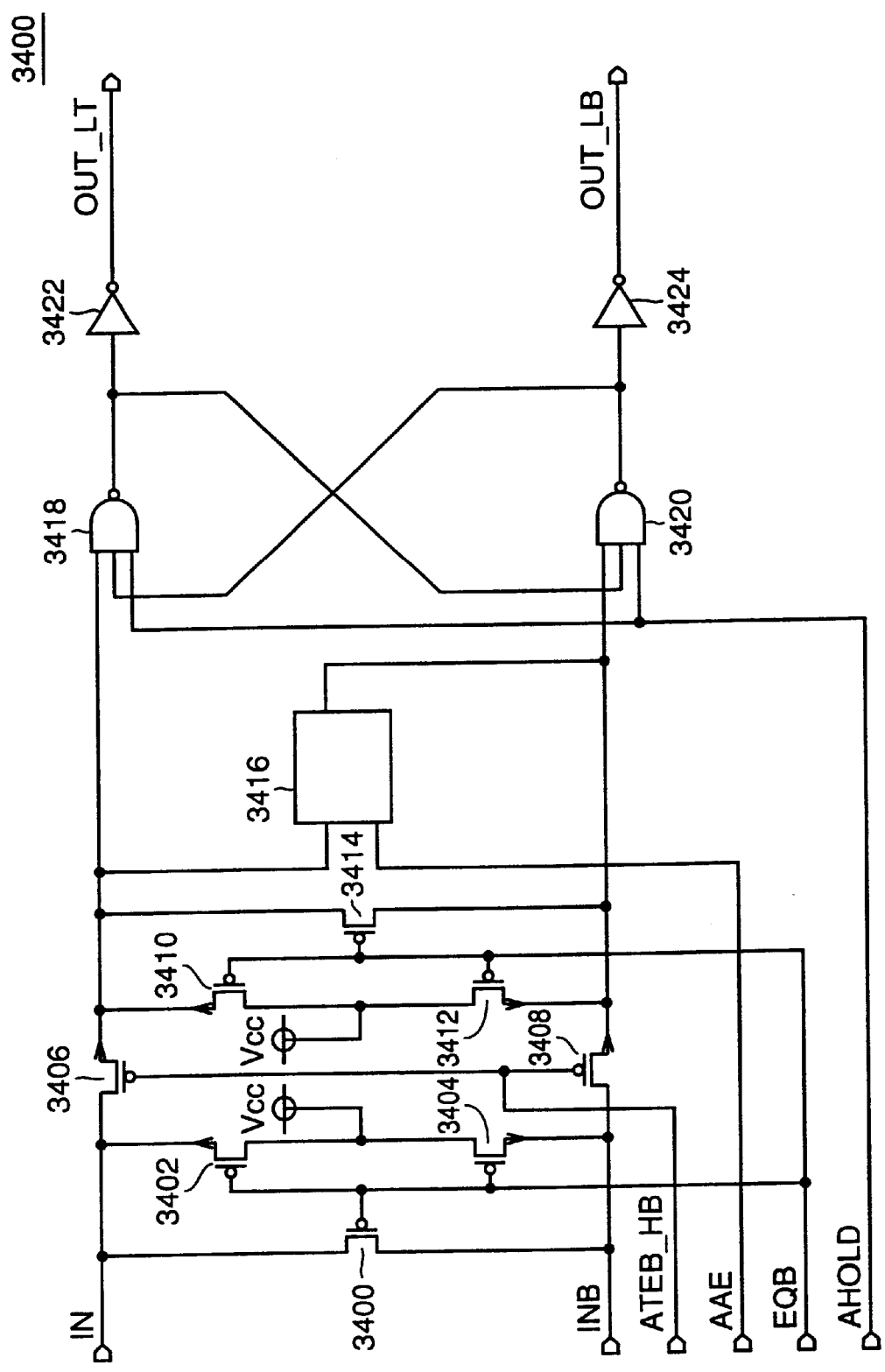
FIG. 43 is a circuit diagram showing a structure of an address receiver and a latch circuit.

FIG. 43 is a circuit diagram showing a structure of the address receiver and latch circuit shown in FIG. 42.

Address receiver and latch circuit 3400 includes an amplifier circuit 3416, a p channel MOS transistor 3406 under control of signal ATEB to open/close the connection with an input signal IN (for example, signal CRSBYij (0)) from the address bus to the amplifier circuit, and a p channel MOS transistor 3408 for opening/closing the connection between the inverted input of amplifier 3416 and the complementary input signal ILB (for example, signal CRSBYBij (0)) from the address bus under control of signal ATEB. Here, signal ATEB is rendered active according to activation of the bank.

Receiver and latch circuit 3400 further includes a p channel MOS transistor 3400 under control of equalize signal EQB, connected between an input node IN and a node INB, and receiving signal EQB at its gate to carry out equalization between p channel MOS transistors 3406 and 3408 and the address bus 50c side, and P channel MOS transistors 3402 and 3404 connected in series between input node IN and node INB, and having its gate controlled by signal EQB. The connection node between transistors 3402 and 3404 is supplied with power supply potential Vcc.

Receiver and latch circuit 3400 further includes p channel MOS transistors 3414, 3410 and 3412 provided between p channel MOS transistors 3406 and 3408 and amplifier 3416 for equalization. Transistors 3414, 3410 and 3412 carry out operations corresponding to p channel MOS transistors 3400, 3402 and 3404, respectively.

Receiver and latch circuit 3400 further includes a NAND circuit 3418 connected to the input node of amplifier circuit 3416 and a first input node, and having the second input node receiving signal AHOLD, a NAND circuit 3420 having its first input node connected to the complementary input node of amplifier 3412, its second input node receiving signal AHOLD, and a third input node connected to the output node of NAND circuit 3418, an inverter 3422 receiving the output of NAND circuit 3418 to output the output signal OUT-LT of receiver and latch circuit 3400, and an inverter 3424 receiving the output of NAND circuit 3420 to output a complementary output OUT-LB of receiver and latch circuit 3400.

NAND circuit 3420 has its output node connected to the third input node of NAND circuit 3418. A latch circuit is formed of NAND circuits 3418 and 3420.

Signal AHOLD serves to render the operation of this latch circuit active.

Figure 44:
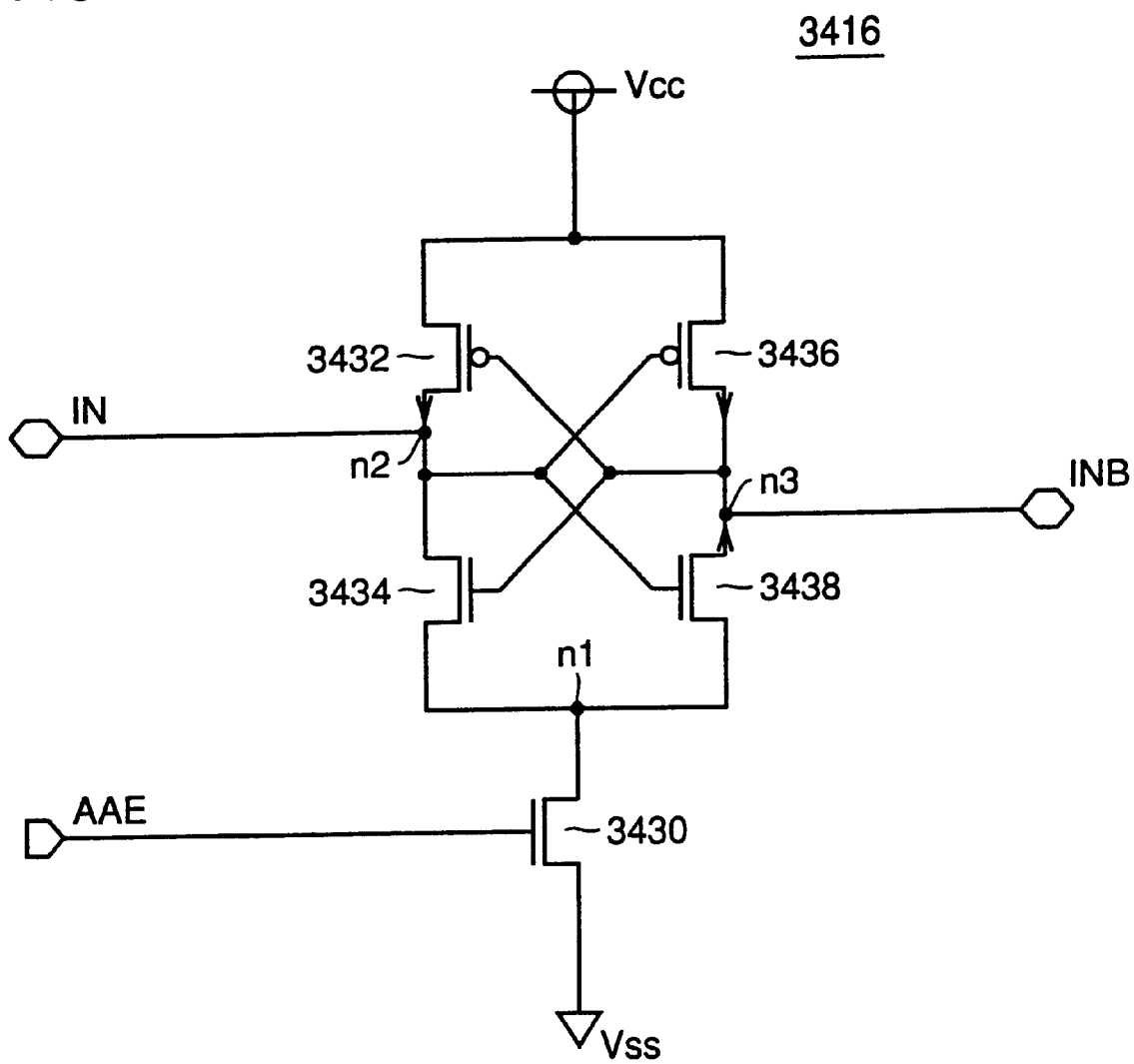
FIG. 44 is a circuit diagram showing a structure of an amplifier circuit 3416.

FIG. 44 is a circuit diagram for describing the structure of amplifier circuit 3416 of FIG. 43.

Amplifier circuit 3416 includes an n channel MOS transistor 3430 connected between an internal node n1 and ground potential GND to receive a signal AAE to render amplifier circuit 3416 active, a p channel MOS transistor 3432 and an n channel MOS transistor 3434 connected in series between node n1 and power supply potential Vcc, and a p channel MOS transistor 3436 and an n channel MOS transistor 3436 connected in series between power supply potential Vcc and node n1 via connection node n3. P channel MOS transistor 3432 and n channel MOS transistor 3434 have their gates connected to the connection node of p channel MOS transistor 3436 and n channel MOS transistor 3438. P channel MOS transistor 3436 and n channel MOS transistor 3438 have their gates connected to connection node n2 of p channel MOS transistor 3432 and n channel MOS transistor 3434.

Node n2 is the input node of amplifier 3416. Node n3 is the complementary input node of amplifier 3416.

Figure 45:
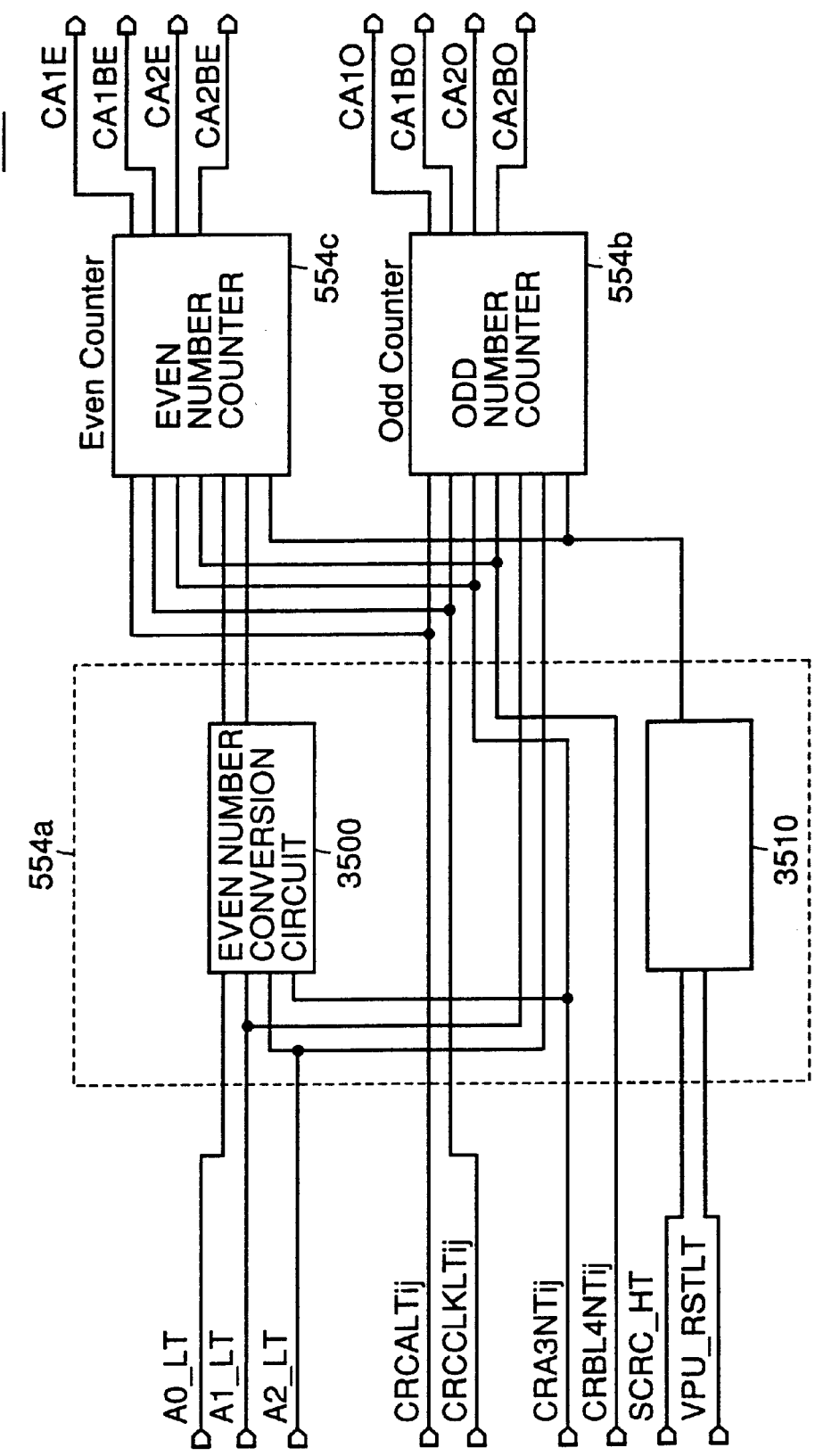
FIG. 45 is a schematic block diagram showing a structure of an address conversion and burst counter circuit 554.
Figure 52:
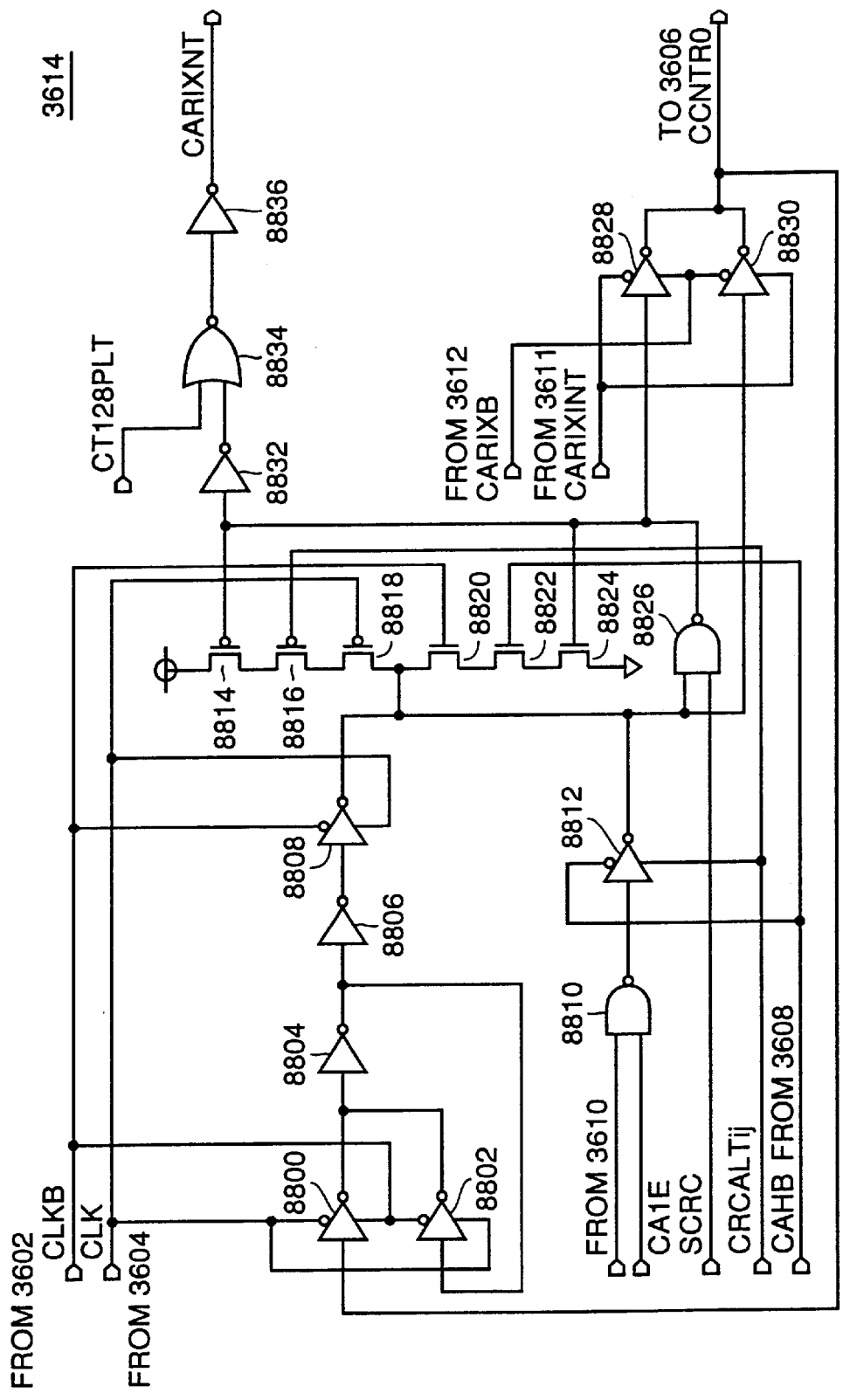
FIG. 52 is a circuit diagram showing a structure of a first bit counter 3614.

FIG. 45 is a schematic block diagram of address conversion and burst counter circuit 554 from the structure shown in FIG. 52.

Address conversion and burst counter circuit 554 includes an address conversion circuit 554a, an even numbered address counter 554c and an odd numbered address counter 554b.

Address conversion circuit 554a includes an even numbered address conversion circuit 3500 and a reset signal generation circuit 3510.

Even numbered address conversion circuit 3500 receives lower order address signals CA0, CA1 and CA2 from receiver and latch circuit 3400 to carry out address conversion according to the operation mode in response to signal CRA3NTij. Reset signal generation circuit 3510 receives signals SCRC and VPU-RST to generate a reset signal for even number and odd numbered address counters 554c and 554b.

Even numbered address counter 554c receives the output from even numbered address conversion circuit 3500, and signals CRCALTij, CRCCLALTij, CRA3NTij and CRBL4NTij to generate signals CA1E and CA1BE of the first bit of the select signal for the column address signal with respect to an even numbered address region and signals CA2U and CA2BE of the second bit of the address select signal.

Signals CA1E and CA1BE are signals complementary to each other. Signals CA2E and CA2BE are signals complementary to each other.

Odd numbered address counter 554b carries out an operation basically similar to that of even numbered address counter 554c.

Figure 46:
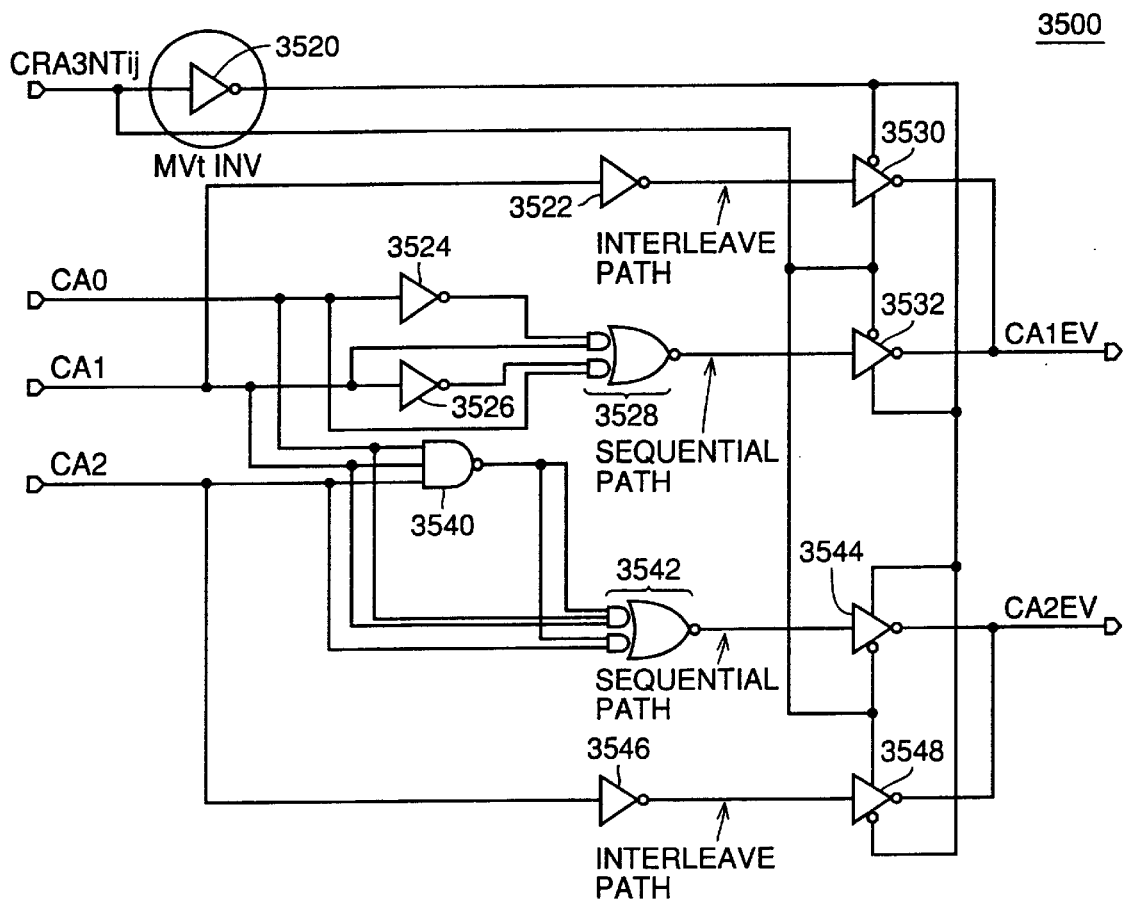
FIG. 46 is a circuit diagram for describing a structure of an even numbered address conversion circuit 3500.

FIG. 46 is a circuit diagram for describing the structure of even numbered address conversion circuit 3500 of FIG. 45.

Even numbered address conversion circuit 3500 includes an inverter 3520 receiving signal CRA3NTij, an inverter 3522 receiving signal CA1, a clocked inverter 3530 receiving the output of inverter 3522 to be rendered active by signal CRA3NTij and the output of inverter 3520 to output signal CA1E, an inverter 3524 receiving signal CA0, an inverter 3526 receiving signal CA1, a logic gate 3528 for providing the NOR result of the logical product between signal CA1 and inverter 3524 and the logical product between signal CA0 and the output of inverter 3526, and a clocked inverter 3532 receiving the output of logic gate 3528, responsive to signal CRA3NTij and the output of inverter 3520 and rendered active complementary to clocked inverter 3530 to output signal CA1E. An interleave operation is specified when signal CAE1 is output from clocked inverter 3530 and a sequential operation is specified when signal CAE1 is output from clocked inverter 3532.

Even numbered address conversion circuit 3500 further includes a 3-input NAND circuit 3540 receiving signals CA0, CA1 and CA2, a logic gate 3542 providing the NOR result of the logical product of signals CA0 and CA1 and the output of NAND circuit 3540 and the logical product of signal CA2 and NAND circuit 3540, a clocked inverter 3544 rendered active in response to signal CRA3NTij and the output of inverter 3520 to receive the output of logic gate 3542 to output signal CA2E, an inverter 3546 receiving and inverting signal CA2, and a clocked inverter 3548 receiving the output of inverter 3546, and responsive to signal CRA3NTij and the output of inverter 3520 to operate in a complementary manner with respect to clocked inverter 3544 to output signal CA2E.

Signal CA2 is output from clocked inverter 3544 when in a sequential operation mode. Signal CA2 is output from clocked inverter 3548 when in an interleave operation.

The circuits other than inverter 3520 operate by a hierarchical power supply structure and enters an operation mode that reduces the leakage current in a standby operation. The threshold values of the transistors forming inverter 3520 are set to a value that reduces the leakage current sufficiently (represented as MVth hereinafter).

Figure 47:
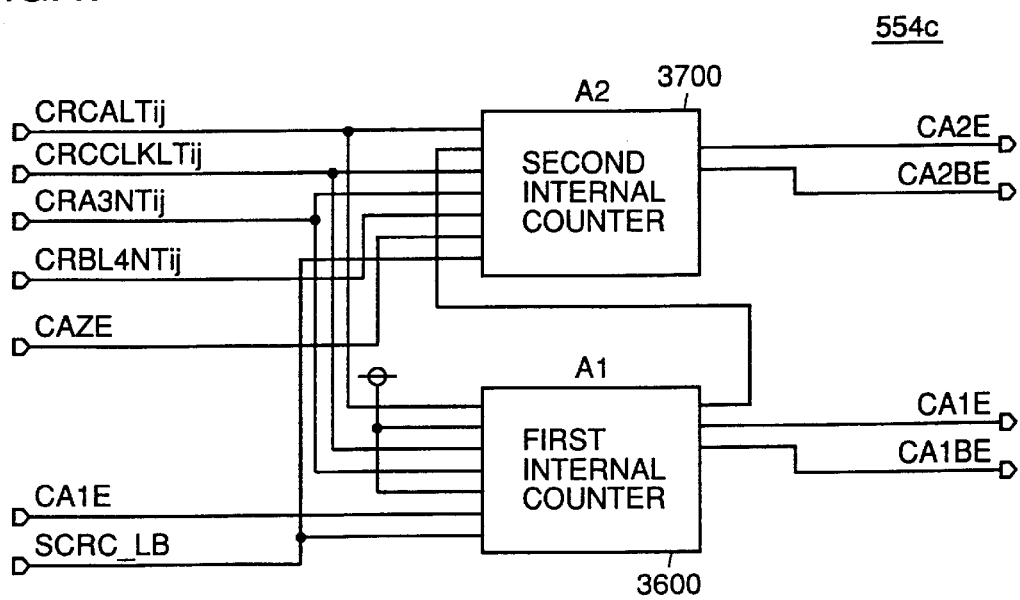
FIG. 47 is a schematic block diagram for describing a structure of an even number counter 554c.

FIG. 47 is a schematic block diagram for describing a structure of even number counter 554c of FIG. 45.

Even numbered address counter 554c includes a first internal counter 3600 and a second internal counter 3700. First internal counter 3600 receives signal CAIE from even numbered address conversion circuit 3500 and provides signals CA1E and CA1BE according to signals CRCALTij, CRCCLKLTij and CRA3NTij . Second internal counter 3700 receives signal CA2E from even numbered address conversion circuit 3500 to generate signals CA2E and CA2BE according to signals CRCALTij, CRCCLKLTij, CRA3NTij and CRBL4NTij.

Figure 48:
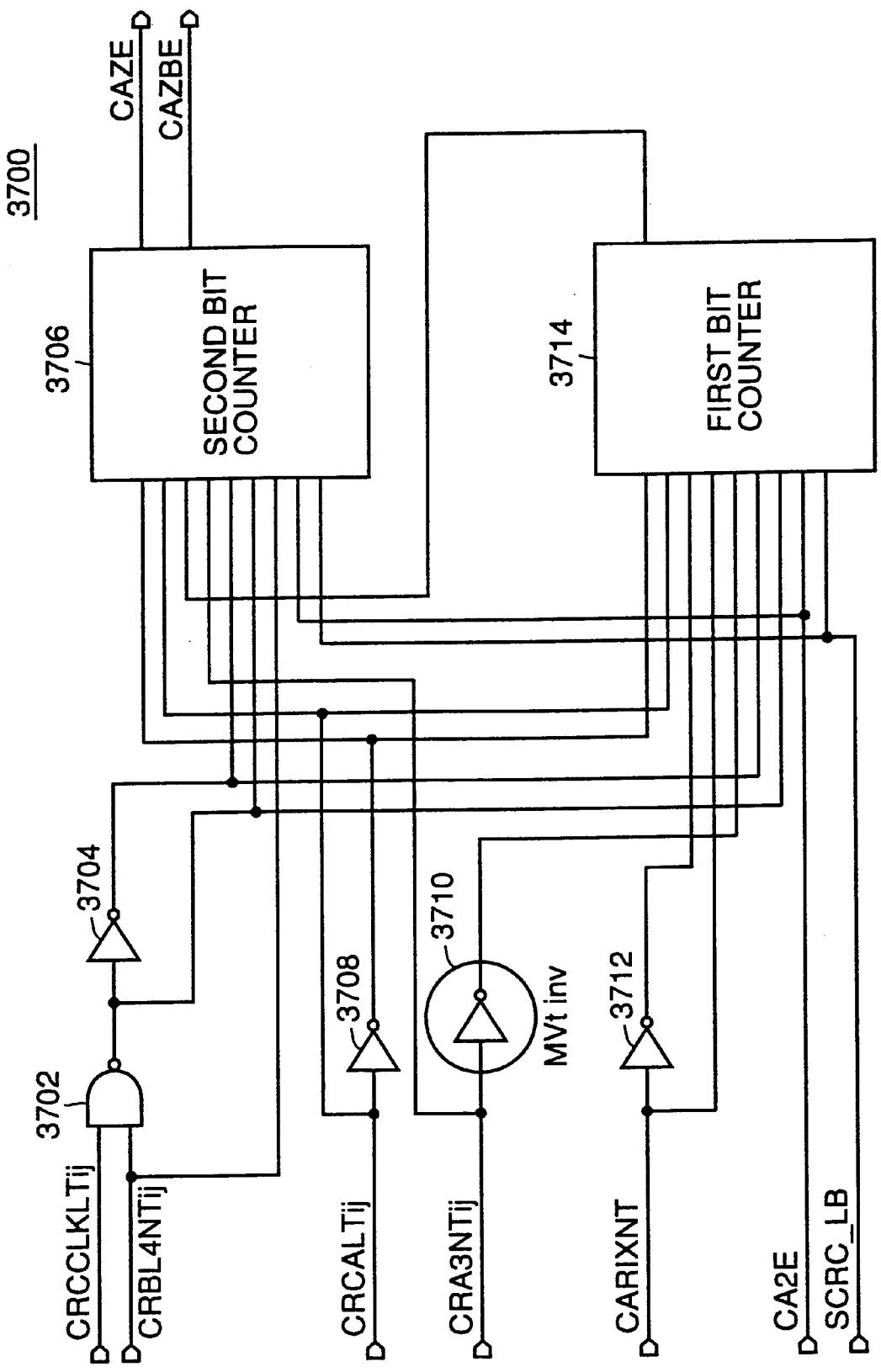
FIG. 48 is a schematic block diagram showing a structure of a second internal counter 3700.

FIG. 48 is a schematic block diagram showing a structure of second internal counter 3700 of FIG. 47.

Second internal counter 3700 includes a NAND circuit 3702 receiving signals CRCCLKLTij, and CRBL4NTij, an inverter 3704 receiving the output of NAND circuit 3702, an inverter 3708 receiving signal CRCALTij, an inverter 3710 receiving signal CRA3NTij, an inverter 3712 receiving signal CARIXNT from first internal counter 3600, a first bit counter 3714 receiving the signal CA2E, the output of NAND circuit 3702, the output of inverter 3704, signal CRCALTij and the output of inverter 3708, the output of inverter 3710, and signal CARIXNT and the output of inverter 3712 for operation, and a second bit counter 3702 receiving the output of bit counter 3714 to output signals CA2E and CA2BE according to the levels of the output of NAND circuit 3702, the output of inverter 3704, signal CRCALTij, the output of inverter 3708.

Figure 49:
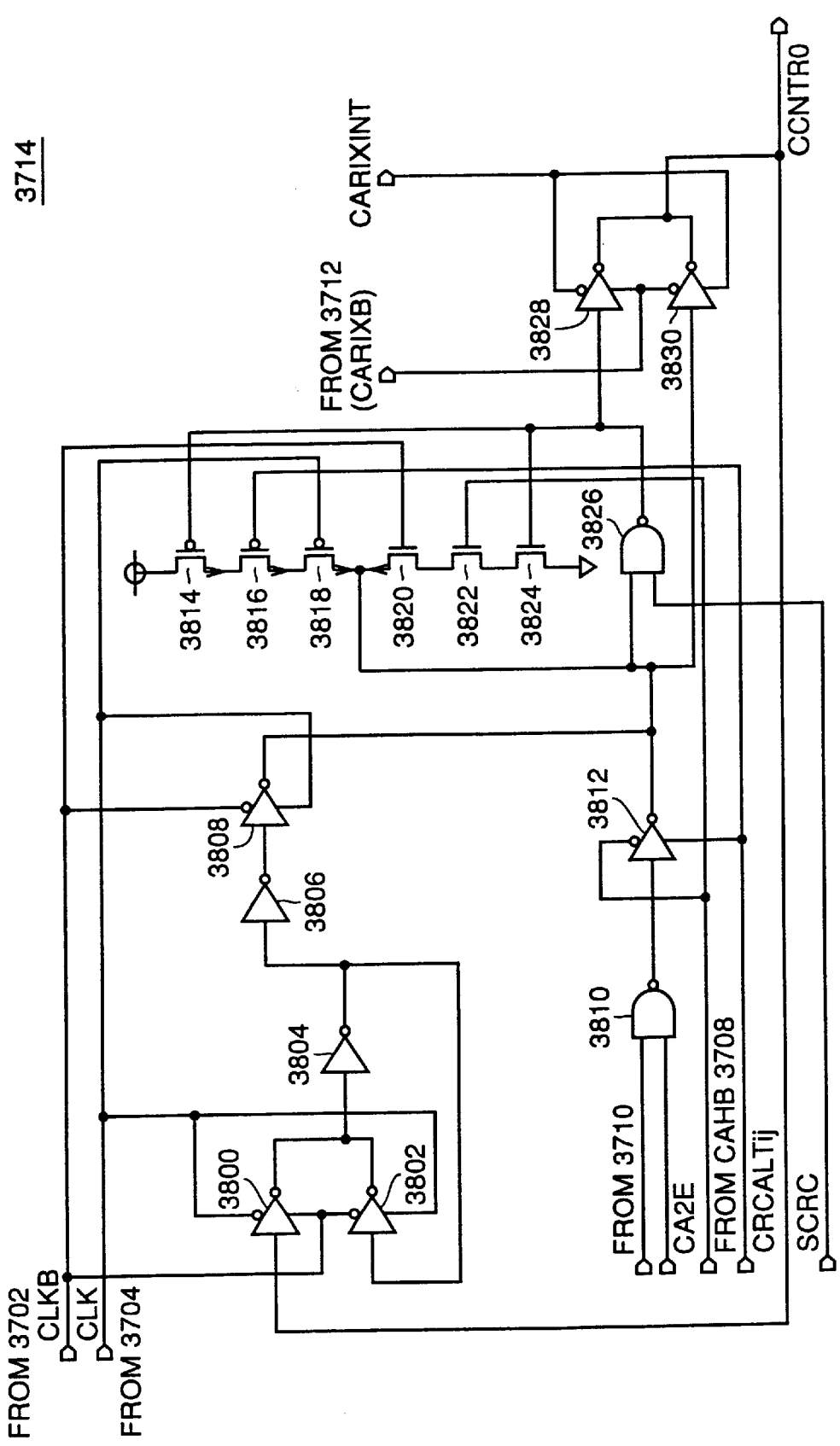
FIG. 49 is a circuit diagram showing a structure of a first bit counter 3714.

FIG. 49 is a circuit diagram showing a structure of first bit counter 3714 of FIG. 48.

First bit counter 3714 includes a clocked inverter 3800 operating according to output signal CLKB from NAND circuit 3702 and signal CLK from inverter 3704, receiving the output signal of first bit counter 3714 as an input, a clocked inverter 3802 that operates complementary to clocked inverter 3800 according to signals CLKB and CLK, and an inverter 3804 receiving the outputs of clocked inverters 3800 and 3802. Inverter 3804 has its output connected to the input node of clocked inverter 3802. First bit counter 3714 further includes an inverter 3806 for receiving and inverting the output of inverter 3804, a clocked inverter 3808 receiving the output of inverter 3806 and operating according to signals CLKB and CLK, a NAND circuit 3810 receiving the output of inverter 3710 and signal CA2E, a clocked inverter 3812 operating according to the output from inverter 3708 and signal CRCALTij to receive and invert the output of NAND circuit 3810, and a NAND circuit 3826 receiving the outputs of clocked inverters 3808 and 3812 at one input node and signal SCRC at the other input node.

First bit counter 3714 further includes p channel MOS transistors 3814, 3816 and 3818 connected in series between power supply potential Vcc and ground potential GND, and n channel MOS transistors 3820, 3822 and 3824. P channel MOS transistor 3814 and n channel MOS transistor 3824 receive the output of NAND circuit 3826 at their gates. P channel MOS transistors 3816 and 3818 receive signals CRCALTij and CLK, respectively, at their gates. N channel MOS transistors 3820 and 3822 receives signal CLKB and the output of inverter 3708, respectively, at their gates.

First bit counter 3714 further includes a clocked inverter 3828 receiving the output of NAND circuit 3826 to operate according to the output of inverter 3712 and signal CARIXINT, and a clocked inverter 3830 receiving the output of inverter 3812 to operate complementary to clocked inverter 3828 according to the output from inverter 3712 and signal CARIXINT. The outputs of clocked inverters 3828 and 3830 are output as signal CCNTR0 from first bit counter 3714.

Figure 50:
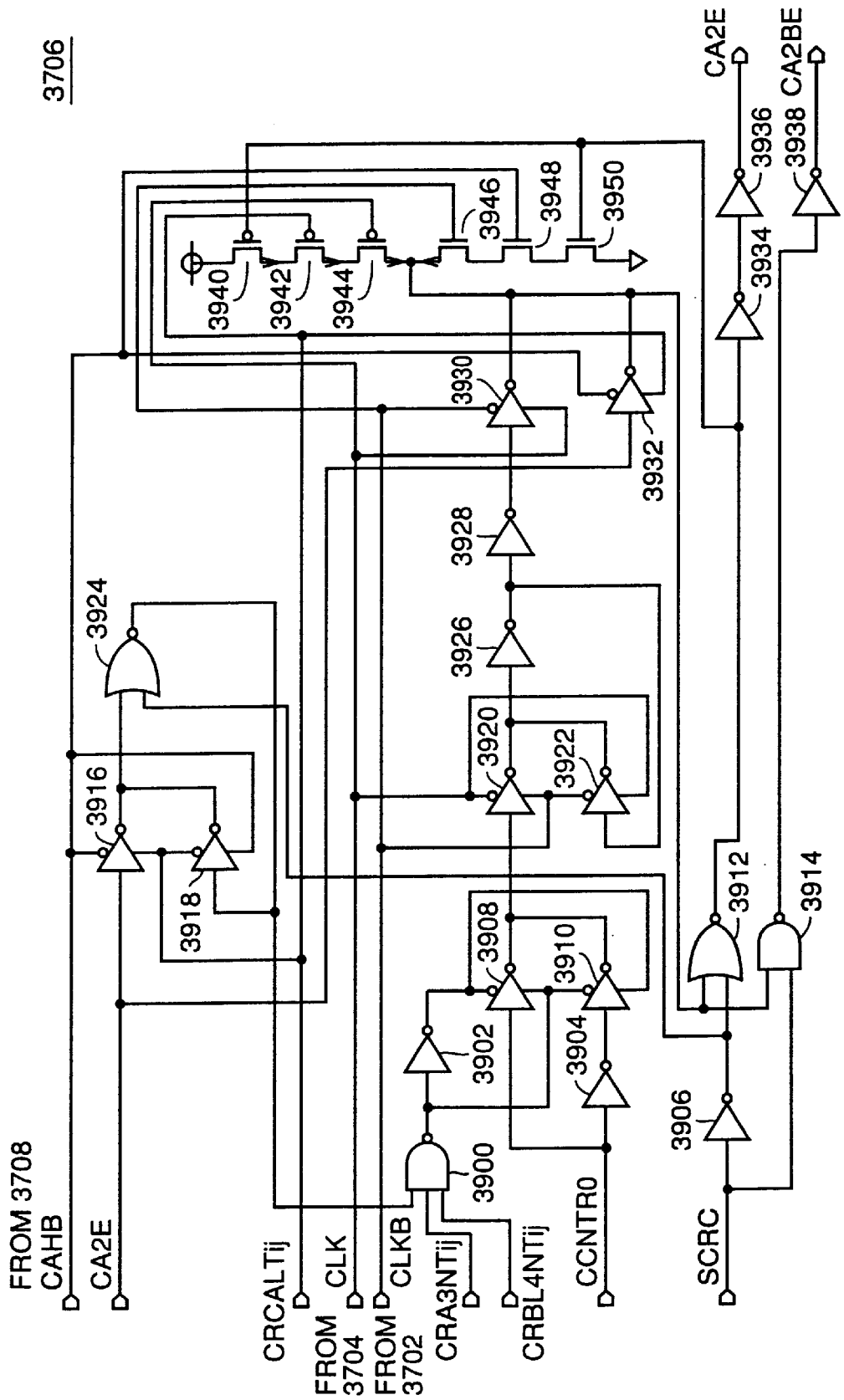
FIG. 50 is a circuit diagram showing a structure of a second bit counter 3706.

FIG. 50 is a schematic block diagram showing a structure of second bit counter 3706 of FIG. 48.

Second bit counter 3706 includes a NAND circuit 3900 receiving signal CRA3NTij at its first input node and signal CRBL4NTij at its second input node, an inverter 3902 receiving the output of NAND circuit 3900, an inverter 3904 receiving output signal CCNTR0 of the first bit counter, a clocked inverter 3910 receiving the output of inverter 3904 to invert and output the same according to the outputs of NAND circuit 3904 and inverter 3902, a clocked inverter 3908 receiving signal CCNTR0, operating complementary to clocked inverter 3910 according to the outputs of NAND circuit 3900 and inverter 3902, clocked inverter 3920 receiving the outputs of clocked inverters 3908 and 3910 to operate and invert the received signal according to signals CLK and CLKB, an inverter 3926 receiving and inverting the output of clocked inverter 3920, a clocked inverter 3922 receiving the output of inverter 3926 to operate differently from clocked inverter 3920 according to signals CLK and CLKB, an inverter 3928 receiving the output of inverter 3926, a clocked inverter 3930 receiving the output of inverter 3928 to operate complementary to clocked inverter 3920 according to signals CLK and CLKB, and a clocked inverter 3932 receiving signal CA2 to operate according to the output of inverter 3708 and signal CRCALTij.

Second bit counter 3706 further includes an inverter 3906 receiving signal SCRC, an NOR circuit 3912 receiving the outputs of inverters 3906 and 3932, a NAND circuit 3914 receiving signal SCRC and the output of inverter 3932, an inverter 3934 receiving the output of NOR circuit 3912, an inverter 3936 receiving and inverting the output of inverter 3934 to output the inverted signal as CA2E, and an inverter 3938 receiving and inverting the output of NAND circuit 3914 to output the inverted signal as CA2BE.

Second bit counter 3706 further includes a clocked inverter 3916 operating according to the output from inverter 3708 and signal CRCALTij, to receive signal CA2E, an NOR circuit 3924 receiving the outputs from clocked inverter 3916 and inverter 3906, and a clocked inverter 3918 receiving the output of NOR circuit 3924 to operate complementary to clocked inverter 3916 according to signal CRCALTij and the output of inverter 3708 to connect the output node to the output node of clocked inverter 3916.

According to the above structure, complementary internal column address signals CA2E and CA2BE corresponding to the least significant third bit signal of the column address according to the operation mode is generated.

Figure 51:
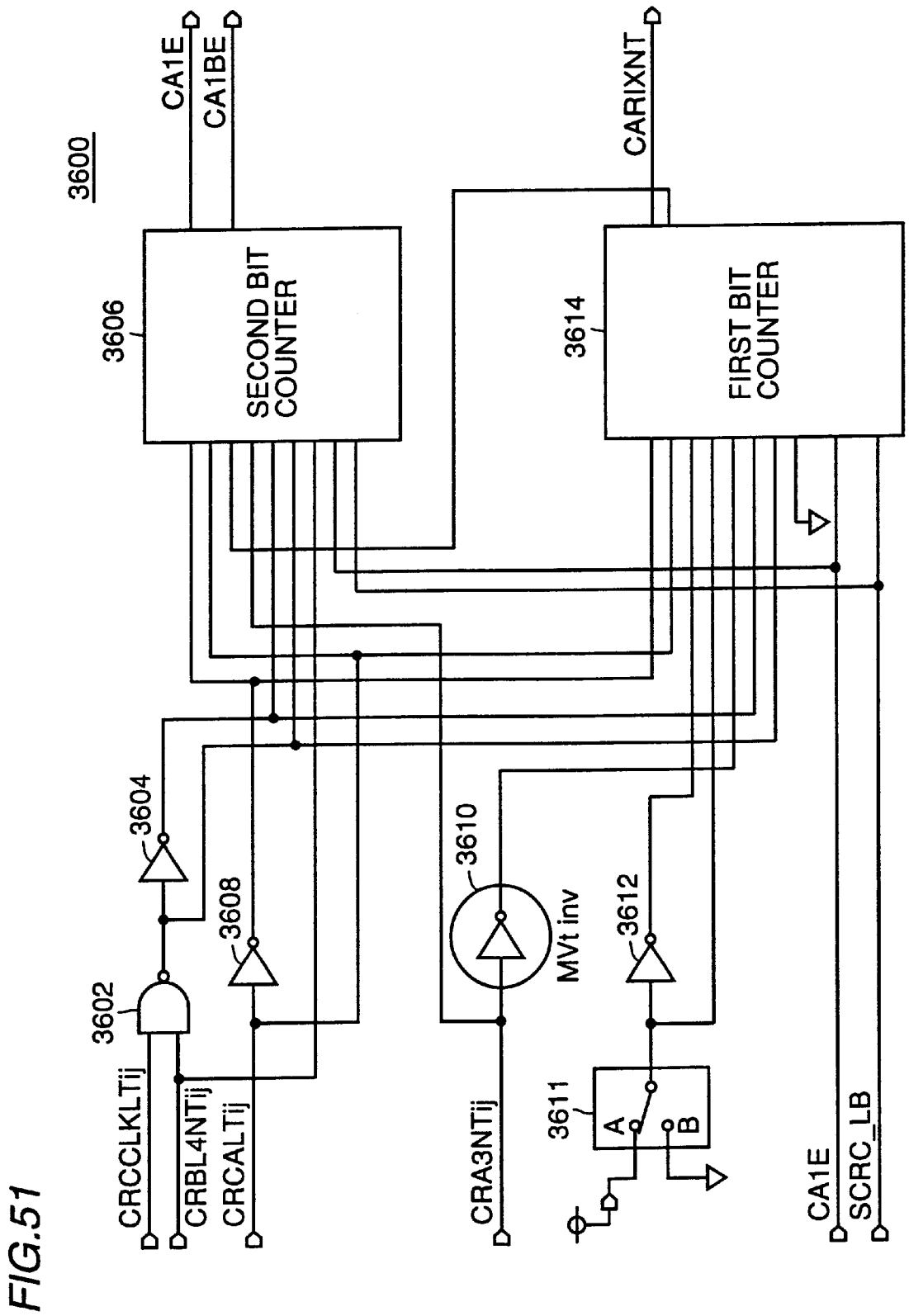
FIG. 51 is a schematic block diagram showing a structure of a first internal bit counter 3600.

FIG. 51 is a schematic block diagram showing a structure of first internal counter 3600 shown in FIG. 47.

First internal counter 3600 includes a NAND circuit 3602 receiving signals CRCCLKLTij and CRBL4NTij, an inverter 3604 receiving the output of NAND circuit 3602, an inverter 3608 receiving signal CRCALTij, an inverter 3610 receiving signal CRA3NTij, a switch circuit 3611 receiving and selectively providing power supply potential Vcc and ground potential Vss, an inverter 3612 receiving the output of switch circuit 3611, a first bit counter 3614 receiving signal CALE, the output of NAND circuit 3602, the output of inverter 3604, signal CRCALTij and inverter 3608, the output of inverter 3610, signal CARIXNT and the output of inverter 3612 for operation, and a second bit counter 3606 receiving the output of bit counter 3714 to operate according to the levels of the output of NAND circuit 3702, the output of inverter 3704, signal CRCALTij, the output of inverter 3708, signal CRA3NTij and signal CA2E to output signals CA2E and CA2BE.

FIG. 52 is a circuit diagram showing a structure of first bit counter 3614 of FIG. 51.

First bit counter 3614 includes a clocked inverter 8800 operating according to output signal CLKB from NAND circuit 3602 and signal CLK from inverter 3604 to receive the output signal of first bit counter 3614 as an input, a clocked inverter 8802 operating complementary to clocked inverter 8800 according to signals CLKB and CLK, and an inverter 8804 receiving the outputs of clocked inverters 8800 and 8802. The output of inverter 8804 is connected to the input node of clocked inverter 8802.

First bit counter 3614 further includes an inverter 8806 receiving and inverting the output of inverter 8804, a clocked inverter 8808 receiving the output of inverter 8806 to operate according to signals CLKB and CLK, a NAND circuit 8810 receiving the output of inverter 3610 and signal CA1E, a clocked inverter 8812 operating according to the output from inverter 3608 and signal CRCALTij to receive and invert the output of NAND circuit 8810, and a NAND circuit 8826 receiving the outputs of clocked inverters 8808 and 8812 at one input node and signal SRC at the other input node.

First bit counter 3614 further includes p channel MOS transistors 8814, 8816 and 8818 connected in series between power supply potential Vcc and ground potential GND, and n channel MOS transistors 8820, 8822 and 8824. P channel MOS transistor 8814 and n channel MOS transistor 8824 receive the output of NAND circuit 8826 at their gates. P channel MOS transistors 8816 and 8818 receive signals CRCALTij and CLK, respectively, at their gates. N channel MOS transistors 8820 and 8822 receive signal CLKB and the output of inverter 3608, respectively, at their gates.

First bit counter 3614 further includes a clocked inverter 8828 receiving the output of NAND circuit 8826 to operate according to the outputs of inverter 3612 and switch circuit 3611, and a clocked inverter 8830 receiving the output of inverter 8812 to operate complementary to clocked inverter 8828 according to the outputs from inverter 3612 and switch circuit 3611. The outputs from clocked inverters 8828 and 8830 are applied as output signal CCNTR0 of first bit counter 3614 to second bit counter 3606.

First bit counter 3614 further includes an inverter 8832 receiving the output of NAND circuit 8826, a NOR circuit 8834 receiving the output of inverter 8832 and signal CT128PLT of the ground potential level, and an inverter 8836 receiving and inverting the output of NOR circuit 8834 to output the inverted signal to second internal counter 3700 as signal CARIXNT.

Figure 53:
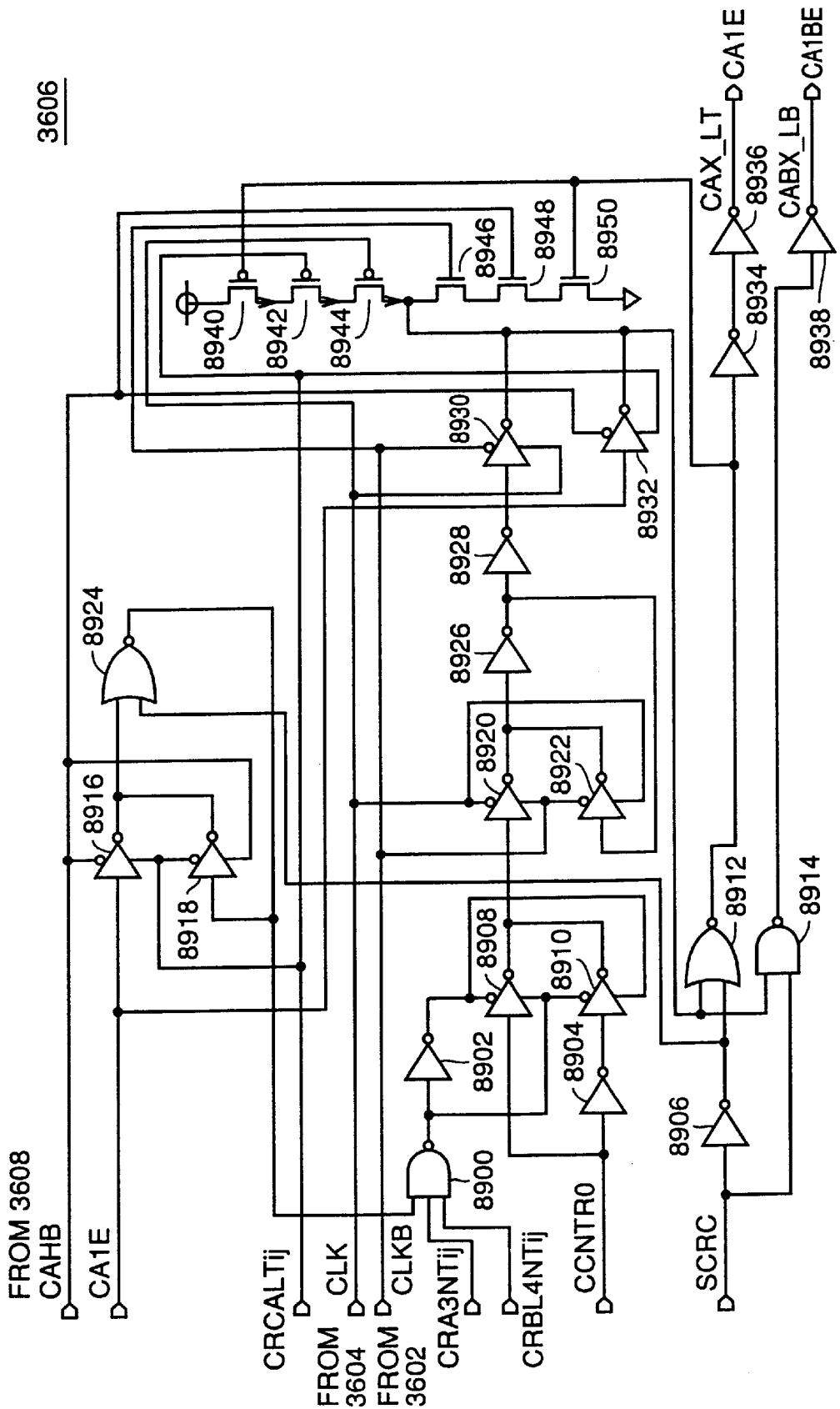
FIG. 53 is a circuit diagram showing a structure of a second bit counter 3606.

FIG. 53 is a schematic block diagram showing a structure of second bit counter 3606 of FIG. 51.

Second bit counter 3606 includes a NAND circuit 8900 receiving signal CRA3NTij at its first input node and signal CRBL4NTij at its second input node, an inverter 8902 receiving the output of NAND circuit 8900, an inverter 8904 receiving output signal CCNTR0 of the first bit counter, a clocked inverter 8910 receiving the output of inverter 8904 to invert the received signal according to the outputs of NAND circuit 8900 and inverter 8902, a clocked inverter 8909 receiving signal CCNTR0 to operate complementary to clocked inverter 8910 according to the outputs of NAND circuit 8900 and inverter 8902, a clocked inverter 8902 receiving the outputs of clocked inverters 8908 and 8910 to operate and invert the received signal according to signals CLK and CLKB, an inverter 8926 receiving and inverting the output of clocked inverter 8920, a clocked inverter 8920 receiving the output of inverter 8926 to operate differently from clocked inverter 8920 according to signals CLK and CLKB, an inverter 8928 receiving the output of inverter 8926, a clocked inverter 8930 receiving the output of inverter 8928 to operate complementary to clocked inverter 8920 according to signals CLK and CLKB, and a clocked inverter 8932 receiving signal CA2E to operate according to the output of inverter 3608 and signal CRCALTij.

Second bit counter 3606 further includes an inverter 8906 receiving signal SCRC, an NOR circuit 8912 receiving the outputs of inverters 8906 and 8932, a NAND circuit 8914 receiving signal SCRC and the output of inverter 8932, an inverter 8934 receiving the output of NOR circuit 8912, an inverter 8936 receiving and inverting the output of inverter 8934 to output the inverted signal as CA1E, and an inverter 8938 receiving and inverting the output of NAND circuit 8914 to output as signal CA1BE.

Second bit counter 3606 further includes a clocked inverter 8916 operating according to the output of inverter 3608 and signal CRCALTij to receive signal CA1E, an NOR circuit 8924 receiving the outputs of clocked inverter 8916 and inverter 8906, and a clocked inverter 8918 receiving the output of NOR circuit 8924 to operate complementary to clocked inverter 8916 according to the output of signal CRCALTij and inverter 8708 to connect the output node with the output node of clocked inverter 8916.

According to the above structure, complementary internal column address signals CA1E and CA1BE corresponding to the second least significant bit signal of the column address is generated according to the operation mode.

[Structure of Predecoder and Shift Register]

Figure 54:
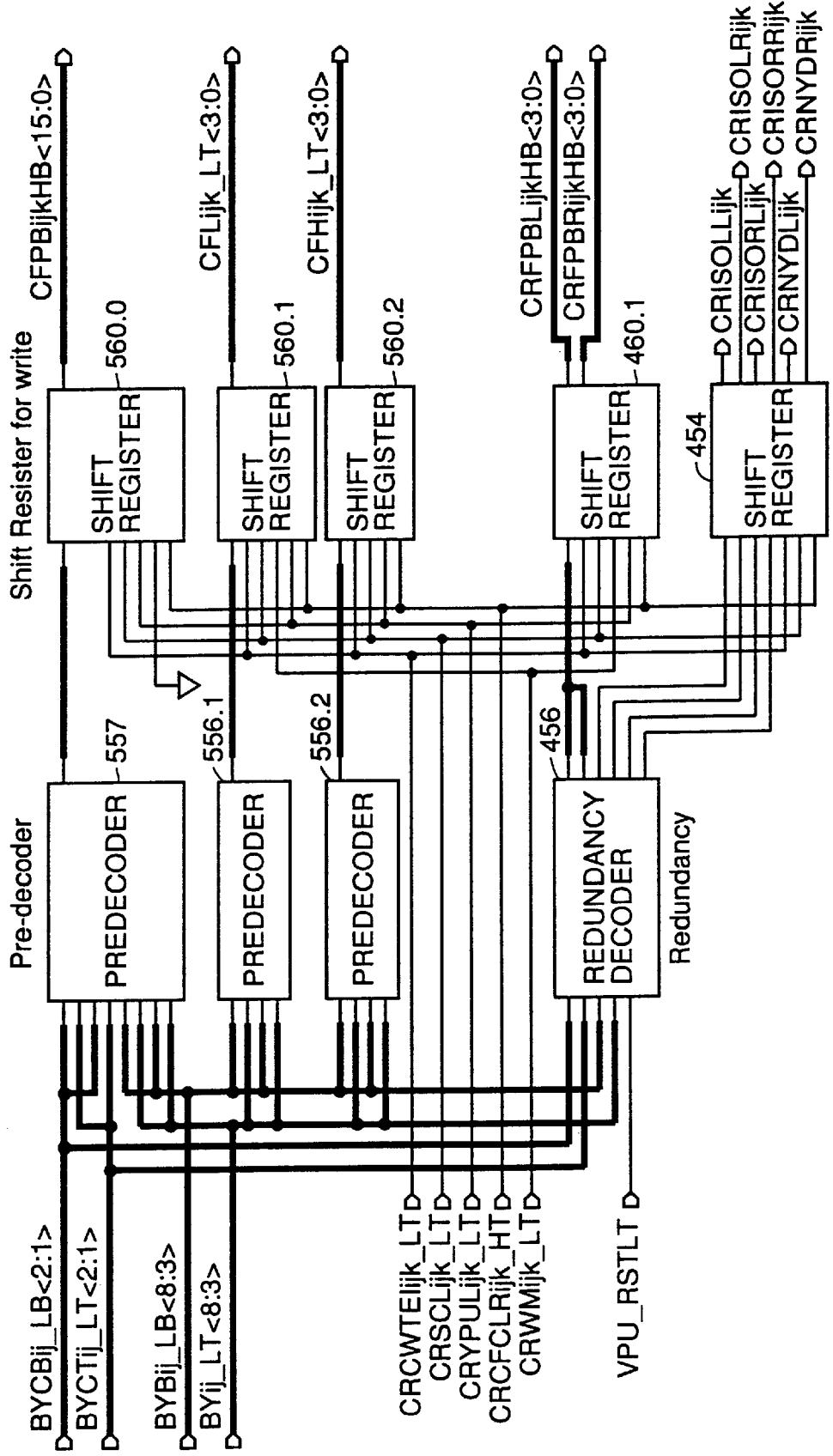
FIG. 54 is a schematic block diagram for describing a structure of a predecoder circuit 556, a shift register circuit 560, and a redundancy determination unit 408.

FIG. 54 is a schematic block diagram showing the structure of predecoder circuit 556 and shift register 560 and the structure of redundancy determination unit 408 of the structure shown in FIG. 41.

The structure shown in FIG. 54 is provided corresponding to an even numbered address region and an odd numbered address region. Predecoder 557 receives column address signal BYCTkij (2:1) from address conversion and burst counter 554 and a complementary signal BYCBkij (2:1) to output the predecode result to a corresponding shift register 560.0. Shift register 560.0 renders any signal CFPBijk (15:0) that renders a corresponding column select line active in a write operation.

Predecoder 556.1 further includes a predecoder 556.1 receiving a column address signal BYij (8:3) and a complementary signal thereof BYBij (8:3) from latch circuit 550 to predecode and output a middle order address signal, a shift register 560.1 receiving the output of predecoder 556.1 to delay a signal CFLijk (3:0) for a predetermined number of clocks to render a column select line active, a predecoder 556.2 receiving a column address signal BYij (8:3) and complementary signal BYBij (8:3) from latch circuit 550 to predecode and output a higher order address signal, and a shift register 560.2 receiving the output of predecoder 556.2 to delay for a predetermined number of clocks signal CFHijk (3:0) that renders a column select line active.

Redundancy decoder 456 receives signals BYCTij (2:1) and BYCBij (2:1), and signals BYij (8:3) and BYBij (8:3) to output a decoded value according to the comparison result with a defective address.

Shift register 460.1 receives the output from redundancy decoder 456 to delay the received signal for a predetermined number of clocks (for example, two clocks) in a write operation mode to output signals CRFPBLijk (3:0) and CRFPBRijk (3:0) to select a redundant column.

Here, signal CRFPBLijk (3:0) is a signal to select the redundant column in the left side region deft block). Signal CRFPBRijk (3:0) is a signal to select a redundant column in the right side region (right block).

Decode and shift register 454 receives the output from redundancy decoder 456 to output signals CRISOLLkij, CRISOLRkij, CRISORLkij and CRISORRkij to control multiplexer 818 that selectively connects main amplifier MA in the redundant array with a global I/O line pair, and signals CRNYDLkij and CRNYDRkij to render inactive a corresponding main amplifier in the regular memory cell array region when a redundant column is selected. Signal CRNYDLkij renders the left block inactive when a redundant column is selected. Signal CRNYDRkij renders the right block when a redundant column is selected.

Signal CRCWTEijk applied to shift registers 560.0, 560.1 and 560.2, shift register 460.1 and decoder and shift register circuit 454 specifies a write operation. Signal CRSCLijk is a clock signal to operate the shift register in a write operation. Signal CRWMijk is a signal to designate a write mask operation. Signal CRYPULijk is a column select signal to select a column select line at a controlled timing. Signal CRCFCLRijk is a reset signal of a latch operation for the shift register. Signal VPU-RST is a power reset signal.

Figure 55:
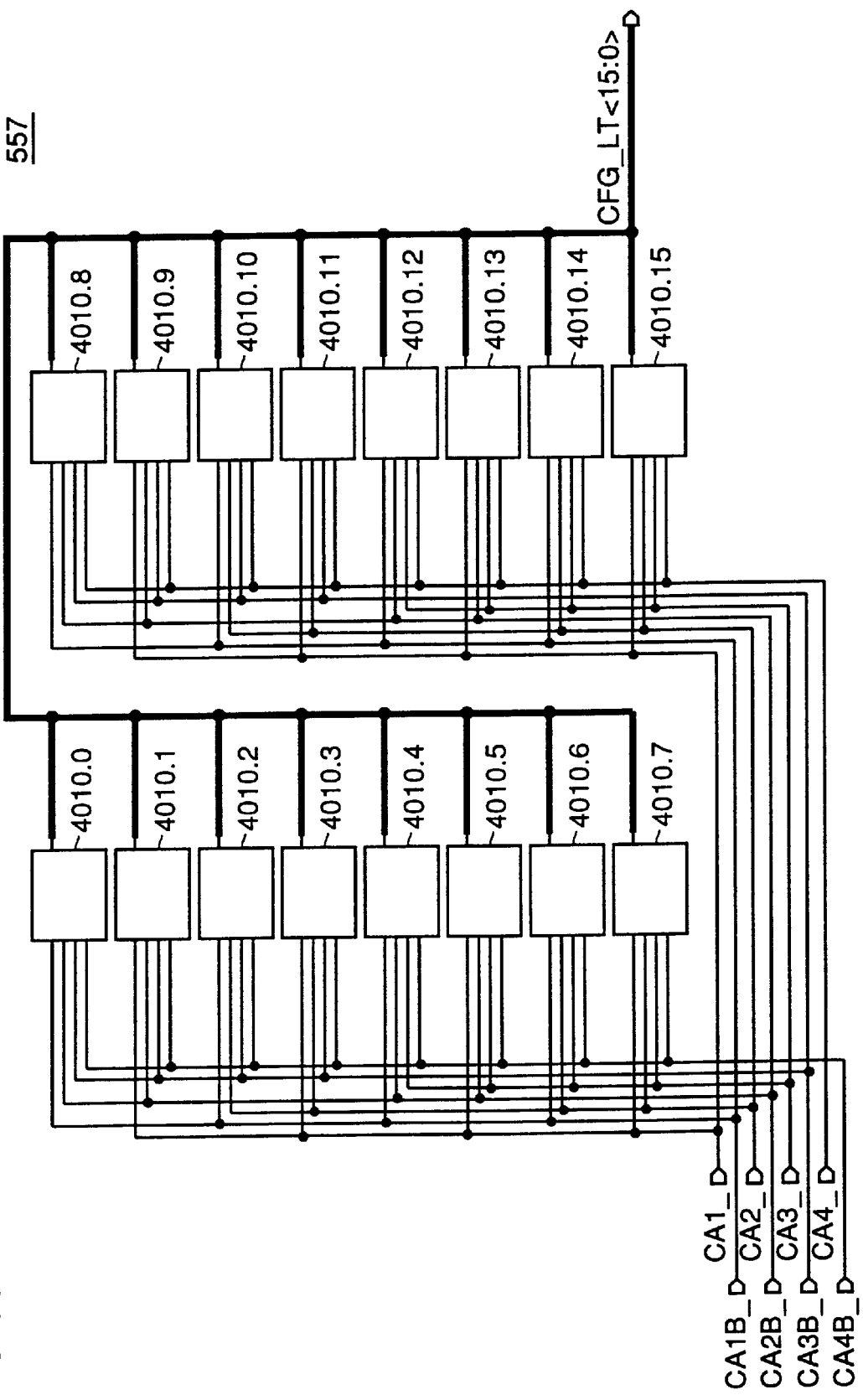
FIG. 55 is a schematic block diagram for describing a structure of a predecoder 557.

FIG. 55 is a schematic block diagram to describe the structure of predecoder 557 of FIG. 54.

Predecoder 557 includes arithmetic and logic circuits 4010.0–4010.15 that selectively receives any of the first bit column address signal CA1 and a complementary signal CA1B thereof, the second bit column address signal CA2 and a complementary signal CA2B thereof, the third bit column address signal CA3 and a complementary signal CA3B thereof, and a fourth bit column address signal CA4 and an inverted signal CA4B thereof out of the column address signal from address conversion and burst counter circuit 554 and address receiver and latch circuit 550.

For example, arithmetic and logic circuit 4010.0 receives signals CA1B, CA2B, CA3B and CA4B to render the output signal active when all signals CA1, CA2, CA3 and CA4 are at an L level.

The basic structure is similar for all the other arithmetic and logic circuits, provided that the input address signal differs.

Figure 56:
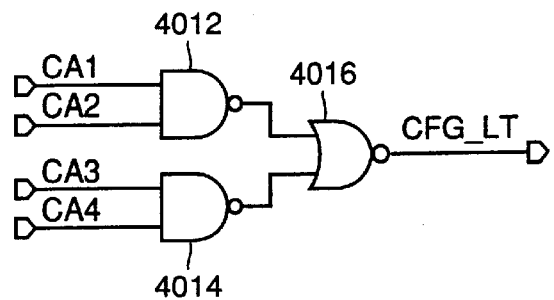
FIG. 56 is a circuit diagram showing a structure of an arithmetic and logic circuit 4010.15.

FIG. 56 is a circuit diagram showing a structure of arithmetic and logic circuit 4010.15 of the arithmetic and logic circuits shown in FIG. 55.

Arithmetic and logic circuit 4010.15 includes a NAND circuit 4012 receiving signals CA1 and CA2, a NAND circuit 4014 receiving signals CA3 and CA4, and an NOR circuit 4016 receiving the outputs of NAND circuits 4012 and 4014 to output the predecode result.

Figure 57:
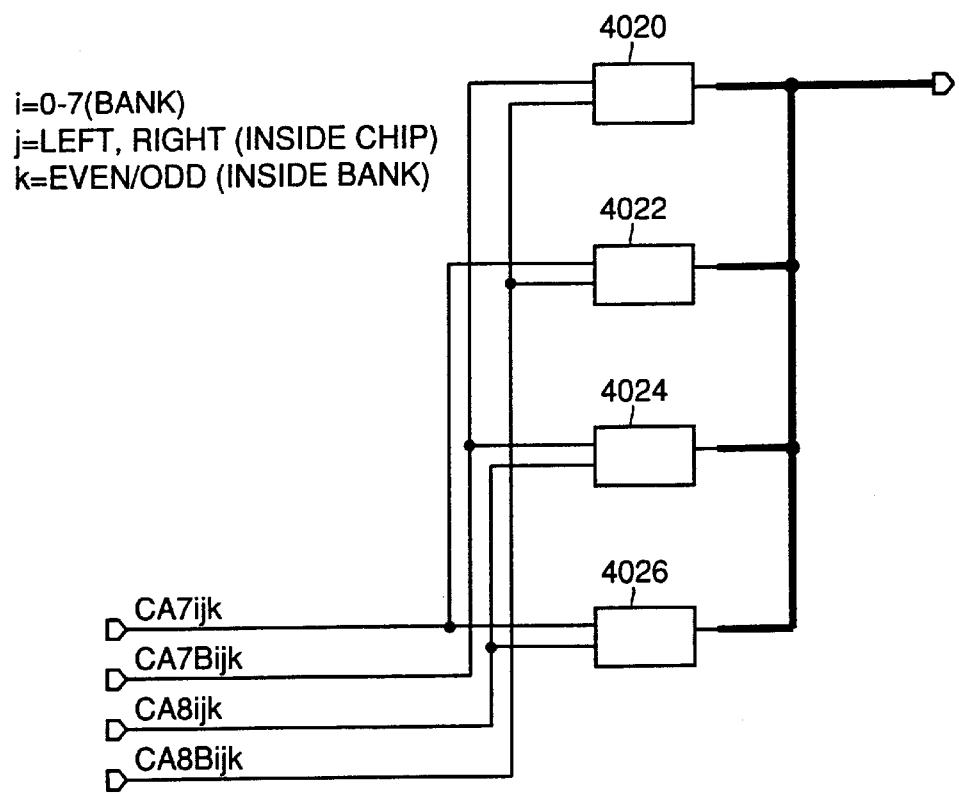
FIG. 57 is a schematic block diagram showing a structure of a predecoder circuit 556.2.

FIG. 57 is a schematic block diagram showing a structure of predecoder circuit 556.2 of FIG. 54. The structure of predecoder circuit 556.1 is basically similar to that of predecoder circuit 556.2 provided that the input signal differs.

Referring to FIG. 57, predecoder circuit 556.2 includes arithmetic and logic circuits 4020–4026 to which are selectively input from address receiver and latch circuit 550 the seventh bit column address signal CA7ijk and a complementary signal CA7Bijk thereof, the eighth bit column address signal CA8ijk and a complementary signal CA8Bijk thereof.

Arithmetic and logic circuit 4020 receives, for example, signals CA7Bijk and CA8Bijk. More specifically, arithmetic and logic circuit 4020 outputs a signal of an active level as a predecode signal when both signals CA7ijk and CA8ijk are both at the L level.

The other arithmetic and logic circuits 4022 and 4026 have a similar structure provided that the input signal differs.

Figure 58:
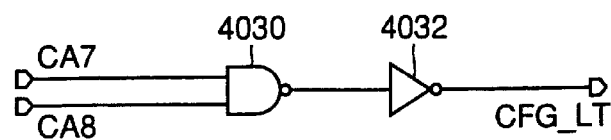
FIG. 58 is a circuit diagram showing a structure of an arithmetic and logic circuit 4026.

FIG. 58 is a circuit diagram showing a structure of arithmetic logic circuit 4026 out of the arithmetic logics circuits 4020–4026 shown in FIG. 57.

Arithmetic and logic circuit 4026 includes a NAND circuit 4030 receiving signals CA7ijk and CA8ijk, and an inverter 4032 receiving and inverting the output of NAND circuit 4030 to output a predecode result.

According to the above structure, an address signal transmitted to address bus 50c at a low amplitude to the memory region is latched at address receiver and latch circuit 550 and predecoded to be applied to a corresponding shift register 560.

[Structure of Shift Register]

Figure 59:
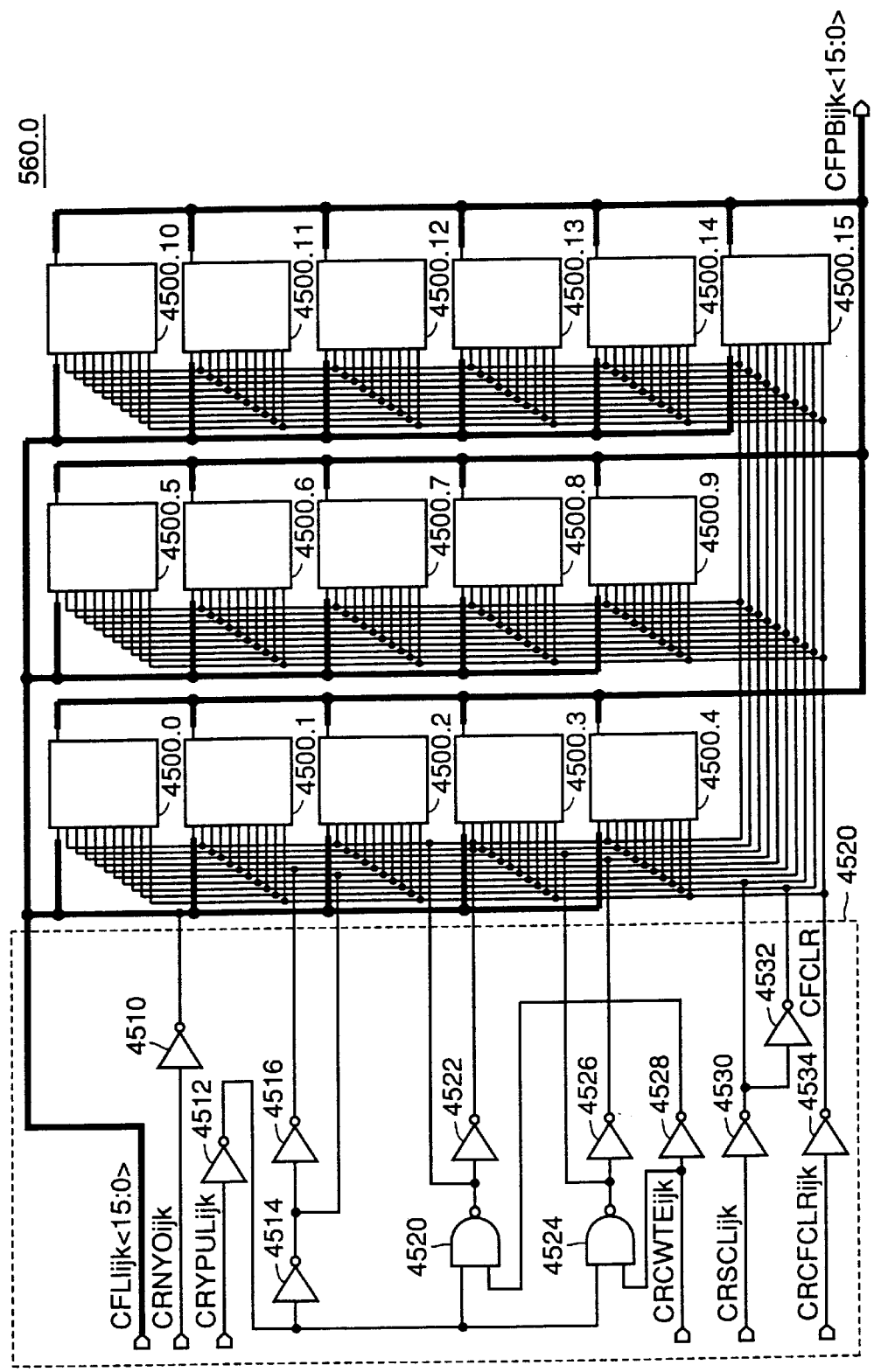
FIGS. 59, 60 and 61 are schematic block diagrams for describing a structure of shift registers 560.0, 560.1, and 560.2, respectively.

FIG. 59 is a schematic block diagram for describing a structure of shift register 560.0 of FIG. 54.

Shift register 560.0 includes registers 4500.0–4500.15 receiving predecoded column address signal CFLIijk (15:0) from predecoder 557, and a shift register control signal generation unit 4502.

Shift register control signal generation unit 4502 includes an inverter 4510 receiving signal CRNYOijk of the ground potential level, an inverter 4512 receiving and inverting a signal CRYPULijk that is a buffered version of signal CRYSELij at buffer circuit 3002, an inverter 4514 receiving the output of inverter 4512 to provide the same as signal CRCYP, and an inverter 4516 receiving the output of inverter 4514 to output the same as CRCYPB.

Shift register control signal generation unit 4502 further includes an inverter 4518 receiving signal CRCWTEijk, a NAND circuit 4520 receiving the outputs of inverters 4512 and 4518 to provide the same as signal CRCREB, an inverter 4522 receiving the output of NAND circuit 4520 to provide the same as signal CRCRE, a NAND circuit 4524 receiving signal CRCWTEijk and the output of inverter 4512 to output signal CRCWEB, an inverter 4526 for receiving and inverting the output of NAND circuit 4524 to output the inverted signal as CRCWE, an inverter 4530 receiving signal CRSCLijk to output the same as signal CRSFTB, an inverter 4534 receiving the output of inverter 4530 to output the same as signal CRSFT, and an inverter 4534 receiving signal CRCFCLRijk to output signal CFCLR.

Figure 60:
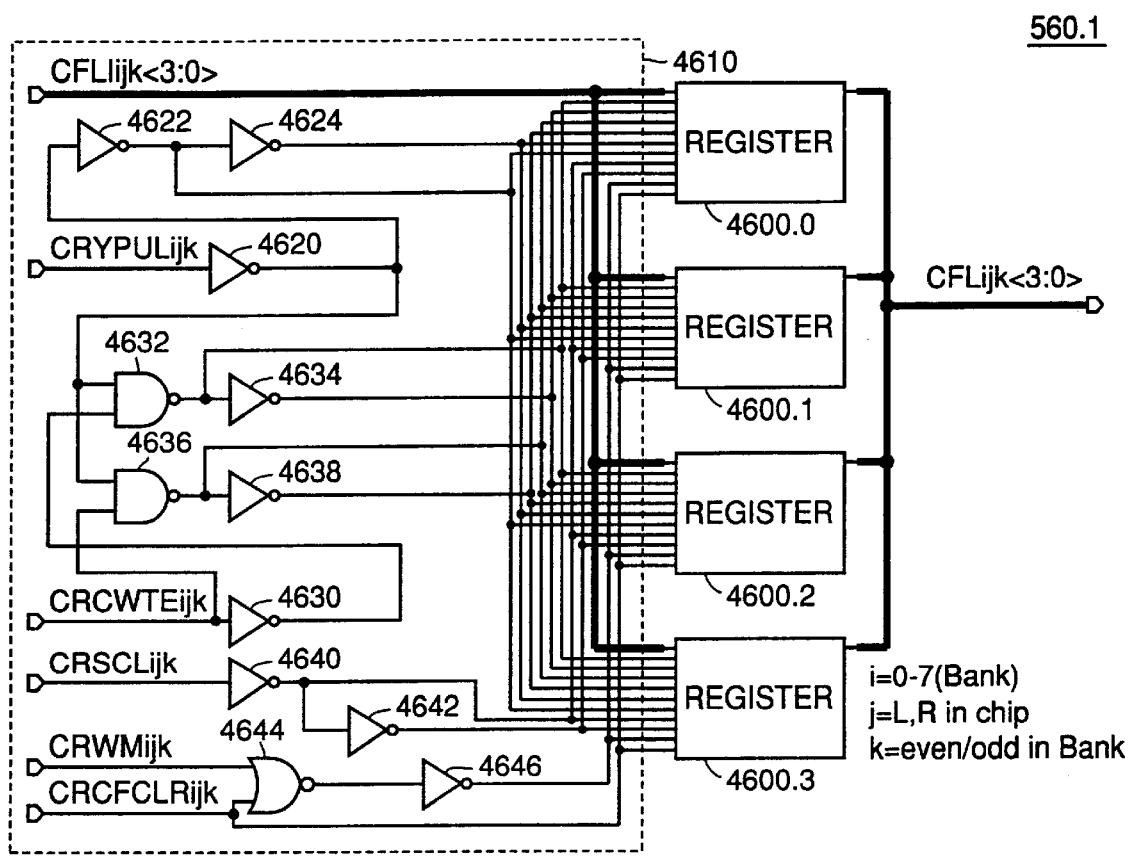

FIG. 60 is a schematic block diagram for describing a structure of shift register 560.1 of FIG. 54.

Shift register 560.1 includes register units 4600.0-4600.3 receiving signal CFLIijk (3:0) from predecoder 565.1, and a shift register control signal generation unit 4610.

Shift register control signal generation unit 4610 includes an inverter 4620 receiving signal CRYPULijk, an inverter 4622 receiving the output of inverter 4620 to provide the signal as CRCYP, an inverter 4624 receiving the output of inverter 4622 to provide the same as signal CRCYPB, an inverter 4630 receiving signal CRCWTEijk, a NAND circuit 4632 receiving the outputs of inverters 4630 and 4620 to output signal CRCREB, an inverter 4634 receiving the output of NAND circuit 4632 to provide the same as signal CRCRE, a NAND circuit 4636 receiving the outputs of inverters 4620 and 4630 to output signal CRCWEB, and an inverter 4638 receiving the output of NAND circuit 4636 to provide signal CRCWE.

Shift register control signal generation unit 4610 further includes an inverter 4640 receiving signal CRSCLijk to output signal CRSFTB, an inverter 4642 receiving the output of inverter 4640 to output signal CRSFT, an NOR circuit 4644 receiving signals CRWMijk and CRCFCLRijk, and an inverter 4646 receiving the output of NOR circuit 4644 to output signal CRWM (signal to designate a write mask operation).

Figure 61:
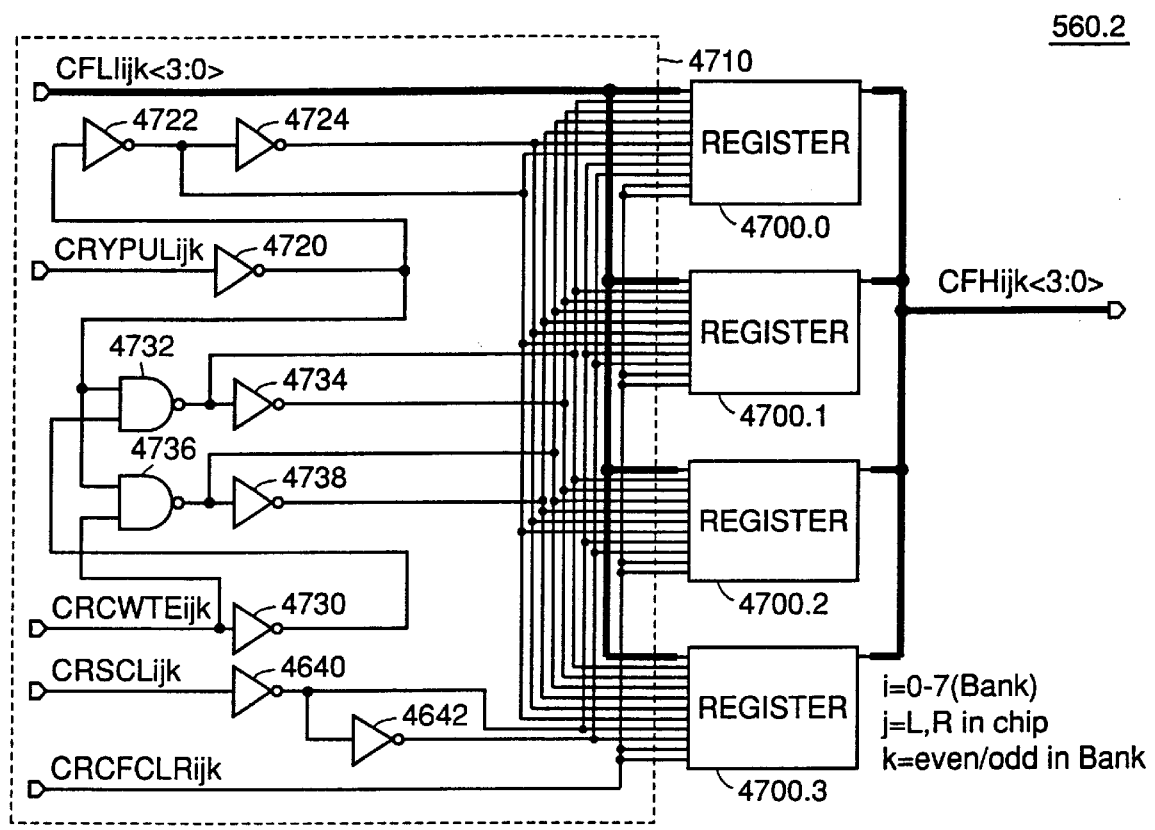

FIG. 61 is a schematic block diagram for describing a structure of shift register 560.2 of FIG. 54.

Shift register 560.2 includes register units 4700.0–4700.3 receiving signal CFLIijk (3:0) from predecoder 556.2, and shift register control signal generation unit 4710.

Shift register control signal generation unit 4710 further includes an inverter 4720 receiving signal CRYPULijk, an inverter 4722 receiving the output of inverter 4720 to provide signal CRCYP, an inverter 4724 receiving the output of inverter 4722 to output signal CRCYPB, an inverter 4730 receiving signal CRCWTEijk, a NAND circuit 4732 receiving the outputs of inverters 4730 and 4720 to provide signal CRCREB, an inverter 4734 receiving the output of NAND circuit 4732 to output signal CRCRE, a NAND circuit 4736 receiving the outputs of inverters 4720 and 4730 to output signal CRCWEB, and an inverter 4738 receiving the output of NAND circuit 4736 to output signal CRCWE.

Shift register control signal generation unit 4710 includes an inverter 4740 receiving signal CRSCLijk to output signal CRSFTB, and an inverter 4742 receiving the output of inverter 4740 to output signal CRSFT.

Signal CRCFCLRijk is applied to register units 4700.0–4700.3 as signal CRVM (signal designating a write mask operation) and signal CFCRL.

The structure of, shift register circuits 560.0, 560.1 and 560.2, register units 4500.0–4500.15, register units 4600.0–4600.3, and register unit 4700.0–4700.3 have a similar structure, provided that the input signal differs.

Figure 62:
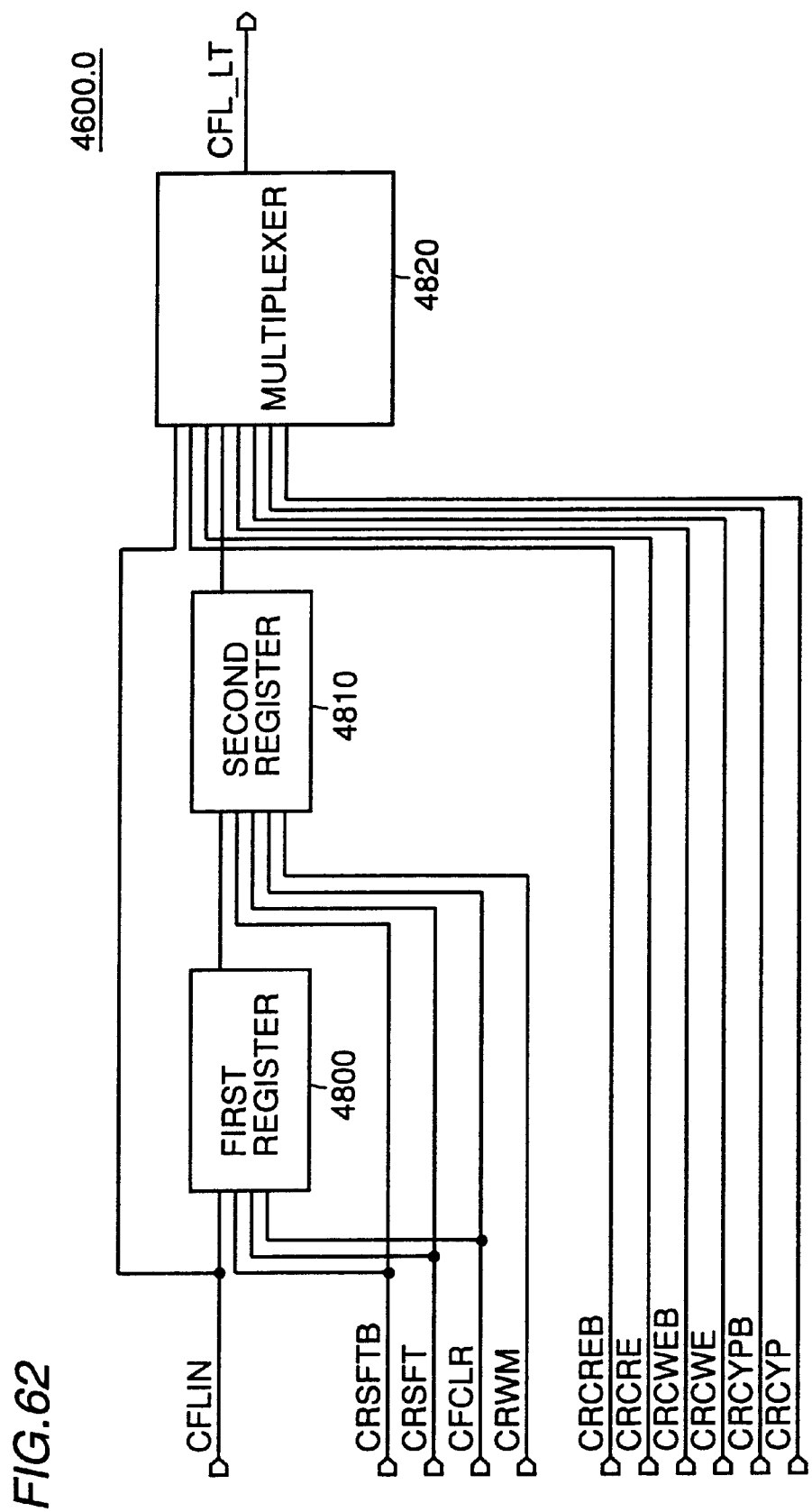
FIG. 62 is a block diagram for describing a structure of a resistor unit 4600.0.

FIG. 62 is a schematic block diagram for describing a structure of register unit 4600.0.

Referring to FIG. 62, register unit 4600.0 includes a first register circuit 4800 receiving signal CFLIN of a corresponding bit out of signal CFLIijk (3:0), signals CRSFTB and CRSFT, and CFCLR a second register circuit 4810 receiving signals CRSFTB, CRSFT, CFCLR, and CRWM, and a multiplexer 4820 receiving the output of second register circuit 4810 and signal CFLIN under control of signals CRCREB and CRCE, signals CRCWEB and CRCWE, and signals CRCYPB and CRCYP.

Figure 63:
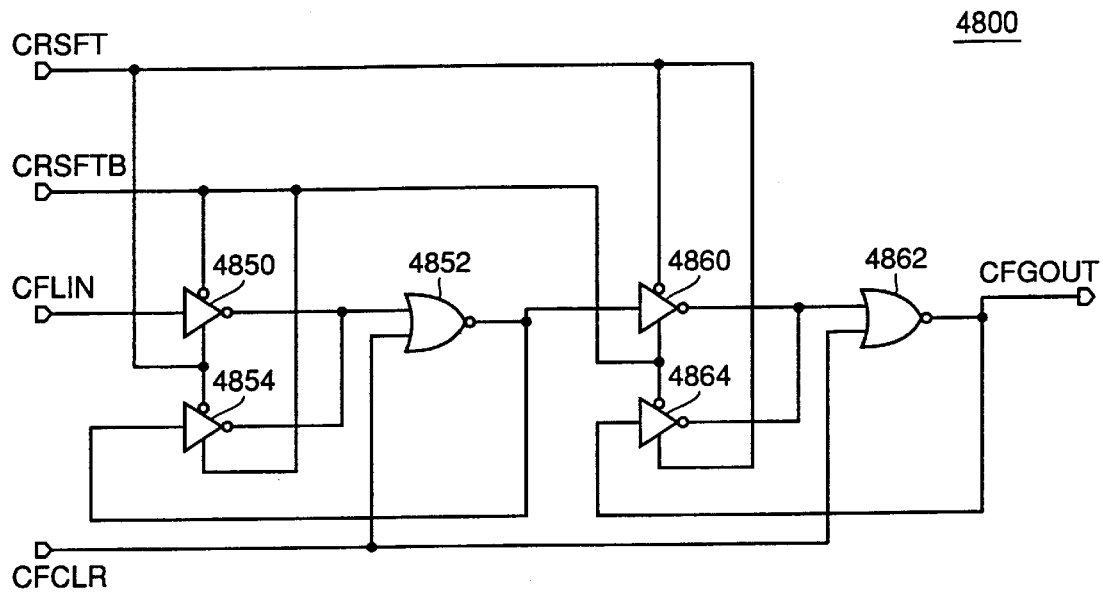
FIGS. 63 and 64 are circuit diagrams showing a structure of first and second register circuits 4800 and 4810, respectively.

FIG. 63 is a circuit diagram for describing a structure of first register circuit 4800 of FIG. 62.

First register circuit 4800 includes a clocked inverter circuit 4850 receiving signal CFLIN under control of signal CRSFT and a complementary signal CRSFTB thereof, an NOR circuit 4852 receiving the output of clocked inverter circuit 4850 and signal CFCRL, a clocked inverter circuit 4854 receiving the output of NOR circuit 4852 to operate complementary to clocked inverter circuit 4850 by signals CRSFT and CRSFTB, a clocked inverter circuit 4860 receiving the output of NOR circuit 4852, and controlled by signal CRSFT and complementary signal CRSFTB thereof, an NOR circuit 4862 receiving the output of clocked inverter circuit 4860 and signal CFCRL to output signal CFGOUT, and a clocked inverter circuit 4864 receiving the output of NOR circuit 4862 to operate complementary to clocked inverter circuit 4860 by signals CRSFT and CRSFTB.

Figure 64:
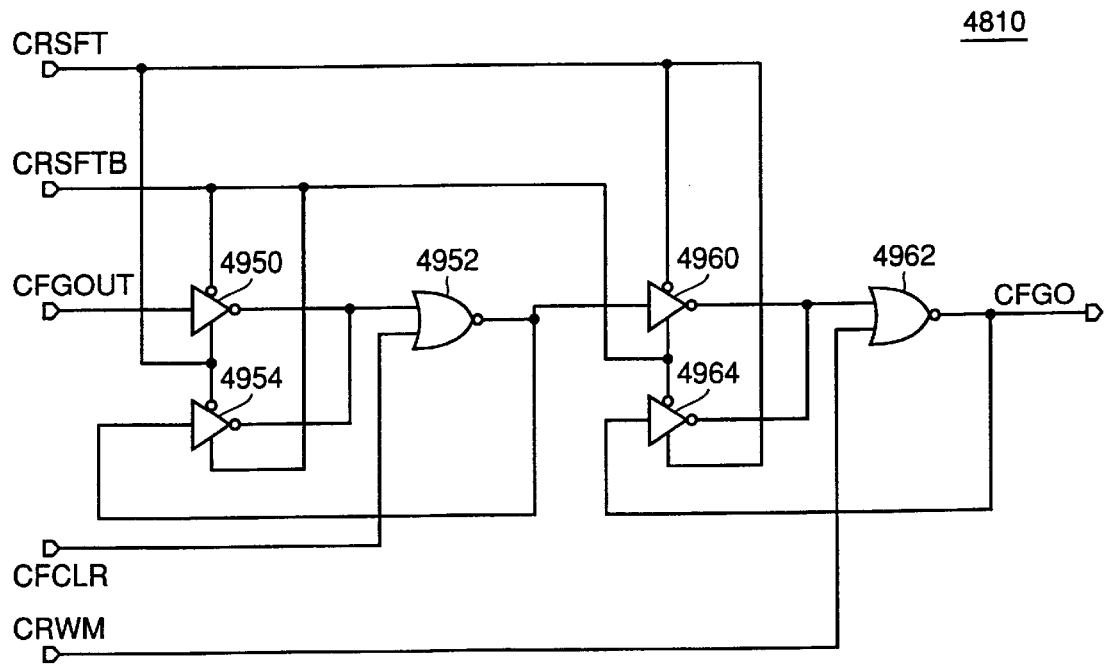

FIG. 64 is a circuit diagram for describing a structure of second register circuit 4810 of FIG. 62.

Second register circuit 4810 includes a clocked inverter circuit 4950 receiving signal CFGOUT, and controlled by signal CRSFT and a complementary signal CRSFTB thereof, a NOR circuit 4952 receiving the output of clocked inverter circuit 4950 and signal CFCRL, a clocked inverter circuit 4954 receiving the output of NOR circuit 4592 to operate complementary to clocked inverter circuit 4950 by signals CRSFT and CRSFTB, a clocked inverter circuit 4960 receiving the output of NOR circuit 4952, and controlled by signal CRSFT and a complementary signal CRSFTB thereof, a NOR circuit 4962 receiving the output of clocked inverter circuit 4960 and signal CRWM to output signal CFGO, and a clocked inverter circuit 4964 receiving the output of NOR circuit 4962 to operate complementary to clocked inverter circuit 4960 according to signals CRSFT and CRSTB.

Figure 65:
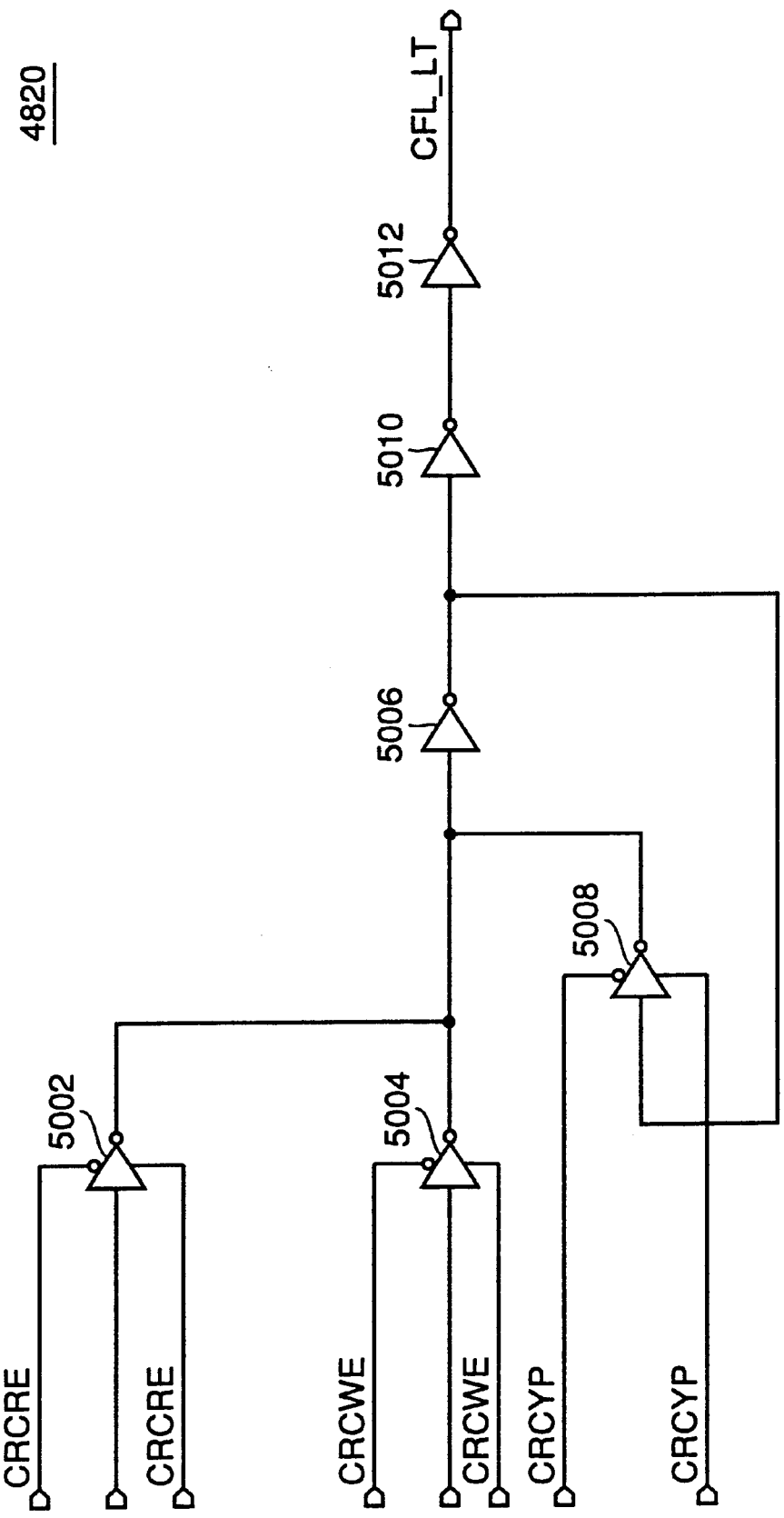
FIG. 65 is a circuit diagram showing a structure of a multiplexer circuit 4820.

FIG. 65 is a circuit diagram for describing the structure of multiplexer circuit 4820 of FIG. 62.

Multiplexer circuit 4820 includes a clocked inverter circuit 5002 receiving signal CFLIN, and controlled by signal CRCRE and complementary signal CRCREB, a clocked inverter circuit 5004 receiving signal CFGO output from second register circuit 4810, and controlled by signal CRCWE and complementary signal CRCWEB thereof, an inverter 5006 receiving the outputs of clocked inverter circuits 5002 and 5004, a clocked inverter 5008 under control of signal CRCYP and complementary signal CRCYPB thereof to receive and provide to the input node of inverter 5006 the output of inverter 5006, an inverter 5010 receiving the output of inverter 5006, and an inverter 5012 receiving the output of inverter 5010 to provide the same as a signal CFL output from the shift register circuit.

[Detailed Structure of Data Input/Output Unit]

Figure 66:
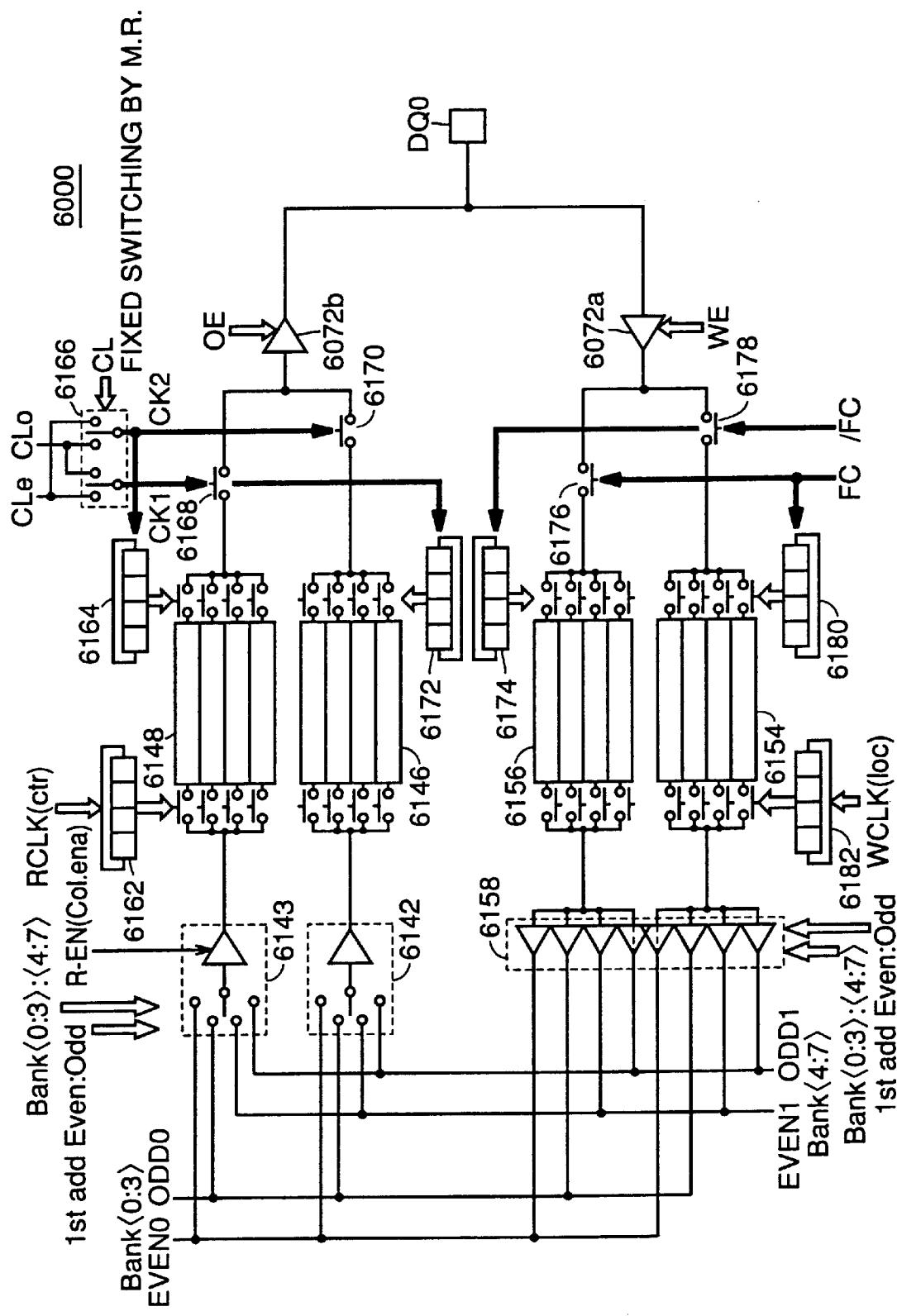
FIG. 66 is a circuit diagram showing a structure of an input/output circuit 6000 corresponding to a data input/output terminal DQ0.

FIG. 66 is a circuit diagram showing a structure of input/output circuit 6000 corresponding to data input/output terminal DQ0.

Referring to FIG. 66, an address bus EVEN0 is a data bus connected to the even numbered address region of banks 0–3. Address bus ODD0 is a data bus connected to the odd numbered address region of bank 0–3. An address bus EVEN1 is a data bus connected to the even numbered address region of banks 4–7. An address bus ODD1 is a data bus connected to the odd numbered address region of banks 4–7.

Input/output circuit 6000 includes read data receiver circuits 6142 and 6143 selecting any one of address buses EVEN0, ODD0, EVEN1 and ODD1 according to the selected bank and whether the address corresponding to the first output data is an even number or an odd number to provide the data transmitted through the selected address bus according to a receiver activation signal R-EN, a shift register 6162 carrying out a shift operation with read clock RCLK (ctr) to output a select signal, and latch circuit 6146 and 6148 for receiving the data output from read data receivers 6142 ad 6143 according to the select signal output from shift register 6126.

Input/output circuit 6000 includes a switch 6166 receiving a clock signal CLe and a clock signal CLo that is an extraction of only the even numbered activation portion and the odd numbered activation portion, respectively, from the clock signal of a frequency two times that of an external clock signal and transmitting the received signals as data output clock signals CK1 and CK2 according to the CAS latency and the setting of the mode register, when in a DDR-SDRAM mode, a shift register 6164 shifting the data according to output clock CK2, and a shift register 6172 shifting the data according to output clock CK1. Latches 6146 and 6148 selectively output the latched data according to the outputs of shift registers 6172 and 6164.

Input/output circuit 6000 further includes an output buffer 1072b rendered active by enable signal OE to output the data to terminal DQ0, a switch 6168 applying the output of latch 6148 to output buffer 1072b according to activation of output clock CK1, and a switch 6170 applying the output of latch 6146 to output buffer 1072b according to activation of output clock CK2.

Input/output circuit 6000 further includes an input buffer 1072a amplifying the externally applied data through terminal DQ0 according to enable signal WE, switches 6176 and 6178 transmitting the output of input buffer 152 internally according to signals FC and /FC, a shift register 6174 receiving signal /FC as a shift clock and providing the same as a select signal, a shift register 6180 receiving signal /FC as shift clock and providing the same as a select signal, a latch 6156 receiving a signal transmitted via switch 6176 according to the select signal output from shift register 6174, and a latch 6154 receiving the signal transmitted via switch 6178 according to the select signal output from shift register 6180.

Input/output circuit 6000 and further includes a shift register 6182 receiving write clock WCLK (loc) as a shift clock and providing the same as a select signal, and a multiplexer circuit 6158 receiving the data output from latches 6154 and 6156 according to the select signal output from shift register 6182. Multiplexer circuit 6158 provides data to any of data buses EVEN0, ODD0, EVEN1, ODD1 selected according to the bank into which the received data is to be written and whether the address into which the first received data is to be written (burst address) is an even number or an odd number, and diives the selected bus.

In operation, either the data from the even numbered address region, the odd numbered address region of banks 0–3, or the data from the even numbered address region, the odd numbered address region of banks 4–7 is discriminated at the four-point switch portion provided at the input unit of receivers 6142 and 6143.

A signal discriminating the higher order/lower order of the bank, and a signal indicating whether the first address at the burst read out is an even numbered address or an odd numbered address are input. The path where receiver 6143, latch 6148 and switch 6168 are provided is the path for the first output data. The path where receiver 6142, latch 6146 and switch 6170 are provided is the path where the second data is output.

The data passing through the switch at the input unit of receivers 6143 and 6142 are amplified by an amplifier to be transferred to the selector unit of the input unit of latches 6148 and 6146. Here, the selector selects one of the four paths included in the latch. This path selection is sequentially shifted according to the internal clock RCLK (ctr) for reading that is applied to shift register 6162 where the select signal is latched. Thus, input data is sequentially latched.

The data stored in the latch is output on the basis of a clock differing from that of input. The selected path at the output side of the latch is sequentially shifted in response to the select signal output from shift registers 6164 and 6172 that carry out a shifting operation according to output side clocks CLe and CLo. The odd numbered output data from the output data is stored in latch 6148 and the even numbered output data is stored in latch 6146. According to the latency starting from read clock RCLK (ctr) recognizing a read command up to data output, determination of which of clock signals CLe and CLo is applied as a control signal to switch 6168 is made. The other clock is input as a control signal to switch 6170. For example, clock signal CLo is input to switch 6168 as the control signal and clock signal CLe is input to switch 6170 as a control signal when the latency is 1.5.

At the time of writing, the first externally applied data is transferred to latch 6156 unconditionally. The next input data is transferred to latch 6154 unconditionally. Data is transferred alternately to latches 6156 and 6154 thereafter.

The latched data is transferred to multiplexer circuit 6158 according to internal clock WCLK (loc) for writing. Multiplexer circuit 6158 provides the data to a corresponding data bus according to the bank address and the first address of the burst data.

As described above, the read out data is temporarily stored in registers 6146 and 6148 and then output, whereas the write data is stored in registers 6154 and 6156 to be then applied to the memory cell array. Therefore, the internal circuitry can operate according to a clock signal of the same frequency in either a SDR-SDRAM operation mode or a DDR-SDRAM operation mode by altering the cycle of clock signals CK1 and CK2 or clock signals FC, /FC between the operation modes.

The fourth embodiment is described in which operation is allowed switching between a DDR-SDRAM and a SDR-SDRAM by the circuit. However this circuit modification is not limited to such two types of circuit operation. It is applicable to a chip that operates by switching a clock signal, similar to the first and second embodiments.

Fifth Embodiment

Figure 67:
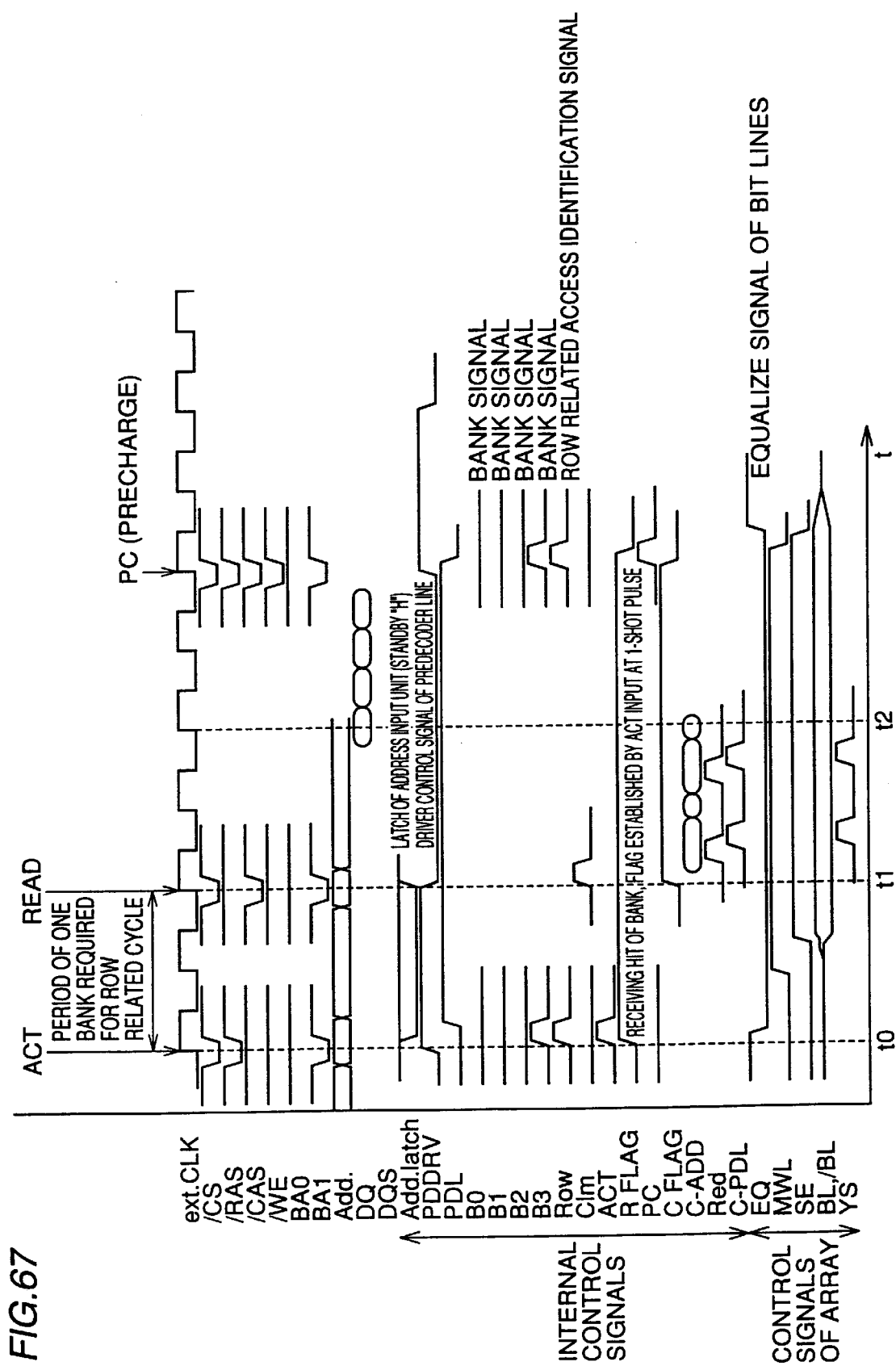
FIG. 67 is a timing chart representing an operation waveform in a DDR-SDRAM operation mode.

FIG. 67 is a timing chart representing an operation waveform of a DDR-SDRAM operation mode.

At the rising edge of external clock signal ext.CLK at time t0, chip select signal /CS, and row address strobe signal /RAS are at an active state (L level), and signals /CAS and /WE are at an inactive state (H level). An ACT command is specified, and bank select signal BA1 is rendered active, at the same time. Selection of a memory cell in the memory cell array is designated by address signal Add applying a predetermined start address.

In response to the activation edge of external clock signal ext.CLK at time t0, signal Add.latch indicating the latching of an address signal is at an active state (H level), whereas predecode line PDL is rendered active according to activation of a driver control signal PDDRV of the predecoder. In response to signals BA0 and BA1 being (0, 1), bank B3 is selected. The decoded bank signal B3 is rendered active.

In response to activation of signal /RAS, signal Row on the command data bus is rendered active. In response to activation of signal ACT of the local control circuit corresponding to the activated bank, a R flag designating activation of the row related operation for bank B3 is rendered active.

In response to activation of flag R, equalize signal EQ is rendered inactive. A main word line (MWL) is rendered active according to an applied row address signal. In response to activation of the sense amplifier, the potential level of the bit line pair (BL, /BL) is amplified by the sense amplifier according to the data read out from the memory cell belonging to the selected row.

At the rising edge of external clock signal ext.CLK at time t1, signals /CS and /CAS are at an active state and signal /WE is at an inactive state. In response, a read out mode is specified, and a column address is input. Signal Add.LATCH that controls the latch operation of an address is at an inactive state. The driver control signal of the predecoder line is rendered inactive. Signal Clm designating a column related operation from the command bus is transmitted as a one shot pulse for the selected bank B3. In response to signal Clm, the C flag indicating the column related operation for bank B3 is rendered active, and a column address from the burst address counter is output. In response, a predecode signal is output from the column related predecode line C-PDL, and the select signal for the redundant column is also rendered active. In response to predecode signal C-PDL, column select signal YS is rendered active, whereby data is read out from the selected memory cell column to be transmitted onto the data bus.

In response to the activation of column select signal YS twice in the period from time t1 to time t2, the read out data is output from the activation edge of external clock signal ext.CLK at time t2 in response to respective rising and falling edges of external clock signal ext.CLK.

At the rising edge of external clock signal ext.CLK at time t3, signals /CS, /RAS, /CAS and /WE are all at an active state. Therefore, a precharge operation for a selected bank is designated. In response to bank address (BA0, BA1) being (0, 1) at time t3, a precharge operation for bank B3 is designated. A precharge signal PC in the local control circuit for bank B3 is rendered active as a one shot pulse. In response, equalize signal EQ designates equalization is rendered active.

Figure 68:
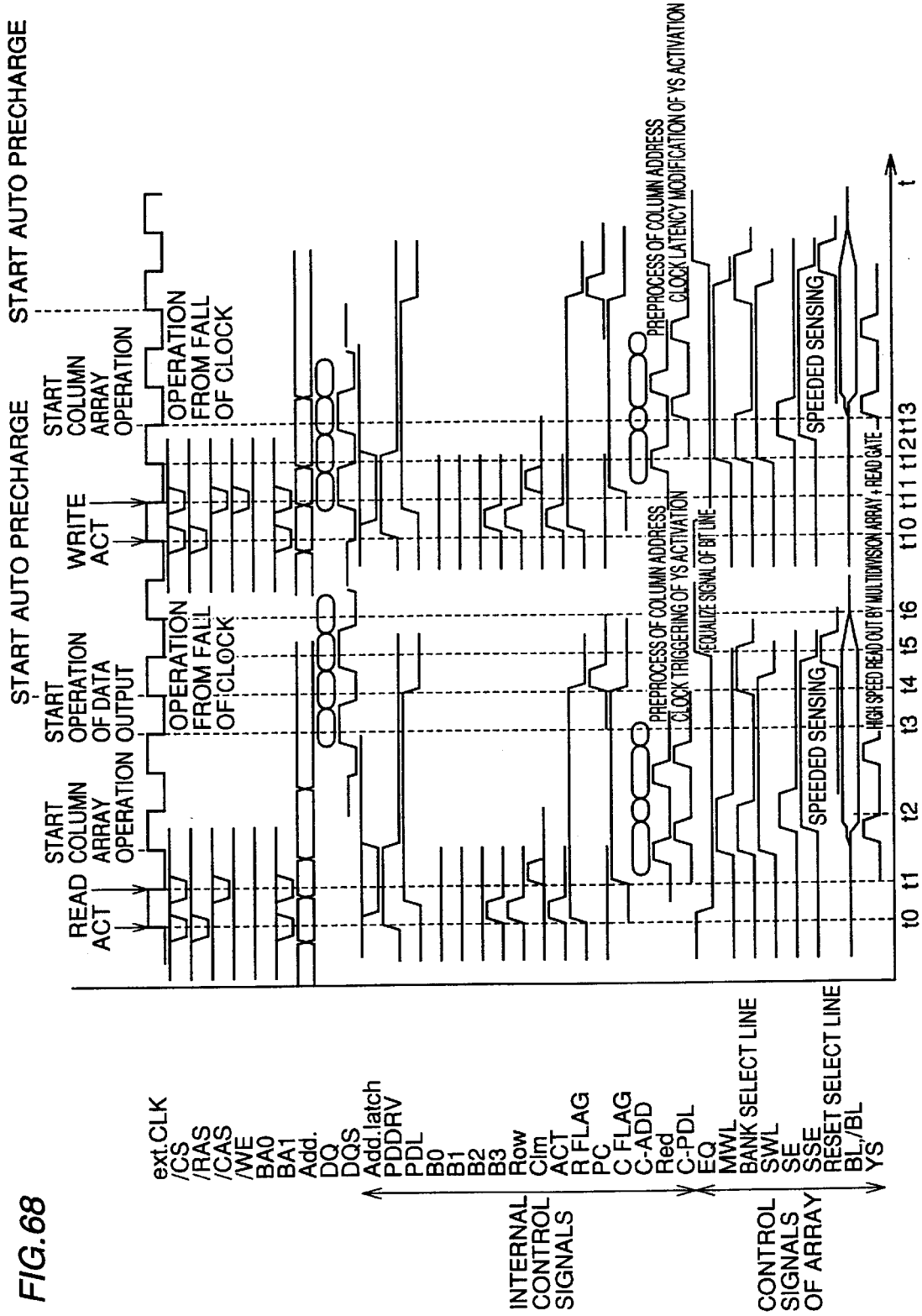
FIG. 68 is a timing chart representing an operation waveform in a server mode that allows reduction in the time up to the first access.

FIG. 68 is a timing chart representing an operation waveform in a special operation mode that can reduce the time up to the first access in a synchronous semiconductor memory device of the present embodiment.

This operation mode is referred to as "server mode" hereinafter.

The structure of the synchronous semiconductor memory device of the present embodiment is basically similar to that of the synchronous semiconductor of the third embodiment except for the structure of the input unit of an address signal, division of the memory cell array, arrangement of a main word line and subword line, structure of column select line YS, the structure of the signal transmission unit from a bit line to an I/O line, and the structure of a sense amplifier activation signal line.

For example, in a local control system, the row related circuit that selects a memory cell row and the column related circuit that selects a memory cell column operate basically independently according to the signal from an address bus and the signal from a command bus.

In the server mode, the first access time can be shortened as well as speeding the dock cycle time.

In the example shown in FIG. 68, a column access command is input at the falling edge of external clock signal ext.CLK at time t2 right after the rising edge of external clock signal ext.CLK at time t0 when signal /RAS access is applied.

Accordingly, a column address can be applied to the synchronous semiconductor memory device at a timing earlier than that for a general SDRAM operation mode. All the addresses required for the synchronous semiconductor memory device to access a certain memory cell can be available at an earlier timing.

By reducing the time required for the sense operation or reducing the load of the current value required for circuitry operation as the result of subdividing the memory cell array corresponding to all these addresses, an operation can be carried out faster than a general operation.

By overlapping the time required for the process of column address with the time required for the process of a column address, the timing of initiating column access with respect to the trigger of a clock can be set ahead.

The access initiation of a column can be set ahead regardless of the sense initiation by setting the structure of the array as the read gate system. Therefore, the read out operation can be speeded.

More specifically, after a column address signal is output at the ising edge of external clock signal ext.CLK at time t1 and when drive signal PDDRV of the row related predecode line is active and the row related predecode line is active, activation of the select signal to the redundant memory cell column and predecode line C-PDL of the column address is effected according to internal column address signal C-ADD that that is already output from burst address counter. In response to activation of predecode line PDL for the row address, the one shot pulse to render the main word line and the bank select line active is rendered active (H level). As a result, a subword line SWL is selected. Activation of a sense amplifier is designated by activation of one shot pulse signal SE. Sense amplifier activation signal SSE corresponding to the selected memory cell block is rendered active according to activation of signal SE. At the time of activation of sense amplifier activation signal SSE, column select line YS is rendered active according to activation of predecode line C-PDL in the column direction, whereby a bit line pair and an I/O line pair are connected.

It is to be noted that since the bit line pair and the I/O line pair are not directly connected despite the signal transmission by the read gate, the potential level of the bit line pair begins to change according to activation of the subword line by the sense amplifier. At the time of the full swing, data transmission from the bit line pair to the 110 line is completed.

In other words, at the falling edge of column select signal YS at time t2, data transmission from bit lines BL and /BL to the I/O line pair is already completed. The data read out at time t2 is provided to data input/output terminal DQ at the falling edge of external clock signal ext.CLK at time t3.

At the rising edge of external clock signal ext.CLK at time t4, the data read out at time t2 is provided to data input/output terminal DQ.

During the period from time t2 to time t3, another column is selected according to internal address signal C-ADD output from the burst address counter. The readout data is applied to data input/output terminal DQ at the falling edge of external clock signal ext.CLK at time t5 and the rising edge of external clock signal ext.CLK at time t5.

An auto precharge operation is initiated at time t5. Signal PC out of the internal control signals transmitted through the command bus is rendered active. In response, equalize signal EQ attains an active state (H level) to initiate equalization of the pair of bit lines BL and /BL.

In response to activation of signal PC, the reset select line is at an active state during the period from time t4 to time t5.

In a write operation, signals /CS and /RAS are at an active state (L level), and signals /CAS and /WE are at an inactive state at the rising edge of external clock signal ext.CLK at time t10. Accordingly, an ACT command is applied. Here, bank B3 is selected in response to the bank address (BA0, BA1) being (0, 1). Simultaneously, row address signal Add is applied at time t10.

In response to the input of the ACT command, address latch signal Add.LATCH is rendered active. As a result, the address signal is latched. Also, in response to the ACT command, signal PDDRV that renders active the driver of the predecode line for the row related circuit attains an active state. Accordingly, the predecode line for the row related circuit is rendered active. In response to the selection of bank B3, the signal line corresponding to bank B3 out of the bank address buses is rendered active. At the command bus, one shot pulse signal Row to designate a row related operation is rendered active. In response, signal ACT in the row related local control circuit attains an active state. The R flag to designate a row related operation is driven to an H level.

At the falling edge of external clock signal ext.CLK at time t11, signals /CS, /CAS and /WE are at an active state (L level) and signal /RAS is at an inactive state to designate a write operation. At time t11, the bank address signal (BA0, BA1) of (0, 1) is applied, whereby the first write data DQ0 is applied together with column address signal Add.

In response to signal /CAS at an active state at the falling edge of external clock signal ext.CLK at time t11, signal Clm on the control bus is rendered active to designate a row related operation for the row related circuit corresponding to bank B3.

In response, flag signal C flag to designate an active state of a column related operation is rendered active. In the column related circuit corresponding to bank B3, a column address is generated by the burst address counter. This column address C-ADD is applied to the redundancy circuit to effect redundancy determination and selection of a redundant column. Also, predecode line C-PDL for the column related circuit is rendered active at the falling edge of external clock signal ext.CLK at time t13 at the elapse of a predetermined latency in the write operation.

Column select signal YS is rendered active, whereby the write data transmitted via the I/O line pair is transmitted to the pair of bit lines BL and /BL.

At the falling edge of external clock signal ext.CLK at time t14, column select signal YS to select another memory cell column is rendered active. The write data that is input after time t13 is transmitted to the selected memory cell.

In response to the rise of external clock signal ext.CLK at time t15, initiation of an auto precharge operation is designated. Signal PC on the command bus is rendered active. In response, equalize signal EQ for the selected bank is rendered active, whereby a precharge operation is carried out. In response to activation of the reset select line, signal SSE designating activation of the sense amplifier returns to the L level.

Figure 69:
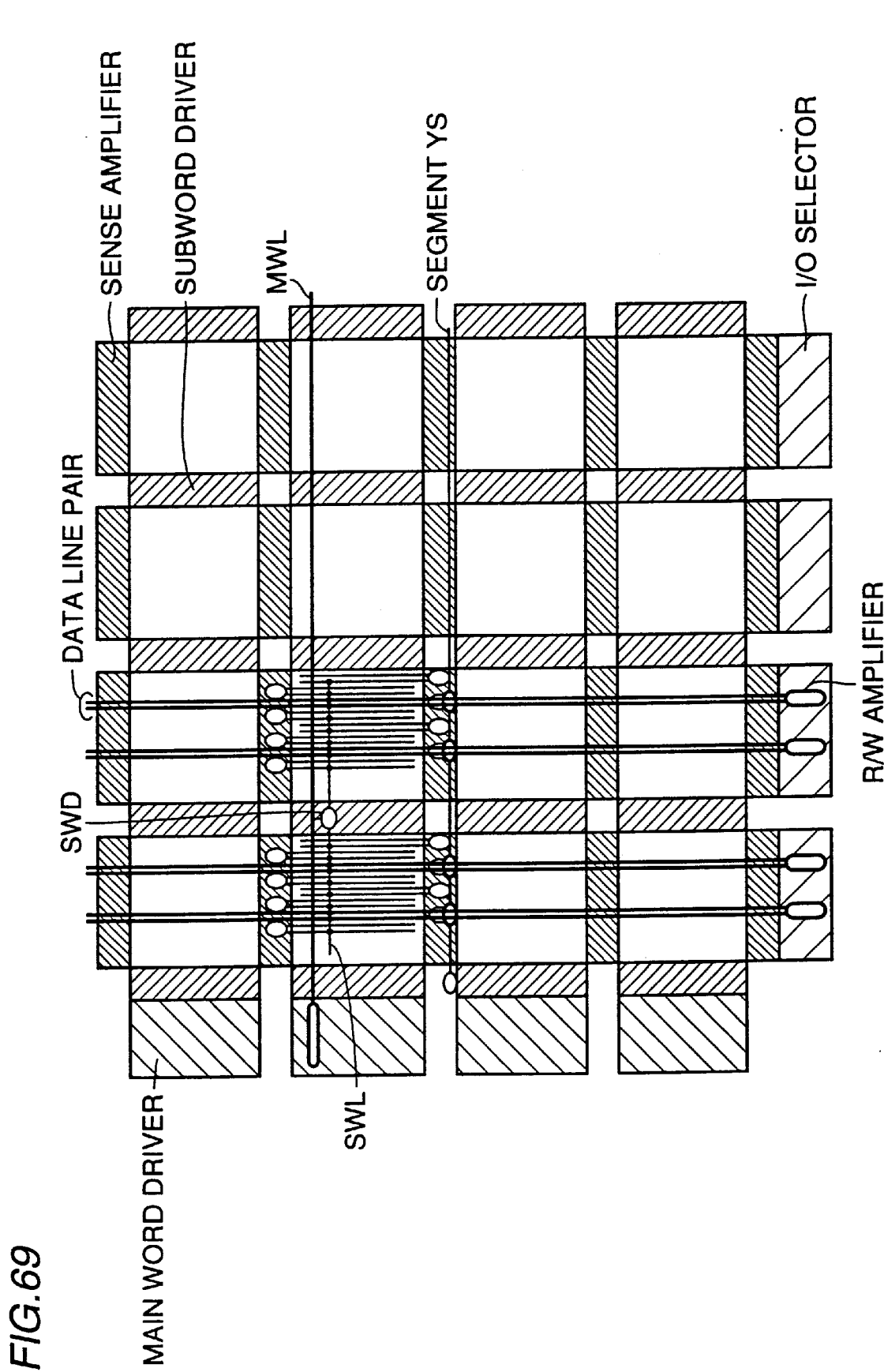
FIG. 69 is a schematic block diagram showing a structure of a memory cell array according to a fifth embodiment of the present invention.

FIG. 69 is a schematic block diagram showing a structure of a memory cell array according to the present embodiment.

The memory cell array is subdivided into the memory cell array unit surrounded by the sense amplifier band and the subword driver band. The unit of activation on the above server mode corresponds to this memory cell array unit.

Main word line MWL is provided spanning each memory cell array unit to render active a corresponding subword driver SWD. In response to activation of subword driver SWD, a corresponding subword line SWL is rendered active. The sense amplifier is arranged alternately sandwiching a unit of the memory cell array. The sense amplifier corresponding to the region where the select line for the region (bank) to be rendered active and the sense select line cross.

A segment YS line is arranged to traverse the sense amplifier band along the direction of the word line in the memory cell array unit.

Data read out from every memory cell array is carried out as set forth in the following. In response to activation of segment YS, the region where segment YS and the bank select line of the activated region cross is rendered active. One data is read out for every 4 sense amplifiers from the activated region (bank), as will be described afterwards.

This readout data passes through the data line pair running on the memory cell array in a direction perpendicular to the word line to be transmitted to a read/write amplifier (referred to as "R/W amplifier" hereinafter). Then, the data passes through the peripheral circuit and the data bus region to be transmitted to the data output unit. Alternatively, the data passes through the data bus region to be transmitted to the logic unit in the case of a memory/logic embedded chip.

Figure 70:
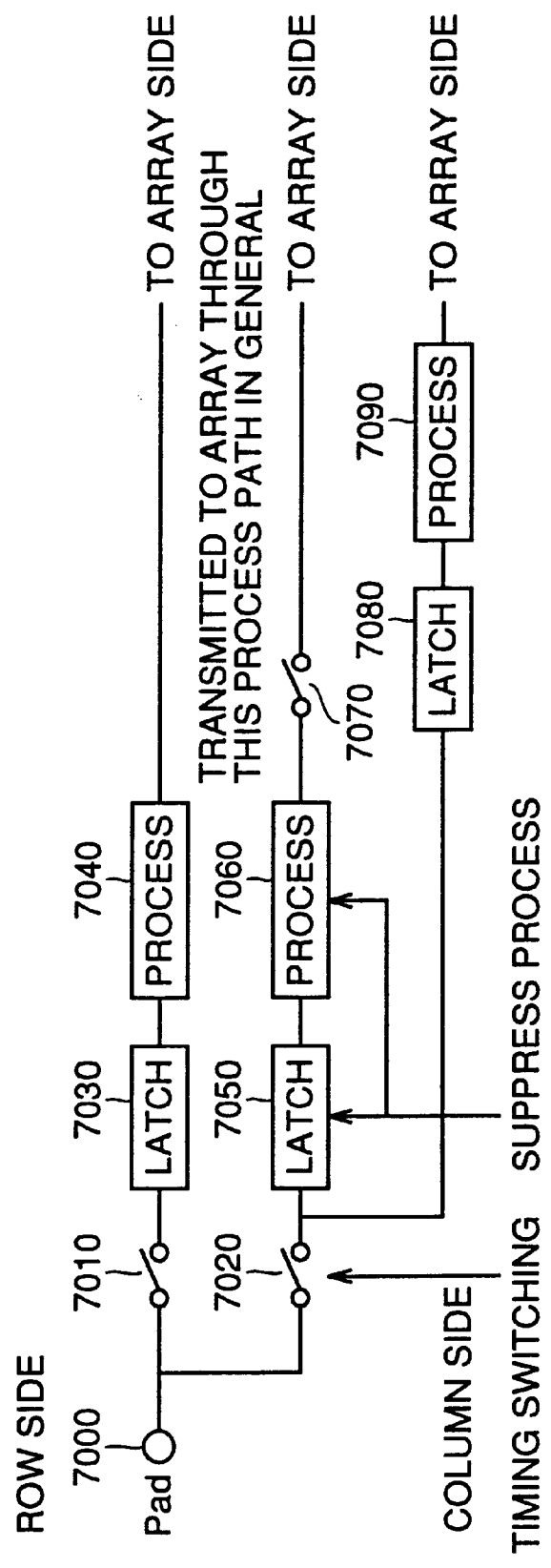
FIG. 70 is a schematic block diagram for describing an address signal transmission path to adjust the transmission timing of an address signal.

FIG. 70 is a schematic block diagram for describing the address signal transmission path for adjusting the timing of transmitting an address signal according to an operation mode when a row address and a column address are input.

The circuit shown in FIG. 70 operates according to an internal clock signal int.CLK generated by the internal synchronizing signal generation circuit (not shown) according to external clock signal ext.CLK.

When a row address is applied, the signal input from address signal input terminal 7000 responds to an externally applied control command to be received by latch circuit 7030 after switch circuit 7010 conducts, and then transmitted to the array unit after being subjected to the predecode process and the like for the row address in processing circuit 7040.

In a normal operation mode, the input column address responds to designation of a column address input by an external command signal to be received by latch circuit 7050 after switch circuit 7020 conducts, and then transmitted to the array unit via switch circuit 7070 after being subjected to a predecode process or a redundancy determination process.

When input of a column address is specified by a command signal in the above-described server mode, an address signal is input to latch circuit 7080 via switch circuit 7020, and then subjected to a process by processing circuit 7090 to be transmitted to the array unit. Here, the operation of latch circuit 7050 and processing circuit 7060 is suppressed according to the operation mode.

According to the above structure, the column address input to latch circuit 7050 and processed by processing circuit 7060 is transmitted to the array unit at a timing adjusted by switch circuit 7070 (or shift circuit) and the like in a normal operation mode. In a server mode, the column address is held in a latch circuit and processed by processing circuit 7090 and then immediately transmitted to the array unit.

Figure 71:
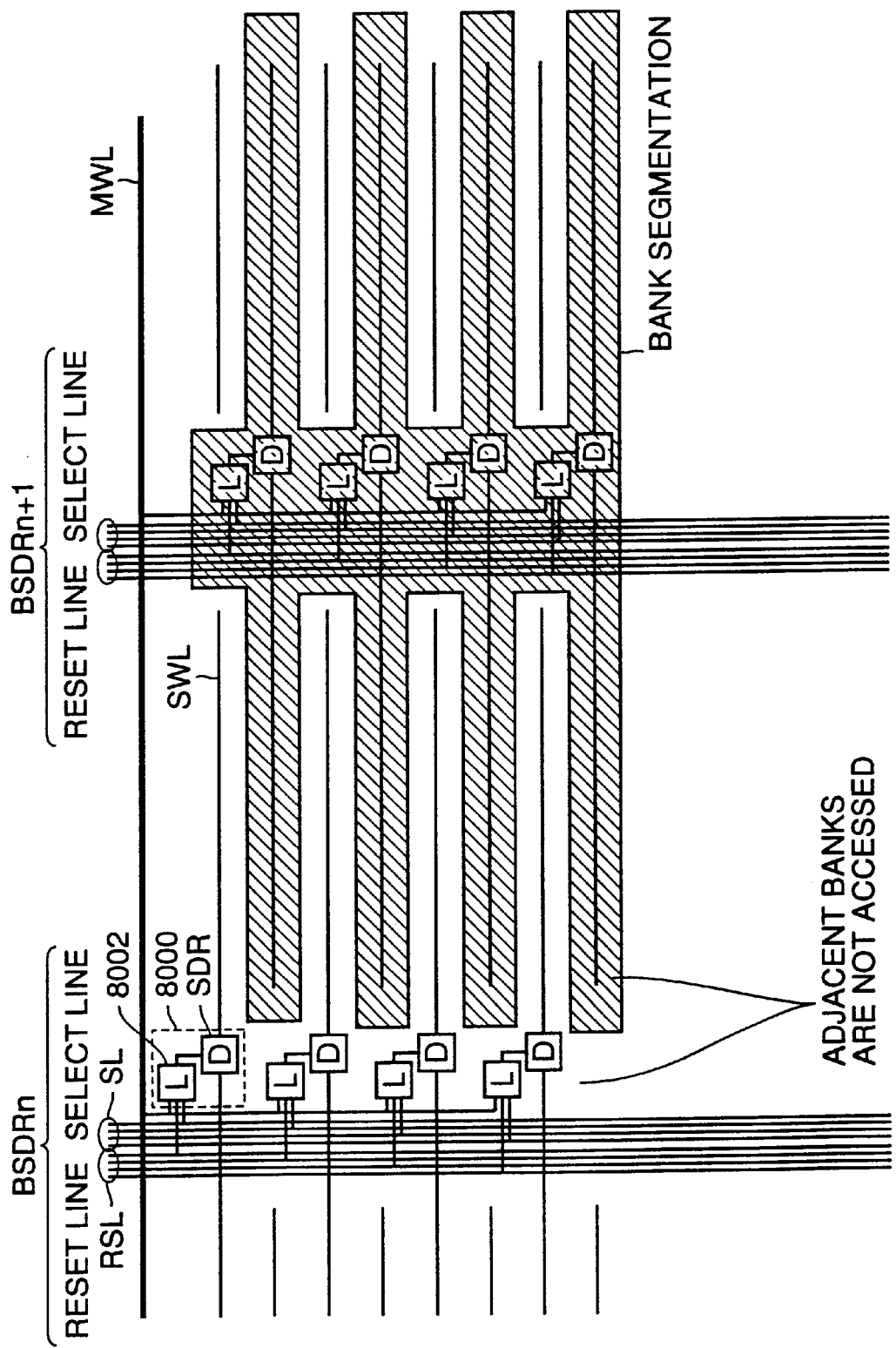
FIG. 71 is a schematic block diagram showing the bank segmentation in an array in accordance with activation of a subword line.

FIG. 71 is a schematic block diagram showing the array bank segmentation in accordance with activation of a subword line.

In the example shown in FIG. 11, latch circuit 8002 in driver circuit 8000 is rendered active receiving a signal from the main word line and a signal from select line SL to maintain the active state. Latch circuit 8002 is reset by a signal from reset line RSL. In response to activation of latch circuit 8002, subword driver SDR renders a corresponding subword line SWL active.

Driver circuit 8000 has its state reset according to the signal from reset line RSL. In response, the operation of subword driver SDR driving subword line SWL is reset.

FIG. 71 shows a structure wherein there are four subword lines for one main word line MWL. Subword line SWL rendered active by a subword driver SDR belonging to one subword driver band BSDRn and a subword line SWL rendered active by an adjacent subword driver band BSDRn+1 are arranged alternately.

In a normal SDRAM operation, all select lines SL for the region corresponding to activated main word line MWL are rendered active. In response, all the subword lines corresponding to this main word line MWL in the memory cell array unit arranged along the direction of the word line shown in FIG. 69 are selected.

In a server mode, select lines SL are rendered active partially, i.e., only select line SL belonging to subword driver band BSDRn corresponding to a particular memory cell array unit shown in FIG. 69 is rendered active.

According to the above structure, a subword line SWL is present at both sides of a subword driver SDR (SWD), and a subword driver SWD is alternately arranged sandwiching the array. Therefore, the boundary of each bank corresponds to the hatched area in FIG. 71. According to this structure, operation is effected so that adjacent banks do not have the sense amplifier rendered active simultaneously since the adjacent banks share the sense amplifier.

Figure 72:
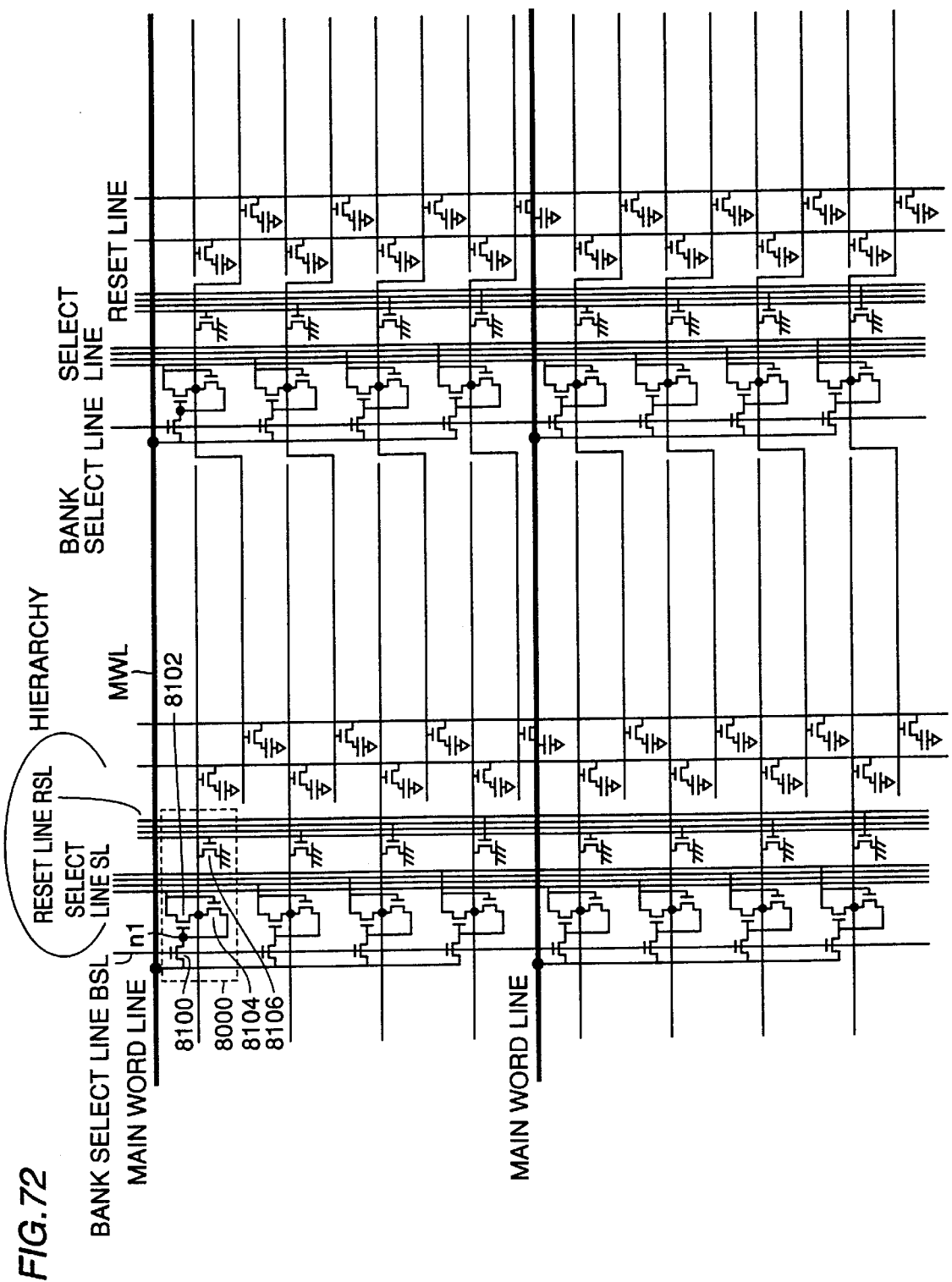
FIG. 72 is a circuit diagram showing a detailed structure of a subword driver band BSDRn shown in FIG. 71.

FIG. 72 is a circuit diagram for describing in further detail subword driver band BSDRn of FIG. 71.

Driver circuit 8000 includes a select transistor 8100 having its gate controlled by bank select line BSL, and provided between a main word line and internal node n1, a transistor 8102 having its gate connected to node n1, and provided between one select line SL0 out of select lines SL and subword line SWL, and a transistor 8104 having its gate potential controlled by select line SL0 identical to that of transistor 8102, and provided between subword line SWL and node n1. Driver circuit 8000 further includes a transistor 8106 having its gate potential controlled by reset line RSL0, and provided between the subword line and the ground potential.

A similar structure is arranged for the other main word lines and subword lines.

By the above structure, a main word line is rendered active, and then a bank select line and select line SL are rendered active. In response, subword line SWL is rendered active (high potential), and then the reset line is rendered active, whereby the corresponding subword line SWL is discharged to the level of the ground potential.

Figure 73:
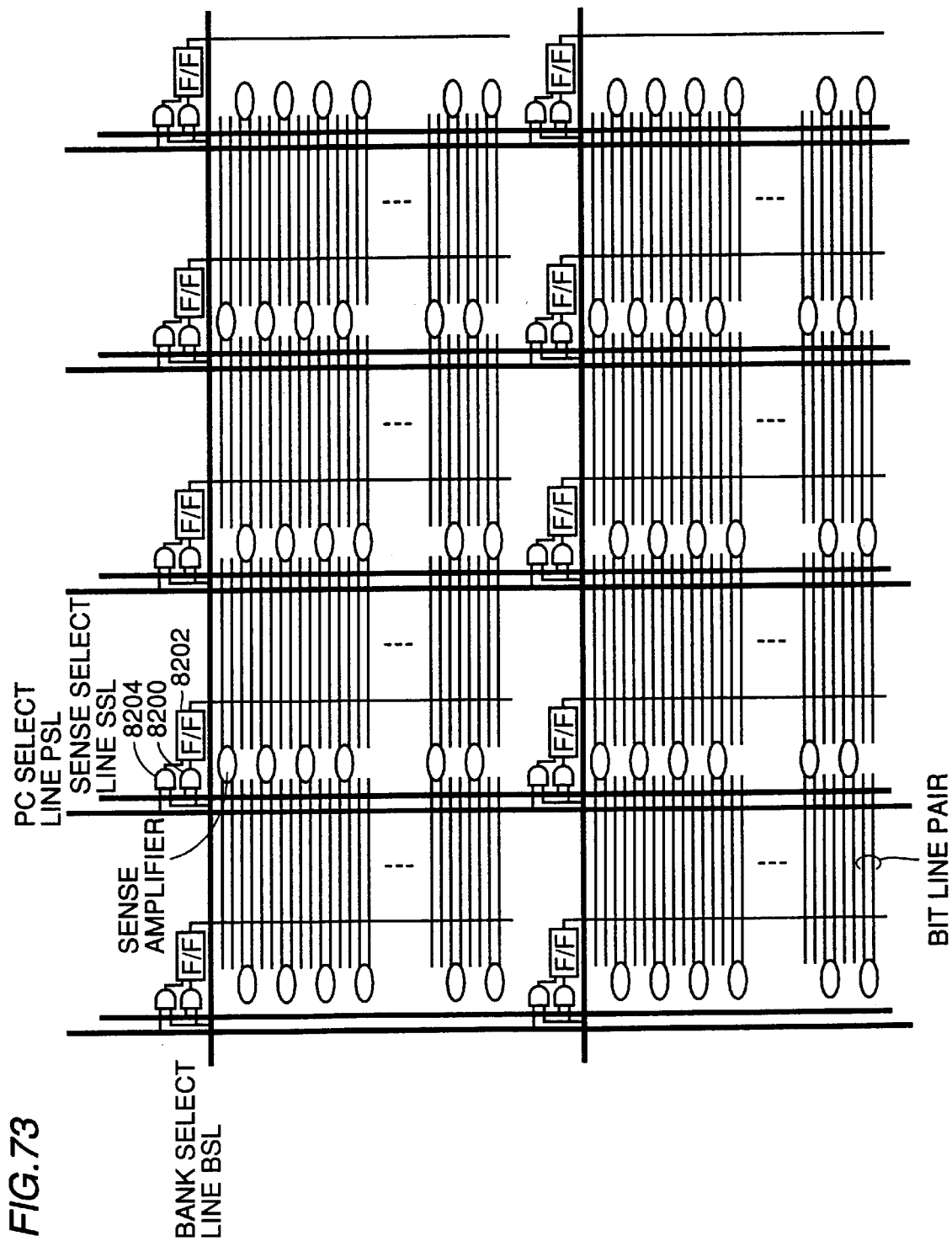
FIG. 73 is a schematic block diagram showing a structure of the control system of the sense amplifier.

FIG. 73 is a schematic block diagram showing a structure of the control system of the sense amplifier.

In response to selection of bank select line BSL and sense select line SSL, flip-flop circuit 8202 is set to an active state via AND circuit 8200. In response, the corresponding sense amplifier is rendered active.

In response to precharge select line PSL and the bank select line rendered active, the output from AND circuit 3204 attains an H level. Flip-flop circuit 8202 is reset. The sense amplifier corresponding to the selected bank is rendered inactive.

According to the select operation by activation of the precharge select line, the sense amplifier is precharged.

Figure 74:
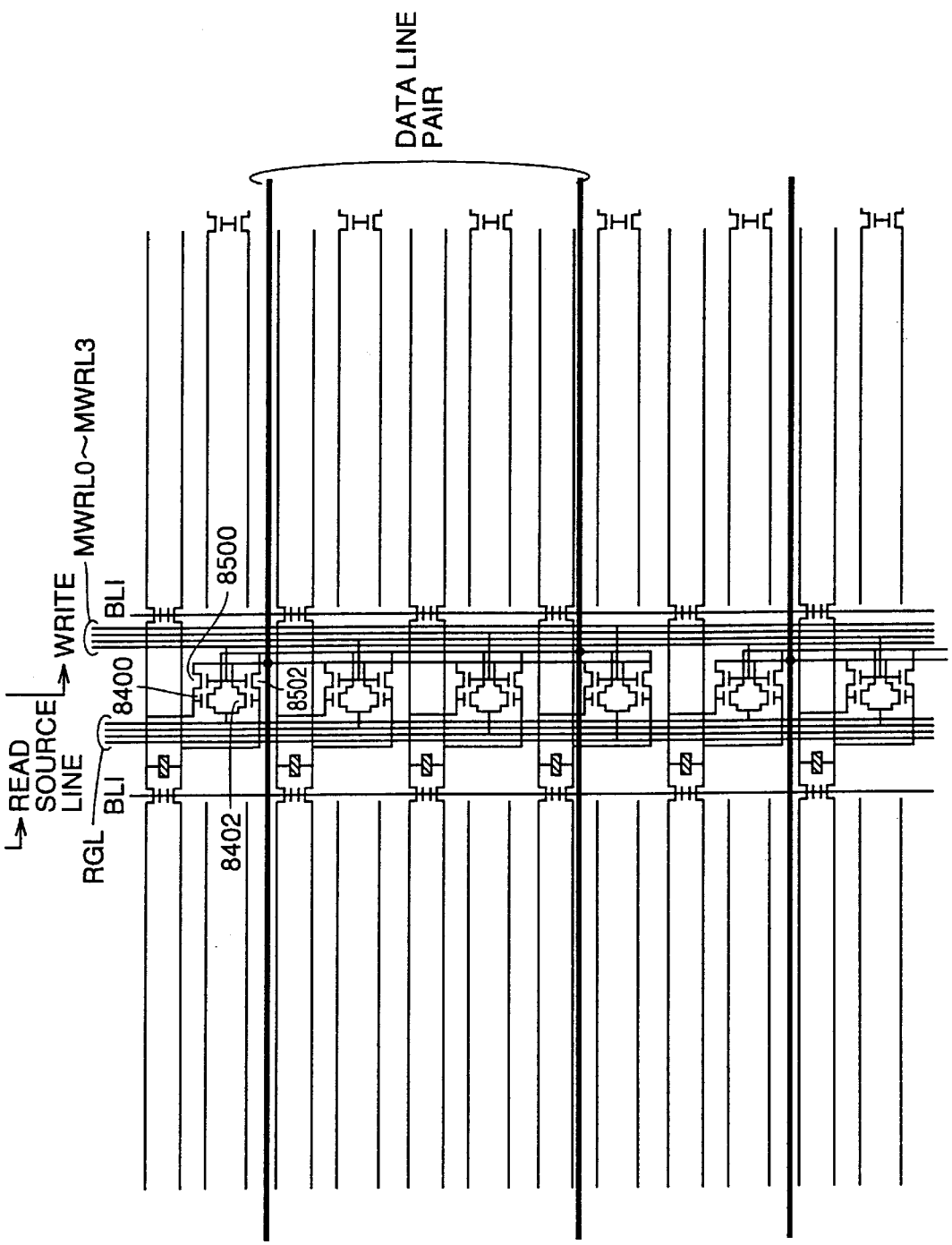
FIG. 74 is a circuit diagram showing a structure for connection between the sense amplifier unit and the data line unit.

FIG. 74 is a circuit diagram showing a structure for connection between a sense amplifier unit and a data line unit.

The input/output node of the sense amplifier has a data signal transmitted through a pair of data lines DL, /DL via transistors 8400 and 8402.

Transistors 8400 and 8402 have their sources selectively set to the ground potential by read source line RGL, their gates connected to the input/output node of respective corresponding sense amplifiers S/A, and their drains connected to respective corresponding data line pairs DL, /DL.

According to the structure of FIG. 74, four sense amplifiers share one data line pair DL, /DL.

In a write operation mode, data line pair DL, /DL is selectively connected by transistors 8500 and 8502 that are respectively connected between a corresponding bit line BL and data line DL, and between bit lines /BL and a corresponding data line /DL.

The input/output nodes of sense amplifiers S/A0–S/A3 corresponding to bit line pairs BL0, /BL0–BL3, /BL3 are selectively connected to data line pair DL, /DL by transistors 8500 and 8502 having the gate potential controlled by corresponding main write lines MWRL0–MWRL3.

Segment YS shown in FIG. 69 includes precharge select line PSL, sense select line SSL, read source line RGL (representative of read source lines RGL0–RGL3), main write line MWRL (representative of main write lines MWRL0–MWRL3), and the like.

By the above structure, data line pair Dl, /DL and the input/output node of the corresponding sense amplifier are not directly connected in the data readout operation. The gates of transistors 8400 and 8402 are driven to the potential level of the input/output node of the sense amplifier, whereby the level of data line pair DL, /DL changes. Selection of a memory cell column by a column address signal, i.e., the select operation of any of read source lines RGL0–RGL3 overlaps the amplification operation by the sense amplifier. The data can be read out without being damaged even in the case where the select operation precedes the amplification operation.

Thus, the read out operation can be speeded.

Furthermore, the peak value of the operating current can be suppressed to reduce power consumption and noise since the sense amplifier is to be rendered active for every limited region.

[Modification of Fifth Embodiment]

In the fifth embodiment, a subword line is activated for every memory cell array unit shown in FIG. 69. This structure is not always necessary from the standpoint of speeding the read out operation. A structure in which all the subword lines are rendered active once by one main word line can be provided.

Figure 75:
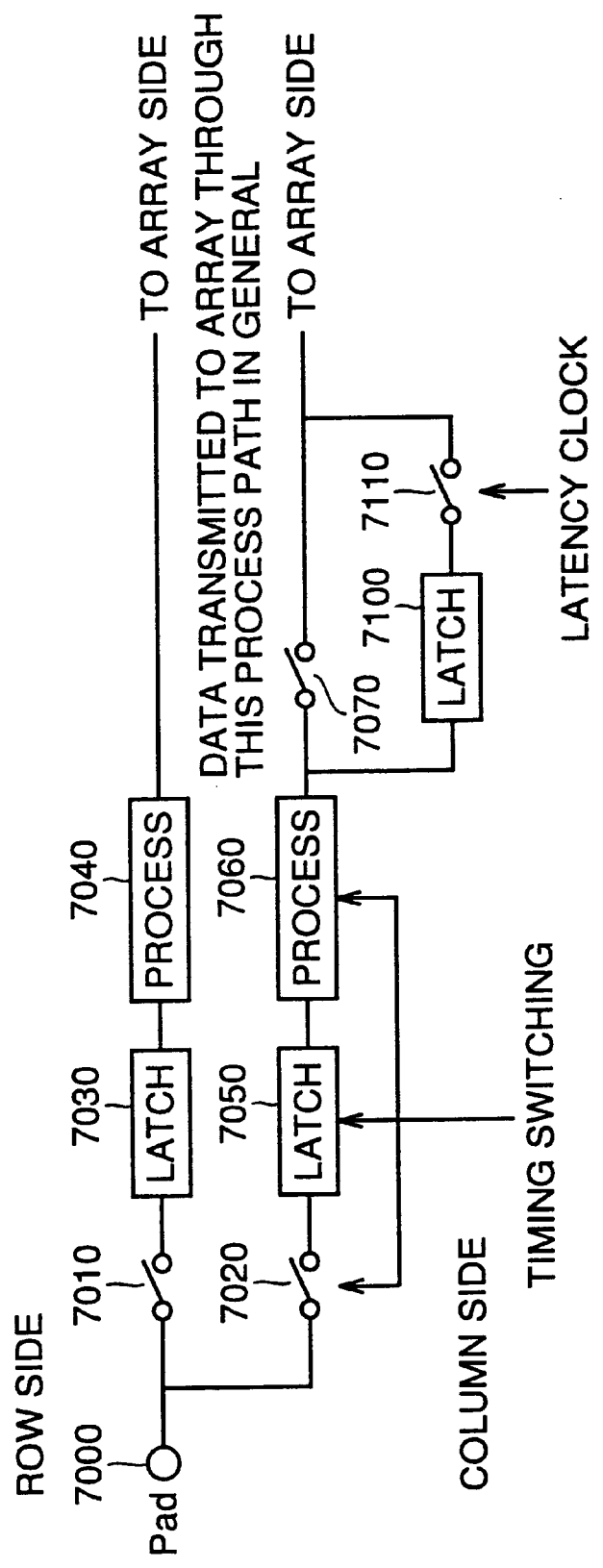
FIG. 75 is a schematic block diagram for describing an address signal transmission path to adjust the transmission timing of an address signal.

FIG. 75 is a schematic block diagram for describing an address signal transmission path in adjusting the timing of transmitting an address signal according to the operation mode when a row address and a column address are input.

The structure of FIG. 75 differs from the structure of FIG. 70 in that, when input of a column address is specified by a command signal in a server mode, an address signal is input to latch circuit 7050 via switch circuit 7020, processed by processing circuit 7060, held by latch circuit 7100, and then transmitted to the array unit in response to conduction of switch circuit 7110 that is controlled by the latency clock.

Since it is not necessary to operate at every memory cell array unit in the row direction, the processed result of the column related address signal by processing circuit 7060 does not have to be immediately transmitted to the array unit. Thus, the above-described structure is allowed.

Figure 76:
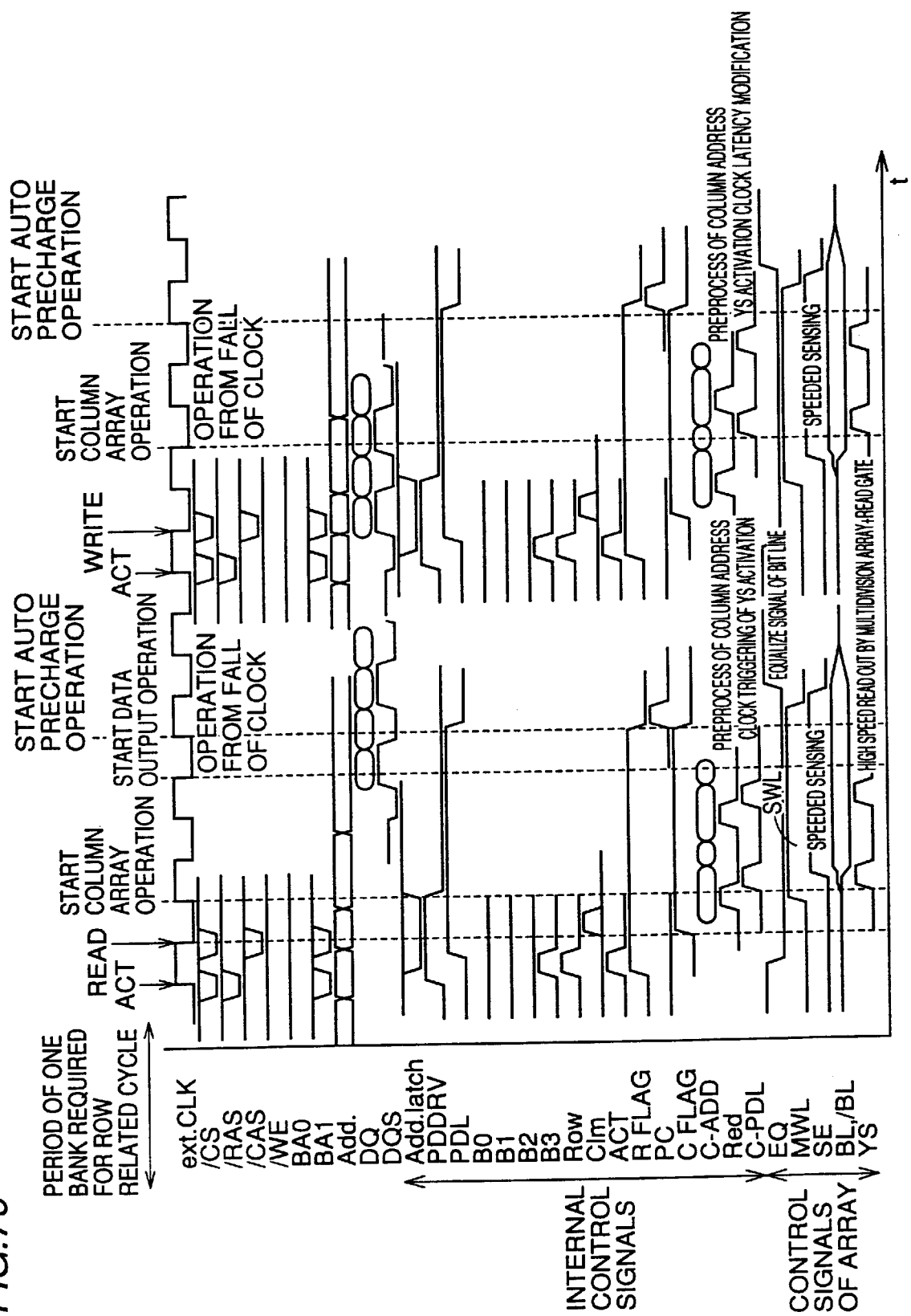
FIG. 76 is a timing chart for describing an operation according to a modification of the fifth embodiment.
Figure 77:
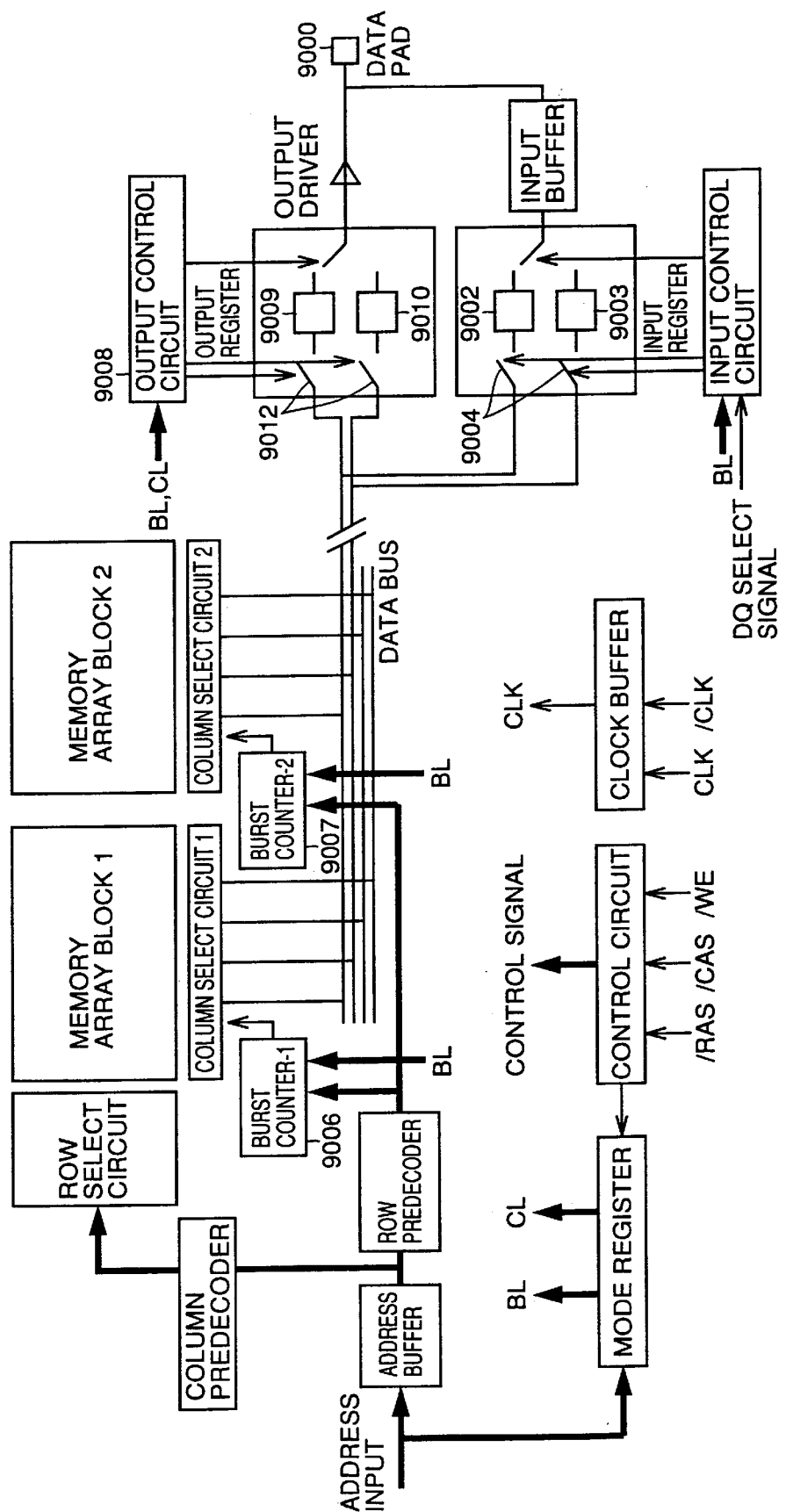
FIG. 77 is a schematic block diagram for describing a structure of a conventional DDR-SDRAM.

FIG. 76 is a timing chart for describing the operation of the above structure. Since adjacent memory cell array units will not be rendered active at the same time, the operation is basically similar to that of FIG. 68 provided that activation of the main word line and the activation signal of the sense amplifier is not a one shot pulse in contrast to FIG. 68. The readout operation can be speeded even by such a structure.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device receiving an address signal and a control signal in synchronization with an external clock signal, comprising:

a memory cell array including a plurality of memory cells arranged in a matrix;

a control circuit controlling an operation of said synchronous semiconductor memory device;

a first internal synchronizing signal generation circuit providing a first internal clock signal in synchronization with said external clock signal and of a frequency higher than the frequency of said external clock signal;

a second internal synchronizing signal generation circuit providing a second internal clock signal in synchronization with said external clock signal;

an address signal input circuit receiving said address signal in synchronization with said second internal clock signal;

a control signal input circuit receiving said control signal in synchronization with said second internal clock signal;

a memory cell select circuit selecting said memory cell according to said address signal;

a plurality of data input/output nodes to which write data to said memory cell array or readout data from said memory cell array are applied; and an interface circuit provided between memory cells selected by said memory cell select circuit and said data input/output nodes to output said readout data, said interface circuit receiving said readout data from said memory cell array in synchronization with said second internal clock signal in a first operation mode, and receiving said readout data from said memory cell array in synchronization with said first internal clock signal in a second operation mode.

2. The synchronous semiconductor memory device according to claim 1, wherein said first internal clock signal has a frequency N times (N: natural number, N≧2) the frequency of said second internal clock signal, wherein said memory cell select circuit selects N memory cells at one time for every said input/output node in said second operation mode, wherein said interface circuit comprises a plurality of parallel-serial conversion circuits provided corresponding to said plurality of input/output nodes respectively, each for receiving in parallel readout data from the selected N memory cells and converting the received data into N serial data to be applied to a corresponding data input/output node in said second operation mode, and a plurality of data buffer circuits provided corresponding to said plurality of data input/output nodes to carry out an output operation of said serial data in synchronization with said first internal clock signal in said second operation mode a plurality of serial-parallel conversion circuits converting N data applied serially to each of said plurality of data input/output nodes into N parallel data and providing the parallel data to said selected memory cells.

3. The synchronous semiconductor memory device according to claim 1, wherein said first internal clock signal has a frequency N times (N: natural number, N≧2) the frequency of said second internal clock signal, wherein said memory cell select circuit selects N memory cells at one time for each said input/output node in said second operation mode, wherein said data input/output circuit comprises a plurality of data buffer circuits provided corresponding to said plurality of data input/output nodes to carry out an input operation of said write data, and 4. The synchronous semiconductor memory device according to claim 2, wherein said second internal synchronizing signal generation circuit comprises a clock buffer circuit receiving said external clock signal to buffer and output the received signal, a clock phase synchronous circuit comparing phases between said external clock signal and said second internal clock signal to set the phase difference to a predetermined value, and a first switch circuit under control of said control circuit to selectively output as said second internal clock signal an output of said clock buffer circuit or an output of said clock phase synchronous circuit.

5. The synchronous semiconductor memory device according to claim 4, wherein said second synchronizing signal generation circuit further comprises a second switch circuit under control of said control circuit to apply an output of said clock buffer circuit to said memory cell select circuit, and an output of said clock phase synchronous circuit as said second internal clock signal.

6. The synchronous semiconductor memory device according to claim 4, further comprising:

a plurality of control signal input nodes receiving said control signal;

a plurality of control signal buffer circuits provided corresponding to said plurality of control signal input nodes, and operating under control of said second internal clock signal;

a plurality of address signal input nodes receiving said address signal;

a plurality of address signal buffer circuits provided corresponding to said plurality of address input nodes, and operating under control of said second internal clock signal; and a first phase adjust circuit receiving an output from said second internal synchronizing signal generation circuit to keep in phase said second internal clock signal applied to said plurality of control signal buffer circuits and said plurality of address signal buffer circuits.

7. The synchronous semiconductor memory device according to claim 4, wherein said clock phase synchronous circuit comprises a variable delay circuit delaying an input clock signal for a delay time according to a delay control signal and providing the delayed signal, wherein said variable delay circuit includes a first delay circuit receiving said input clock signal to delay said input clock signal for a delay time according to said delay control signal and providing the delayed signal, and a second delay circuit receiving an output of said first delay circuit to delay the received signal for a delay time according to said delay control signal and providing the delayed signal, wherein said clock phase synchronous circuit further comprises a second switch circuit under control of said control circuit to switch between a first state and a second state, said second switch circuit providing an output of said second delay circuit as the output of said clock phase synchronous circuit and applying the output of said clock buffer circuit to an input of said first delay circuit in the first state, and said second switch circuit providing a signal that corresponds to an output of said first delay circuit as the output of said clock phase synchronous circuit, inverting the output of said first delay circuit and applying the inverted signal to the input of said first delay circuit in the second state, and a second state of receiving and inverting the output of said first delay circuit and applying the inverted signal to an input of said first delay circuit, and applying a signal that corresponds to an output of said first delay circuit that is frequency-divided by a predetermined rate as said second internal clock signal, and a delay control circuit comparing phases of said second internal clock signal and said external clock signal to control said delay control signal so that a difference of said phase maintains a predetermined value according to the comparison result, wherein said second internal synchronizing signal generation circuit further comprises a fourth switch circuit under control of said control circuit to apply the output of said first delay circuit to said memory cell select circuit in said second state.

8. The synchronous semiconductor memory device according to claim 2, wherein said first internal clock signal has a frequency two times the frequency of said second internal clock signal, wherein said first internal synchronizing signal generation circuit generates a first internal clock signal in response to respective activation of said external clock signal and a signal complementary to said external clock signal.

9. The synchronous semiconductor memory device according to claim 2, further comprising a second phase adjust circuit receiving an output from said first internal synchronizing signal generation circuit to keep in phase said first internal clock signal respectively applied to said plurality of data buffer circuits.

10. The synchronous semiconductor memory device according to claim 2, wherein said memory cell array is divided into a plurality of memory cell blocks, and allows a readout operation and a write operation independently, further comprising:
an address bus provided in common to said plurality of memory cell blocks to transmit said address signal from said address signal input circuit;
a command data bus provided in common to said plurality of memory cell blocks to transmit an internal control signal output from said control circuit;
a first variable vernier circuit under control of said control circuit to adjust an amount of delay of a signal transmitted through said address bus; and
a second variable vernier circuit under control of said control circuit to adjust an amount of delay of a signal transmitted through said command data bus,
wherein said memory cell select circuit comprises a plurality of local select circuits provided corresponding to said memory cell blocks to select said memory cell according to said address signal from said address bus,
each said local select circuit being rendered active according to selection of a corresponding memory cell block on a basis of said internal control signal and said address signal.

11. The synchronous semiconductor memory device according to claim 1, wherein said first internal clock signal has a frequency two times the frequency of said second internal clock signal,
wherein said memory cell array is divided into a plurality of memory cell blocks,
further comprising switching means for setting correspondence of said plurality of memory cell blocks with said plurality of data input/output nodes respectively when in said first operation mode, and for setting correspondence of every two of said plurality of memory cell blocks with said data input/output node when in said second operation mode.

12. The synchronous semiconductor memory device according to claim 1, wherein said first internal clock signal has a frequency two times the frequency of said second internal clock signal,
wherein said memory cell array is divided into a plurality of memory cell blocks,
further comprising switching means for setting correspondence of said plurality of memory cell blocks with said plurality of data input/output nodes respectively when in said first operation mode, and for setting correspondence of two of said plurality of memory cell blocks that are distinguished by a particular bit data of said address signal in said first operation mode alternately with said data input/output node when in said second operation mode.

13. The synchronous semiconductor memory device according to claim 1, wherein said first internal clock signal has a frequency N times (N: natural number, N≧2) the frequency of said second internal clock signal,
wherein said memory cell select circuit continuously carries out for M cycles (M: natural number, M≧2) a one-time select operation of memory cells of N data,
wherein said data input/output circuit comprises
a plurality of parallel-serial conversion circuits provided corresponding to said plurality of input/output nodes respectively, each for sequentially receiving the data read out in parallel from said N selected memory cells and converting the sequentially received data into N×M serial data to a corresponding data input/output node, and
a plurality of data buffer circuits provided corresponding to said plurality of data input/output nodes respectively for carrying out an output operation of the readout data in synchronization with said second internal clock signal when in said first operation mode and in synchronization with said first internal clock signal when in said second operation mode.

14. The synchronous semiconductor memory device according to claim 13, further comprising an internal counter circuit generating an internal address signal to select said memory cell over said M cycles,
wherein said internal counter circuit comprises
a first counter circuit generating said internal address signal when in both said first and second operation modes, and
a second counter circuit generating said internal address signal alternately with said first counter circuit when in said second operation mode.

15. A synchronous semiconductor memory device receiving a row address signal and a column address signal in synchronization with an external clock signal, comprising:
a memory cell array including a plurality of memory cells arranged in a matrix, said memory cell array including a plurality of memory cell blocks;
an internal synchronizing signal generation circuit generating an internal clock signal in synchronization with said external clock signal;
an address signal input circuit receiving said row and column address signals in synchronization with said internal clock signal;
a row select circuit provided corresponding to said memory cell block to select said memory cell row according to said row address signal, said row select circuit including a first retain circuit retaining said row address signal from said address signal input circuit; and
a column select circuit provided corresponding to said memory cell block to select said memory cell column according to said column address signal, said column select circuit including
a second retain circuit retaining said column address signal applied in a time-divisional manner with said row address signal, and
a path select circuit initiating a select operation of a memory cell column to output data prior to the end of a row select operation of said row select circuit according to said column address signal in said second retain circuit.

16. The synchronous semiconductor memory device according to claim 15, wherein each said memory cell block comprises
a plurality of bit line pairs provided corresponding to a memory cell column, and
a plurality of sense amplifiers provided corresponding to said bit line pair,
wherein said column select circuit further includes a sense amplifier activation circuit to selectively render active a sense amplifier in said memory cell block including a selected memory cell according to said row address signal and said column address signal.

17. The synchronous semiconductor memory device according to claim 15, wherein said memory cell array comprises a plurality of data line pairs for data transmission,
   wherein each said memory cell block comprises
      a plurality of bit line pairs provided corresponding to a memory cell column,
      a plurality of sense amplifiers provided corresponding to said bit line pair, and
      a data transmission circuit to selectively transmit data from selected said bit line pair to said data line pair,
   wherein said column select circuit comprises
      a memory cell activation circuit selectively rendering active a sense amplifier in said memory cell block including a selected memory cell according to said row address signal and said column address signal, and
      an output path select circuit selectively rendering active said data transmission circuit prior to the end of an amplification operation of said sense amplifier.

18. The synchronous semiconductor memory device according to claim 15, wherein said address signal input circuit inputs said row address signal at an activation edge of said external clock, and inputs said column address signal at an inactivation edge of said external clock at which said row address signal is input.

19. The synchronous semiconductor memory device according to claim 15, wherein said row select circuit comprises
   a plurality of main word lines provided in common to said memory cell blocks arranged in a row direction,
   a plurality of subword line groups provided for every said main word line,
   a select line to designate which of said subword line groups is to be selected, and
   a driver circuit provided for every subword line included in said subword line group to hold a corresponding subword line at an active state according to activation of said main word line and said select line.

20. The synchronous semiconductor memory device according to claim 19, wherein said subword line is provided over two adjacent said memory cell block pairs, and
   wherein a plurality of first subword lines included in a first memory cell block pair and a plurality of second subword lines included in a second memory cell block pair adjacent to said first memory cell block pair are arranged alternately with each other.

21. A synchronous semiconductor memory device receiving an address signal in synchronization with an external clock signal, comprising:
   a memory cell array including a plurality of memory cells arranged in a matrix, said memory cell array being divided into a plurality of memory cell blocks on a grid, each of said memory cell blocks including two banks;
   a plurality of word lines provided corresponding to memory cell rows of said memory cell blocks, said word lines in said memory cell block alternately belonging to different banks; and
   a row select circuit for selecting one of said banks and one of said word lines in the selected bank according to said address signal.

22. The synchronous semiconductor memory device according to claim 21, wherein said row select circuit comprises
   a plurality of main word lines provided in common to said memory cell blocks arranged in a row direction,
   a plurality of select lines to designate which of said banks is to be selected, and
   a driver circuit provided for every word line included in said bank to hold a corresponding word line at an active state according to activation of said main word line and said select line.

23. A synchronous semiconductor memory device receiving an address signal and a control signal in synchronization with an external clock signal, comprising:
   a memory cell array including a plurality of memory cells arranged in a matrix;
   a control circuit controlling an operation of said synchronous semiconductor memory device;
   a first internal synchronizing signal generation circuit generating a first internal clock signal based on a timing clock signal;
   a second internal synchronizing signal generation circuit providing a second internal clock signal in synchronization with said external clock signal;
   an address signal input circuit receiving said address signal in synchronization with said second internal clock signal;
   a control signal input circuit receiving said control signal in synchronization with said second internal clock signal;
   a memory cell select circuit selecting said memory cell according to said address signal;
   a plurality of data input/output nodes to which write data to said memory cell or readout data from said memory cell are applied; and
   an interface circuit provided between memory cells selected by said memory cell select circuit and said data input/output nodes to input said write data, said interface circuit receiving said write data from said plurality of data input/output nodes in synchronization with said second internal clock signal in a first operation mode, and receiving said write data from said plurality of data input/output nodes in synchronization with said first internal clock signal in a second operation mode.

24. The synchronous semiconductor memory device according to claim 22, further comprising a plurality of sub select lines to designate which of said word lines is to be selected, and wherein said driver circuit includes
   a first transistor transmitting a potential level of said main word line to an internal node in response to activation of one of said select lines,
   a second transistor provided between said word line and said internal node and having a gate coupled to a corresponding one of said sub selected lines, and
   a third transistor provided between said corresponding sub select line and word line and having a gate coupled to said internal node.

* * * * *